US012122527B2

(12) United States Patent
Graves et al.

(10) Patent No.: US 12,122,527 B2
(45) Date of Patent: Oct. 22, 2024

(54) SYSTEMS, METHODS, AND MECHANICAL DESIGNS FOR INVERTERS FOR EVTOL AIRCRAFT

(71) Applicant: Archer Aviation Inc., San Jose, CA (US)

(72) Inventors: Scott Graves, Felton, CA (US); Alan Baldwin, San Jose, CA (US); Stephen Michael Spiteri, Livermore, CA (US); Wei Wu, San Jose, CA (US); Alan D. Tepe, Fremont, CA (US)

(73) Assignee: ARCHER AVIATION INC., San Jose, CA (US)

( * ) Notice: Subject to any disclaimer, the term of this patent is extended or adjusted under 35 U.S.C. 154(b) by 0 days.

(21) Appl. No.: 18/622,647

(22) Filed: Mar. 29, 2024

(65) Prior Publication Data

US 2024/0253795 A1 Aug. 1, 2024

Related U.S. Application Data

(63) Continuation of application No. 18/306,275, filed on Apr. 25, 2023, now Pat. No. 11,975,854.
(Continued)

(51) Int. Cl.
B64D 27/24 (2024.01)
B64C 29/00 (2006.01)
(Continued)

(52) U.S. Cl.
CPC .......... B64D 27/24 (2013.01); B64C 29/0033 (2013.01); H02P 25/16 (2013.01); H02P 27/06 (2013.01)

(58) Field of Classification Search
None
See application file for complete search history.

(56) References Cited

U.S. PATENT DOCUMENTS 5,742,484 A 4/1998 Gillette et al.
9,413,208 B2 8/2016 Pal
(Continued)

FOREIGN PATENT DOCUMENTS

CN 2507177 Y 8/2002
CN 201887602 U 6/2011
(Continued)

OTHER PUBLICATIONS

"Flex without the Flex", cy384, Nov. 12, 2020, http://www.cy384.com/blog/flex-pcbs.html. 5 pages.
(Continued)

Primary Examiner — Naishadh N Desai
(74) Attorney, Agent, or Firm — Finnegan, Henderson, Farabow, Garrett & Dunner, LLP

(57) ABSTRACT

An electrical propulsion system for a vertical take-off and landing (VTOL) aircraft comprises an electrical motor assembly and an inverter assembly. The inverter assembly comprises a housing, a capacitor assembly, at least one printed circuit board assembly (PCBA), and a plurality of positioning pins. The capacitor assembly comprises a center hole, at least one capacitor, a capacitor housing having at least one busbar, and a plurality of through holes in the capacitor housing. The capacitor assembly and the at least one PCBA are positioned inside the housing. The plurality of positioning pins pass through the through the plurality of through holes of the capacitor housing and the at least one PCBA and are connected to the housing.

22 Claims, 78 Drawing Sheets

Related U.S. Application Data

(60) Provisional application No. 63/378,680, filed on Oct. 7, 2022, provisional application No. 63/378,536, filed on Oct. 6, 2022.

(51) Int. Cl.
*H02P 25/16* (2006.01)
*H02P 27/06* (2006.01)

(56) References Cited

U.S. PATENT DOCUMENTS

| | | | |
|---|---|---|---|
| 10,967,934 B2 | 4/2021 | Ferguson | |
| 11,213,934 B2 | 1/2022 | Bandy et al. | |
| 2003/0200761 A1* | 10/2003 | Funahashi | F04C 29/0085 62/228.4 |
| 2004/0106428 A1 | 6/2004 | Shoji | |
| 2008/0205107 A1* | 8/2008 | Hattori | H05K 7/1432 29/854 |
| 2012/0021621 A1 | 1/2012 | Kim | |
| 2012/0305294 A1 | 12/2012 | Takaura | |
| 2016/0336700 A1 | 11/2016 | Caveney et al. | |
| 2017/0301992 A1 | 10/2017 | Khlat et al. | |
| 2019/0028815 A1 | 1/2019 | Brioschi et al. | |
| 2019/0318878 A1* | 10/2019 | Owen | H01G 4/40 |
| 2019/0319551 A1* | 10/2019 | Song | H05K 7/20881 |
| 2019/0323473 A1 | 10/2019 | Namuduri | |
| 2019/0366951 A1 | 12/2019 | Young et al. | |
| 2021/0328482 A1 | 10/2021 | Rutowski et al. | |
| 2022/0190764 A1 | 6/2022 | Yoon | |
| 2022/0250756 A1 | 8/2022 | Wagner | |
| 2022/0357223 A1 | 11/2022 | Khazaai et al. | |

FOREIGN PATENT DOCUMENTS

| | | |
|---|---|---|
| CN | 202997950 U | 6/2013 |
| CN | 108390577 A | 8/2018 |
| CN | 108736744 A | 11/2018 |
| CN | 208907678 U | 5/2019 |
| CN | 209516989 U | 10/2019 |
| CN | 111465171 A | 7/2020 |
| CN | 212163179 U | 12/2020 |
| CN | 113410060 B | 4/2022 |
| CN | 216721843 U | 9/2022 |
| CN | 217388412 U | 9/2022 |
| DE | 202012101392 U1 | 5/2012 |
| DE | 212020000044 U1 | 5/2020 |
| DE | 102019213857 A1 | 3/2021 |
| EP | 3939890 A1 | 1/2022 |
| EP | 3944476 A1 | 1/2022 |
| KR | 20100082105 A | 7/2010 |
| WO | 2014026202 A2 | 2/2014 |
| WO | 2021114606 A1 | 6/2021 |
| WO | 2022135939 A1 | 6/2022 |

OTHER PUBLICATIONS

"Endless-Snake Flexible Printed Circuits", Leiton, May 20, 2022. 4 pages.
"Things to Know About PCB for LED Strips", MyLedy, Sep. 13, 2021. 12 pages.
Ing, W. et al., "New Generation of Intelligent Electromechanical Valve Actuation", 11th International Fluid Power Conference 2018, 5 pages.
Jeon, D. et al., "4 Types of Enclosures for Large Motors", TMEIC, Jul. 4, 2021, 8 pages.
PCT International Search Report and Written Opinion mailed Jan. 18, 2024, issued in corresponding International Application No. PCT/US2023/076253 (12 pgs.).

\* cited by examiner

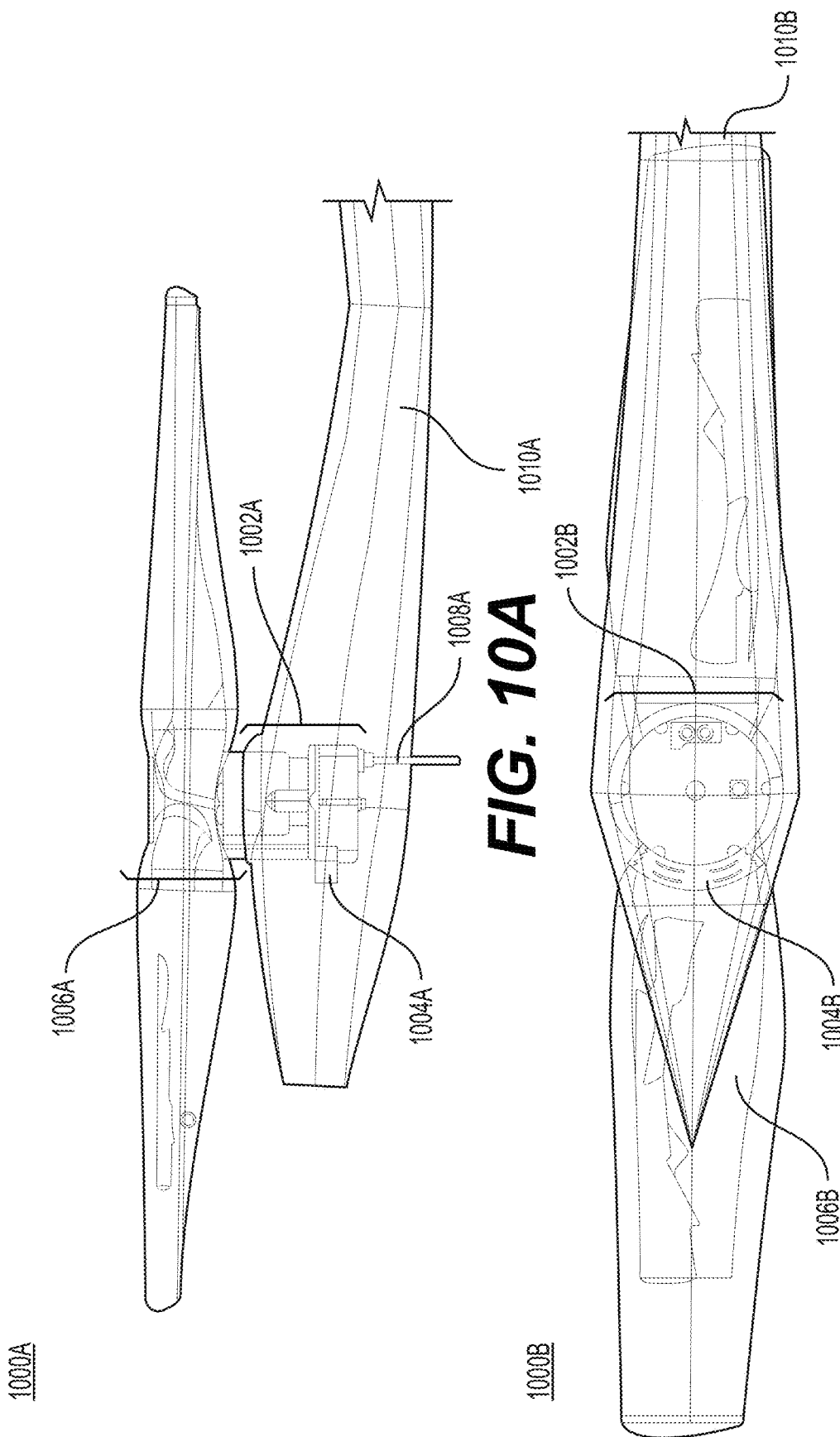

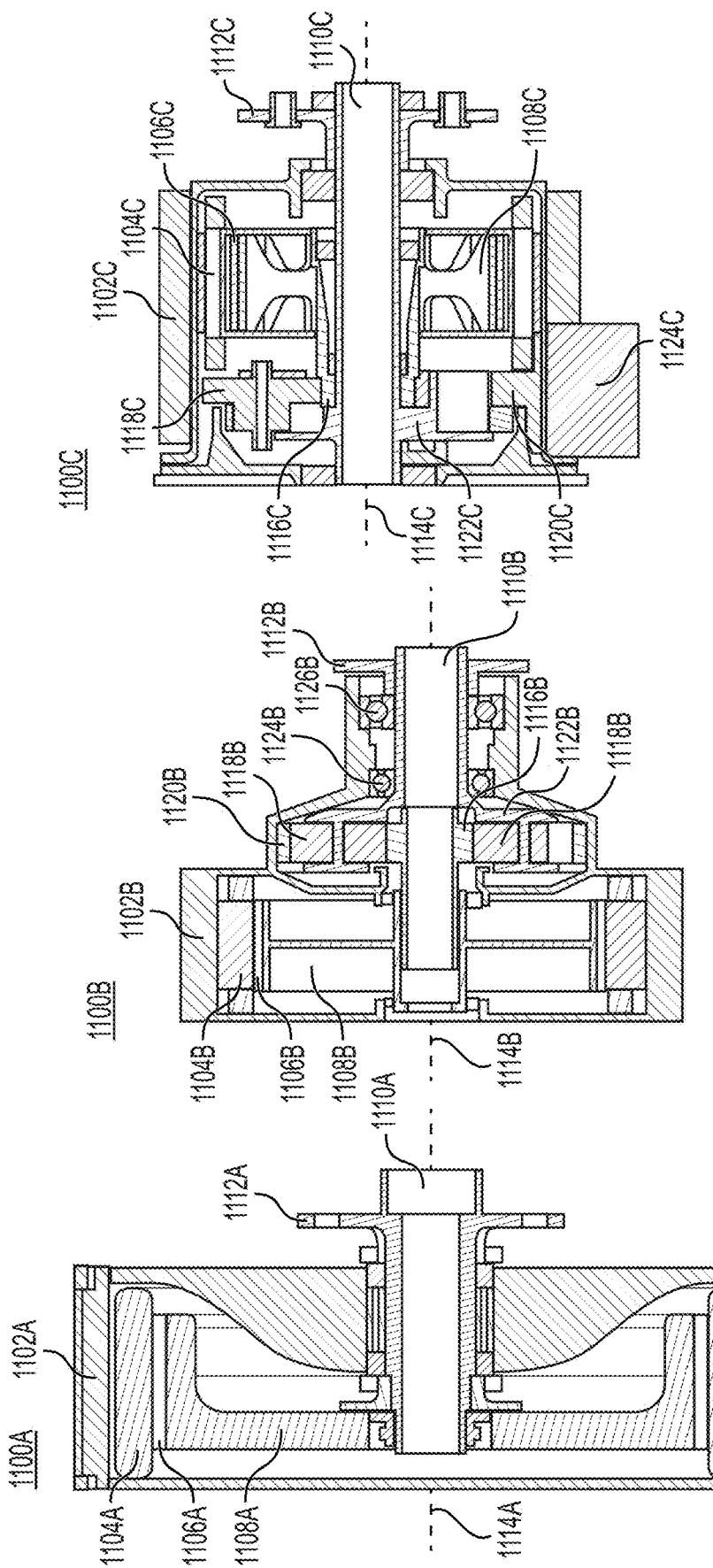

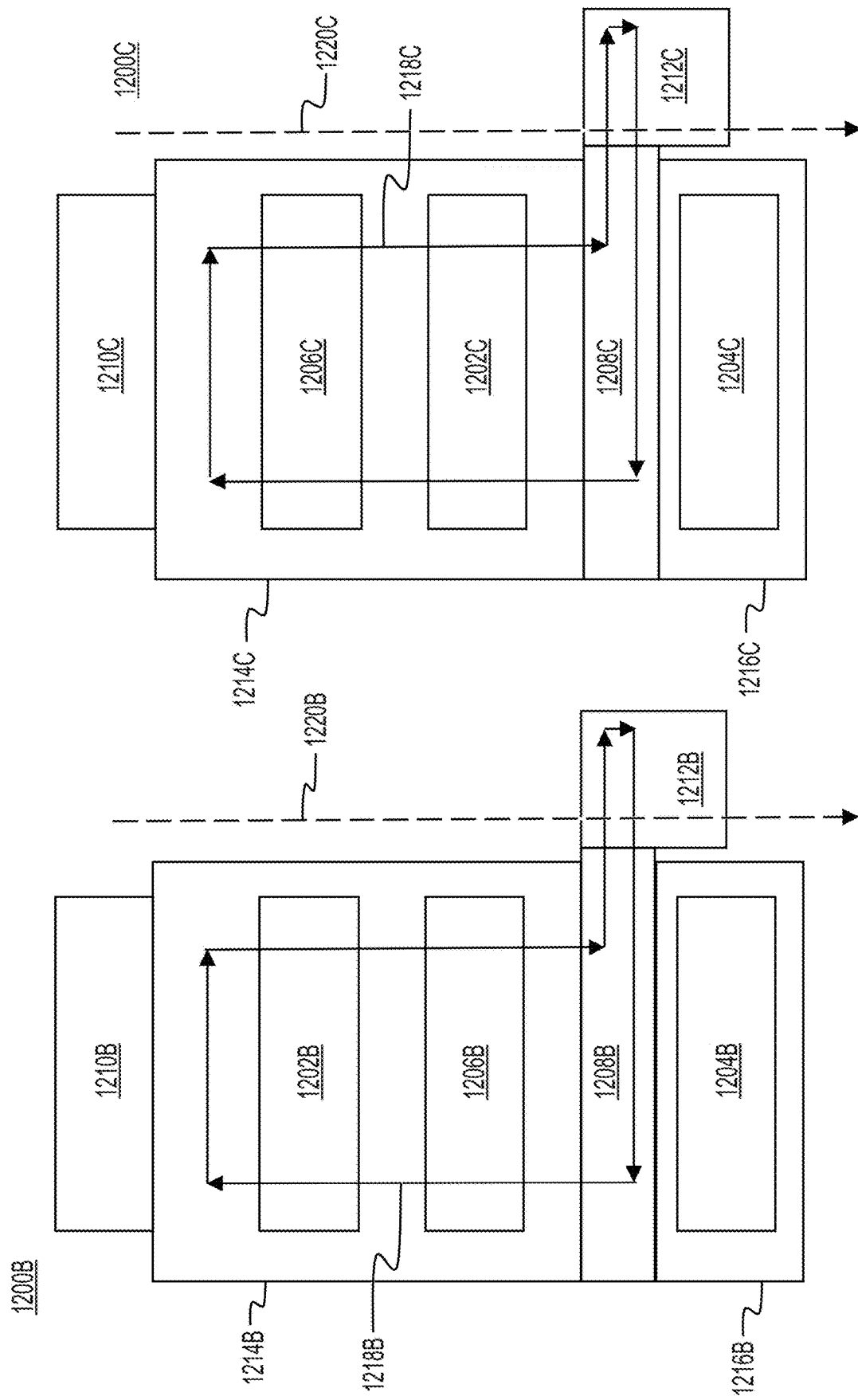

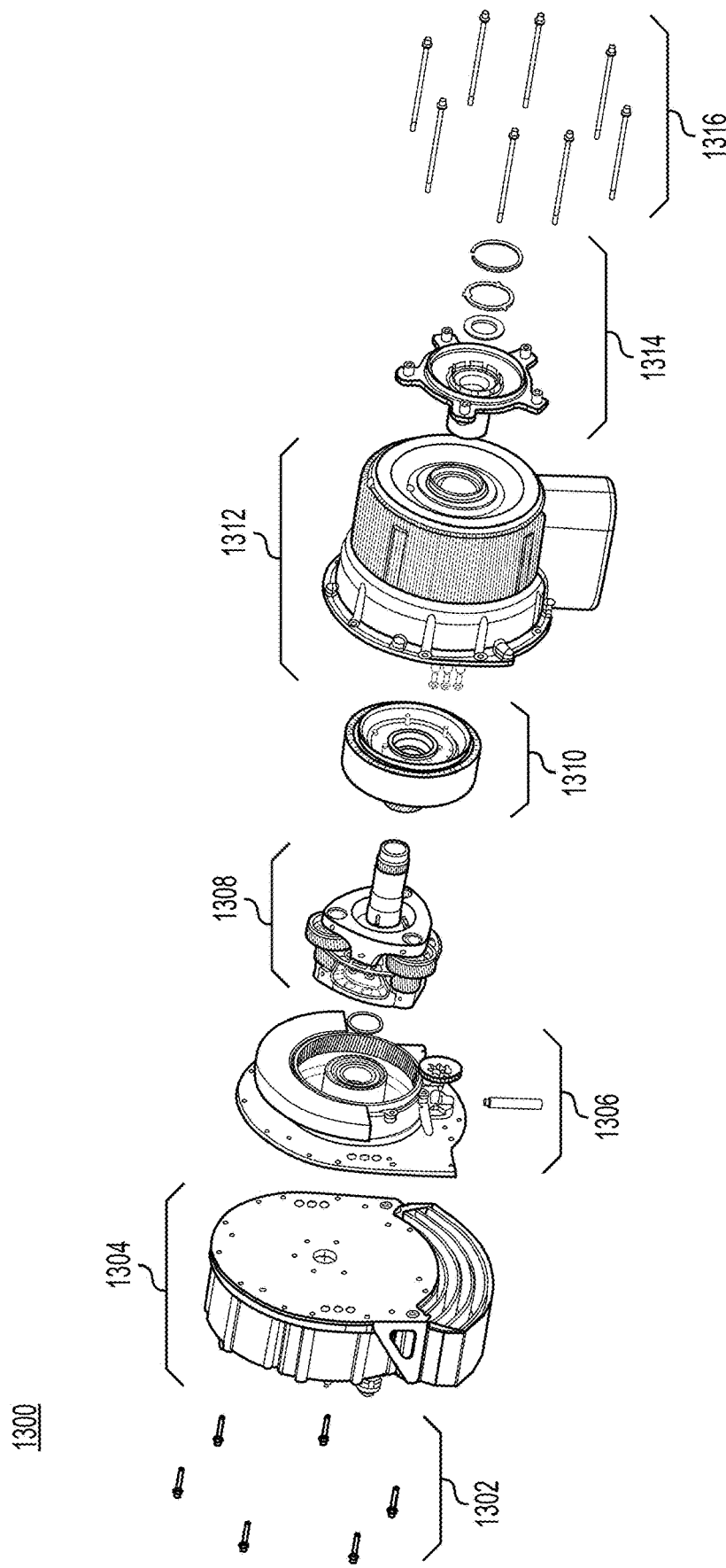

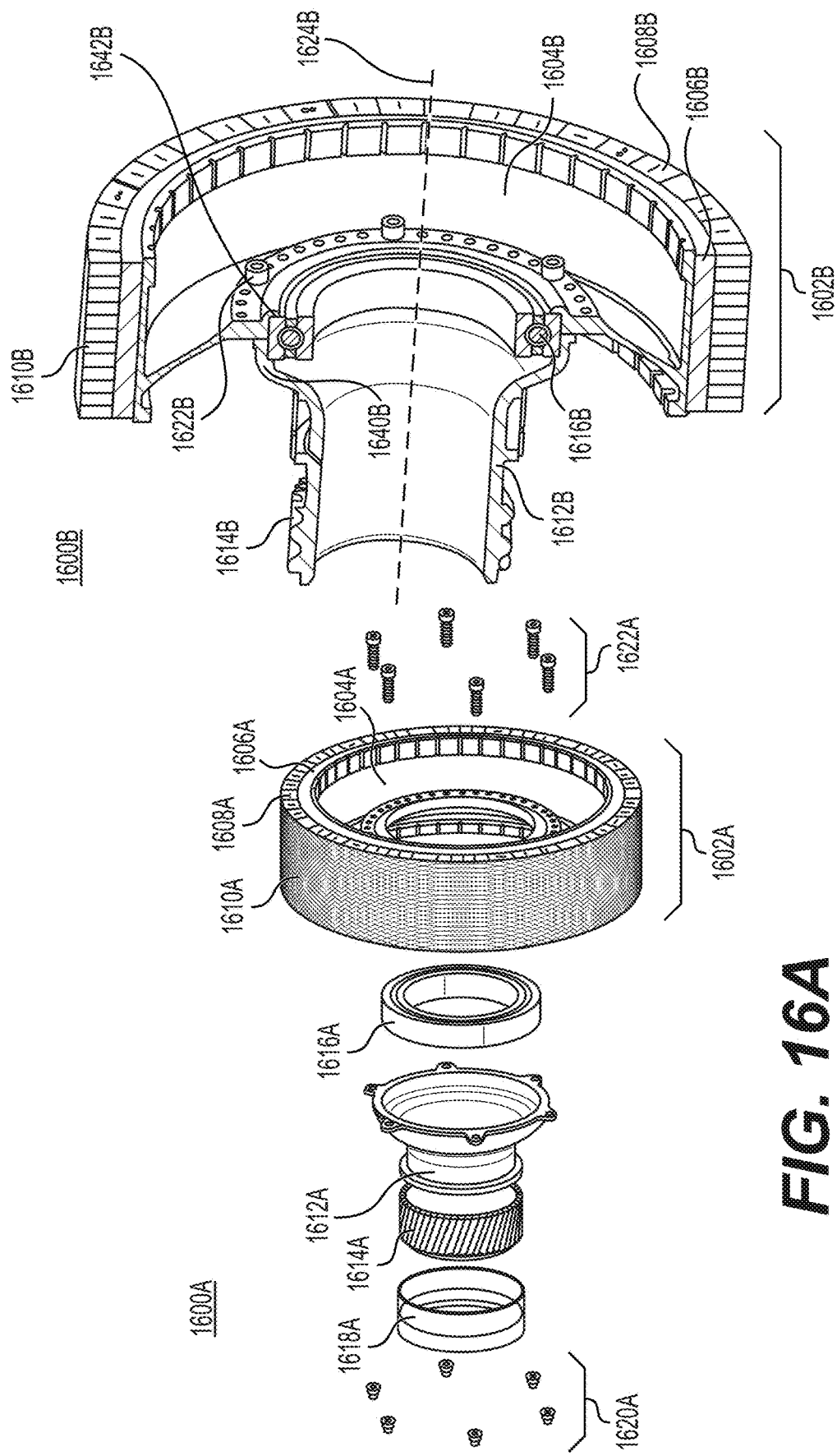

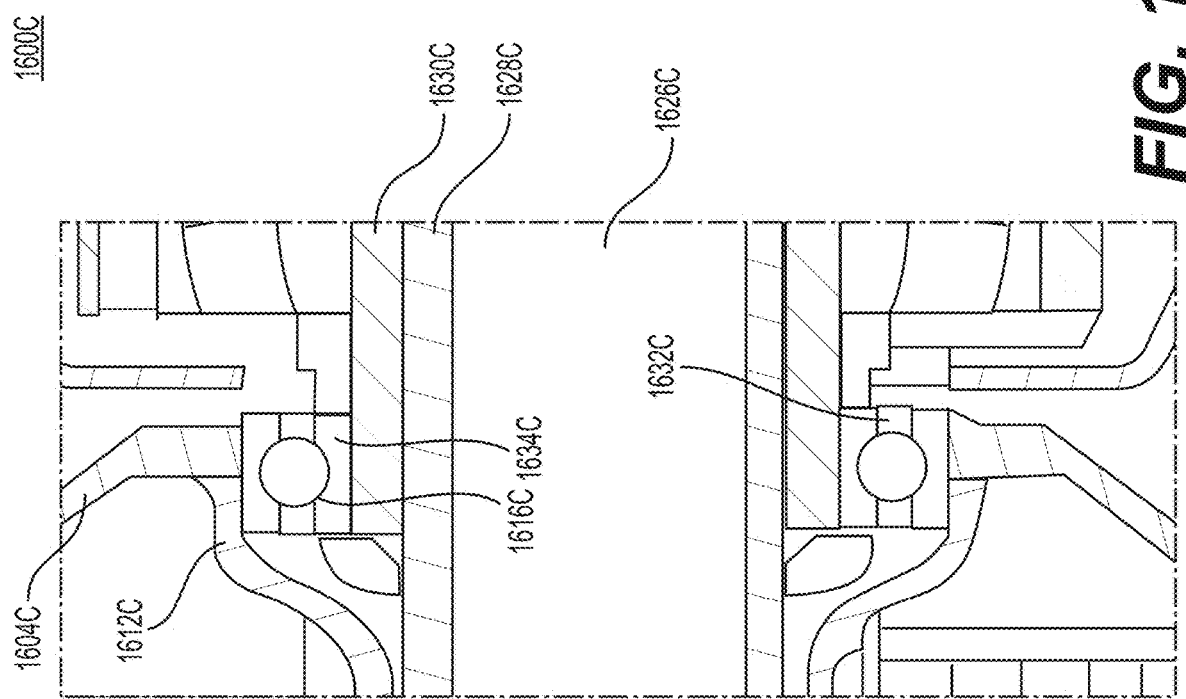

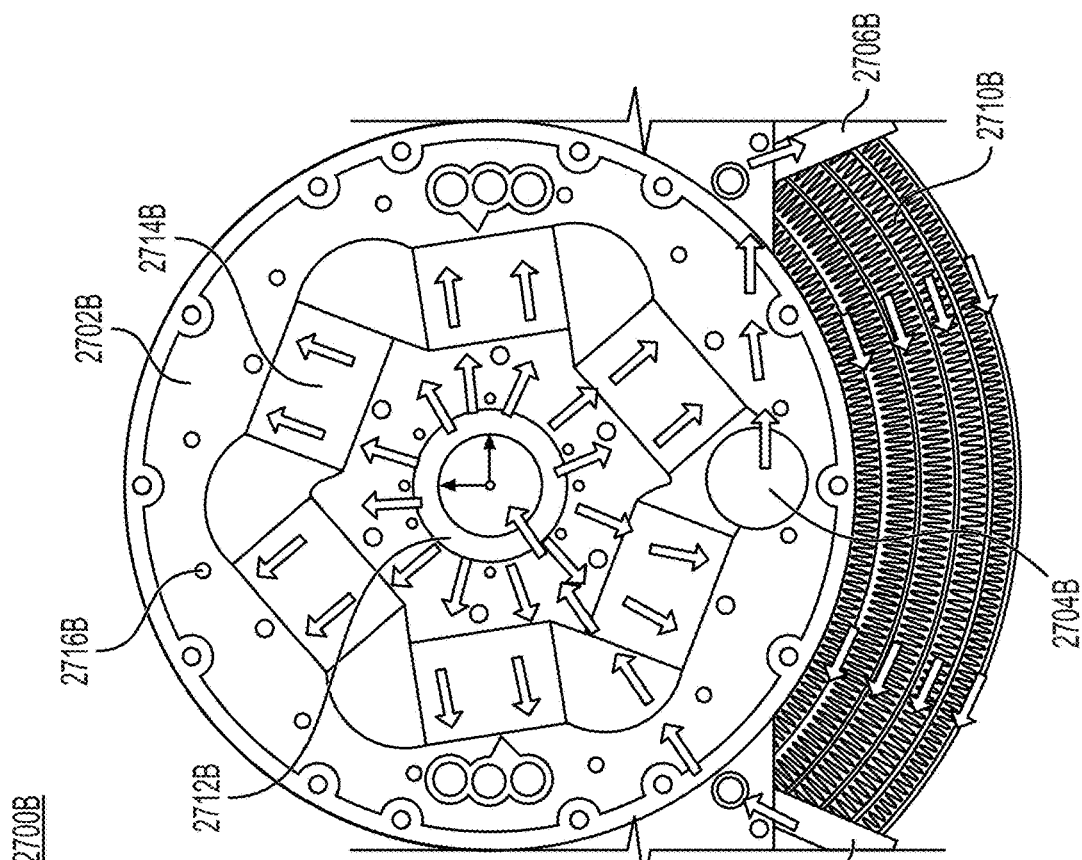
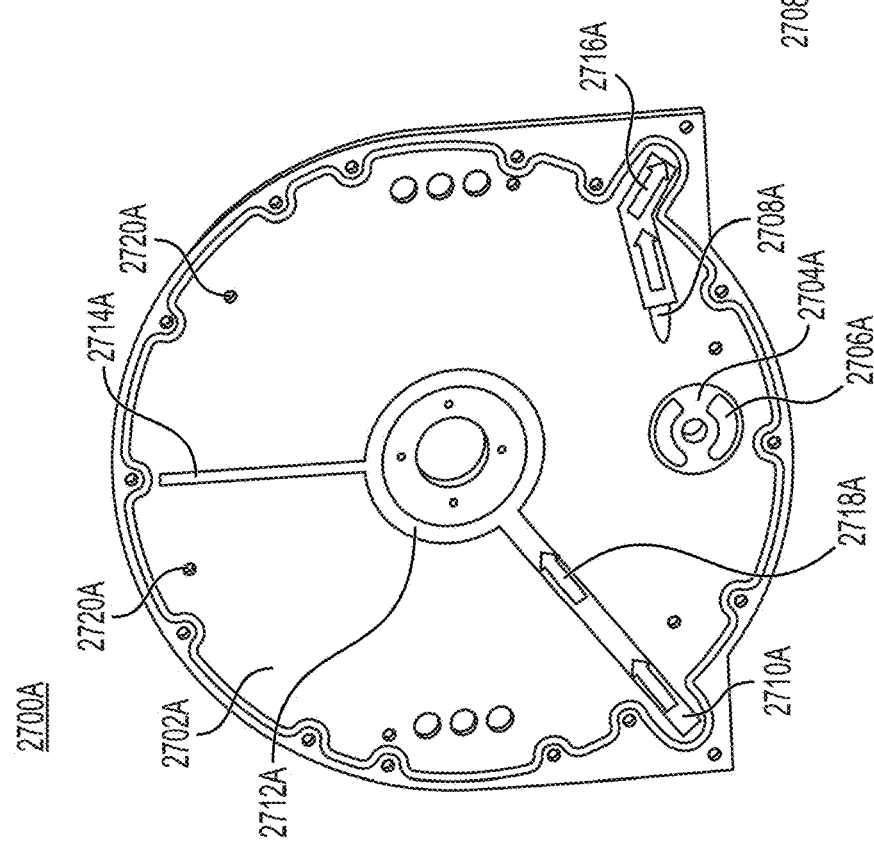
FIG. 27B
FIG. 27A

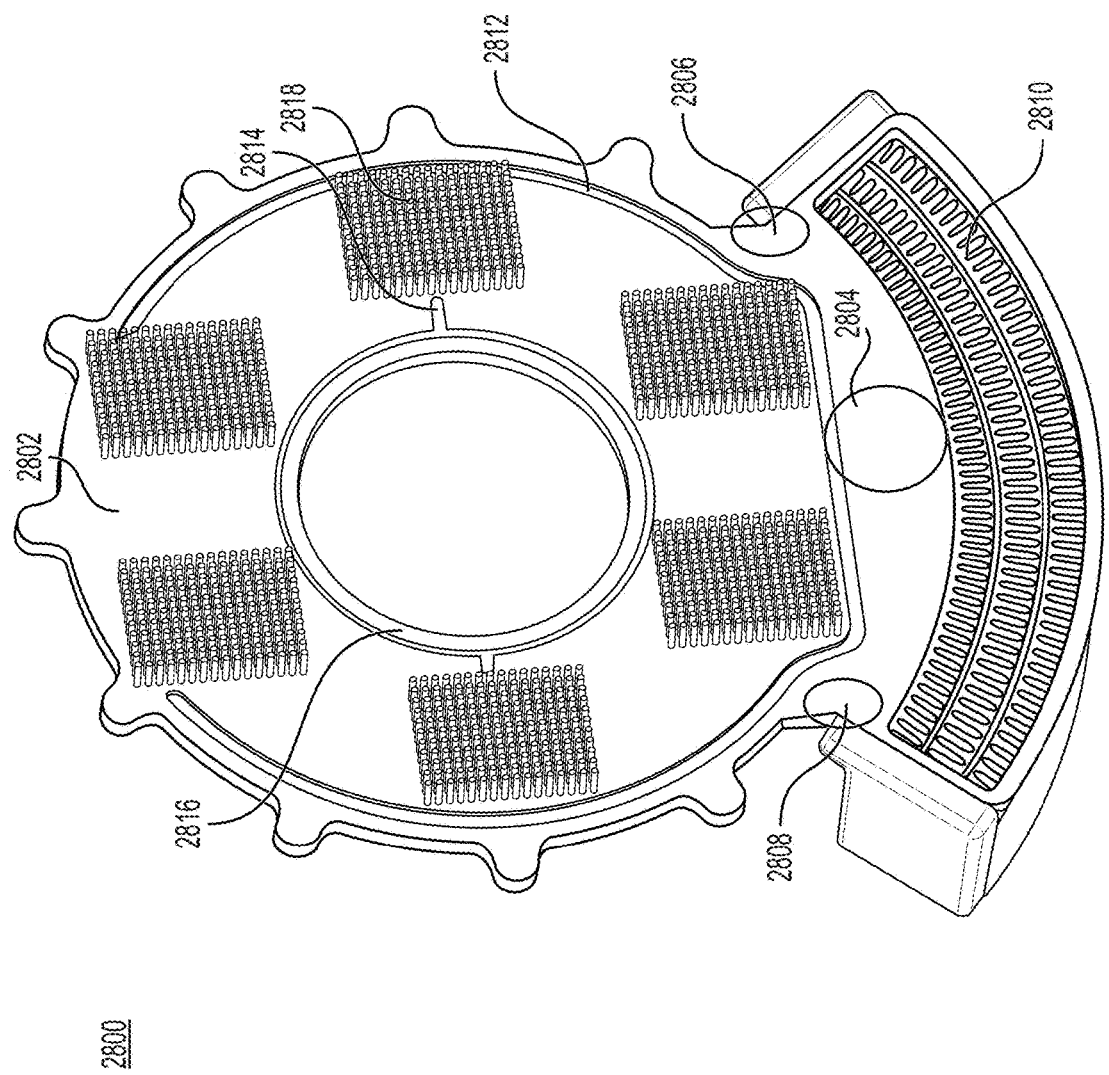

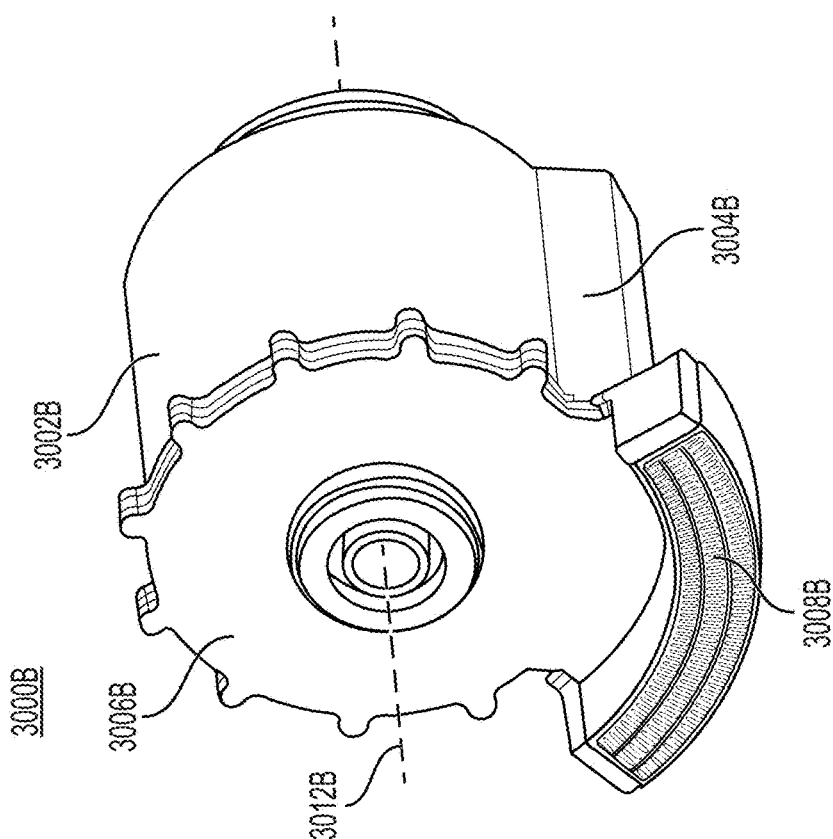
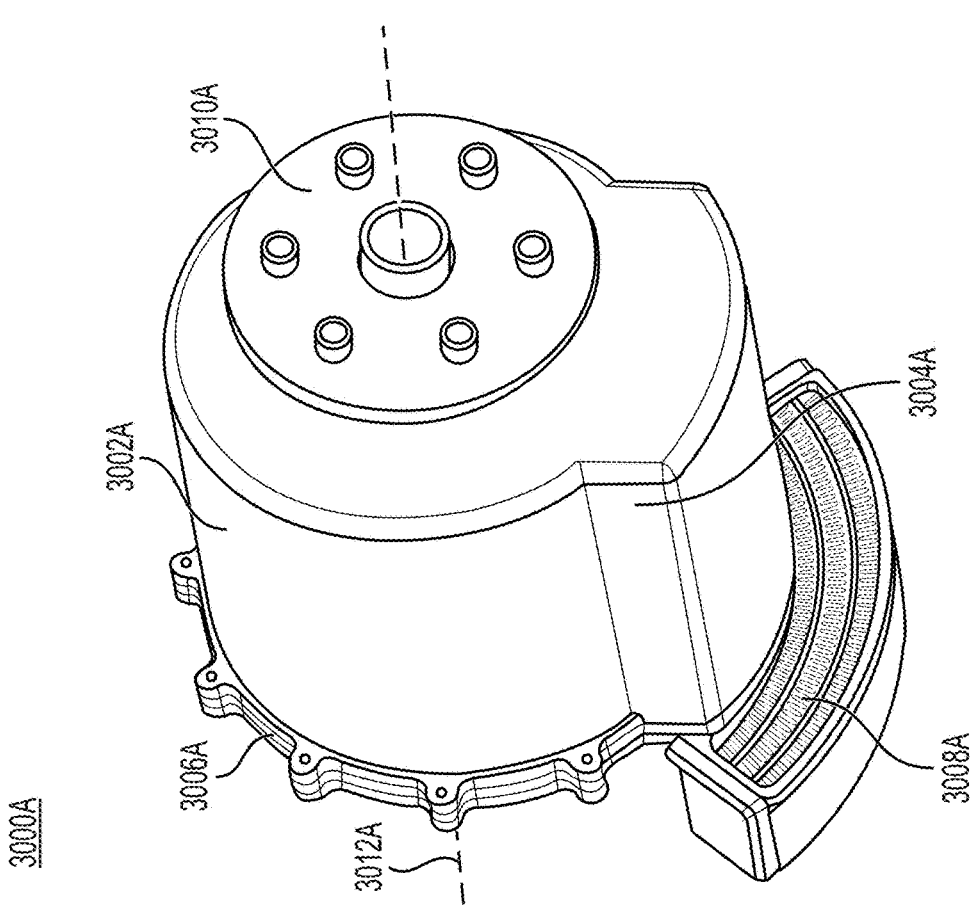
FIG. 30B
FIG. 30A

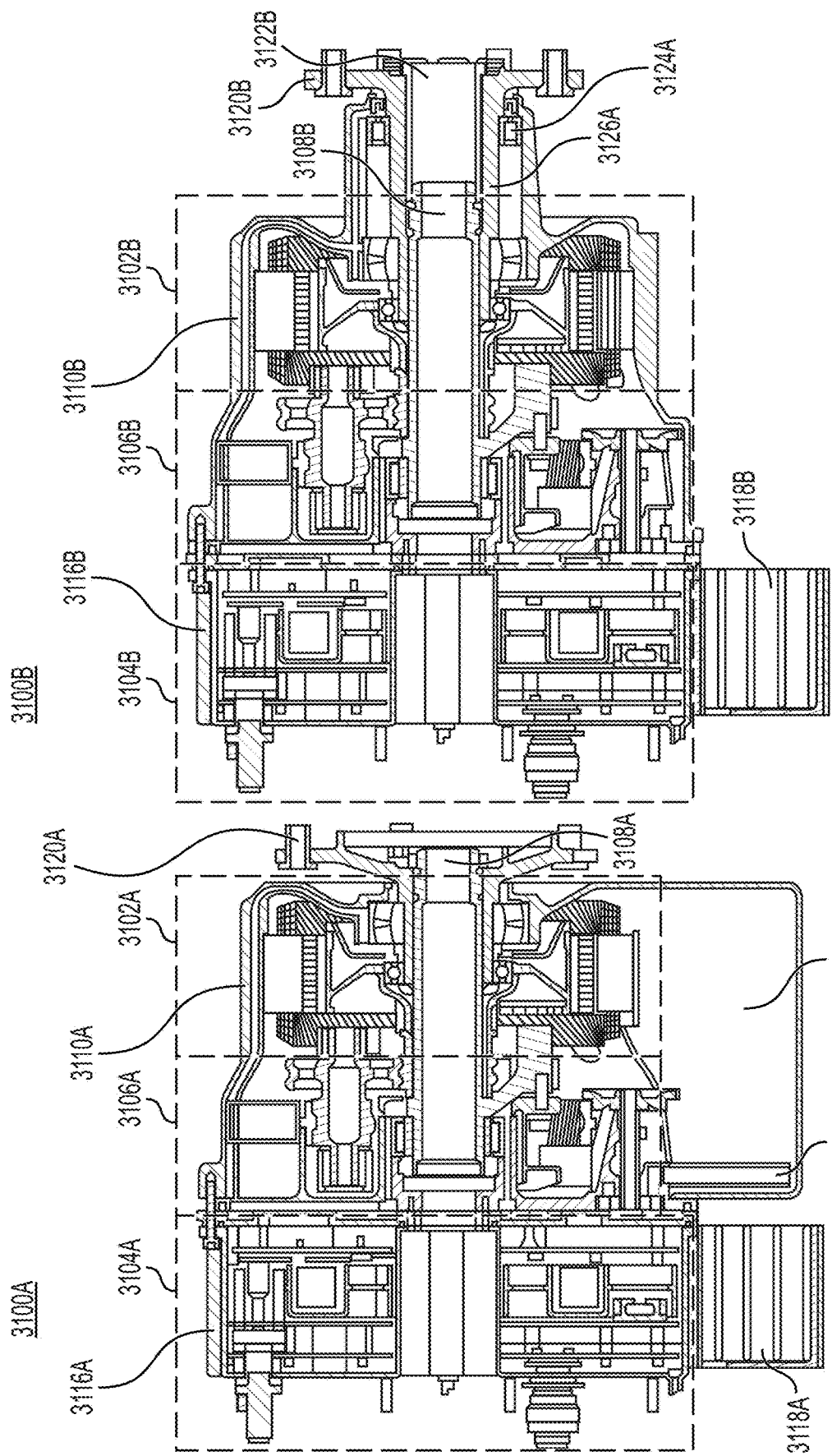

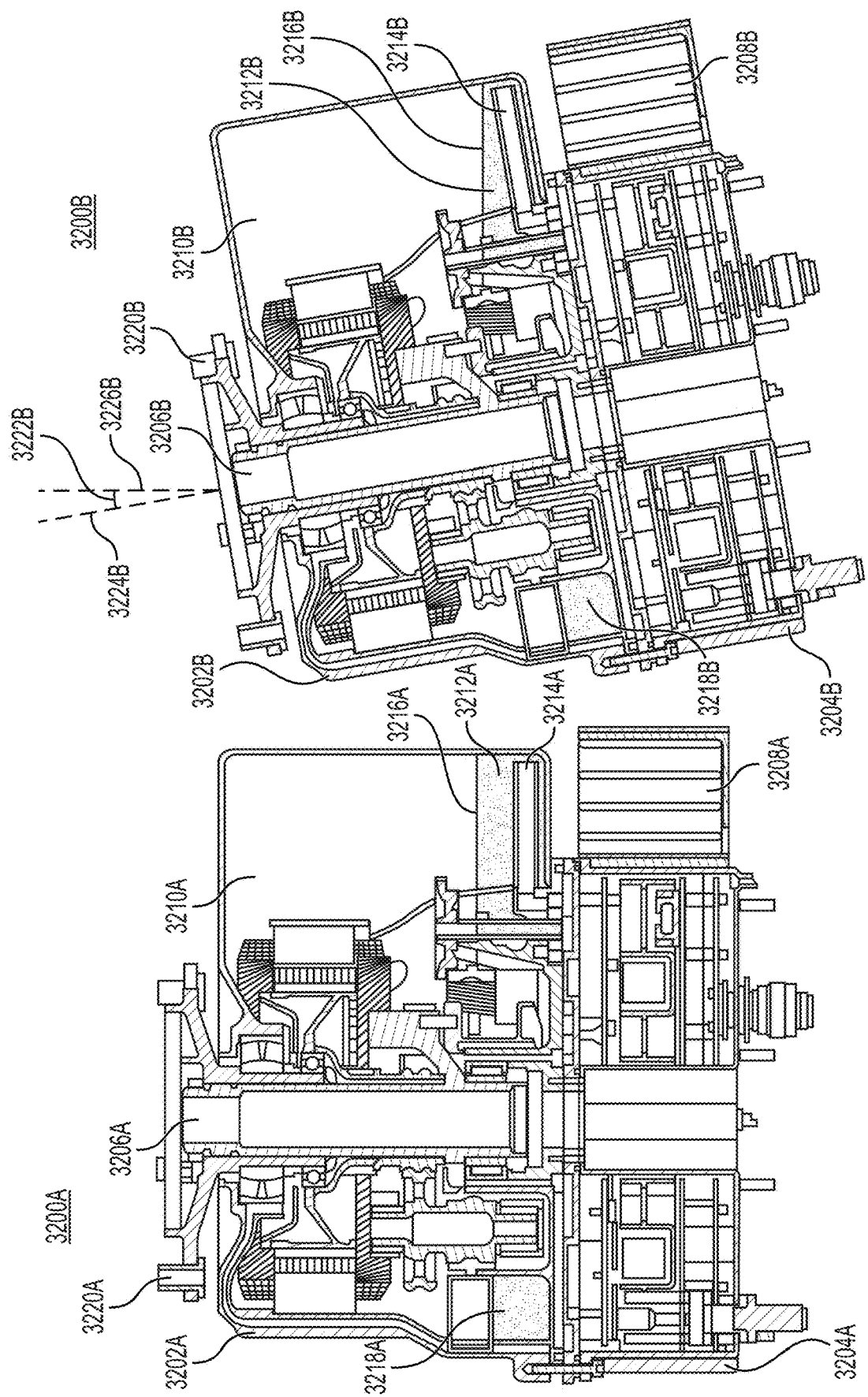

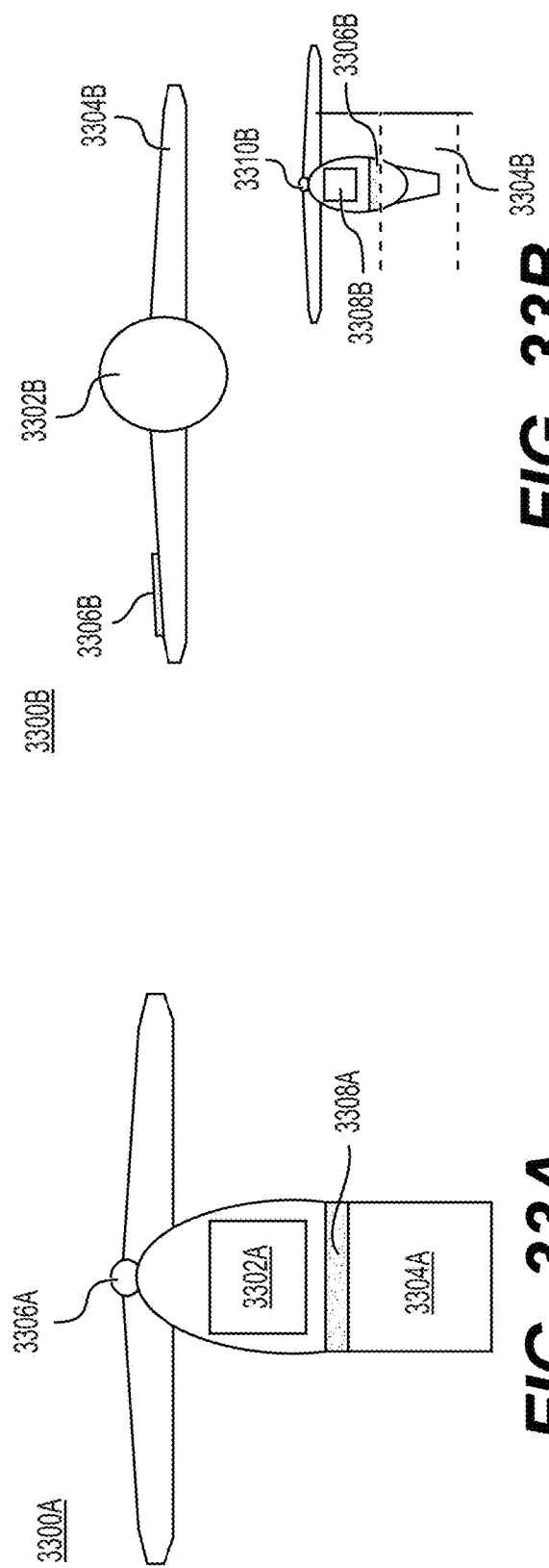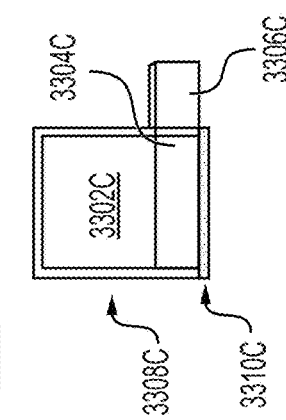
FIG. 33A
FIG. 33B
FIG. 33C

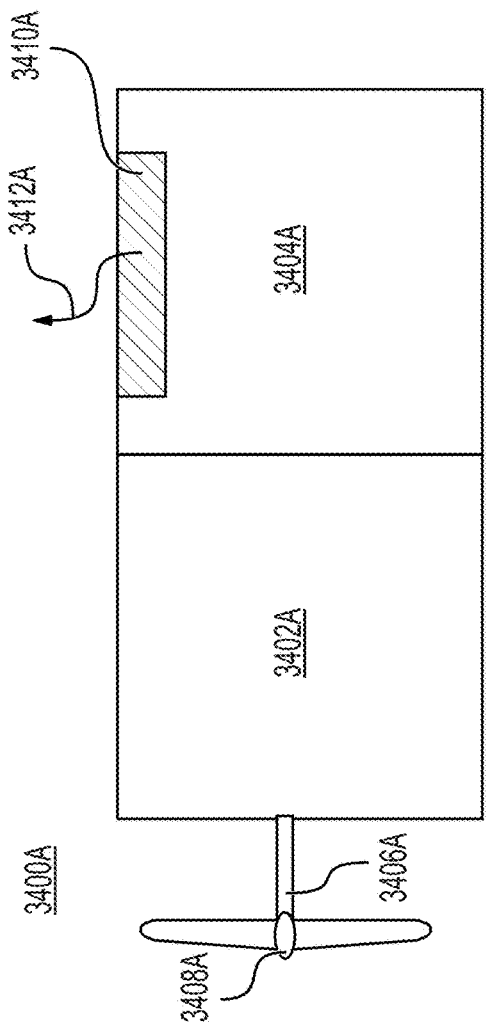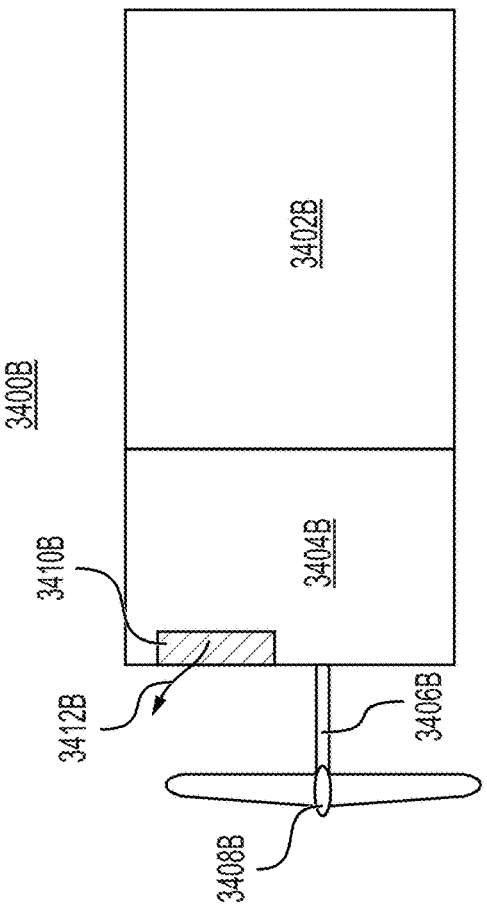
FIG. 34A
FIG. 34B

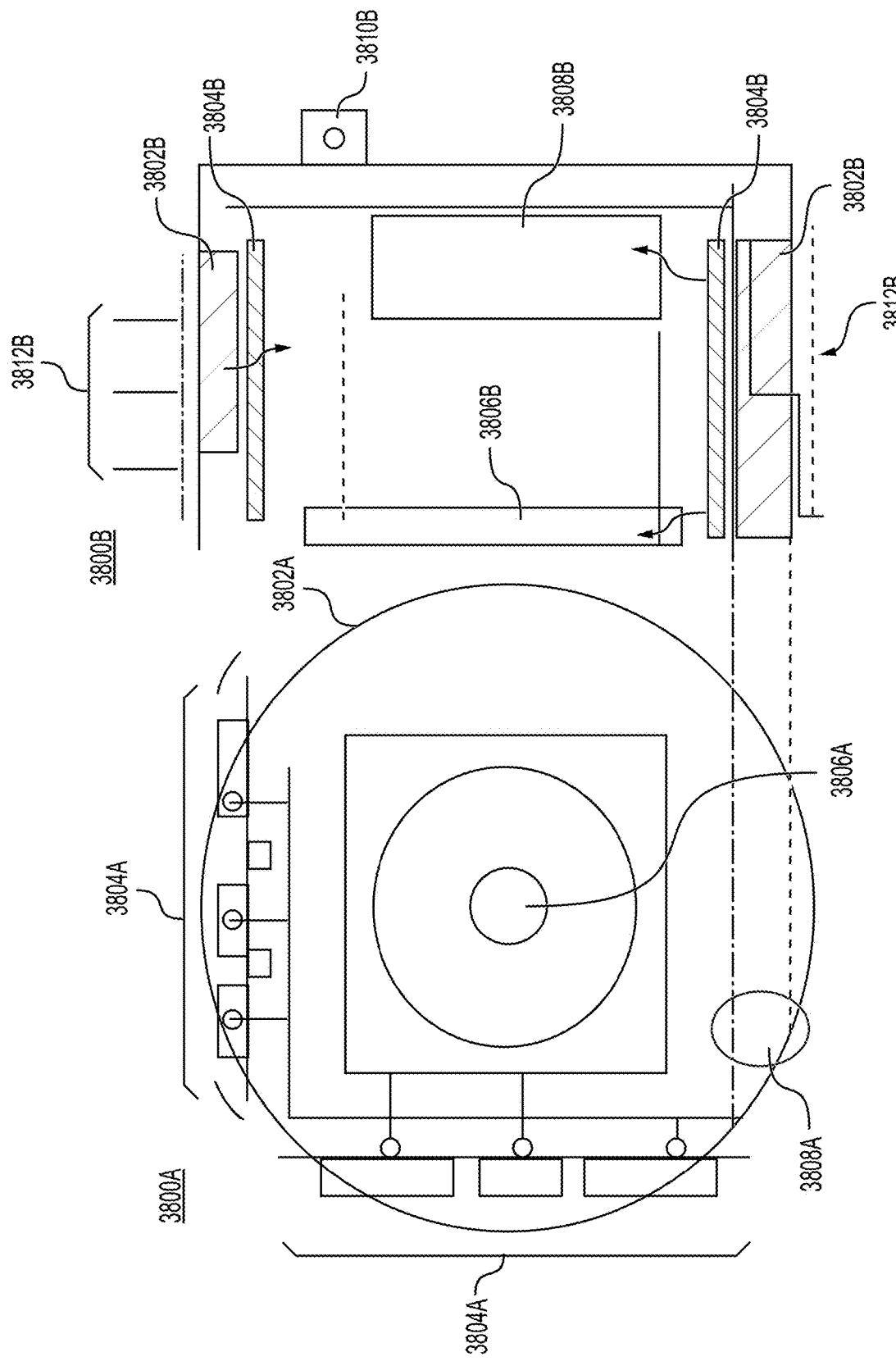

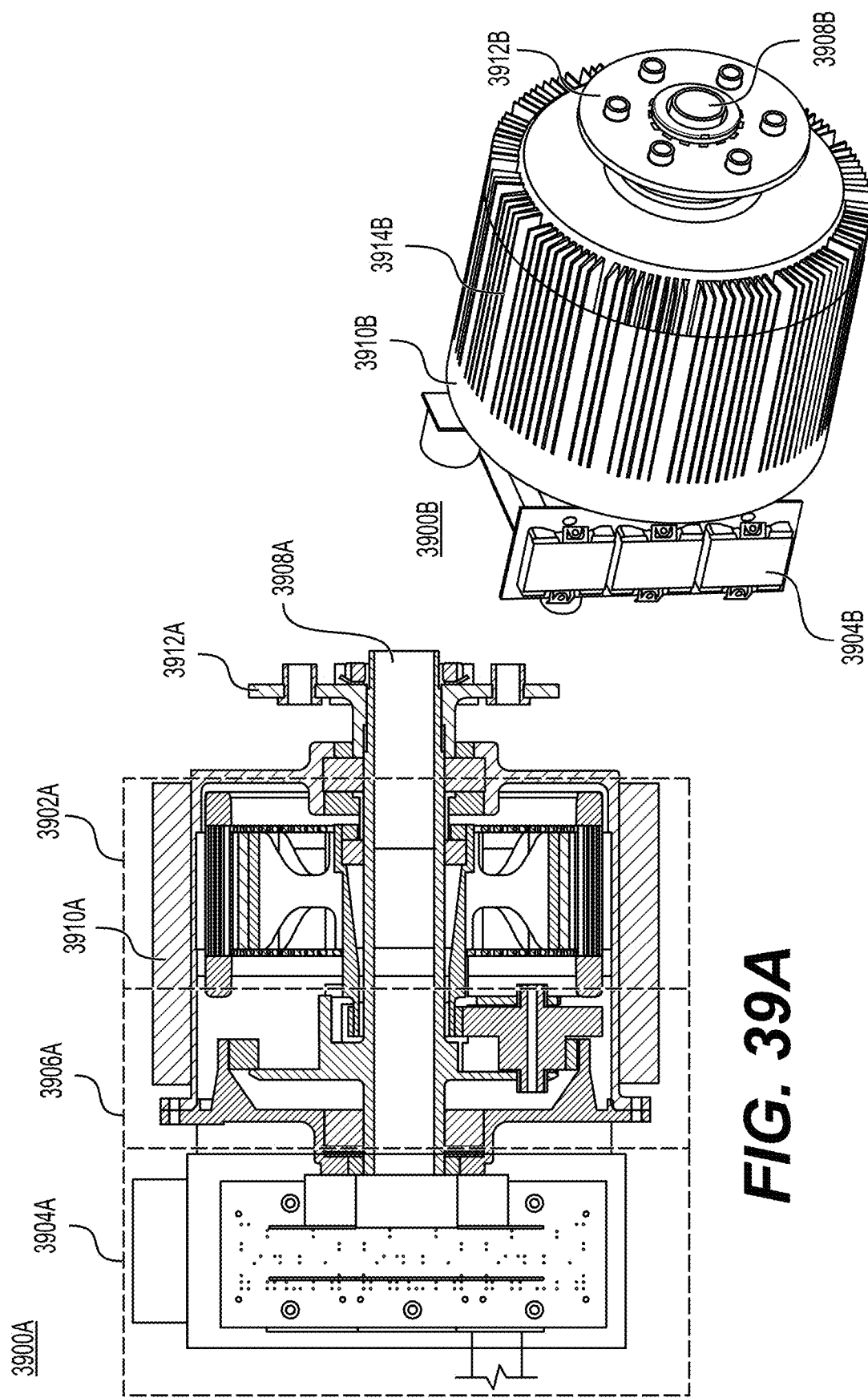

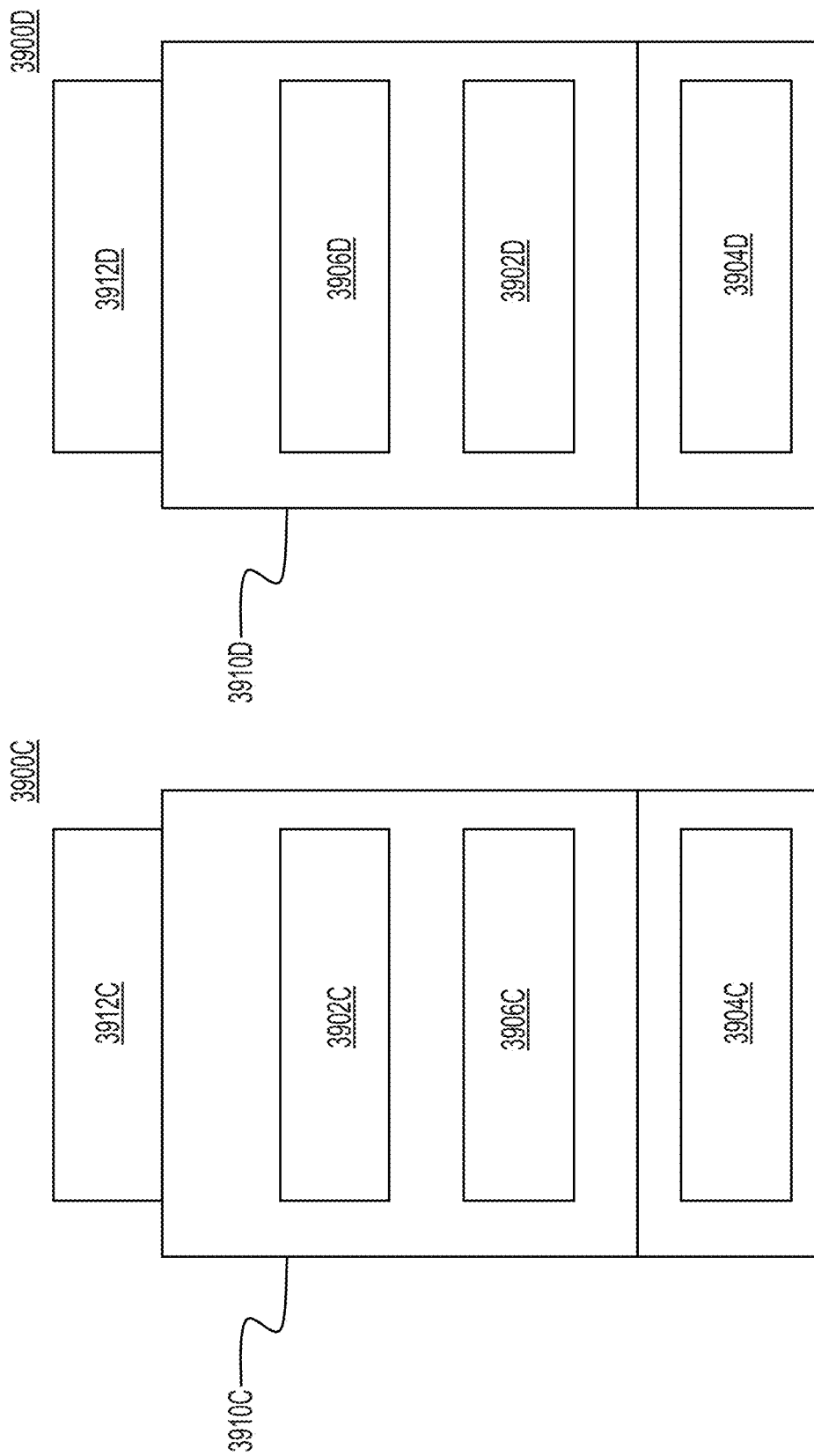

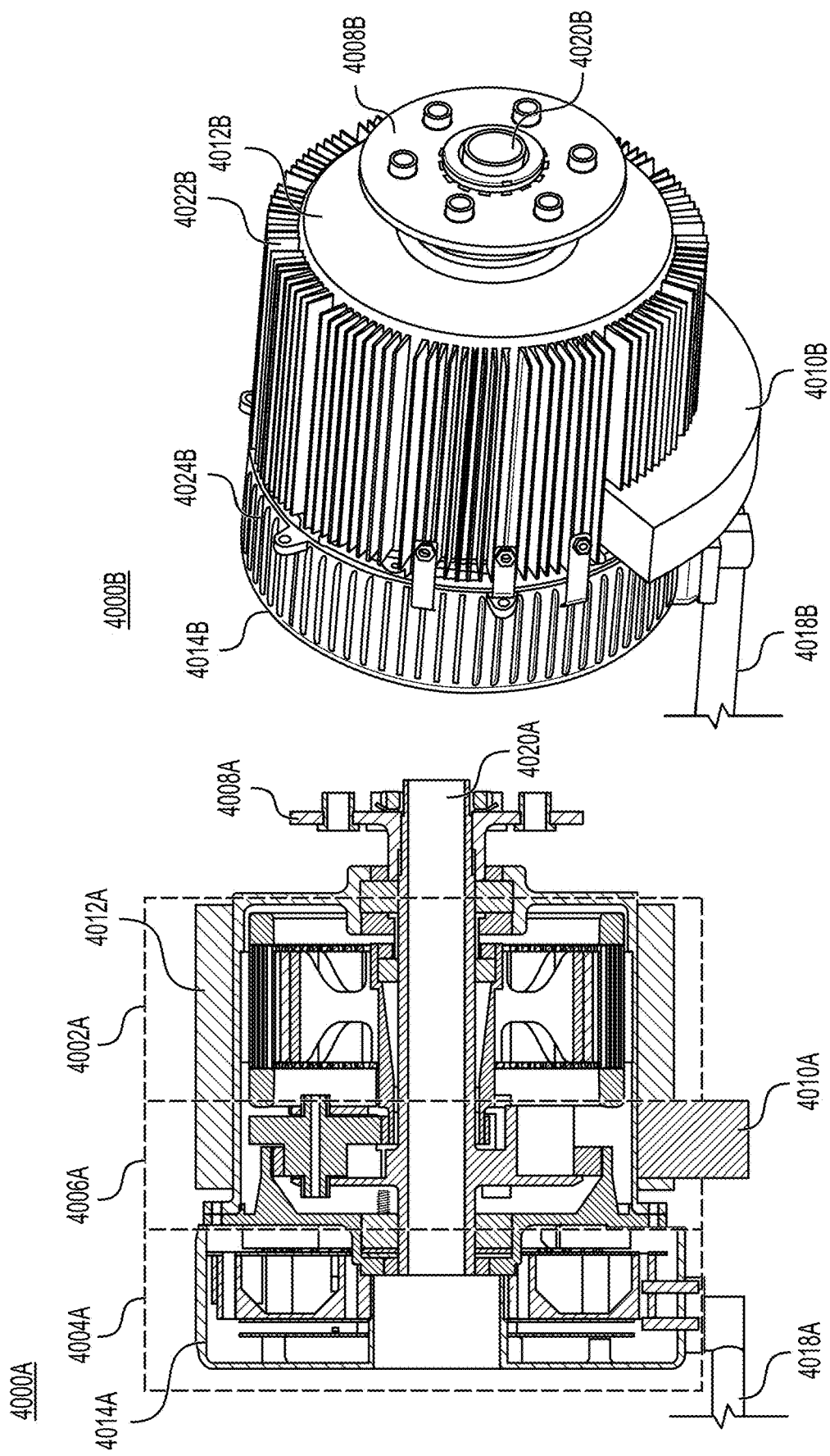

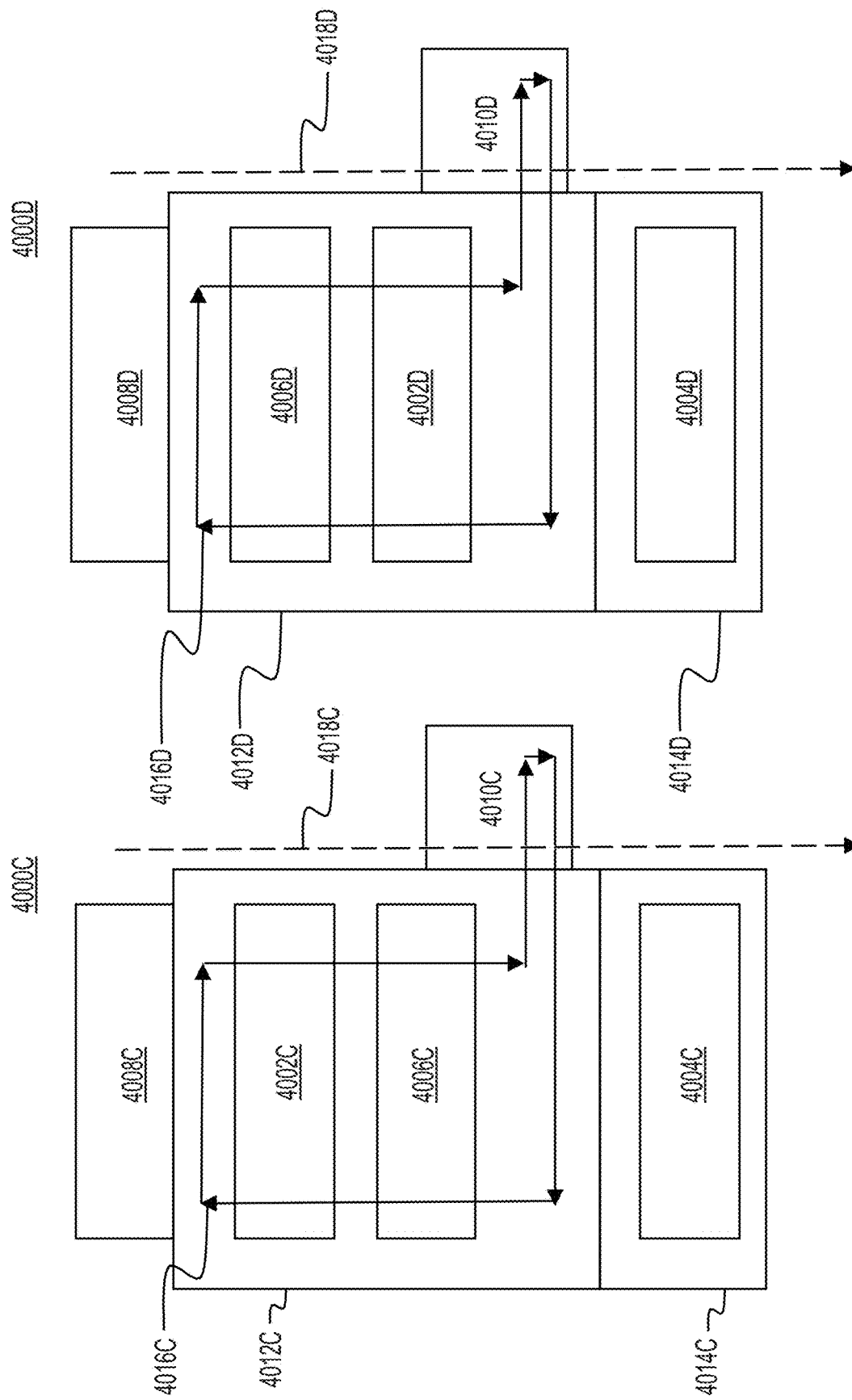

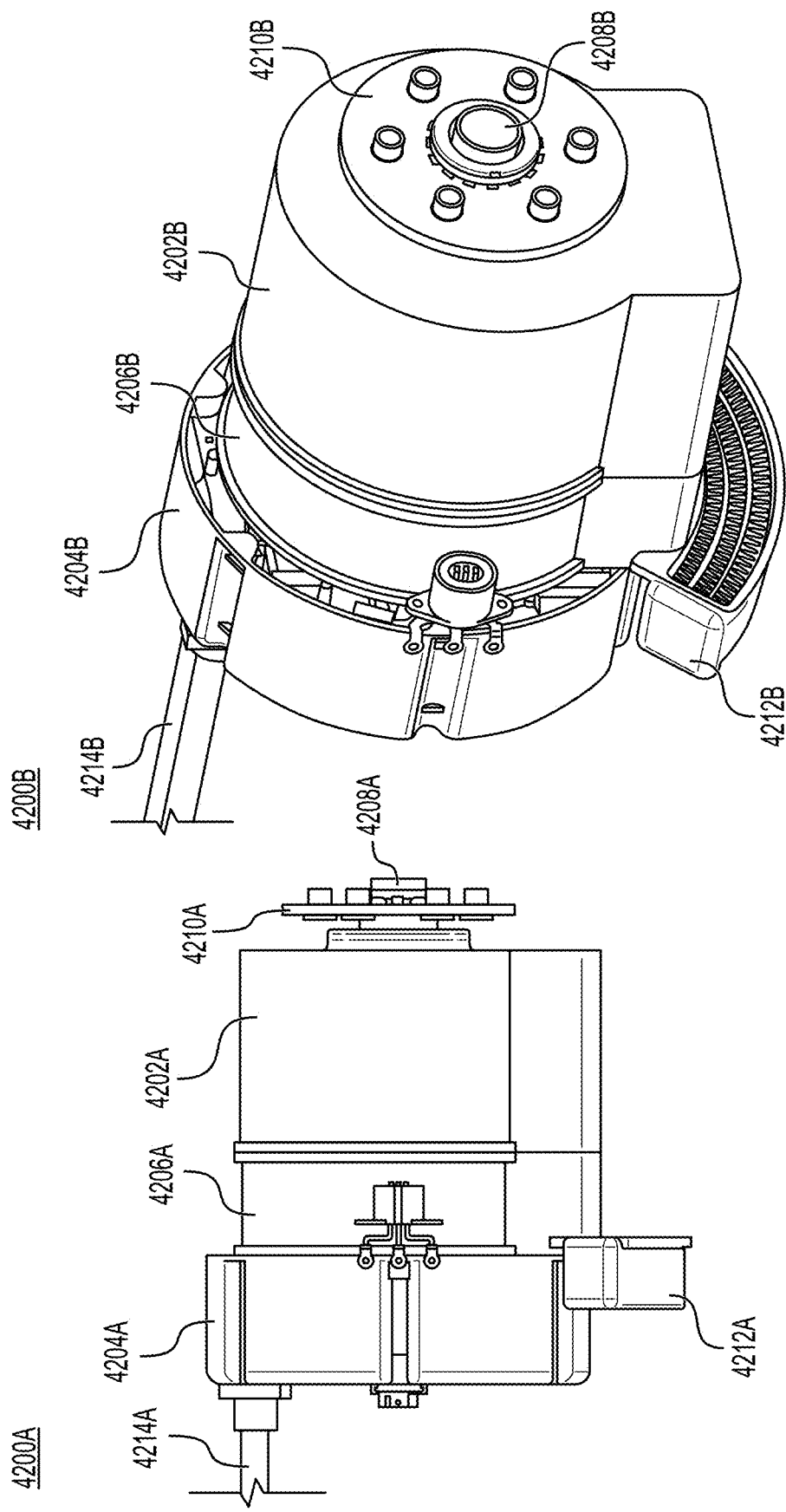

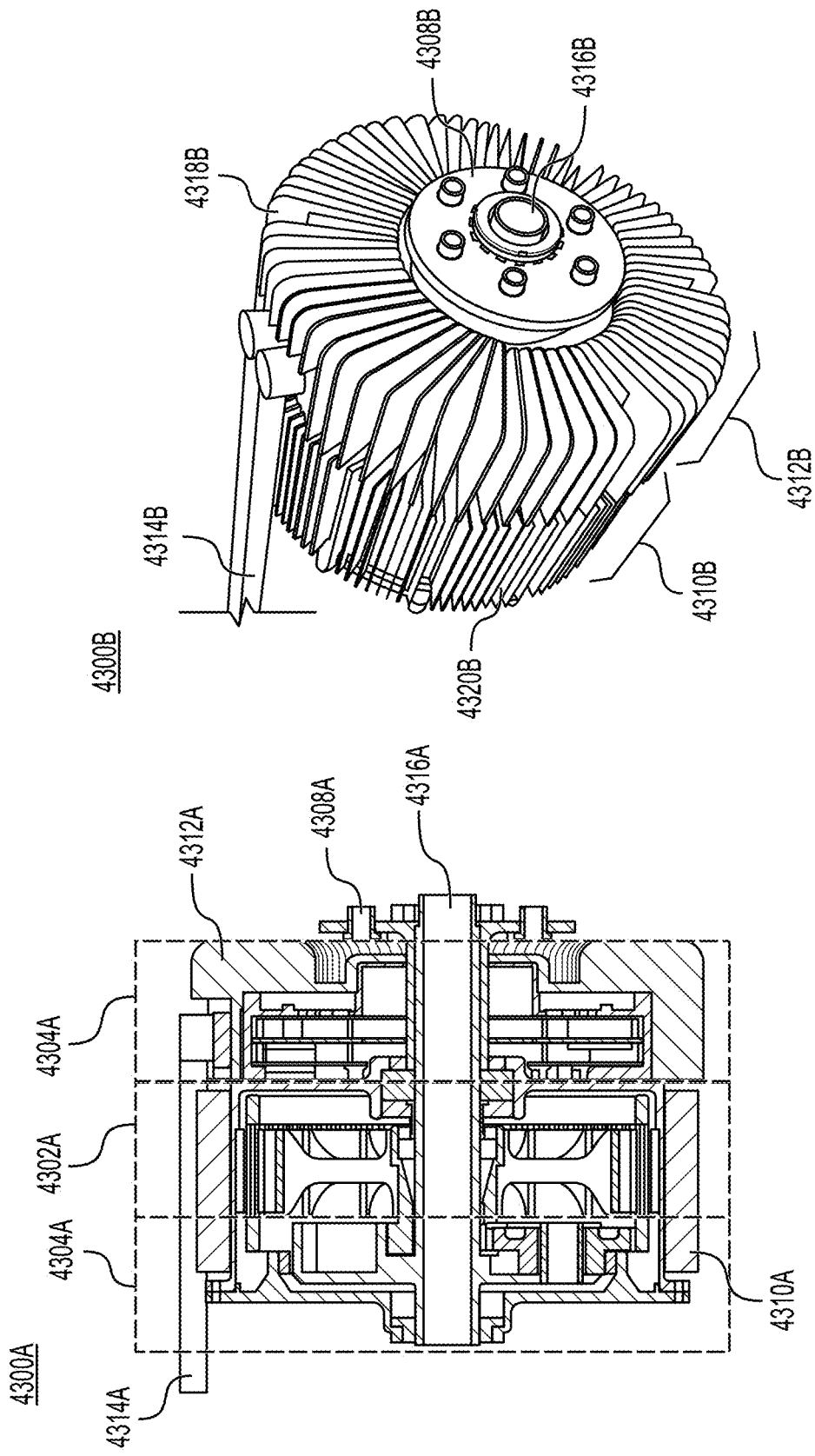

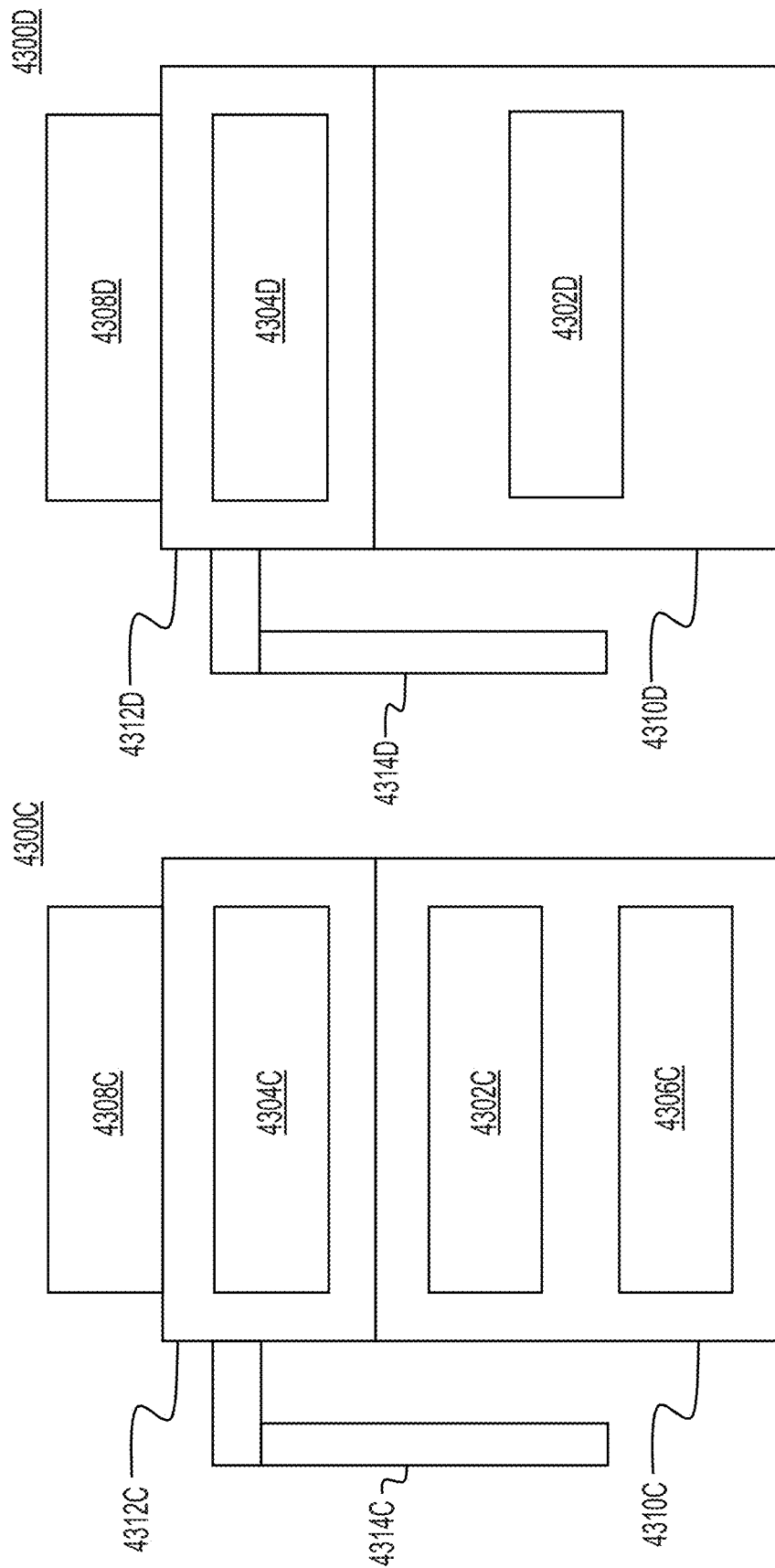

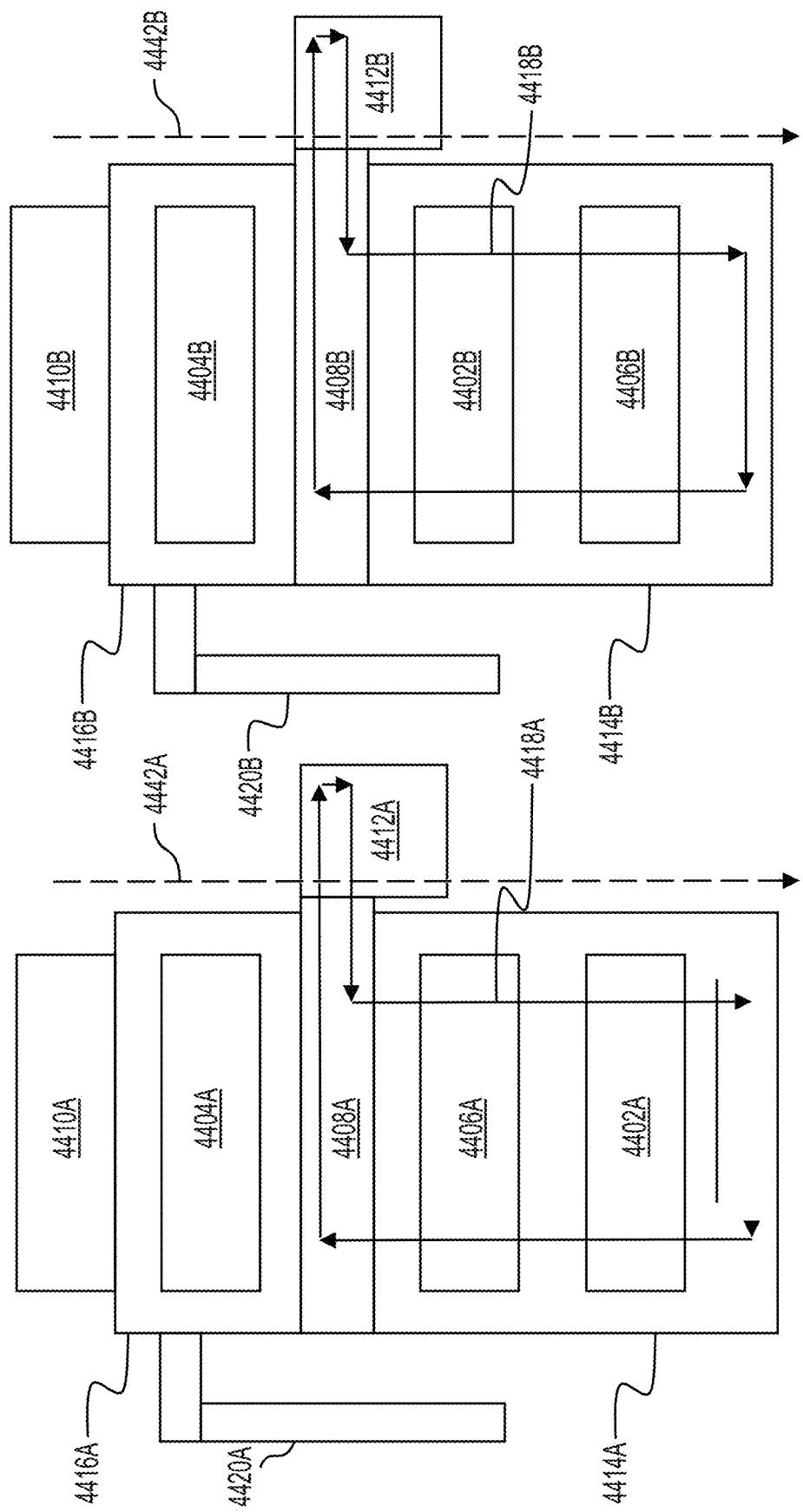

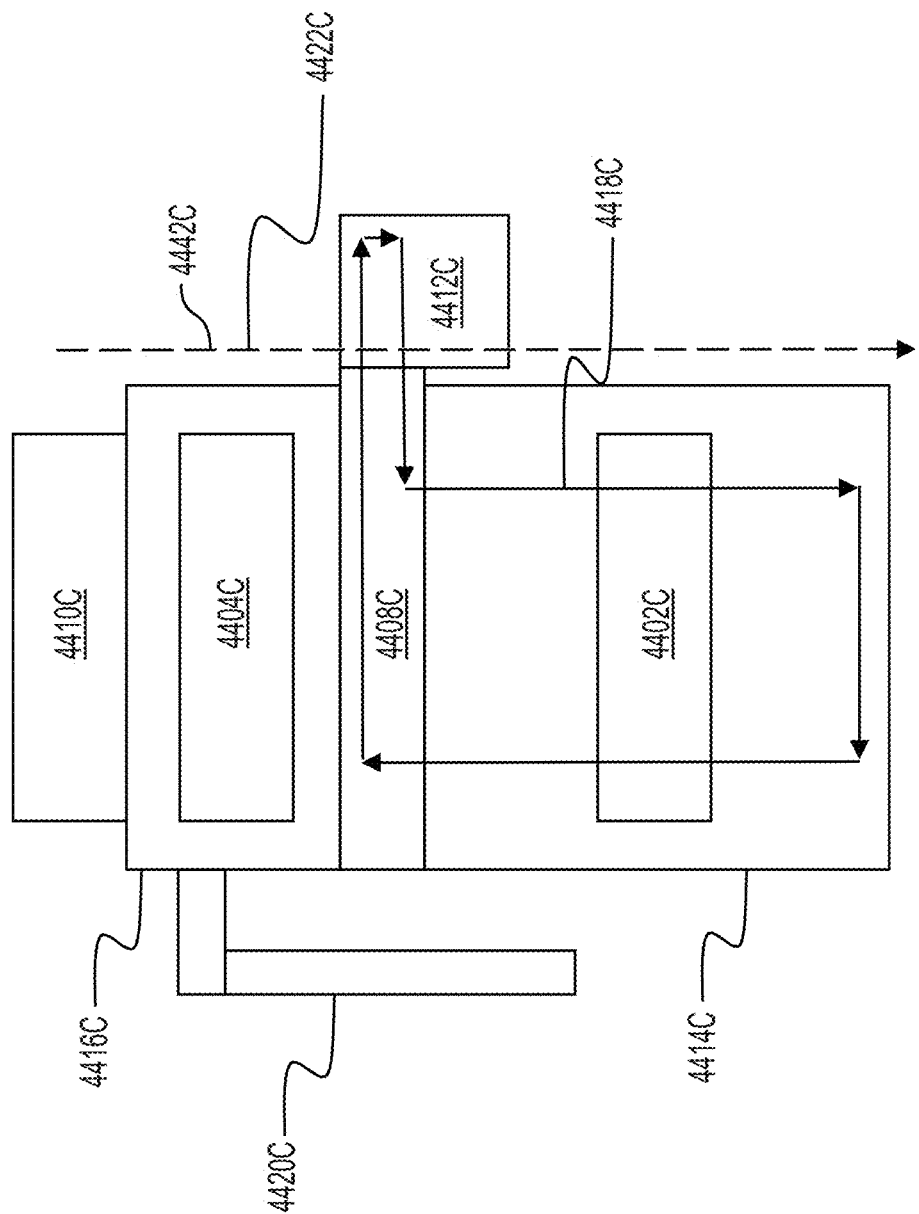

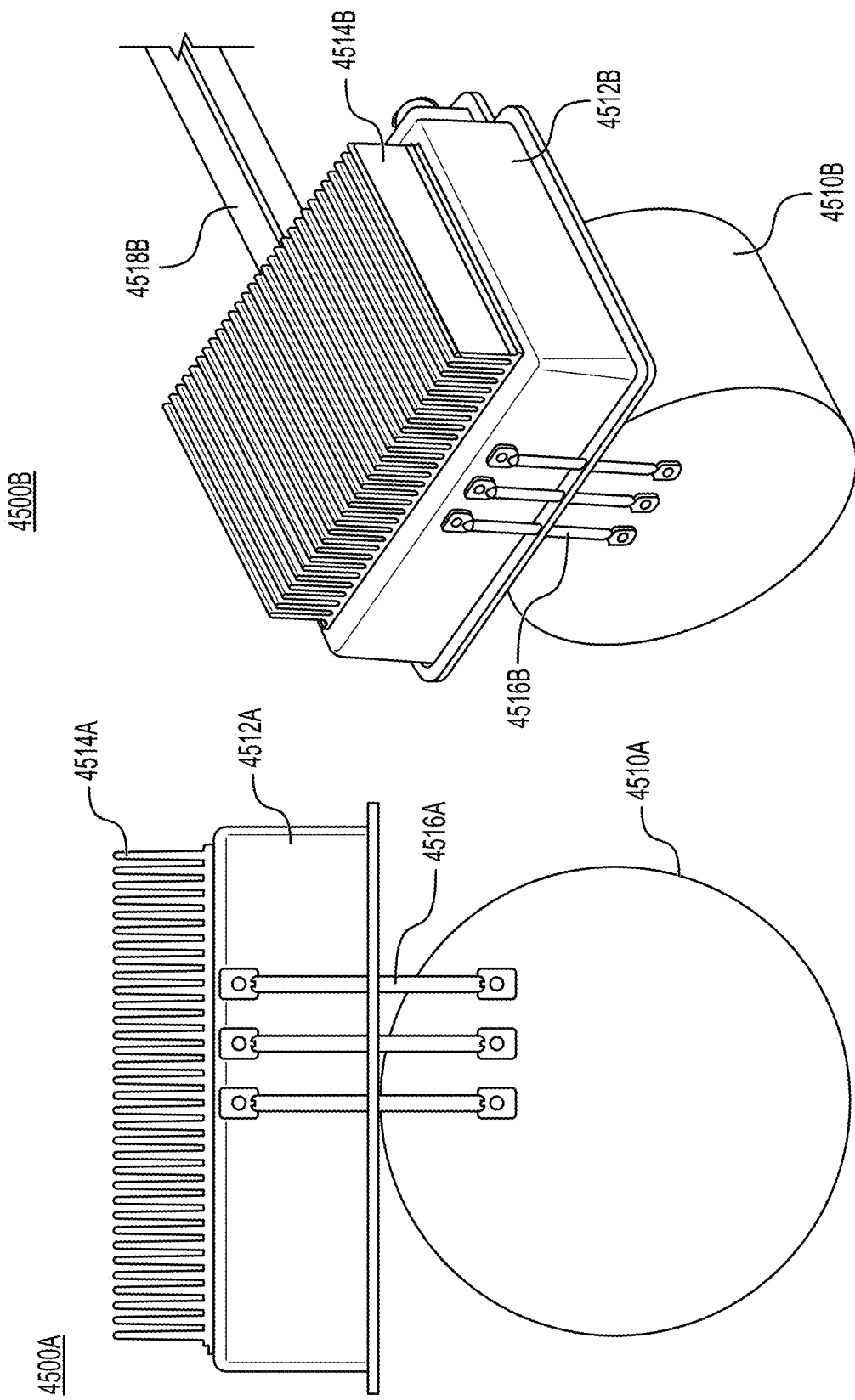

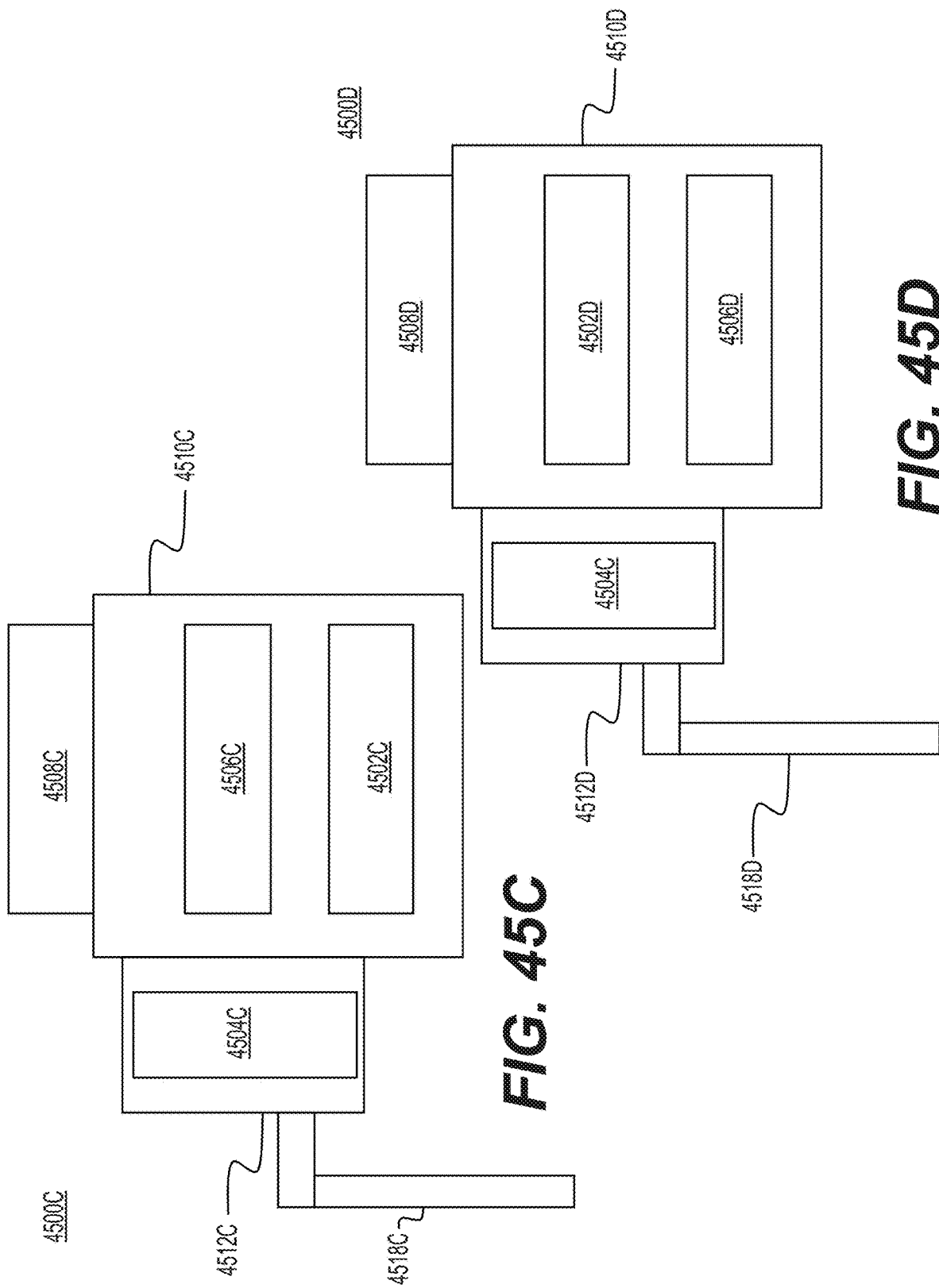

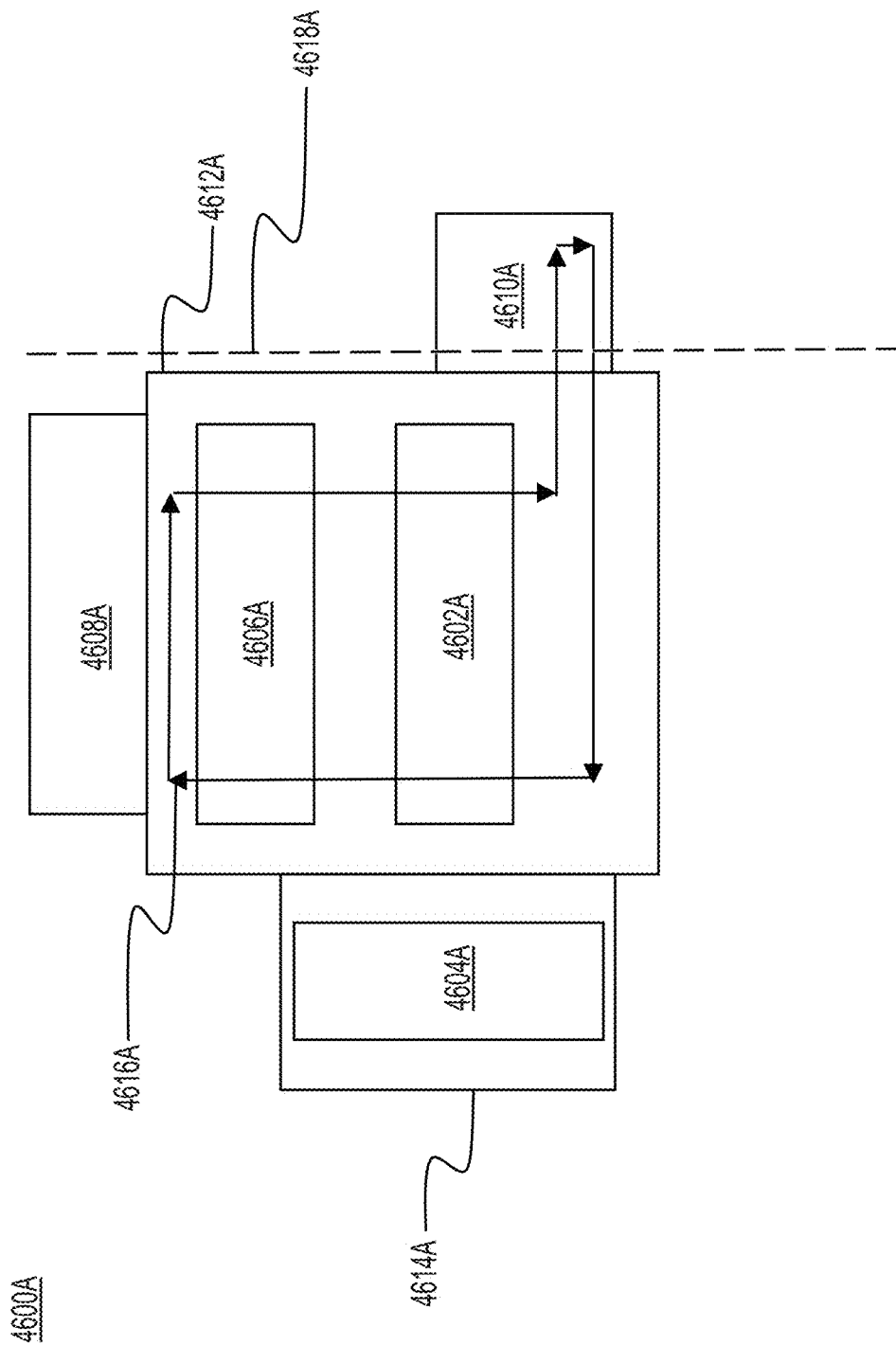

5100

```
┌─────────────────────────────────────────────────────────┐
│ IDENTIFYING AN AXIS OF ROTATION OF A ROTOR, WHEREIN THE │
│ ROTOR COMPRISES A SACRIFICIAL LAYER HAVING A MASS M     │──5102
│ FORMED ALONG A CIRCUMFERENCE OF THE ROTOR               │
└─────────────────────────────────────────────────────────┘
                            │
                            ▼
┌─────────────────────────────────────────────────────────┐
│ DETERMINING AN IMBALANCE PRESENT IN THE ROTOR BY        │──5104
│ ROTATING THE ROTOR ABOUT THE AXIS OF ROTATION           │
└─────────────────────────────────────────────────────────┘
                            │
                            ▼
┌─────────────────────────────────────────────────────────┐
│ CALCULATING AN AMOUNT OF MASS k TO ADD AT A POSITION p  │
│ ALONG THE SACRIFICIAL LAYER SUCH THAT A CENTER OF MASS  │──5106
│ OF THE ROTOR COINCIDES WITH THE AXIS OF ROTATION        │
│ OF THE ROTOR                                            │
└─────────────────────────────────────────────────────────┘
                            │
                            ▼
┌─────────────────────────────────────────────────────────┐
│ REMOVING AN AMOUNT OF MASS r FROM THE SACRIFICIAL LAYER │
│ SUCH THAT AN AMOUNT OF REMAINDER MASS n IS PRESENT      │──5108
│ ALONG THE CIRCUMFERENCE OF THE ROTOR                    │
└─────────────────────────────────────────────────────────┘
```

*FIG. 51*

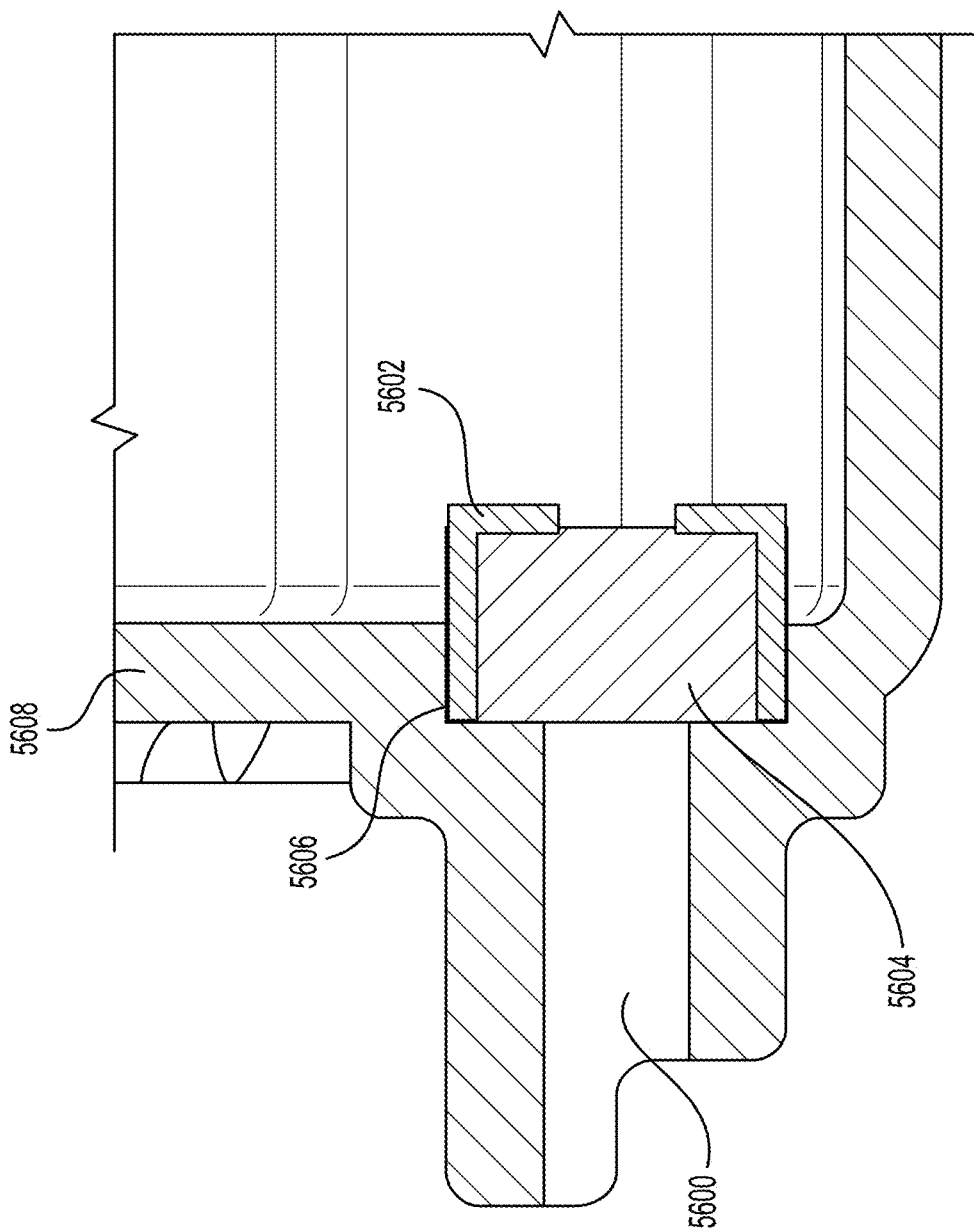

SYSTEMS, METHODS, AND MECHANICAL DESIGNS FOR INVERTERS FOR EVTOL AIRCRAFT

CROSS-REFERENCE TO RELATED APPLICATIONS

This disclosure is a continuation of U.S. application Ser. No. 18/306,275, titled "Systems, Methods and Mechanical Designs for eVTOL Aircraft", filed Apr. 25, 2023, which claims priority to U.S. Provisional Application No. 63/378,536, titled "Tilt Rotor Systems and Methods for eVTOL Aircraft," filed Oct. 6, 2022, and U.S. Provisional Application No. 63/378,680, titled "Systems and Methods for Improved Propulsion Systems for eVTOL Aircraft," filed Oct. 7, 2022, all of which are incorporated herein by reference in their entireties for all purposes.

TECHNICAL FIELD

This disclosure relates generally to the field of powered aerial vehicles. More particularly, and without limitation, the present disclosure relates to innovations in aircrafts driven by electric propulsion systems. Certain aspects of the present disclosure generally relate to improvements in electric engines, gearboxes, and power inverters that provide particular advantages in aerial vehicles driven by electric propulsion systems and in other types of vehicles.

SUMMARY

The present disclosure addresses systems, components, and techniques primarily for use in a non-conventional aircraft driven by an electric propulsion system. For example, the tilt-rotor aircraft of the present disclosure may be configured for frequent (e.g., over 50 flights per work day), short-duration flights (e.g., less than 100 miles per flight) over, into, and out of densely populated regions. The aircraft may be configured to carry 4-6 passengers or commuters who have an expectation of a comfortable experience with low noise and low vibration. Accordingly, it may be desired that components of the aircraft are configured and designed to withstand frequent use without wearing, generate less heat and vibration, and that the aircraft include mechanisms to effectively control and manage heat or vibration generated by the components. Further, it may be intended that several of these aircraft operate near each other over a crowded metropolitan area. Accordingly, it may be desired that their components are configured and designed to generate low levels of noise interior and exterior to the aircraft, and to have a variety of safety and backup mechanisms. For example, it may be desired for safety reasons that the aircraft be propelled by a distributed propulsion system, avoiding the risk of a single point of failure, and that they are capable of conventional takeoff and landing on a runway. Moreover, it may be desired that the aircraft can safely vertically takeoff and land from and into relatively small or restricted spaces compared to traditional airport runways (e.g., vertiports, parking lots, or driveways) while transporting several passengers or commuters with accompanying baggage. These use requirements may place design constraints on aircraft size, weight, operating efficiency (e.g., drag, energy use), which may impact the design and configuration of the aircraft components.

Disclosed embodiments provide new and improved configurations of aircraft components that are not observed in conventional aircraft, and/or identified design criteria for components that differ from those of conventional aircraft. Such alternate configurations and design criteria, in combination addressing drawbacks and challenges with conventional components, yielded the embodiments disclosed herein for various configurations and designs of components for an aircraft driven by an electric propulsion system.

In some embodiments, the aircraft driven by an electric propulsion system of the present disclosure may be designed to be capable of both vertical and conventional takeoff and landing, with a distributed electric propulsion system enabling vertical flight, horizontal and lateral flight, and transition. Thrust may be generated by supplying high voltage electrical power to a plurality of electric engines of the distributed electric propulsion system, which may include the necessary components to convert the high voltage electrical power into mechanical shaft power to rotate a propeller. Embodiments disclosed herein may involve optimizing the energy density of the electric propulsion system. Embodiments may include an electric engine connected to an onboard electrical power source, which may include a device capable of storing energy such as a battery or capacitor, and may include one or more systems for harnessing or generating electricity such as a fuel powered generator or solar panel array. Some disclosed embodiments provide for direct current (DC) to alternating current (AC) conversion by an inverter assembly to allow more powerful AC motors. Some disclosed embodiments provide for weight reduction and space reduction of components in the aircraft to increase aircraft efficiency and performance. Disclosed embodiments also improve upon safety in passenger transportation using new and improved safety protocols and system redundancy in the case of a failure, to minimize any single points of failure in the aircraft propulsion system. Some disclosed embodiments also provide new and improved approaches to satisfying and exceeding aviation and transportation laws and regulations. For example, the Federal Aviation Administration enforces federal laws and regulations requiring safety components such as fire protective barriers adjacent to engines that use more than a threshold amount of oil or other flammable materials. A fire protective barrier may include an engine component or aircraft component designed, constructed, or installed with the primary purpose of being constructed so that no hazardous quantity of air, fluid, or flame can pass around or through the fire protective barrier and/or to protect against corrosion. In some embodiments, a fire protective barrier may include a component separate from additional components as recited herein. Persons of ordinary skill in the art would understand which components within an aircraft, including within an electric propulsion system, would act with the primary function of being a fire protective barrier. In some embodiments, a fire protective barrier may include a firewall, a fireproof barrier, a fire resistant barrier, a flame resistant barrier, or any other barrier capable of ensuring no hazardous quantity of air, fluid, or flame can pass around or through the barrier and/or to protect against corrosion. For example, while a fuselage may be constructed so that no hazardous quantity of air, fluid, or flame can pass around or through the fire protective barrier, and/or protect against corrosion, the fuselage may not be considered a fire protective barrier since the primary purpose of a fuselage is not to be a fire protective barrier. In some embodiments, electric propulsion systems provide for efficient and effective lubrication and cooling using less than the threshold level of oil, yielding an aircraft that does not require engine fire protective barriers, saving on aircraft weight while maximizing performance and efficiency.

In some embodiments, the distributed electric propulsion system may include twelve electric engines, which may be mounted on booms forward and aft of the main wings of the aircraft. A subset of the electric engines, such as those mounted forward of the main wings, may be tiltable mid-flight between a horizontally oriented position (e.g., to generate forward thrust for cruising) and a vertically oriented position (e.g., to generate vertical lift for takeoff, landing, and hovering). The propellers of the forward electric engines may rotate in a clockwise or counterclockwise direction. Propellers may counter-rotate with respect to adjacent propellers. The aft electric engines may be fixed in a vertically oriented position (e.g., to generate vertical lift). The propellers may also rotate in a clockwise or counterclockwise direction. In some embodiments, the difference in rotation direction may be achieved using the direction of engine rotation. In other embodiments, the engines may all rotate in the same direction, and gearing may be used to achieve different propeller rotation directions In some embodiments, an aircraft may possess quantities of electric engines in various combinations of forward and aft engine configurations. For example, an aircraft may possess six forward and six aft electric engines, four forward and four aft electric engines, or any other combination of forward and aft engines, including embodiments where the number of forward electric engines and aft electric engines are not equivalent.

In some embodiments, for a vertical takeoff and landing (VTOL) mission, the forward and aft electric engines may provide vertical thrust during takeoff and landing. During flight phases where the aircraft is moving forward, the forward electric engines may provide horizontal thrust, while the propellers of the aft electric engines may be stowed at a fixed position in order to minimize drag. The aft electric engines may be actively stowed with position monitoring. Transition from vertical flight to horizontal flight and vice-versa may be accomplished via the tilt propeller subsystem. The tilt propeller subsystem may redirect thrust between a primarily vertical direction during vertical flight mode to a horizontal or near-horizontal direction during a forward-flight cruising phase. A variable pitch mechanism may change the forward electric engine's propeller-hub assembly blade collective angles for operation during the hover-phase, transition phase, and cruise-phase.

In some embodiments, in a conventional takeoff and landing (CTOL) mission, the forward electric engines may provide horizontal thrust for wing-borne take-off, cruise, and landing, and the wings may provide vertical lift. In some embodiments, the aft electric engines may not be used for generating thrust during a CTOL mission and the aft propellers may be stowed in place. In other embodiments, the aft electrical engines may be used at reduced power to shorten the length of the CTOL takeoff or landing.

In some embodiments, an inverter assembly that converts direct current (DC) power to alternate current (AC) power for an electrical propulsion system, the inverter assembly may comprise a housing, a capacitor assembly, at least one printed circuit board assembly (PCBA), and a plurality of positioning pins. In some embodiments, the capacitor assembly may have a center hole, at least one capacitor, a capacitor housing having at least one busbar, and a plurality of through holes in the capacitor housing. In some embodiments, the capacitor assembly and the at least one PCBA are positioned inside the housing. In some embodiments, the plurality of positioning pins pass through the plurality of through holes of the capacitor housing and the at least one PCBA and are connected to the housing.

In some embodiments, an electric engine for a vertical takeoff-and-landing aircraft may include or be connected to an inverter assembly. In some embodiments, a centerline of the inverter assembly may be aligned with a main shaft of the electric engine. In some embodiments, an airflow driven by the electric engine may cool the inverter assembly, thereby managing operating temperature and optimizing the inverter assembly's performance.

In some embodiments, the inverter assembly may have a housing having a round shape or other shape designed to minimize drag during flight. Furthermore, the inverter assembly may be installed in an orientation such that the housing shape minimizes drag in different flight conditions.

BRIEF DESCRIPTION OF FIGURES

The patent or application file contains at least one drawing executed in color. Copies of this patent or patent application publication with color drawing(s) will be provided by the Office upon request and payment of the necessary fee.

FIGS. 10A-10B are illustrations of an exemplary lift electric propulsion systems of a VTOL aircraft, consistent with disclosed embodiments.

FIGS. 11A-11C are cross-sectional illustrations of exemplary electric propulsion systems of a VTOL aircraft, consistent with disclosed embodiments.

FIGS. 12A-12D are illustrations and block diagrams of exemplary electric propulsion systems of a VTOL aircraft, consistent with disclosed embodiments.

FIG. 13 is an illustration of an exploded view of an exemplary electric propulsion system of a VTOL aircraft, consistent with disclosed embodiments.

FIGS. 16A-16C are illustrations of an exploded view and cross-section of rotor assemblies of a VTOL aircraft, consistent with disclosed embodiments.

FIGS. 27A-27B are illustrations of a divider plate of a VTOL aircraft, consistent with disclosed embodiments.

FIG. 28 is an illustration of a thermal plate of a VTOL aircraft, consistent with disclosed embodiments.

FIGS. 30A-30B are illustrations of exemplary electric propulsion systems of a VTOL aircraft, consistent with disclosed embodiments.

FIGS. 31A-31B are cross-sectional illustrations of electric propulsion systems of a VTOL aircraft, consistent with disclosed embodiments.

FIGS. 32A-32D are cross-sectional illustrations of electric propulsion systems of a VTOL aircraft in various flight phases, consistent with disclosed embodiments.

FIGS. 33A-33C are schematic diagrams illustrating exemplary electric propulsion systems of a VTOL aircraft comprising fire protective barriers, consistent with disclosed embodiments.

FIGS. 34A-34D are schematic diagrams illustrating exemplary electric propulsion systems of a VTOL aircraft, consistent with disclosed embodiments.

FIGS. 38A-38B are schematic diagrams illustrating an exemplary electric propulsion system of a VTOL aircraft and an exemplary inverter assembly of an electric propulsion system, consistent with disclosed embodiments.

FIGS. 39A-39D are cross-sectional and perspective illustrations and schematic diagrams illustrating exemplary electric propulsion systems of a VTOL aircraft, consistent with disclosed embodiments.

FIGS. 40A-40D are illustrations and schematic diagrams illustrating of electric propulsion systems of a VTOL aircraft, consistent with disclosed embodiments.

FIGS. 42A-42B are illustrations of exemplary electric propulsion systems of a VTOL aircraft, consistent with disclosed embodiments.

FIGS. 43A-43D are illustrations and schematic diagrams illustrating exemplary electric propulsion systems of a VTOL aircraft, consistent with disclosed embodiments.

FIGS. 44A-44C are schematic diagrams illustrating exemplary electric propulsion systems of a VTOL aircraft, consistent with disclosed embodiments.

FIGS. 45A-45D are schematic diagrams illustrating exemplary electric propulsion systems of a VTOL aircraft, consistent with disclosed embodiments.

FIGS. 46A-46B are schematic diagrams illustrating exemplary electric propulsion systems of a VTOL aircraft, consistent with disclosed embodiments.

FIG. 51 is a flow chart of an exemplary process for balancing a rotor of a VTOL aircraft, consistent with disclosed embodiments.

FIG. 56A is an illustration showing a cross-sectional view of a press-in mesh port, consistent with disclosed embodiments.

DETAILED DESCRIPTION

Figure 1:
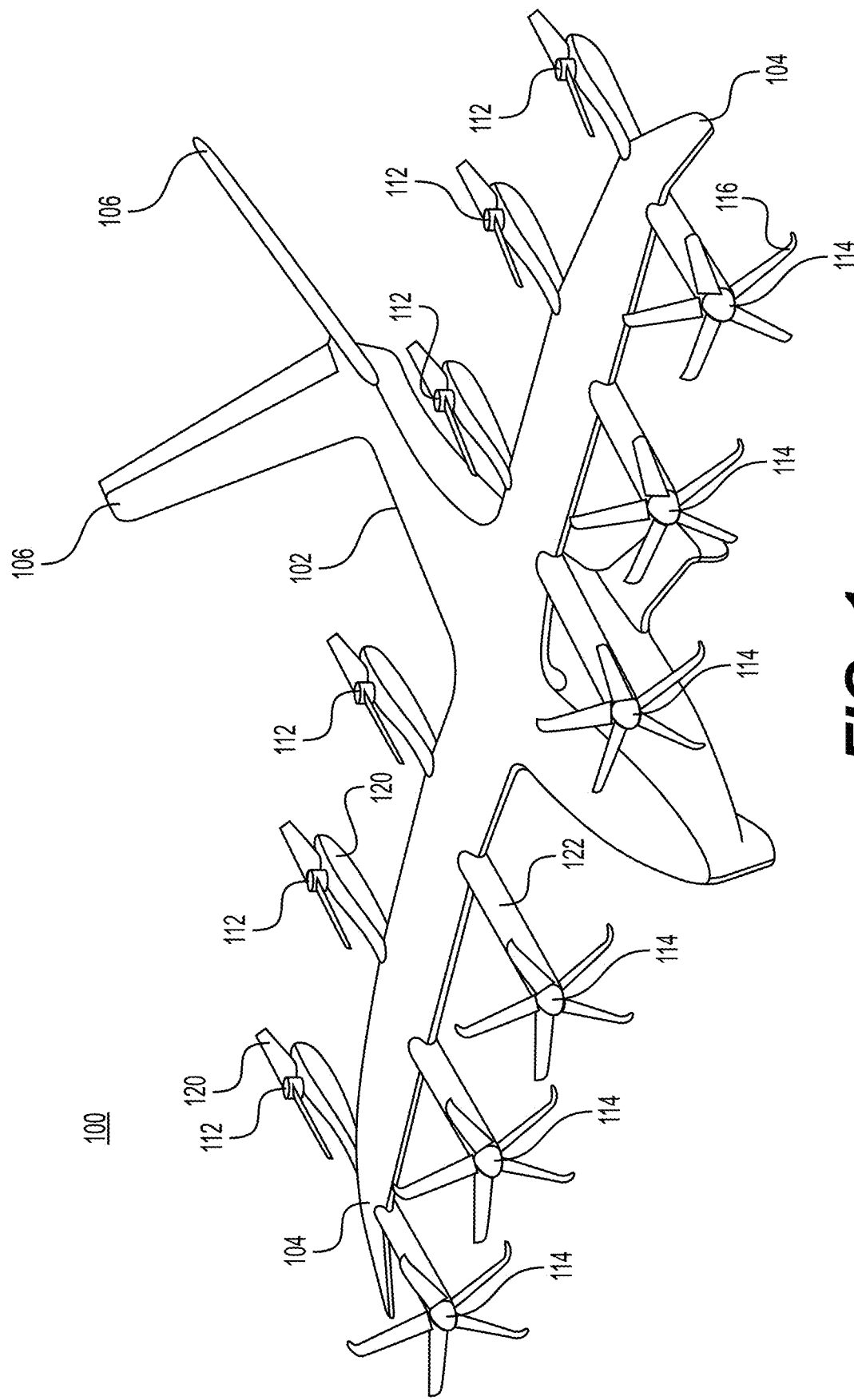
FIG. 1 is an illustration of a perspective view of an exemplary VTOL aircraft, consistent with disclosed embodiments.

The disclosed embodiments provide systems, subsystems, and components for new VTOL aircraft having various combinations of an electric propulsion system and cooling systems that maximize performance while minimizing weight.

In some embodiments, an electric propulsion system as described herein may generate thrust by supplying High Voltage (HV) electric power to an electric engine, which in turn converts HV power into mechanical shaft power which is used to rotate a propeller. An aircraft as described herein may include multiple electric engines mounted forward and aft of the wing. The engines may be mounted directly to the wing, or mounted to one or more booms attached to the wing. The amount of thrust each electric engine generates may be governed by a torque command from a Flight Control System (FCS) over a digital communication interface to each electric engine. Embodiments may include forward electric engines that are capable of altering their orientation, or tilt. Some embodiments include forward engines that may be a clockwise (CW) type or counterclockwise (CCW) type. The forward electric propulsion subsystem may consist of a multi-blade adjustable pitch propeller, as well as a variable pitch subsystem.

In some embodiments, an aircraft may include aft electric engines, or lifters, that can be of a clockwise (CW) type or counterclockwise (CCW) type. Some embodiments may include aft electric engines that utilize a multi-blade fixed pitch propeller.

As described herein, the orientation and use of the electric propulsion system components may change throughout the operation of the aircraft. In some embodiments, during vertical takeoff and landing, the forward propulsion systems as well as aft propulsion systems may provide vertical thrust during takeoff and landing. During the flight phases where the aircraft is in forward flight-mode, the forward propulsion systems may provide horizontal thrust, while the aft propulsion system propellers may be stowed at a fixed position to minimize drag. The aft electric propulsion systems may be actively stowed with position monitoring. Some embodiments may include a transition from vertical flight to horizontal flight and vice-versa. In some embodiments, the transitions may be accomplished via the Tilt Propeller System (TPS). The TPS reorients the electric propulsion system between a primarily vertical direction during vertical flight mode to a mostly horizontal direction during forward-flight mode. Some embodiments may include a variable pitch mechanism that may change the forward propulsion system propeller blade collective angles for operation during the hover-phase, cruise-phase and transition phase. Some embodiments may include a Conventional Takeoff and Landing (CTOL) configurations such that the tilters provide horizontal thrust for wing-borne take-off, cruise and landing phases. In some embodiments, the aft electric engines are not used for generating thrust during a CTOL mission and the aft propellers are stowed in place to minimize drag.

In some embodiments, an electric engine as described herein may possess design features which mitigate and protect against uncontained fire, such as utilizing non-hazardous quantity of flammable fluid contained in both the tilt and lift engines. For example, in some embodiments, the electric engine may be configured to utilize less than one quart of oil or another flammable fluid. Some embodiments may include the electric engine containing a non-hazardous quantity of air such that any fire may not be capable of maintaining a duration capable of migrating to another portion of the aircraft. In some embodiments, the non-hazardous quantity of air may be in contact with flammable liquids throughout the electric engine. Some examples may include an electric engine possessing up to one liter, two liters, three liters, four liters, five liters, ten liters, or twenty liters of air within the electric engine housing. In some embodiments, the amount of air present within the electric engine housing may possess a fixed ratio to the amount of oil, or other liquid for cooling, present within the electric propulsion system. Such a ratio may be driven by a determination of the sufficient thermal mass needed to properly cool the electric propulsion system. Some embodiments may include a ratio of about 3:1 of air to oil present within the electric propulsion system. Some embodiments may include an electric engine housing where 75% of the open volume, that is, interior volume that is not occupied by components of the electric engine, is comprised of air while 25% of the open volume is comprised of oil or some other liquid for cooling and/or lubricating. Some embodiments may also be configured without a nominal ignition source within the electric engines, possess an engine over temperature operating limit that may be more than 50° ° C. less than a flammable fluid auto-ignition temperature, possess overtemperature detection and protection, overvoltage detection and protection, and/or possess overcurrent detection and protection. Further, some embodiments may include an electric propulsion system where the bulk temperature of the electric propulsion system is lower than the autoignition temperature and flashpoint of the oil, or other liquid, present within the electric propulsion system in all normal operating conditions. In some embodiments, non-normal conditions that raise the bulk electric propulsion system temperature may result in system responses that prevent the exceedance of the oil, or other liquid, flashpoint and autoignition temperature. In some embodiments, the ratio of air to oil, or other liquid, may be such that if a fire were to occur, including if an arc were to cause a fire, within the electric engine housing, the amount of air present within the electric engine housing would not allow the fire to propagate to other areas of the aircraft. In some embodiments, these and other design features may yield an electric engine that is deemed by one or more guidelines or regulations to not be a designated fire zone.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the subject matter recited in the appended claims.

A. Exemplary Electric Aircraft Features

Figure 2:
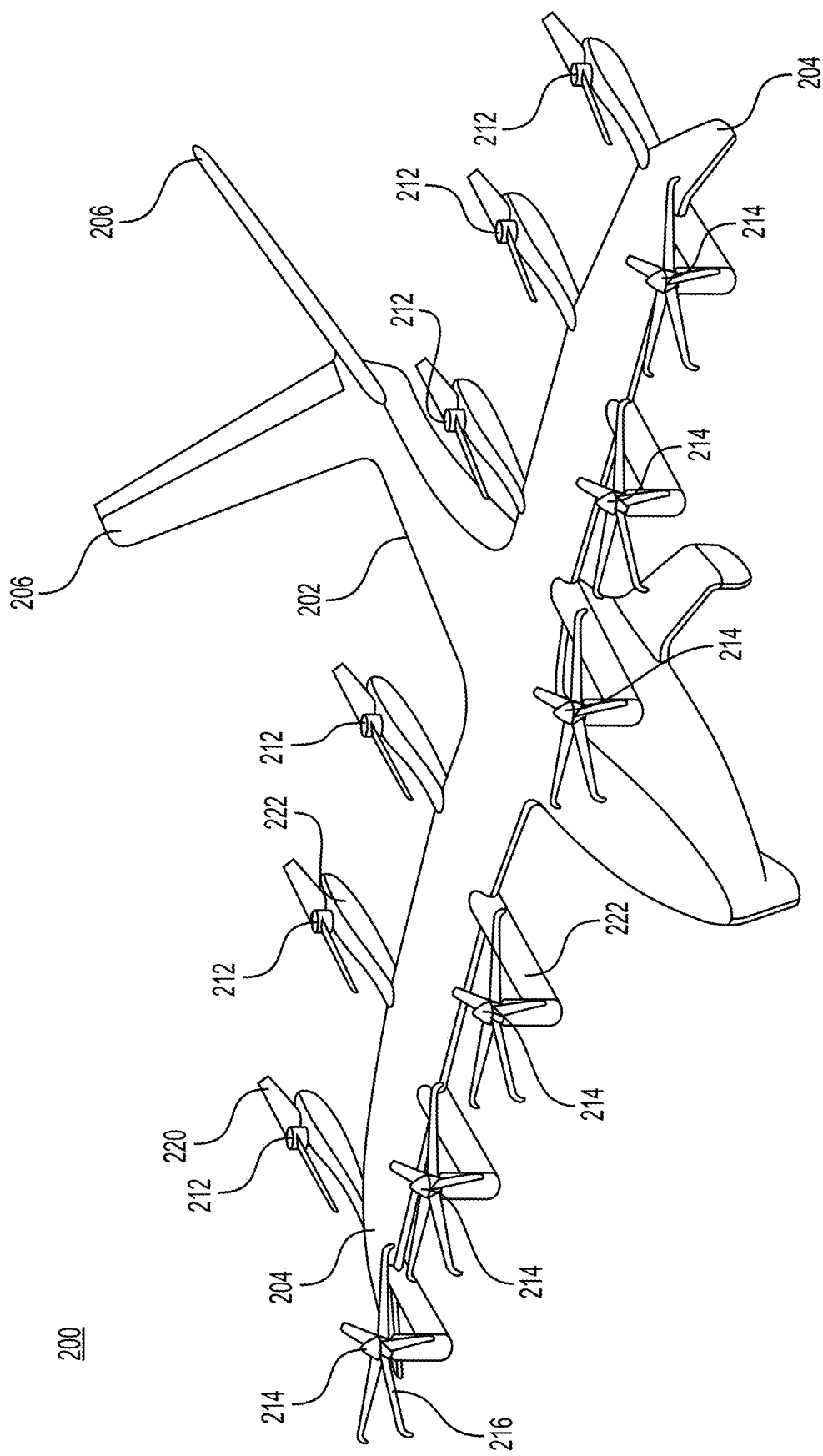
FIG. 2 is another illustration of a perspective view of an exemplary VTOL aircraft in an alternative configuration, consistent with embodiments of the present disclosure.

FIG. 1 is an illustration of a perspective view of an exemplary VTOL aircraft, consistent with disclosed embodiments. FIG. 2 is another illustration of a perspective view of an exemplary VTOL aircraft in an alternative configuration, consistent with embodiments of the present disclosure. FIGS. 1 and 2 illustrate a VTOL aircraft 100, 200 in a cruise configuration and a vertical take-off, landing and hover configuration (also referred to herein as a "lift" configuration), respectively, consistent with embodiments of the present disclosure. Elements corresponding to FIGS. 1 and 2 may possess like numerals and refer to similar elements of the aircrafts 100, 200. The aircraft 100, 200 may include a fuselage 102, 202, wings 104, 204 mounted to the fuselage 102, 202 and one or more rear stabilizers 106, 206 mounted to the rear of the fuselage 102, 202. A plurality of lift propellers 112, 212 may be mounted to wings 104, 204 and may be configured to provide lift for vertical take-off, landing and hover. A plurality of tilt propellers 114, 214 may be mounted to wings 104, 204 and may be tiltable between the lift configuration in which they provide a portion of the lift required for vertical take-off, landing and hovering, as shown in FIG. 2, and the cruise configuration in which they provide forward thrust to aircraft 100 for horizontal flight, as shown in FIG. 1. As used herein, a tilt propeller lift configuration refers to any tilt propeller orientation in which the tilt propeller thrust is providing primarily lift to the aircraft and tilt propeller cruise configuration refers to any tilt propeller orientation in which the tilt propeller thrust is providing primarily forward thrust to the aircraft.

In some embodiments, lift propellers 112, 212 may be configured for providing lift only, with all horizontal propulsion being provided by the tilt propellers. Accordingly, lift propellers 112, 212 may be configured with fixed positions and may only generate thrust during take-off, landing and hover phases of flight. Meanwhile, tilt propellers 114, 214 may be tilted upward into a lift configuration in which thrust from propellers 114, 214 is directed downward to provide additional lift.

For forward flight, tilt propellers 114, 214 may tilt from their lift configurations to their cruise configurations. In other words, the orientation of tilt propellers 114, 214 may be varied from an orientation in which the tilt propeller thrust is directed downward (to provide lift during vertical take-off, landing and hover) to an orientation in which the tilt propeller thrust is directed rearward (to provide forward thrust to aircraft 100, 200). The tilt propellers assembly for a particular electric engine may tilt about an axis of rotation defined by a mounting point connecting the boom and the electric engine. When the aircraft 100, 200 is in full forward flight, lift may be provided entirely by wings 104, 204. Meanwhile, in the cruise configuration, lift propellers 112, 212 may be shut off. The blades 120, 220 of lift propellers 112, 212 may be held in low-drag positions for aircraft cruising. In some embodiments, lift propellers 112, 212 may each have two blades 120, 220 that may be locked for cruising in minimum drag positions in which one blade is directly in front of the other blade as illustrated in FIG. 1. In some embodiments, lift propellers 112, 212 have more than two blades. In some embodiments, tilt propellers 114, 214 may include more blades 116, 216 than lift propellers 112, 212. For example, as illustrated in FIGS. 1 and 2, lift propellers 112, 212 may each include, e.g., two blades, whereas and tilt propellers 114, 214 may each include more blades, such as the five blades shown. In some embodiments, each of the tilt propellers 114, 214 may have 2 to 5 blades, and possibly more depending on the design considerations and requirements of the aircraft.

In some embodiments, the aircraft may include a single wing 104, 204 on each side of fuselage 102, 202 (or a single wing that extends across the entire aircraft). At least a portion of lift propellers 112, 212 may be located rearward of wings 104, 204 and at least a portion of tilt propellers 114, 214 may be located forward of wings 104, 204. In some embodiments, all of lift propellers 112, 212 may be located rearward of wings 104, 204 and all of tilt propellers 114, 214 may be located forward of wings 104, 204. According to some embodiments, all lift propellers 112, 212 and tilt propellers 114, 214 may be mounted to the wings—i.e., no lift propellers or tilt propellers may be mounted to the fuselage. In some embodiments, lift propellers 112, 212 may be all located rearwardly of wings 104, 204 and tilt propellers 114, 214 may be all located forward of wings 104, 204. According to some embodiments, all lift propellers 112, 212 and tilt propellers 114, 214 may be positioned inwardly of the ends of the wing 104, 204.

In some embodiments, lift propellers 112, 212 and tilt propellers 114, 214 may be mounted to wings 104, 204 by booms 122, 222. Booms 122, 222 may be mounted beneath wings 104, 204, on top of the wings, and/or may be integrated into the wing profile. In some embodiments, lift propellers 112, 212 and tilt propellers 114, 214 may be mounted directly to wings 104, 204. In some embodiments, one lift propeller 112, 212 and one tilt propeller 114, 214 may be mounted to each boom 122, 222. Lift propeller 112, 212 may be mounted at a rear end of boom 122, 222 and tilt propeller 114, 214 may be mounted at a front end of boom 122, 222. In some embodiments, lift propeller 112, 212 may be mounted in a fixed position on boom 122, 222. In some embodiments, tilt propeller 114, 214 may mounted to a front end of boom 122, 222 via a hinge. Tilt propeller 114, 214 may be mounted to boom 122, 222 such that tilt propeller 114, 214 is aligned with the body of boom 122, 222 when in its cruise configuration, forming a continuous extension of the front end of boom 122, 222 that minimizes drag for forward flight.

In some embodiments, aircraft 100, 200 may include, e.g., one wing on each side of fuselage 102, 202 or a single wing that extends across the aircraft. According to some embodiments, the at least one wing 104, 204 is a high wing mounted to an upper side of fuselage 102, 202. According to some embodiments, the wings include control surfaces, such as flaps and/or ailerons. According to some embodiments, wings 104, 204 may have designed with a profile that reduces drag during forward flight. In some embodiments, the wing tip profile may be curved and/or tapered to minimize drag.

In some embodiments, rear stabilizers 106, 206 include control surfaces, such as one or more rudders, one or more elevators, and/or one or more combined rudder-elevators. The wing(s) may have any suitable design. In some embodiments, the wings have a tapering leading edge.

In some embodiments, lift propellers 112, 212 or tilt propellers 114, 214 may canted relative to at least one other lift propeller 112, 212 or tilt propeller 114, 214. As used herein, canting refers to a relative orientation of the rotational axis of the lift propeller/tilt propeller about a line that is parallel to the forward-rearward direction, analogous to the roll degree of freedom of the aircraft. Canting of the lift propellers and/or tilt propellers may help minimize damage from propeller burst by orienting a rotational plane of the lift propeller/tilt propeller discs (the blades plus the hub onto which the blades are mounted) so as to not intersect critical portions of the aircraft (such areas of the fuselage in which people may be positioned, critical flight control systems, batteries, adjacent propellers, etc.) or other propeller discs and may provide enhanced yaw control during flight.

Figure 3:
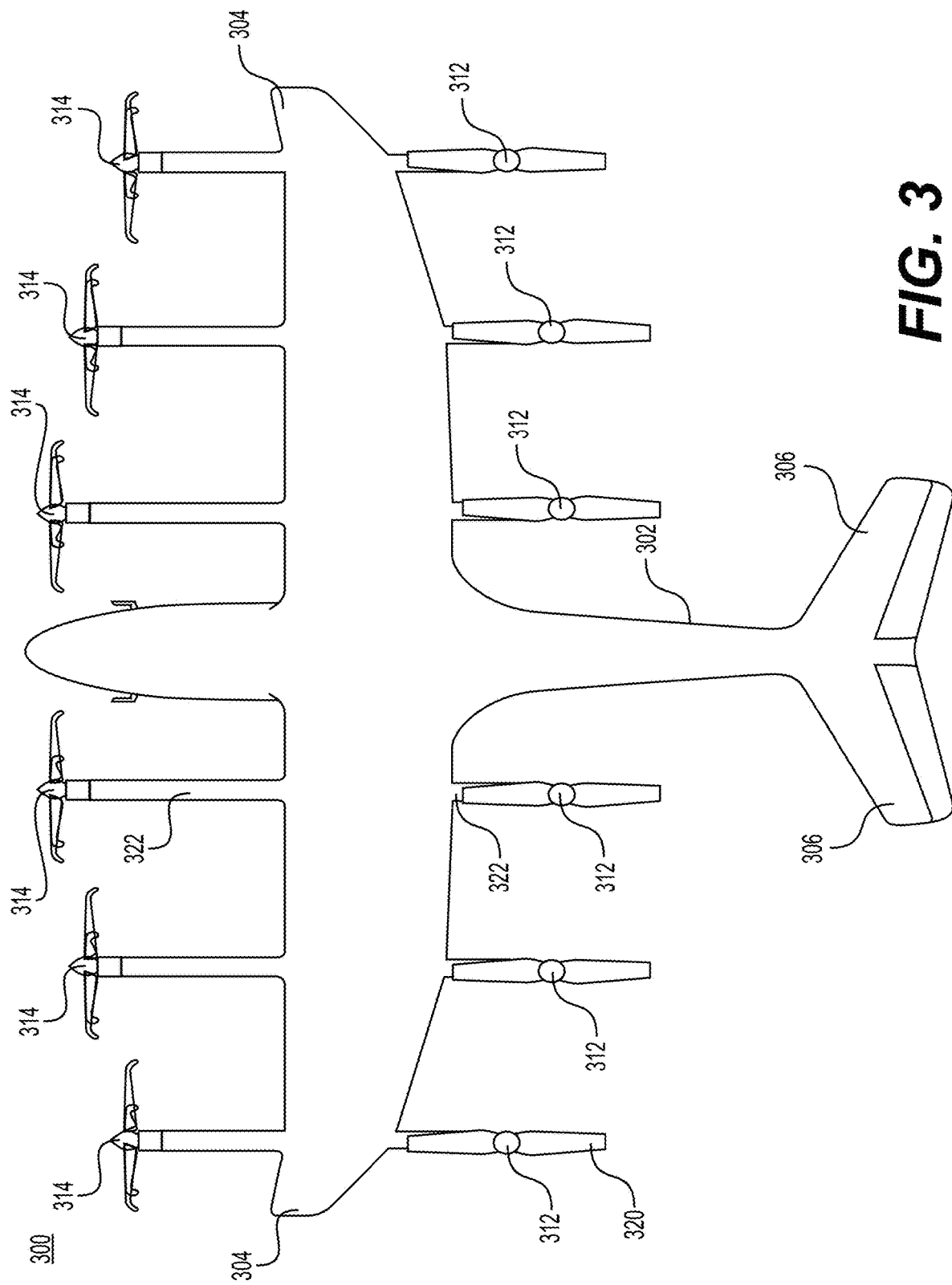
FIG. 3 is an illustration of a top plan view of an exemplary VTOL aircraft, consistent with embodiments of the present disclosure.

FIG. 3 is an illustration of a top plane view of an exemplary VTOL aircraft, consistent with embodiments of the present disclosure. Aircraft 300 shown in the figure may be a top plan view of the aircraft 100, 200 shown in FIGS.

1 and 2, respectively. As discussed herein, an aircraft 300 may include twelve electric propulsion systems distributed across the aircraft 300. In some embodiments, a distribution of electric propulsion systems may include six forward electric propulsion systems 314 and six aft electric propulsion systems 312 mounted on booms forward and aft of the main wings 304 of the aircraft 300. In some embodiments, a length of the rear end of the boom 324 from the wing 304 to the lift propeller 312 may comprise a similar rear end of the boom 324 length across the numerous rear ends of the booms. In some embodiments, the length of the rear ends of the booms may vary across the, exemplary, six rear ends of the booms. For example, each rear end of the boom 324 may comprise a different length from the wing 304 to the lift propeller 312, or a subset of rear ends of booms may be similar in length. In some embodiments, a front end of boom 322 may comprise various lengths from the wing 304 to the tilt propeller 314 across the front ends of booms. For example, as shown in FIG. 3, a length of the front end of boom 322 from the tilt propellers 314 nearest the fuselage to the wing 304 may comprise a greater length than the length of the front end of the boom 322 from the wing 304 to the tilt propellers 314 furthest from the fuselage. Some embodiments may include front ends of the booms with similar lengths across the, exemplary, six front ends of booms or any other distribution of lengths of the front ends of booms from the wing 304 to tilt propellers 314. Some embodiments may include an aircraft 300 possessing eight electric propulsion systems with four forward electric propulsion systems 314 and four aft electric propulsion systems 312, or any other distribution of forward and aft electric propulsion systems, including embodiments where the number of forward electric propulsion systems 314 is less than or greater than the number of aft electric propulsion systems 312. Further, FIG. 3 depicts an exemplary embodiment of a VTOL aircraft 300 with forward propellers 314 in a horizontal orientation for horizontal flight and aft propeller blades 320 in a stowed position for a forward phase of flight.

As disclosed herein, the forward electric propulsion systems and aft electric propulsion systems may be of a clockwise (CW) type or counterclockwise (CCW) type. Some embodiments may include various forward electric propulsion systems possessing a mixture of both CW and CCW types. In some embodiments, the aft electric propulsion systems may possess a mixture of CW and CCW type systems among the aft electric propulsion systems.

Figure 4:
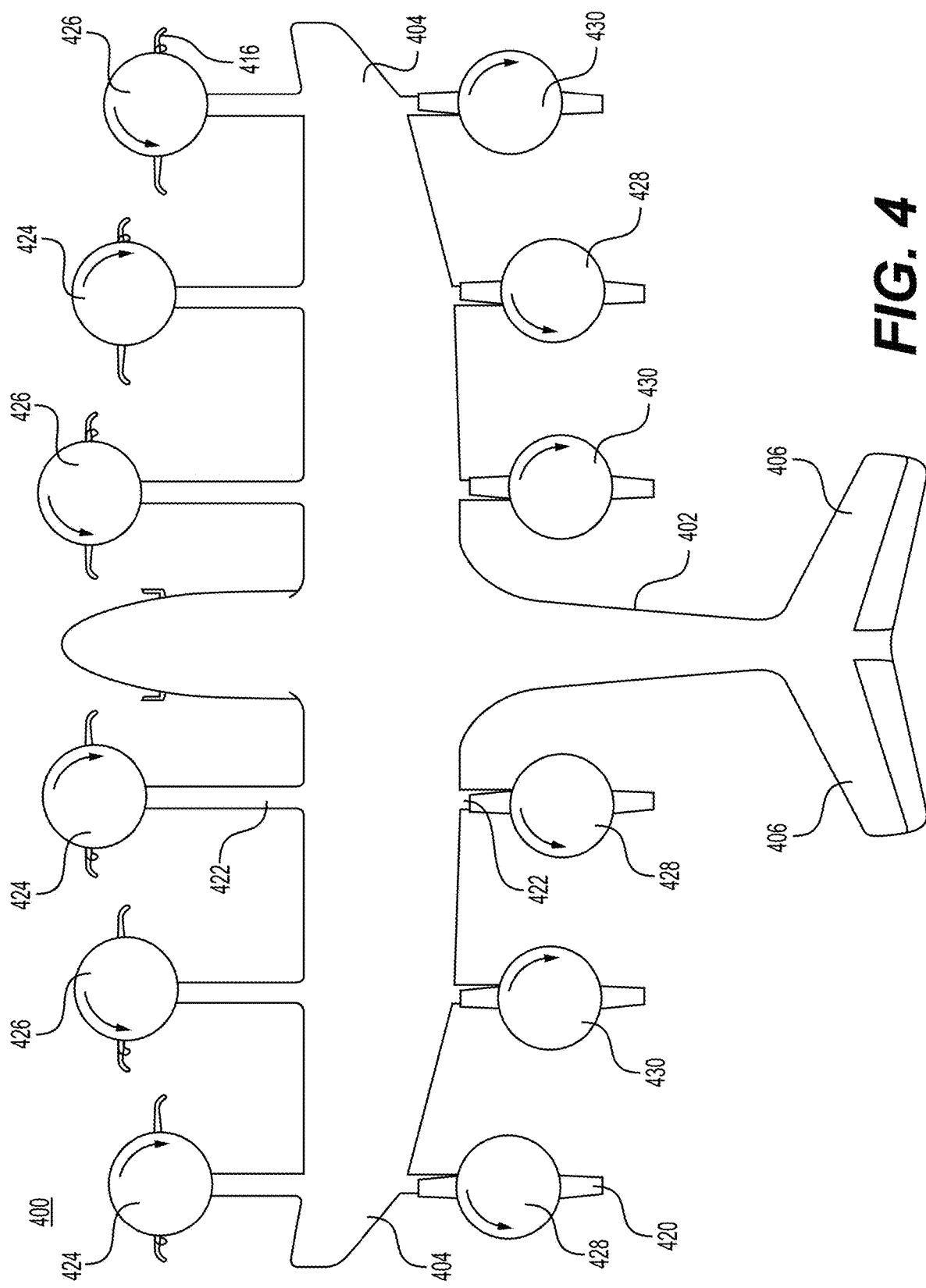
FIG. 4 is a schematic diagram illustrating exemplary propeller rotation of a VTOL aircraft, consistent with disclosed embodiments.

FIG. 4 is a schematic diagram illustrating exemplary propeller rotation of a VTOL aircraft, consistent with disclosed embodiments. Aircraft 400 shown in the figure may be a top plan view of the aircraft 100, 200, and 300 shown in FIGS. 1, 2, and 3, respectively. An aircraft 400 may include six forward electric propulsion systems with three of the forward electric propulsion systems being of CW type 424 and the remaining three forward electric propulsion systems being of CCW type. In some embodiments, three aft electric propulsion systems may be of CCW type 428 with the remaining three aft electric propulsion systems being of CW type 430. Some embodiments may include an aircraft 400 possessing four forward electric propulsion systems and four aft electric propulsion systems, each with two CW types and two CCW types. In some embodiments, propellers may counter-rotate with respect to adjacent propellers to cancel torque steer, generated by the rotation of the propellers, experienced by the fuselage or wings of the aircraft. In some embodiments, the difference in rotation direction may be achieved using the direction of engine rotation. In other embodiments, the engines may all rotate in the same direction, and gearing may be used to achieve different propeller rotation directions.

Some embodiments may include an aircraft 400 possessing forward and aft electric propulsion systems where the amount of CW types 424 and CCW types 426 is not equal among the forward electric propulsion systems, among the aft electric propulsion systems, or among the forward and aft electric propulsion systems.

Figure 5:
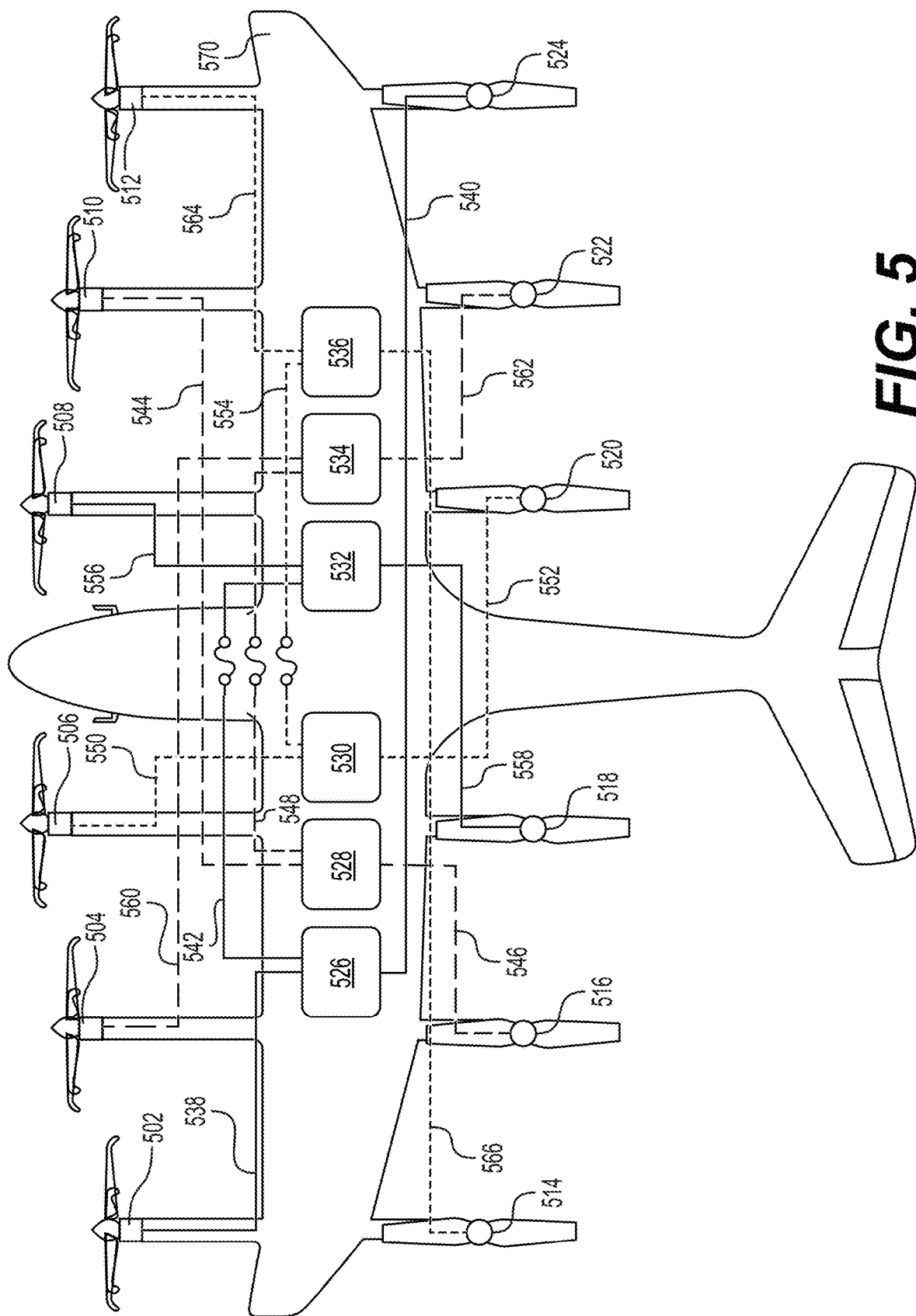
FIG. 5 is a schematic diagram illustrating exemplary power connections in a VTOL aircraft, consistent with disclosed embodiments.

FIG. 5 is a schematic diagram illustrating exemplary power connections in a VTOL aircraft, consistent with disclosed embodiments. A VTOL aircraft may have various power systems connected to diagonally opposing electric propulsion systems. In some embodiments, the power systems may include high voltage power systems. Some embodiments may include high voltage power systems connected to electric engines via high voltage channels. In some embodiments, an aircraft 500 may include six power systems, including batteries 526, 528, 530, 532, 534, and 536 stored within the wing 570 of the aircraft 500. In some embodiments, the aircraft 500 may include six forward electric propulsion systems having six electric engines 502, 504, 506, 508, 510, and 512 and six aft electric propulsion systems having six electric engines 514, 516, 518, 520, 522, and 524. In some embodiments, a battery may be connected to diagonally opposing electric engines. In such a configuration, first power system 526 may provide power to electric engines 502 via power connection channel 538 and electric engine 524 via power connection channel 540. In some embodiments, first power system 526 may also be paired with a fourth power system 532 via a power connection channel 542 possessing a fuse to prevent excessive current from flowing through the power systems 526 and 532. Further to this embodiment, VTOL aircraft 500 may include a second power system 528 paired with a fifth power system 534 via power connection channel 548 possessing a fuse and may provide power to electric engines 510 and 516 via power connection channels 544 and 546, respectively. In some embodiments, a third power system 530 may be paired with a sixth power system 536 via power connection channel 554 possessing a fuse and may provide power to electric engines 506 and 520 via power connection channels 550 and 552, respectively. The fourth power system 532 may also provide power to electric engines 508 and 518 via power connection channels 556 and 558, respectively. The fifth power system 534 may also provide power to electric engines 504 and 522 via power connection channels 560 and 562, respectively. The sixth power system 536 may also provide power to electric engines 512 and 514 via power connection channels 564 and 566, respectively.

As disclosed herein, an electric propulsion system may include an electric engine connected to a High Voltage Power System, such as a battery, located within the aircraft, via high voltage channels or power connection channels. Some embodiments may include various batteries being stored within an aircraft wing with high voltage channels traveling throughout the aircraft, including the wing and boom, to an electric propulsion system. In some embodiments, multiple high voltage power systems may be used to create an electric propulsion system with multiple high voltage power supplies to avoid the risk of a single point of failure. In some embodiments, an aircraft may include multiple electric propulsion systems that may be wired in a pattern to various batteries or power sources stored throughout the aircraft. It is recognized that such a configuration may be beneficial as to avoid the risk of a single point of failure where one battery or power source failure could lead to a portion of the aircraft not being able to maintain a required amount of thrust to continue flight or perform a controlled landing. For example, if a VTOL possessed two forward electric propulsion systems and two aft propulsion systems, the forward and the aft electric propulsion systems on opposite sides of the VTOL aircraft may be connected to the same high voltage power system. In such a configuration, if one high voltage power system were to fail, a forward and an aft electric propulsion system on opposite sides of the VTOL aircraft would remain in working order and may provide a more balanced flight or landing compared to a forward and aft electric propulsion system failing on the same side of a VTOL aircraft. Some embodiments may include four forward electric propulsion systems and four aft electric propulsion systems where diagonally opposing electric engines are connected to a common battery or power source. Some embodiments may include various configurations of electric engines electrically connected to high voltage power systems such that a risk of a single point of failure is avoided in the case of a power source failure and the phase of flight during which a failure occurs may continue or the aircraft may perform an alternative phase of flight in response to the failure.

As discussed above, an electric propulsion system may include an electric engine that provides mechanical shaft power to a propeller assembly to produce thrust. In some embodiments, the electric engine of an electric propulsion system may include a High Voltage Power System supplying high voltage power to the electric engines and/or a Low Voltage System supplying low voltage direct current power to an electric engine. Some embodiments may include the electric engine(s) digitally communicating with a Flight Control System ("FCS") comprising Flight Control Computers ("FCC") that may send and receive signals to and from the electric engine including commands and responsive data or status. Some embodiments may include an electric engine capable of receiving operating parameters from and communicating operating parameters to the FCC, including speed, voltage, current, torque, temperature, vibration, propeller position, and any other value of operating parameters.

In some embodiments, a flight control system may include a system capable of communicating with an electric engine to send and receive analog/discrete signals to the electric engine and controlling an apparatus capable of redirecting thrust of the tilt propellers between a primarily vertical direction during vertical flight mode to a mostly horizontal direction during forward-flight mode. In some embodiments, this system may be referred to as a Tilt Propeller System ("TPS") and may be capable of communicating and orienting additional features of the electric propulsion system.

Figure 6:
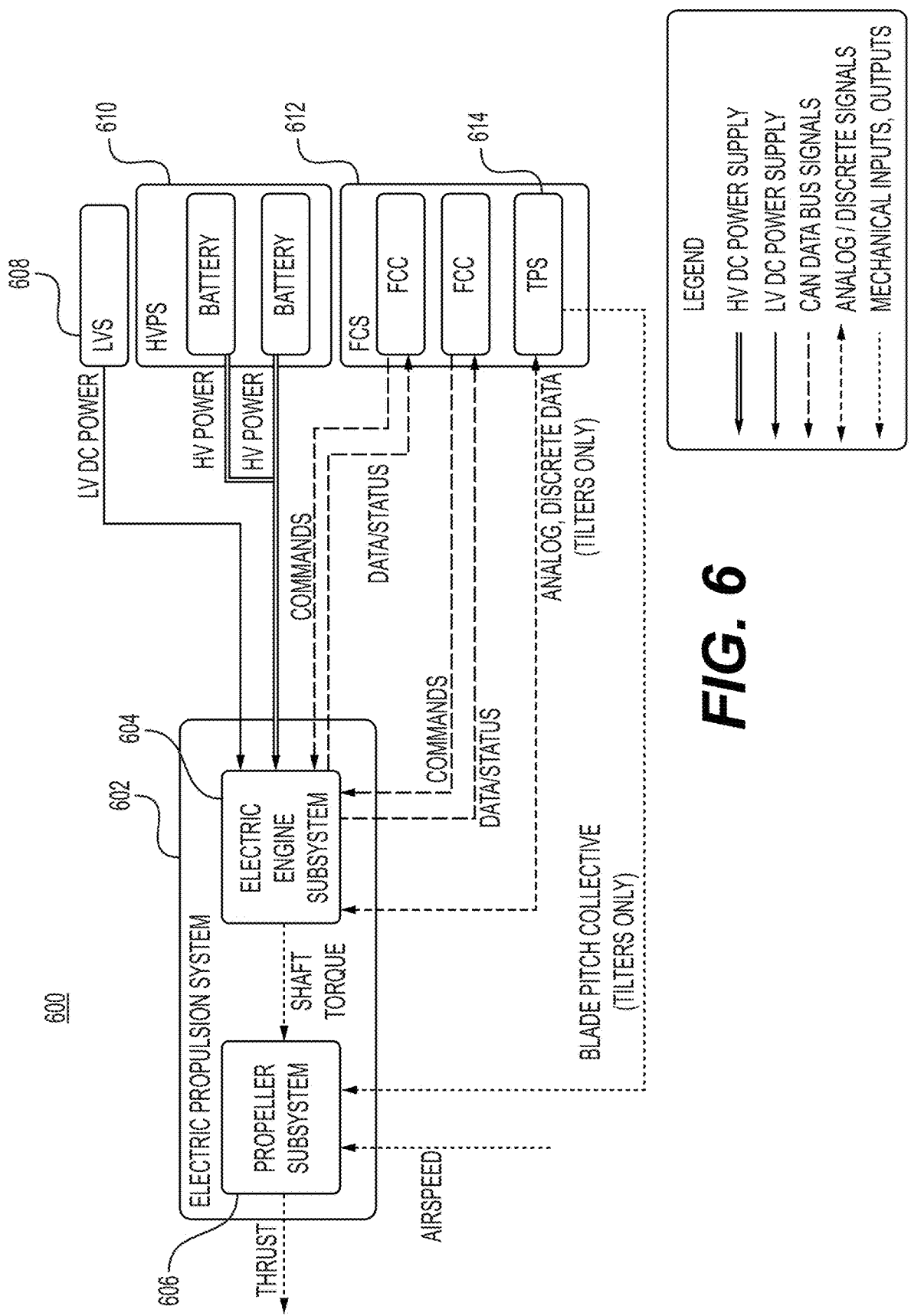
FIG. 6 is a block diagram illustrating an exemplary architecture and design of an electric propulsion unit of a VTOL aircraft, consistent with disclosed embodiments.

FIG. 6 illustrates block diagram of an exemplary architecture and design of an electric propulsion unit 600 consistent with disclosed embodiments. In some embodiments, an electric propulsion system 602 may include an electric engine subsystem 604 that may supply torque, via a shaft, to a propeller subsystem 606 to produce the thrust of the electric propulsion system 602. Some embodiments may include the electric engine subsystem 604 receiving low voltage DC (LV DC) power from a Low Voltage System (LVS) 608. Some embodiments may include the electric engine subsystem 604 receiving high voltage (HV) power from a High Voltage Power System (HVPS) 610 comprising at least one battery or other device capable of storing energy. In some embodiments, a High Voltage Power System may include more than one battery, or other device capable of storing energy, supplying high voltage power to the electric engine subsystem 604. It is recognized that such a configuration may be advantageous as to not risk a single point of failure where a single battery failure leads to an electric propulsion system 602 failure.

Some embodiments may include an electric propulsion system 602 including an electric engine subsystem 604 receiving signals from and sending signals to a flight control system 612. In some embodiments, a flight control system 612 may comprise a flight control computer capable of using Controller Area Network ("CAN") data bus signals to send commands to the electric engine subsystem 604 and receive status and data from the electric engine subsystem 604. It should be understood that while CAN data bus signals are used between the flight control computer and the electric engine(s), some embodiments may include any form of communication with the ability to send and receive data from a flight control computer to an electric engine. In some embodiments, a flight control system 612 may also include a Tilt Propeller System ("TPS") 614 capable of sending and receiving analog, discrete data to and from the electric engine subsystem 604 of the tilt propellers. A tilt propeller system 614 may include an apparatus capable of communicating operating parameters to an electric engine subsystem 604 and articulating an orientation of the propeller subsystem 606 to redirect the thrust of the tilt propellers during various phases of flight using mechanical means such as a gearbox assembly, linear actuators, and any other configuration of components to alter an orientation of the propeller subsystem 606.

As discussed throughout, an exemplary VTOL aircraft may possess various types of electric propulsion systems including tilt propellers and lift propellers, including forward electric engines with the ability to tilt during various phases of flight, and aft electric engines that remain in one orientation and may only be active during certain phases of flight (i.e., take off, landing, and hover).

Figure 7:
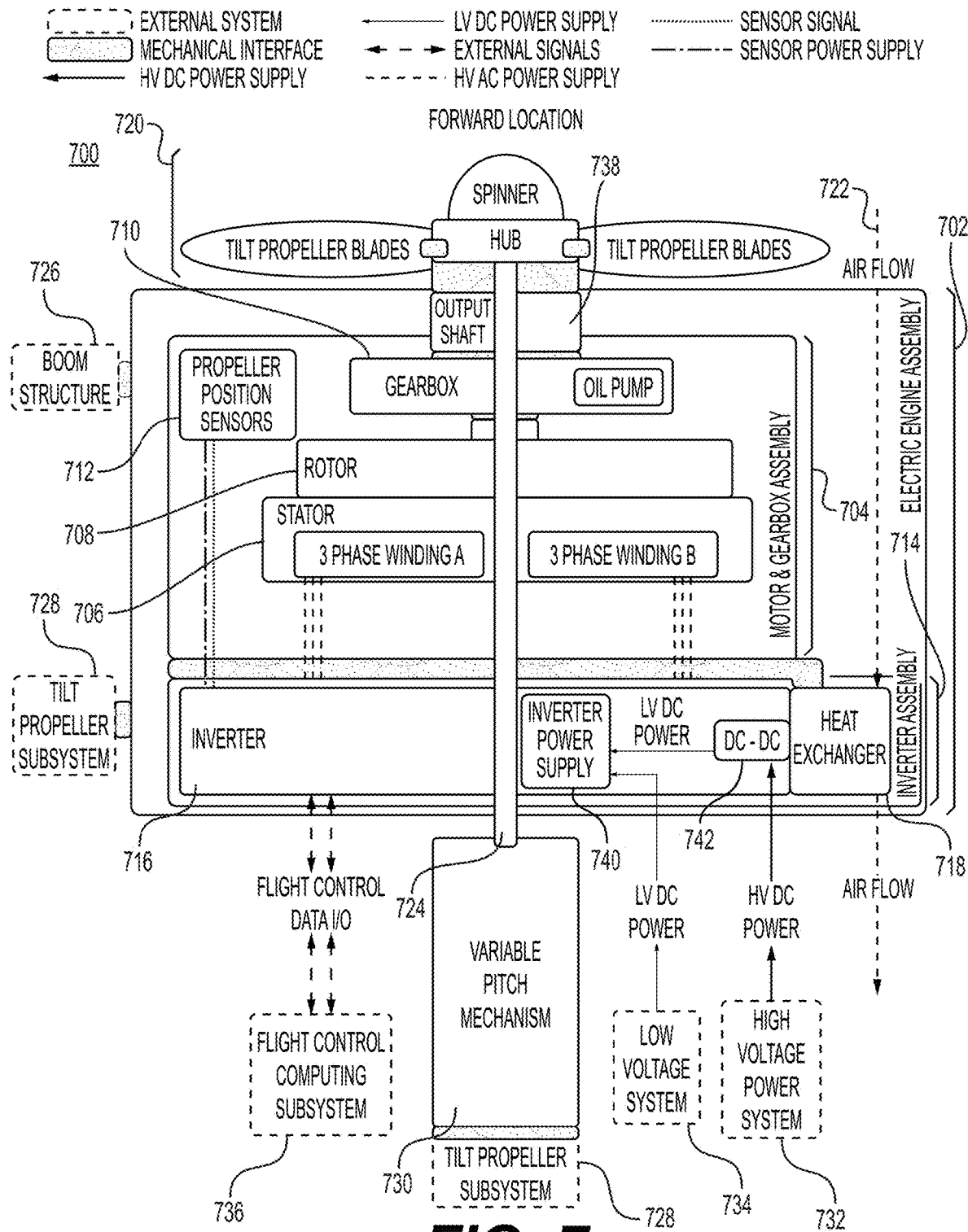
FIG. 7 is a schematic diagram illustrating an exemplary tilt electric propulsion system of a VTOL aircraft, consistent with disclosed embodiments.

FIG. 7 is a schematic diagram illustrating an exemplary tilt electric propulsion system of a VTOL aircraft, consistent with disclosed embodiments. A tiltable electric propulsion system 700 may include an electric engine assembly 702 aligned along a shaft 724 that is connected to an output shaft 738 that is mechanically coupled to a propeller assembly 720 comprising a hub, a spinner, and tilt propeller blades. In some embodiments, an electric engine assembly 702 may include a motor and gearbox assembly 704 aligned along and mechanically coupled to the shaft 724. In some embodiments, a motor and gearbox assembly 704 may include an electric motor assembly comprising a stator 706 and a rotor 708. As shown in FIG. 7, and present in some embodiments, a stator 706 may include multiple stator windings connected to the inverter 716. In such a configuration, a stator 706 may incorporate one or more redundancies so that, in the event one set of windings were to fail, power would still be transmitted to the stator 706 via one or more remaining windings, so that the electric engine assembly 702 retains power and continues to generate thrust at the propeller assembly 720.

In some embodiments, a motor and gearbox assembly 704 may contain a gearbox 710 aligned along the shaft 724 to provide a gear reduction between the torque of the shaft 724 from the electric engine assembly, comprising a stator 706 and rotor 708, and the output shaft 738 Torque applied to the output shaft 738 may be transferred to the propeller assembly 720. Some embodiments may include a gearbox 710 containing an oil pump. In such an embodiment, the oil pump may drive a circulation of oil throughout the motor and gearbox assembly 704 at a speed equivalent to the rotation of the output shaft 738 to cool and lubricate the gearbox and electric motor components. In some embodiments, the oil pump may drive a circulation of oil at a speed greater than or less than the rotation of the output shaft 738. Some embodiments of a motor and gearbox assembly 704 may include propeller position sensors 712 present within the housing that may detect a magnetic field produced by the electric engine assembly to determine a propeller position. Further embodiments may include propeller position sensors 712 that are powered by an inverter 716 and send collected data to an inverter 716.

In some embodiments, an electric engine assembly 702 may also include an inverter assembly 714 substantially aligned along the shaft 724. An inverter assembly 714 may include an inverter 716 and an inverter power supply 740 An inverter power supply 740 may accept low voltage DC power from a low voltage system 734 located outside the electric engine assembly 702. An inverter power supply 740 may accept low voltage DC power originating from a high voltage power system 732, located outside the electric engine assembly 702, that has been converted to low voltage DC power via a DC-DC converter 742. An inverter 716 may supply high voltage alternating current (AC) to the stator 706 of the electric engine assembly located within the motor and gearbox assembly 704 via at least one three-phase winding. An inverter assembly 714 may include an inverter 716 that may receive flight control data from a flight control computing subsystem 736.

In some embodiments, a motor and gearbox 704 may be located between an inverter assembly 714 and a propeller assembly 720. Some embodiments may also include a divider plate 744 coupled to the motor and gearbox assembly 704 and inverter assembly 714. A divider plate 744 may create an enclosed environment for an upper portion of the motor and gearbox assembly 704 via an end bell assembly, and create an enclosed environment for a lower portion of the inverter assembly 714 via a thermal plate. In some embodiments, divider plate 744 may serve as an integral mounting bracket for supporting heat exchanger 718. Heat exchanger 718 may comprise, for example, a folded fin or other type of heat exchanger. In some embodiments, the electric propulsion system 700 may circulate oil or other coolant throughout the electric engine assembly 702, motor and gearbox assembly 704, or inverter assembly 714 to transfer heat generated from the components to the oil or other coolant liquid. The heated oil or other coolant liquid may circulate through heat exchanger 718 to transfer the heat to an air flow 722 passing through the fins of the heat exchanger.

In some embodiments, the electric engine assembly 702 may be mounted or coupled to a boom structure 726 of the aircraft. A variable pitch mechanism 730 may be mechanically coupled to the propeller assembly 720. In some embodiments, the variable pitch mechanism may abut the electric engine assembly 702. In some embodiments, the variable pitch mechanism 730 may be coupled to the variable pitch mechanism 730 such it may be remotely mounted within the boom, wing, or fuselage of the aircraft. In some embodiments, the variable pitch mechanism 730 may include a shaft or component traveling within or adjacent to the shaft 724 to the propeller assembly 720. A variable pitch mechanism 730 may serve to change the collective angle of the forward electric engine's propeller assembly blades as needed for operation during the hover-phase, transition phase, and cruise-phase. Some embodiments may include the electric engine assembly 702 being mechanically coupled to a tilt propeller subsystem 728 that may redirect thrust between a primarily vertical direction during vertical flight mode to a mostly horizontal direction during forward-flight mode. In some embodiments, the tilt propeller subsystem may abut the variable pitch mechanism 730. Some embodiments may include a tilt propeller subsystem 728 comprising various components located in various locations. For example, a component of the tilt propeller subsystem may be coupled to the electric engine assembly 702 and other components may be coupled to the variable pitch mechanism 730. These various components of the tilt propeller subsystem 728 may work together to redirect the thrust of the tiltable electric propulsion system 700.

Figure 8:
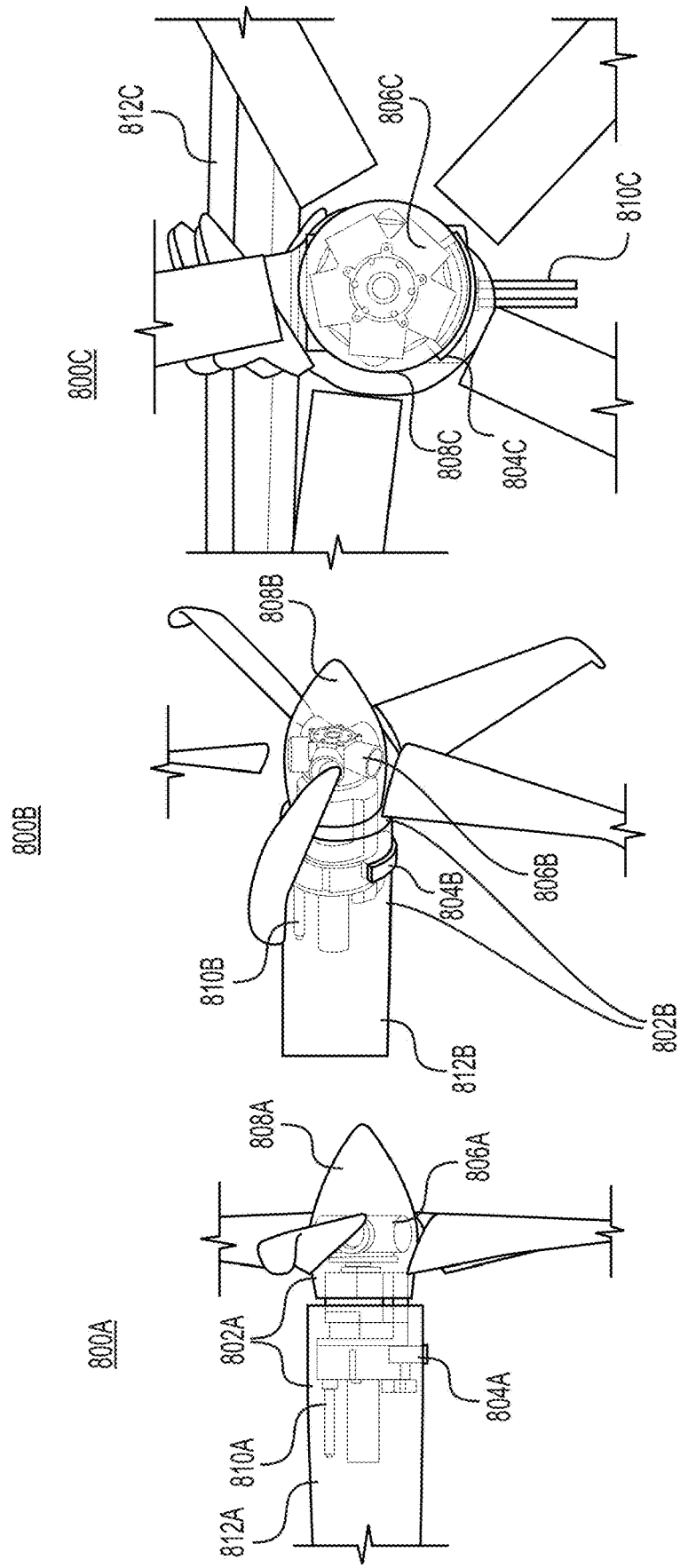
FIGS. 8A-8C are illustrations of an exemplary tilt electric propulsion system of a VTOL aircraft, consistent with disclosed embodiments.

FIGS. 8A-8C are illustrations of an exemplary tilt electric propulsion system of a VTOL aircraft, consistent with disclosed embodiments. FIGS. 8A-8C possess like numerals and refer to similar elements of tiltable electric propulsion systems 800A, 800B, and 800C. As such, similar design considerations and configurations may be considered throughout the embodiments FIGS. 8A and 8B illustrate a side profile and perspective view, respectively, of a tiltable electric propulsion system 800A, 800B in a cruise configuration integrated into a boom 812A, 812B consistent with this disclosure. A tiltable propeller electric propulsion system 800A, 800B may comprise an electric engine assembly 802A, 802B housed within a boom 812A, 812B of a VTOL aircraft. In some embodiments, a cruise configuration may include the electric engine assembly 802A, 802B being posited within the boom 812A, 812B. An electric engine assembly 802A, 802B may comprise an electric motor assembly, a gearbox assembly, an inverter assembly with power connection channels 810A, 810B, and a heat exchanger 804A, 804B, as described herein. The electric engine assembly 802A, 802B may be mechanically coupled to a propulsion assembly 808A, 808B comprising a shaft flange assembly 806A, 806B, a spinner, and propeller blades.

FIG. 8C illustrates a top-down view, along a spinner 808C, of a tiltable electric propulsion system 800C in a lift configuration integrated into a boom 812B consistent with this disclosure. As shown in FIG. 8C a tiltable electric propulsion system 800C in a lift configuration may comprise the electric engine assembly 802A, 802B being posited outside of the boom 812C and changing its orientation with respect to the boom 812C.

As discussed herein, a lift electric propulsion system may be configured to provide thrust in one direction and may not provide thrust during all phases of flight. For example, a lift system may provide thrust during take-off, landing, and hover, but may not provide thrust during cruise.

Figure 9:
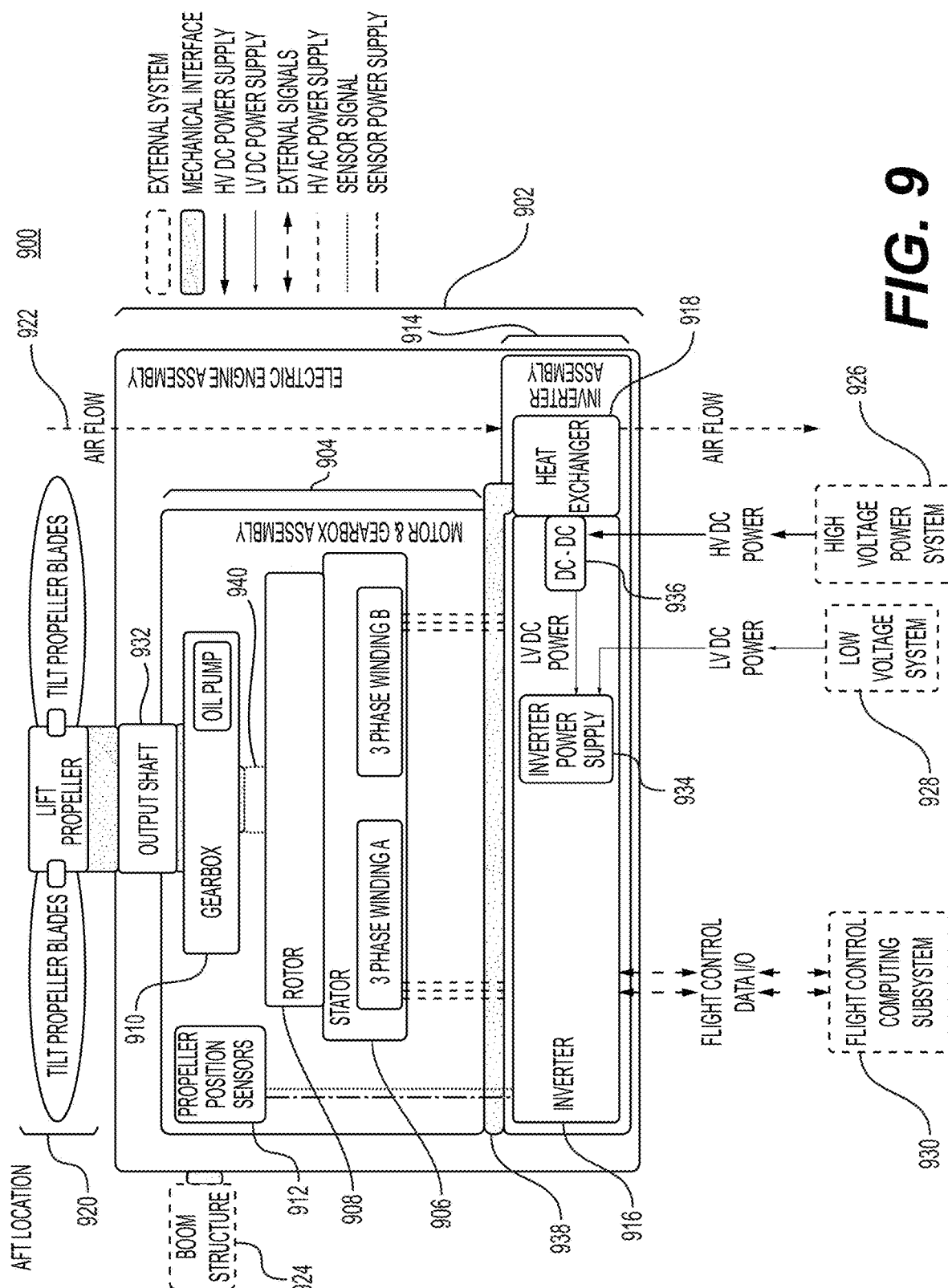
FIG. 9 is a schematic diagram illustrating an exemplary lift electric propulsion system of a VTOL aircraft, consistent with disclosed embodiments.

FIG. 9 is a schematic diagram illustrating an exemplary lift electric propulsion system of a VTOL aircraft, consistent with disclosed embodiments. A lift electric propulsion system 900 may be mounted or coupled to a boom structure 924 of the aircraft. A lift electric propulsion system 900 may include electric engine assembly 902 aligned along a shaft 940 that is connected to an output shaft 932 that is mechanically coupled to a propeller assembly 920 comprising a hub and tilt propeller blades. In some embodiments, an electric engine assembly 902 may include a motor and gearbox assembly housing 904 aligned along and mechanically coupled to the shaft 940. In some embodiments, a motor and gearbox assembly housing 904 may include an electric motor assembly comprising a stator 906 and a rotor 908. A stator 906 may include multiple stator windings connected to the inverter 916. In such a configuration, a stator 906 may incorporate one or more redundancies and backup measures to avoid a single point of failure in the case. For example, stator 906 may include multiple windings such that, if a winding fails, power may continue to be transmitted to the stator 906 via remaining windings, allowing the electric engine assembly 902 to retain power and continue to generate thrust at the propeller assembly 920.

In some embodiments, a motor and gearbox assembly housing 904 may contain a gearbox 910 aligned along the shaft 940 to provide a gear reduction between the torque of the shaft 932 from the electric engine assembly, comprising a stator 906 and rotor 908, and the output shaft 932. Torque applied to the output shaft 932 may be transferred to the propeller assembly 920. Some embodiments may include a gearbox 910 containing a fluid pump for circulating cooling and/or lubrication fluid. In the embodiment shown, the fluid pump is an oil pump. In such an embodiment, the oil pump may drive a circulation of oil throughout the motor and gearbox assembly housing 904 at a speed equivalent to the rotation of the output shaft 932 to cool and lubricate the gearbox and electric motor components. Some embodiments of a motor and gearbox assembly housing 904 may include propeller position sensors 912 present within the housing that may detect a magnetic field produced by the electric engine assembly to determine a propeller position. Further embodiments may include propeller position sensors 912 that are powered by an inverter 916 and send collected data to an inverter 916 that may be transferred to a flight control computing system 930 among other flight control data.

In some embodiments, an electric engine assembly 902 may also include an inverter assembly housing 914 aligned along an axis sharing the axis of the shaft 924. An inverter assembly housing 914 may include an inverter 916 and an inverter power supply 934. An inverter power supply 934 may accept low voltage DC power from a low voltage system 928 located outside the electric engine assembly 902. An inverter power supply 934 may accept low voltage DC power originating from a high voltage power system 926, located outside the electric engine assembly 902, that has been converted to low voltage DC power via a DC-DC converter 936. An inverter 916 may supply high voltage alternating current to the stator 906 of the electric engine assembly located within the motor and gearbox assembly housing 904 via at least one three-phase winding. An inverter assembly 914 may include an inverter 916 that may send data to and receive data from a flight control computing subsystem 930.

In some embodiments, a motor and gearbox housing 904 may be located between an inverter assembly housing 914 and a propeller assembly 920. Some embodiments may also include a divider plate 938 coupled to the motor and gearbox assembly housing 904 and inverter assembly housing 914. A divider plate 938 may create an enclosed environment for an upper portion of the motor and gearbox assembly housing 904 via an end bell assembly, and may create an enclosed environment for a lower portion of the inverter assembly housing 914 via a thermal plate. In some embodiments, a divider plate 938 may serve as an integral mounting bracket for supporting heat exchanger 918. Heat exchanger 918 may comprise, e.g., a folded fin or other type of heat exchanger. In some embodiments, the electric propulsion system 900 may circulate oil or other coolant fluid throughout the electric engine assembly 902, motor and gearbox assembly 904, or inverter assembly 914 to transfer heat generated from the components to the oil or other coolant liquid. The heated oil or other coolant liquid may be circulated through heat exchanger 918 to transfer the heat to an air flow 922 passing through the fins of the heat exchanger.

In some embodiments, a tiltable electric propulsion system and a lift electric propulsion system may possess similar components. This may be advantageous with respect to many design considerations present within VTOL aircrafts. For example, from a manufacturability standpoint, different types of electric propulsion systems having similar components may be beneficial in terms of manufacturing efficiency. Further, having similar components may be beneficial in terms of risk management as similar components possess similar points of failure and these points of failure may be well explored and designed around when comparing systems having similar components to systems having different components and configurations.

While a tiltable electric propulsion system may possess additional, and in some embodiments different, components compared to a lift electric propulsion system, it should be understood that in some embodiments a tiltable electric propulsion system and a lift electric propulsion system may possess the same configuration of components. For example, in some embodiments, a tiltable and lift electric propulsion system may contain the same components while the lift electric propulsion system may be coupled to a boom, wing, or fuselage of the aircraft such that it may not be able to provide thrust in as many directions as tiltable electric propulsion system.

FIGS. 10A-10B are illustrations of an exemplary lift electric propulsion systems of a VTOL aircraft, consistent with disclosed embodiments. FIGS. 10A and 10B possess like numerals and refer to similar elements of lift electric propulsion systems 1000A and 1000B. As such, similar design considerations and configurations may be considered throughout the embodiments FIG. 10A illustrates a side profile of a lift electric propulsion system 1000A in a lift configuration integrated into a boom 1010A consistent with this disclosure. A lift electric propulsion system 1000A may comprise an electric engine assembly 1002A housed within a boom 1010A of a VTOL aircraft. In some embodiments, a lift configuration may include the electric engine assembly 1002A being posited vertically within the boom 1010A. An electric engine assembly 1002A may comprise an electric motor assembly, a gearbox assembly, an inverter assembly with power connection channels 1008A, and a heat exchanger 1004A, as described herein. The electric engine assembly 1002A may be mechanically coupled to a propulsion assembly 1006A comprising a shaft flange assembly and propeller blades.

FIG. 10B illustrates a top-down view of a lift electric propulsion system 1000B in a lift configuration integrated into a boom 1010B, consistent with this disclosure.

Some embodiments of the disclosed electric engine may generate heat during operation and may comprise a heat management system to ensure components of the electric engine do not fail during operation. In some embodiments, coolant may be used and circulated throughout individual components of the engine, such as an inverter, gearbox, or motor, through some of the components, or through all of the components of the engine to assist with managing the heat present in the engine. Some embodiments may include using air cooling methods to cool the electric engine or using a mixture of coolant and air to manage the heat generated during operation in the electric engine. In some embodiments, the coolant being used may also be the same liquid that is being used as lubricant throughout the inverter, gearbox, or motor. For example, components of the electric engines may be cooled using a liquid or air or using a mixture of air and liquid cooling. As another example, a motor may be cooled using air cooling while the inverter and gearbox are cooled using liquid cooling. It should be understood that a mixture of cooling may be used for any combination of electric engine components or within each component.

In some embodiments, oil may be used as a lubricant throughout an electric engine and may also be used as coolant fluid to assist in managing the heat generated by the engine during operation. Further to this example, different amounts of oil may be used to act as both lubricant and coolant fluid in the electric engine, such as less than or equal to one quart, 1.5 quarts, two quarts, 2.5 quarts, three quarts, five quarts or any other amount of oil needed to lubricate and cool the electric engine, in combination with or without the assistance of air cooling. In some embodiments, the amount of the oil or liquid to be used in the system in relation to cooling may be determined based on an amount of thermal mass needed to drive heat transfer from the components of the electric propulsion system. As has been disclosed herein, an electric engine may have different primary functionalities such as being used only for lifting and landing, and as such only being used in one orientation, or being used during all stages of flight such as lifting, landing, and in-flight. An engine that is used in all stages of flight may experience various orientations throughout flight and may comprise more lubricant and coolant than the engine only used in one orientation. As such, all the engines on an aircraft may not include the same amount of lubricant and coolant. For example, a lifting and landing engine may only require less than one quart of oil while an engine that operates in all stages of flight may require more than one quart of oil. In some embodiments, the amount of oil or liquid for cooling may be of an appropriate amount to provide sufficient thermal mass to drive heat transfer from the components of the electric propulsion system no matter the orientation of the electric propulsion system. The embodiments discussed herein are exemplary, non-limiting, and do not dictate the bounds of the amount of lubricant and coolant that may be used in an electric engine.

Some embodiments may use oil to lubricate the electric engine and to cool the electric engine. Such embodiments may require additional volumes of oil. In such embodiments, the additional oil may allow for removal of traditional components that may be used to cool such an electric engine. For example, if the electric engine were cooled by another liquid such as glycol, the engine may comprise separate heat exchangers for both the lubricant fluid and the coolant fluid. As such, in embodiments where a single fluid is being used for both lubrication and cooling, such as oil, an increase in oil would be present but there would only be a need for one heat exchanger, so there may be a decrease in mass, due to using less heat exchangers and potentially other components not being required, of the overall system and a more appealing drag profile may be present. Further, using one substance for the lubrication and cooling of the engine may increase efficiency of the system due to the reduction in mass and the benefits of cooling the engine with a substance rather than relying on air cooling which may have issues traveling throughout the engine.

Some embodiments of electric engines may include various components for monitoring flammable fluids, and for preventing ingress of flammable materials into certain sections of the electric engine. Some embodiments may include an electric engine possessing a wet zone enclosure that may be defined by a gearbox, motor, and/or heat exchanger. In some embodiments, an electric engine may possess up to 4 liters, or more, of air within the motor-gearbox housing which is in contact with engine oil. Embodiments of a motor-gearbox housing may equalize internal and external pressure using a breather. Embodiments of a breather may include it protruding above nearby design features to prevent inadvertent entry of external fluids. Some embodiments may include a breather that possesses a screen and a circuitous entry path to prevent entry of external debris. Embodiments may include a sight glass being present on both the tilt and lift electric engines in order to check that oil is not overfilled or underfilled during servicing.

Some embodiments of electric engines may include active protection features in the forward and aft electric engines such as monitoring vibration throughout the engine and internal temperatures such as oil temperature, stator winding set temperature, inverter bulk capacitor temperature, power module temperature, control board power module temperature, control board control processor temperature, control board monitor processor temperature, internal hot-spot temperatures, and other various operating conditions throughout the engine as needed. Such monitoring may be accomplished using various sensors positioned throughout the electric propulsion system and aircraft. Embodiments may include vibration limits based on known failure points or resonances of components and overtemperature limits set based on known failure temperatures and operating limits in relation to auto-ignition temperatures of fluids. In some embodiments, the various sensors used to monitor the operating conditions throughout the engine may report operating conditions to the flight control system. Some embodiments may include a threshold operating value that may be required before an operating value is sent to, or flagged by, the flight control system. In some embodiments, a flight control system may, in response to detecting an operating condition, act to reduce the amount of power directed to an electric propulsion system. Some embodiments may include reducing the amount of power to an electric propulsion system to reduce mechanical wear or friction sparks from vibrations and/or reducing power in an effort to reduce the temperature of components present within the electric propulsion system. Further, some embodiments may include reducing power to an electric propulsion system where a detected efficiency of an inverter is less than a targeted efficiency. In some embodiments, for example where twelve electric propulsion systems are present within the aircraft, a flight control system may act to reduce power, or terminate power, to a single electric propulsion system while increasing the power directed to the remaining electric propulsion systems, or a subset thereof, to counter reduction in lift produced by the one electric propulsion system. In some embodiments, the flight control system may establish various thresholds of operating conditions to correspond with the reduction or increase of power to an electric propulsion system.

Some embodiments may include a High Voltage Power System that may have fuses at the high voltage battery terminals which may rapidly and irreversibly disconnect the engine electrical connection to mitigate and avoid overcurrent events. Such overcurrent protection may be activated when the electric engine current draw is greater than the Overcurrent operating. As such, in some embodiments, failure conditions which lead to overcurrent may only lead to a transient overheating, arc or spark faults. Some embodiments may include a fire threat characterization test ignition source that may be selected to be a more severe ignition source than a short occurring in the electric engine and being opened by the engine fuse. In some embodiments, an inverter may detect AC overcurrent and isolate the erroneous phase and/or will continuously monitor input DC voltage, and will apply protective actions to keep voltages under the overvoltage operating limit.

During takeoff, landing, hover and cruise, motors and related control components of the VTOL aircraft may generate heat. The heat must be dissipated to prevent degradation or damage to the motor, control components and other elements of the VTOL aircraft. For some types of VTOL aircraft, such as electric VTOL (eVTOL) aircraft, thermal control is likewise important to maintain optimal energy efficiency of, e.g., battery-powered components.

Some elements may generate high thermal loads only during certain operational periods. For example, some lift propellers may be used only during takeoff, landing, and hover, and may be shut off during cruise. Therefore, such lift propellers may generate a high thermal load during takeoff, landing, and hover, and generate little or no heat during cruise.

B. Exemplary Electric Propulsion System Embodiments

As described herein, embodiments of an electric engine may include an inverter assembly, a gearbox assembly, and an electric motor assembly, or various combinations thereof. In some embodiments, the inverter assembly, the gearbox assembly, and the electric motor assembly may be substantially aligned along a central axis of the electric engine. As disclosed herein, these assemblies or combinations thereof may be substantially aligned along an axis by sharing a common axis or having parallel axes that are within a distance less than or equal to 5% of the outer diameter of the component with the largest diameters of one another. For example, the inverter assembly, the gearbox assembly, and the electric motor assembly may be substantially aligned along a central axis where the central axis of the inverter assembly, the central axis of the gearbox assembly, and the central axis of the electric motor assembly are within a distance less than or equal 5% of the outer diameter of the electric motor assembly where the electric motor assembly possesses a greater outer diameter than the gearbox assembly and inverter assembly. It should be understood that the embodiments described herein are only exemplary and while certain components of the electric propulsion system may be shown to abut others, all configurations of abutting may be present. For example, a gearbox assembly may be shown to abut an inverter assembly and an electric motor assembly. Further, in some embodiments an inverter assembly may abut a gearbox assembly and an electric motor assembly. Some embodiments may include an electric motor assembly abutting a gearbox assembly and an inverter assembly.

In some embodiments, each of the inverter assembly, the gearbox assembly, and the electric motor assembly may abutting at least one of the other assemblies. Abutting may include direct or indirect contact between the components comprising an assembly or housings wherein an assembly is located. In some embodiments, an electric engine may include an inverter assembly and an electric motor assembly without a gearbox assembly. Some embodiments of an electric engine may include an electric motor assembly and a gearbox assembly without an inverter assembly, or an electric motor assembly without a gearbox assembly or an inverter assembly.

FIGS. 11A-11C are cross-sectional illustrations of exemplary electric propulsion systems of a VTOL aircraft, consistent with disclosed embodiments FIG. 11A illustrates an example of an electric propulsion system. In some embodiments, an electric engine may directly assist in the propulsion of propellers for an aircraft. Electric engine 1100A may include a motor housing 1102A. Electric engine 1100A may also include an electric motor assembly comprising components such as a stator 1104A, rotor magnet 1106A, and rotor 1108A. In some embodiments, a rotor 1108A may be mechanically coupled to a main shaft 1110A such that the main shaft 1110A spins at a speed equivalent to the rotation speed of the rotor 1108A. The main shaft 1110A may be mechanically coupled to shaft flange assembly 1112A. In some embodiments, a shaft flange assembly 1112A may be an anchoring point for propellers. The electric motor assembly may be substantially aligned along central axis 1114A.

In some embodiments, an electric engine may include a gearbox. FIG. 11B illustrates an example of an electric engine. In some embodiments, an electric engine may include an electric motor assembly and a gearbox assembly substantially aligned along a shaft. In some embodiments, an electric motor assembly, a gearbox assembly, and a shaft may be substantially aligned along an axis 1114B. Electric engine 1100B may include a motor housing 1102B, stator 1104B, rotor magnet 1106B, and rotor 1108B. In some embodiments, the rotor 1108B may be mechanically coupled to a main shaft 1110B such that the main shaft 1110B spins at a speed equivalent to the speed of the rotor 1108B. A main shaft 1110B may be mechanically coupled to a shaft flange assembly 1112B such that the shaft flange assembly 1112B, and by extension a propeller assembly not shown, may rotate at a speed equal to the speed of rotation of the main shaft 1110B. In some embodiments, a gearbox assembly may provide a gear reduction and change the speed of rotation of the main shaft 1110B. For example, electric engine 1102B may include gearbox assembly comprising a sun gear 1116B, planetary gears 1118B, ring gear 1020B, and planetary carrier 1122B. In some embodiments, a sun gear 1116B may be mechanically coupled to the main shaft 1110B such that the sun gear 1116B rotates at a speed equal to that of the main shaft 1110B. A sun gear 1116B may interface with planetary gears 1118B that also interface with a ring gear 1120B. In such an embodiment where the sun gear 1116B is rotating, the ring gear 1120B may be fixed to the motor housing 1102B. In some embodiments, the planetary gears 1118B may rotate around the sun gear 1116B due to their interaction with the rotating sun gear 1116B and fixed ring gear 1120B. A planetary carrier 1122B may be mechanically coupled to planetary gears 1118B and may rotate at an equivalent speed. Some embodiments may include a planetary carrier 1122B mechanically coupled to the main shaft 1110B. In some embodiments, a main shaft 1110B may include multiple phases of the shaft or layers of the shaft such that portions of the shaft may rotate at different speeds. Some embodiments may include a first portion of the main shaft rotating at a speed equivalent to the speed of the rotor 1108B and another portion of the main shaft rotating at a speed equivalent to the speed of the planetary carrier 1122B. In some embodiments, a speed of the planetary carrier may be less than the speed of the rotor 1108B.

In some embodiments, an electric engine 1100B may include bearings 1124B, 1126B aligned along the main shaft 1110B. Some embodiments may include an inner race of bearings 1124B, 1126B that are mechanically coupled to the planetary carrier and various bearings such as 1124B and 1126B.

FIG. 11C illustrates an example of an electric propulsion system. In some embodiments, an electric propulsion system may include an electric motor assembly and a gearbox assembly substantially aligned along a shaft. In some embodiments, an electric motor assembly may be positioned between a gearbox assembly and a shaft flange assembly. Electric propulsion system 1100C may include a motor-gearbox assembly housing 1102C. In some embodiments, an electric propulsion system 1100C may comprise an electric motor assembly including a stator 1104C, rotor magnet 1106C, and rotor 1108C. Electric propulsion system 1100C may also include a gearbox assembly. In some embodiments, a gearbox assembly may comprise a sun gear 1116C, planetary gears 1118C, ring gear 1120C, and a planetary carrier 1122C. A sun gear 1116C may interface with planetary gears 1118C that also may interface with a ring gear 1120C. Sun gear 1116C may be mechanically coupled to rotor 1106C, such that the rotation of rotor 1106C may rotate the sun gear 1116C at the same speed of rotation. A planetary carrier 1122B may be mechanically coupled to planetary gears 1118C and may rotate at an equivalent speed. Some embodiments may include a planetary carrier 1122C mechanically coupled to the main shaft 1110C. A main shaft 1110C may be mechanically coupled to a shaft flange assembly 1112C. Main shaft 1110C may be substantially aligned along central axis 1114C, such that the gearbox assembly and motor assembly are also substantially aligned along central axis 1114C. In some embodiments, an electric propulsion system 1100C may comprise a heat exchanger 1124C that may be used to cool oil or liquid used to cool or lubricate components of the gearbox assembly or electric motor assembly.

Electric propulsion systems 1100A-C, as discussed above, are exemplary embodiments. However, it is understood that while electric propulsion system 1100A may be capable of providing required thrust to a VTOL aircraft, it may creating a larger drag profile and contribute more mass to the VTOL aircraft than electric propulsion systems 1100B and 1100C. Electric propulsion systems 1100B and 1100C comprise gearbox assemblies. As such, the electric propulsion systems 1100B and 1100C possess a gear reduction that allows the electric motor assembly, and thus the electric propulsion systems, to possess smaller drag profiles and less mass.

Electric propulsion system 1100B may possess a gearbox assembly between an electric motor assembly and a shaft flange assembly. While this configuration may require less mass than electric propulsion system 1100A, it may require more mass than electric propulsion system 1100C. Electric propulsion system 1100B may possess a gearbox assembly such that an input shaft, or sun gear, travels from the electric motor assembly to the gearbox assembly and an output shaft, or portion of planetary carrier, travels from the gearbox assembly to the shaft flange assembly. Whereas electric propulsion system 1100C, in some embodiments, may possess a sun gear that travels from the rotor of the electric motor assembly to the gearbox assembly and a main shaft, coupled to a planetary carrier or carrier cover, that travels through the sun gear, past the electric motor assembly to a shaft flange assembly. As such, electric propulsion system 1100C may comprise a more compact design, housing, and drag profile when compared to electric propulsion system 1100B. This may result in a more efficient drag profile and a more mass efficient system. Further, electric propulsion system 1100B may possess a gearbox assembly without means of lubrication which may limit the run time of the electric propulsion system. Electric propulsion system 1100C may comprise a heat exchanger to cool and lubricate portions of the systems, including the gearbox assembly. This may lead to additional efficiency and long flight range times.

Figure 49:
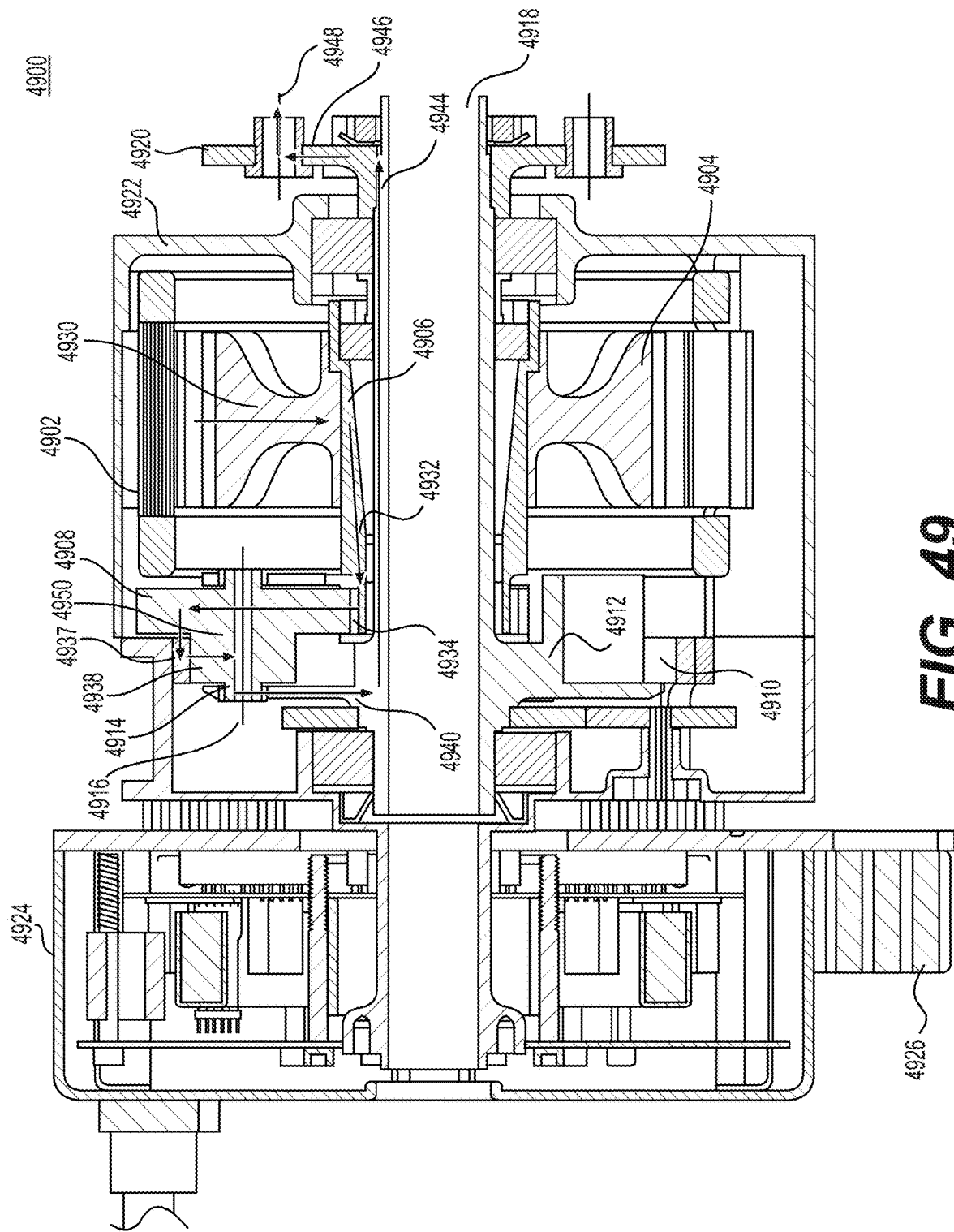
FIG. 49 is an illustration of a cross sectional view of an exemplary electric propulsion system of a VTOL aircraft, consistent with disclosed embodiments.

FIG. 49 illustrates a cross sectional view of an exemplary electric propulsion system of a VTOL aircraft, consistent with disclosed embodiments. Electric propulsion system 4900 may comprise system that initially sends torque away from a propeller to then bring the torque back through portions of the system to the propeller. In some embodiments, electric propulsion system 4900 may comprise a motor-gearbox assembly housing 4922, an inverter assembly housing 4924, and a heat exchanger 4926. In some embodiments, an electric motor assembly may include a stator 4902 and a rotor 4904. In some embodiments, electric propulsion system 4900 may comprise a gearbox assembly comprising a sun gear 4906, planetary gear 4908, ring gear 4910, and a planetary carrier 4912. A sun gear 4906 may be mechanically coupled to a rotor 4904. A sun gear 4906 may interface with planetary gear 4908. Planetary gear 4908 may interface with a ring gear 4910, that may be fixed, such that the planetary gear 4908 rotate about the sun gear 4906 against the ring gear 4910. In some embodiments, a planetary gear 4908 may comprise a compound planetary gear 4908, 4950. A planetary carrier 4912 may be mechanically coupled to planetary gear 4908 via a shaft 4914 that may extend from the planetary gear 4908, along a central axis 4916 of the planetary gear, and be received by planetary carrier 4912. Planetary carrier 4912 may rotate at a rate of speed equal to that of the planetary gear 4908. Planetary carrier 4912 may be mechanically coupled to a main shaft 4918 such that the main shaft 4918 may rotate at a rate of speed equal to that of the planetary carrier 4912. In some embodiments, a planetary gear 4908 may be mechanically coupled to a carrier cover via a shaft such that the carrier cover may rotate at a rate of speed equal to that of the planetary gear 4908. Main shaft 4918 may be mechanically coupled to a shaft flange assembly 4920 such that shaft flange assembly 4920 may rotate at a rate of speed equal to that of the main shaft 4918. It should be understood that a planetary gear 4908 or compound planetary gear 4908, 4950 may comprise multiple planetary gears rotating about a sun gear 4906.

Due to the mechanical coupling as described herein, torque may be transferred from the rotor 4904 to sun gear 4906 along path 4930. The sun gear 4906 may transfer torque to planetary gear 4908 along paths 4932 and 4934. The planetary gear 4908, and in some embodiments compound planetary gear 4908, 4950, may transfer torque to planetary carrier along paths 4936 and 4938. The planetary carrier may transfer torque to the main shaft 4918 along paths 4940. The main shaft 4918 may transfer torque along its length, via path 4944 and to a propeller assembly 4920. A propeller assembly 4920 may transfer torque to propellers via paths 4946 and 4948. It should be understood that the paths discussed above are exemplary and all configurations consisting of sending torque away from a propeller to a gearbox assembly and then sending the torque back through the gearbox assembly and electric motor assembly to the propellers are considered.

In some embodiments, a process of delivering power from an electric engine using a gearbox assembly via a reverse torque path may comprise driving a planetary gear that is mechanically coupled to a rotor of an electric motor assembly. In some embodiments, the planetary gear may interface with a sun gear and a ring gear. Some embodiments may include a hollow sun gear and a fixed ring gear. Some embodiments may include driving a planetary carrier that is connected a shaft that extends from the planetary gear. A shaft that extends from a planetary gear may include a shaft aligned along a central axis of the planetary gear. Some embodiments may include driving a carrier cover that is connected to a shaft from a shaft that extends concentrically from the planetary gear. Some embodiments may include driving a main shaft. Driving a main shaft may comprise driving a first portion of the main shaft that is mechanically coupled to the carrier cover and transferring torque along the main shaft to a second portion of the main shaft that is mechanically coupled to a propeller assembly. Some embodiments may include a heat exchanger, as described herein, that may cool the gearbox assembly using various amounts of oil that may comprise one quart, 1.5 quarts, two quarts, 2.5 quarts, three quarts, or five quarts.

In some embodiments, a gearbox assembly may include multiple sets of gearboxes. For example, in some embodiments, the output of a gearbox assembly may be fed into another gearbox assembly to achieve a greater gear reduction. Such embodiments may include at least one sun gear, at least one set of planetary gears, at least one ring gear, and at least one planetary carrier. The gearboxes may possess common gears such as a common sun gear, a common set of planetary gears, and a common ring gear. The embodiments discussed herein may be modified to include multiple sets of gearboxes.

Figure 53:
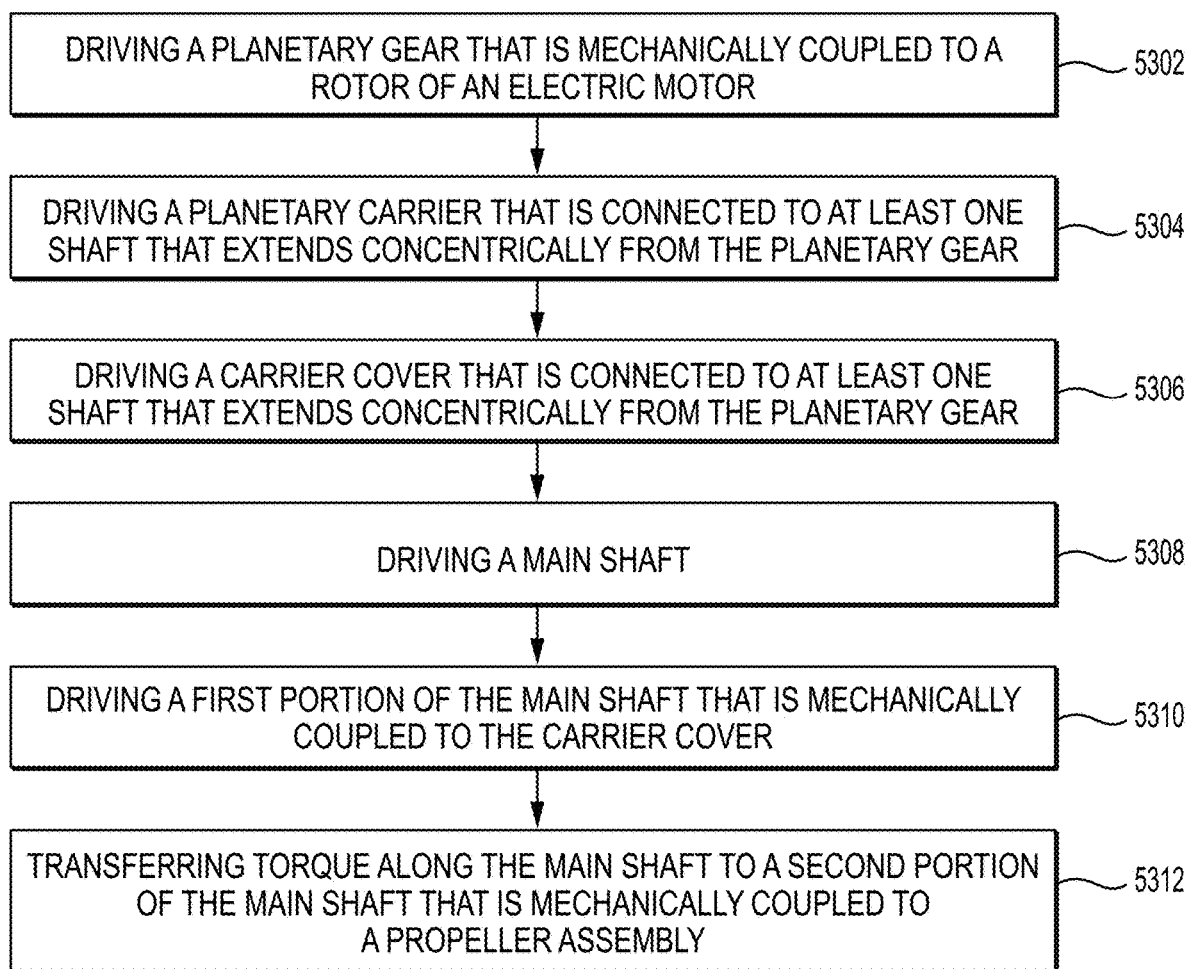
FIG. 53 is a flow chart of an exemplary process for transmitting torque from an electric motor assembly to a propeller assembly of a VTOL aircraft, consistent with disclosed embodiments.

FIG. 53 illustrates flow chart of an exemplary process for transmitting torque from an electric motor assembly to a propeller assembly of a VTOL aircraft 5300, consistent with disclosed embodiments. While the block diagram may be described below in connection with certain implementation embodiments presented in other figures, those implementations are provided for illustrative purposes only, and are not intended to serve as a limitation on the block diagram.

FIG. 53 includes process blocks 5302 to 5312. At block 5302, a process for delivering power from an electric engine using a gearbox assembly may include driving a planetary gear that is mechanically coupled to a rotor of an electric motor, consistent with the discussion throughout this disclosure.

At block 5304, a process for delivering power from an electric engine using a gearbox assembly may include driving a planetary carrier that is connected to at least one shaft that extends concentrically from the planetary gear, consistent with the discussion throughout this disclosure.

At block 5306, a process for delivering power from an electric engine using a gearbox assembly may include driving a carrier cover that is connected to at least one shaft from a set of shafts that extends concentrically from the planetary gear, consistent with the discussion throughout this disclosure.

At block 5308, a process for delivering power from an electric engine using a gearbox assembly may include driving a main shaft, consistent with the discussion throughout this disclosure.

At block 5310, a process for delivering power from an electric engine using a gearbox assembly may include driving a first portion of the main shaft that is mechanically coupled to the carrier cover, consistent with the discussion throughout this disclosure.

At block 5312, a process for delivering power from an electric engine using a gearbox assembly may include transferring torque along the main shaft to a second portion of the main shaft that is mechanically coupled to a propeller assembly, consistent with the discussion throughout this disclosure.

FIGS. 12A-12D are illustrations and block diagrams of exemplary electric propulsion systems of a VTOL aircraft, consistent with disclosed embodiments.

As described herein, an electric propulsion system may include an inverter assembly, gearbox assembly, and engine assembly. In some embodiments, the electric propulsion system 1200A may include components packaged in various housings including a motor-gearbox assembly housing 1202A and an inverter assembly housing 1228A. Enclosing the various components of electric propulsion system 1200A in housings 1202A and 1228A may provide various benefits, including lower mass and a more efficient drag profile, as described herein. Further, in some embodiments, the gearbox assembly, inverter assembly, and/or electric motor assembly may possess a substantially circular profile. As used herein a profile may be substantially circular where the length of a minor axis of a circular shape and the length of a major axis of a circular shape possess a relationship such that the length of the minor axis is at least a threshold amount, such as 80%, of the length of the major axis. Further, in some embodiments, the gearbox assembly, inverter assembly, and electric motor assembly, or a subset of those listed, may be sized such that the assemblies possess substantially equivalent radii. As used herein assemblies may possess substantially equivalent radii where the difference among the radii between two assemblies is less than a threshold amount, such as 10%, of the radius of the largest assembly. In some embodiments, the profile of components making up the electric propulsion system as described herein may include various polygons such as hexagons, heptagons, octagons, nonagons, decagons, and additional polygons have more than ten sides.

Electric propulsion system 1200A may include an electric motor assembly, including stator 1204A, rotor magnet 1206A, and rotor 1208A.

In some embodiments, the electric motor assembly may interact with, and in some embodiments transfer toque to, a gearbox assembly. Electric propulsion system 1200A may include a gearbox assembly, comprising a sun gear 1214A, a set of planetary gears 1216A, a planetary carrier 1218A, and a carrier cover 1220A. Some embodiments may include a sun gear 1214A having teeth that interact with teeth of the planetary gears 1216A, and a ring gear (not picture here in this figure) having teeth that also interact with the teeth of the planetary gears 1216A. In some embodiments, a shaft 1222A may extend through or from the planetary gears 1216A. In some embodiments, the planetary carrier 1218A may receive a first end of the shafts 1222A such that the planetary carrier 1218A may rotate at the same rate as the planetary gears 1216A. In some embodiments, the carrier cover 1220A may receive a second end of the shafts 1222A such that the carrier cover 1220A may rotate at the same rate as the planetary gears 1216A. In some embodiments, the planetary gears 1216A, planetary carrier 1218A, and carrier cover 1220A may be mechanically coupled along the axis of shaft 1222A.

In some embodiments, electric propulsion system 1200A may include a main shaft 1210A that may be mechanically coupled to a shaft flange assembly 1224A to provide mechanical shaft power to turn the propellers of a propeller assembly. As used herein, components may be mechanically coupled where there exists any connections or coupling, whether direct or indirect, between two components. A shaft flange assembly may include a flange that is coupled to a main shaft with a splined connection to take torque loads from the main shaft and transfer the torque to the propellers that coupled to the flange. A flange may also be coupled to a main shaft using fasteners, by welding, by brazing, or any other use of components or methods to couple the main shaft and the flange. In some embodiments, a main shaft and a flange may be machined together to form a single component. In some embodiments, a shaft flange assembly may be a component of a propeller assembly that may comprise a shaft flange assembly, propellers, and a spinner. In some embodiments, a shaft flange assembly may also be referred to as a propeller hub.

In some embodiments, electric propulsion system 1200A may include components for an inverter assembly, as described herein. For example, electric propulsion system 1200A may include printed circuit board assemblies (PCBAs) such as a power PCBA 1230A that may comprise power modules 1232A, a gate drive PCBA 1236A, and a control PCBA 1240A, Some embodiments of the inverter assembly of the electric propulsion system 1200A may also include a spacer board 1238A among the various PCBAs. Further, some embodiments may include an energy storage device, for example a DC capacitor that may be stored within the DC capacitor housing 1234A. Some embodiments of an inverter assembly may also include busbar connectors 1244A to supply alternating current to the electric motor assembly. Some embodiments of an inverter assembly may include power connections 1246A coupled to a high voltage connector to deliver high voltage power to the inverter assembly.

Some embodiments of an inverter assembly of the electric propulsion system 1200A may include layering the respective inverter assembly components in a stacking formation along guide pins 1242A that extend through each layer of the inverter assembly. It is recognized that an inverter assembly utilizing a stacking formation along guide pins 1242A may be beneficial in various design criteria relevant for VTOL aircrafts. For example, a stacking formation may allow for a more compact packaging of the inverter assembly, and thus may help in minimizing the mass of the electric propulsion system 1200A and minimize the drag experienced due to the electric propulsion system packaging. Further, a stacking formation of the inverter assembly may be advantageous from a manufacturing perspective as a stacking formation may allow for tolerances within various parts of the inverter assembly. In some embodiments, structural components may be introduced to the inverter assembly to assist in supporting the stacking formation with loads experienced during various phases of flight. Some embodiments may include inverter assembly components also acting as structural components. For example, a DC capacitor housing 1234A may house the capacitor, as well as other components, for the inverter assembly and may be made of a plastic, or other material, capable of supporting the PCBAs and other components surrounding it.

In some embodiments, an electric propulsion system 1200A may include a heat exchanger 1226A coupled to the motor-gearbox assembly housing 1202A and an inverter assembly housing 1228A. A heat exchanger 1226 may be coupled to a dividing plate comprising a thermal plate 1248A and an end bell plate 1250A. An end bell plate 1250A may serve to close off the motor-gearbox assembly housing 1202A. A thermal plate 1248A may serve to close off the inverter assembly housing 1228A. In some embodiments, a dividing plate may serve as an integral mounting bracket for supporting heat exchanger 1226A. Heat exchanger 1226A may comprise, e.g., a folded fin or other type of heat exchanger. In some embodiments, the electric propulsion system 1200A may circulate oil or other coolant throughout the electric motor assembly, gearbox assembly, or inverter assembly to transfer heat generated from the components to the oil or other coolant liquid. The heated oil or other coolant liquid may be circulated through the fins of heat exchanger 1226A by an internal liquid flow paths which may possess an inlet and outlet for the liquid flow paths that may be coupled to an outlet and inlet, respectively, of the bores or grooves that may be present on the dividing plate. In some embodiments, a motor-gearbox housing 1202A may comprise a sump 1212A. A sump 1212 may serve to collect oil or liquid coolant distributed throughout the electric propulsion system 1200A and recirculate the oil or liquid coolant.

In some embodiments, a heat exchanger may be fluidically coupled to the gearbox assembly, inverter assembly, and/or electric motor assembly. As used herein, an assembly, or components therein, may be fluidically coupled where a liquid flow path from the heat exchanger may interact with, supply liquid to, or interface with the assembly or components therein.

FIG. 12B illustrates an exemplary schematic diagram of a configuration of an electric propulsion system 1200B. In some embodiments, the electric propulsion system may include a motor assembly and gearbox assembly. Electric propulsion system 1200B divider plate 1208B, motor assembly 1202B, inverter assembly 1204B, gearbox assembly 1206B, heat exchanger 1212B, and propeller assembly 1210B. In some embodiments, inverter assembly housing 1216B may enclose inverter assembly 1204B, and motor-gearbox housing 1214B may enclose motor assembly 1202B and gearbox assembly 1206B. Inverter assembly housing 1216B may abut motor-gearbox housing 1214B. In some embodiments, an electric propulsion system 1200B may comprise a gearbox assembly 1206B positioned between an electric motor assembly 1202B and inverter assembly 1204B. As described herein, a coolant or lubricant, such as oil, may be distributed throughout the electric propulsion system. For example, oil flow 1218B may have a path from heat exchanger 1212B to divider plate 1208B, then to gearbox assembly 1206B and motor assembly 1202B, providing cooling and lubrication to motor assembly 1202B and gearbox assembly 1206B. Oil flow 1218B may then travel from motor assembly 1202B back to heat exchanger 1212B. As described herein, propeller assembly 1210B may drive air flow 1220B from propellers towards heat exchanger 1212B. Heat exchanger 1212B may transfer heat from oil flow 1218B to air flow 1220B. Oil flow 1218B may be cooled and exit heat exchanger 1212B.

FIG. 12C illustrates an exemplary schematic diagram of a configuration of an electric propulsion system. In some embodiments, the electric propulsion system 1200C may include a divider plate 1208C, motor assembly 1202C, inverter assembly 1204C, gearbox assembly 1206C, heat exchanger 1212C, and propeller assembly 1210C. In some embodiments, inverter assembly housing 1216C may enclose inverter assembly 1204C, and motor-gearbox housing 1214C may enclose motor assembly 1202C and gearbox assembly 1206C. Inverter assembly housing 1216C may abut motor-gearbox housing 1214C. In some embodiments, an electric propulsion system 1200C may comprise an electric motor assembly 1202C positioned between a gearbox assembly 1206C and inverter assembly 1204C. As described herein, a coolant or lubricant, such as oil, may be distributed throughout the electric propulsion system. For example, oil flow 1218C may have a path from heat exchanger 1212C to divider plate 1208B, then to motor assembly 1202C and then to gearbox assembly 1206C, providing cooling and lubrication to motor assembly 1202C and gearbox assembly 1206C. Oil flow 1218C may then travel from motor assembly 1202C back to heat exchanger 1212C. As described herein, propeller assembly 1210C may drive air flow 1220C from propellers towards heat exchanger 1212C. Heat exchanger 1212C may transfer heat from oil flow 1218C to air flow 1220C. Oil flow 1218C may be cooled and exit heat exchanger 1212C.

Figure 12A:
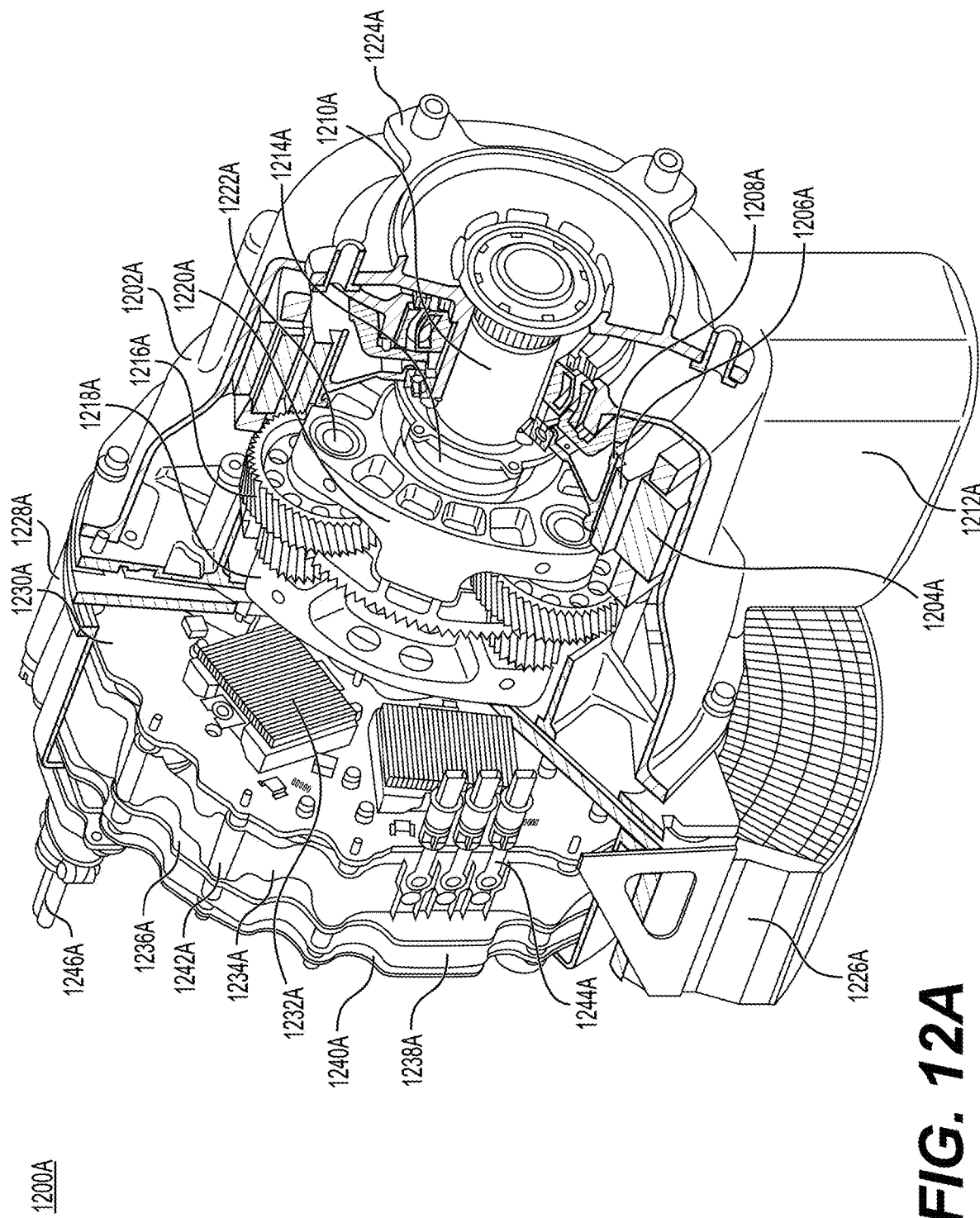
Figure 12D:
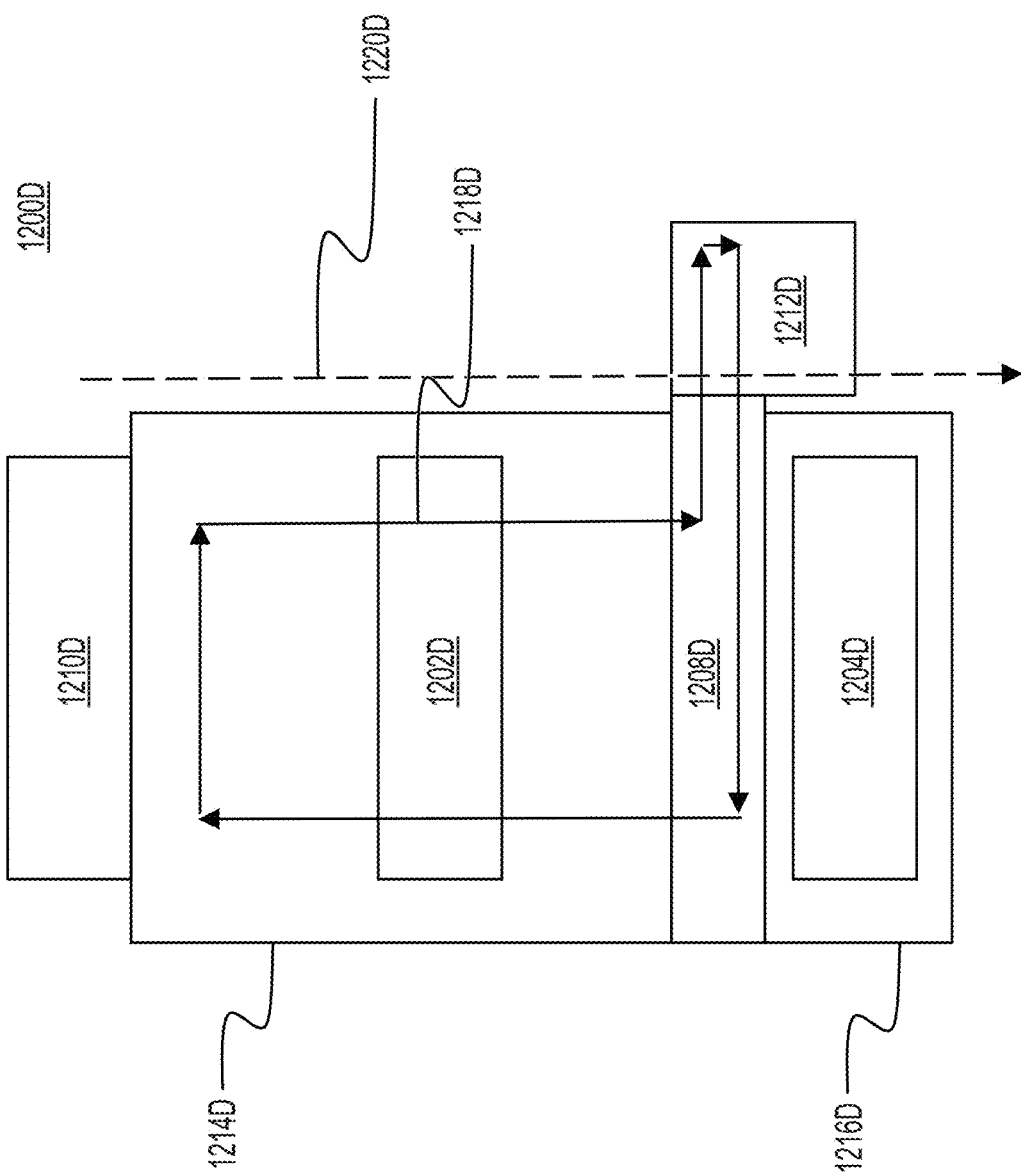

FIG. 12D illustrates an exemplary schematic diagram of a configuration of an electric propulsion system. In some embodiments, the electric propulsion system may comprise a motor and propeller assembly. Electric propulsion system 1200D may include a divider plate 1208D, motor assembly 1202D, inverter assembly 1204D, heat exchanger 1212D and propeller assembly 1210D. In some embodiments, inverter assembly housing 1216D may enclose inverter assembly 1204D, and motor assembly housing 1214D may enclose motor assembly. Inverter assembly housing 121D may abut motor assembly housing 1214D. In some embodiments, an electric propulsion system 1200C may comprise an electric motor assembly 1202C directly driving a main shaft providing mechanical shaft power to a propeller assembly 1210C. In such embodiments, the main shaft many rotate at a speed equal to the speed of a rotor within the electric motor assembly 1202. As described herein, a coolant or lubricant, such as oil, may be distributed throughout the electric propulsion system. For example, oil flow 1218D may have a path from heat exchanger 1212D to divider plate 1208D, then to motor assembly 1202D, providing cooling and lubrication to motor assembly 1202D and other components of electric propulsion system 1200D. Oil flow 1218D may then travel from motor assembly 1202D back to heat exchanger 1212D. As described herein, propeller assembly 1210D may drive air flow 1220D from propellers towards heat exchanger 1212D. Heat exchanger 1212D may transfer heat from oil flow 1218D to air flow 1220D. Oil flow 1218D may be cooled and exit heat exchanger 1212D.

FIG. 13 is an illustration of an exploded view of an exemplary electric propulsion system of a VTOL aircraft, consistent with disclosed embodiments. Electric engine 1300 may include an inverter assembly 1304, end bell assembly 1306, main shaft assembly 1308, rotor 1310, stator housing 1312, and shaft flange assembly 1314. In some embodiments, inverter assembly 1304 may abut a gearbox assembly. A gearbox assembly may include end bell assembly 1306 and main shaft assembly 1308. In some embodiments, the gearbox assembly may abut an electric motor assembly. The electric motor assembly may include rotor 1310 and stator housing 1312. In some embodiments, components of the electric propulsion system may be substantially aligned along an axis. In some embodiments, the main shaft may represent a central axis that electric propulsion system 1300 components may be substantially aligned along. In alternative embodiments, the sequence of the inverter assembly, gearbox assembly, and motor assembly may be rearranged such that different electric propulsion system components abut each other, as described herein. A housing of the inverter assembly 1304 may be affixed to the thermal plate of the inverter assembly by screws 1302. In some embodiments, fasteners 1316 may affix the electric engine 1300 to a boom of the aircraft.

Figure 14:
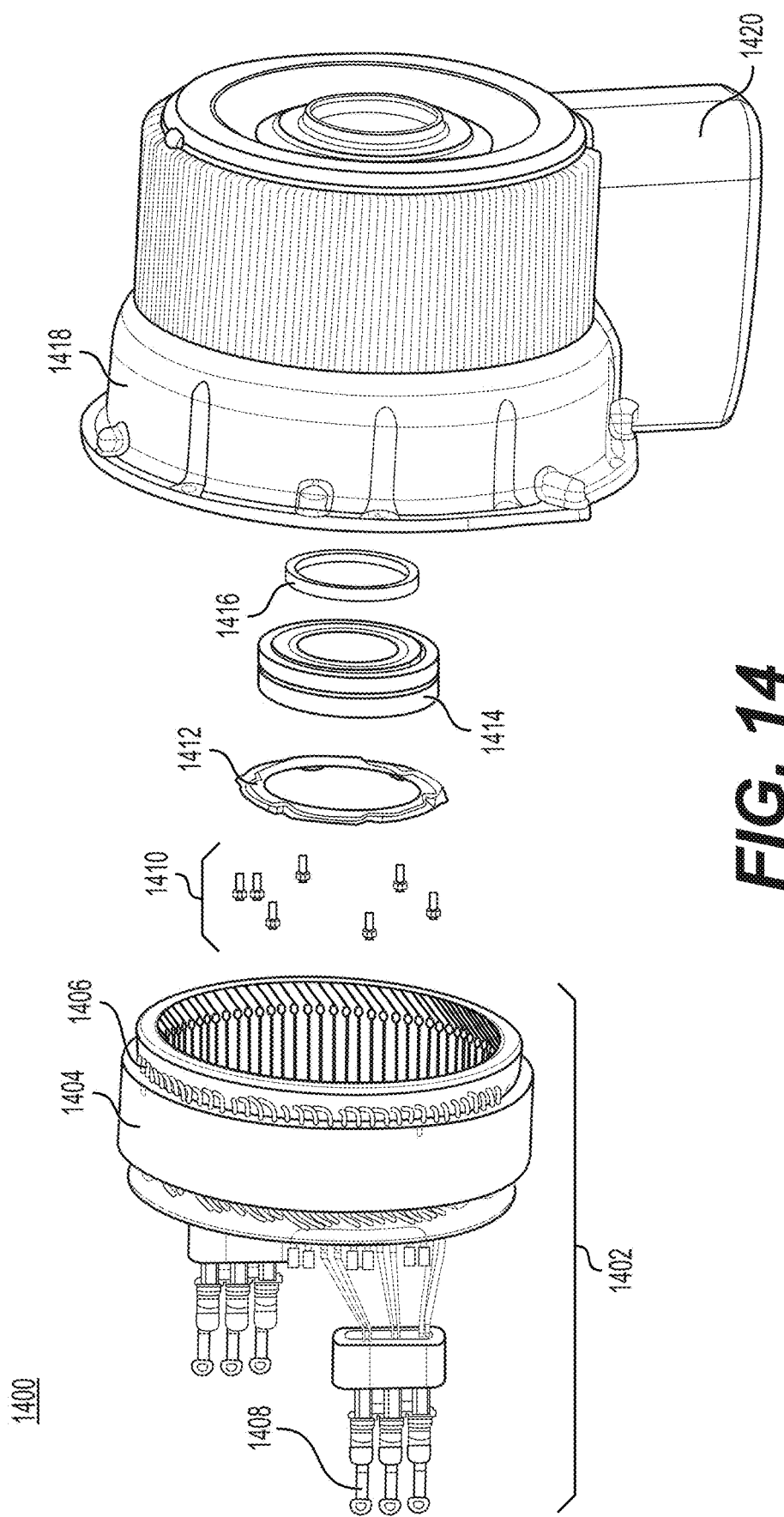
FIG. 14 is an illustration of an exploded view of an exemplary electric motor assembly of a VTOL aircraft, consistent with disclosed embodiments.

Embodiments of an electric engine may include an electric motor assembly, as described herein. FIG. 14 is an illustration of an exploded view of an exemplary electric motor assembly of a VTOL aircraft, consistent with disclosed embodiments. Electric motor assembly 1400 may include stator assembly 1402. In some embodiments, a stator may include laminations and coils of insulated wires. In some embodiments, stator assembly 1402 may include permanent magnets. Stator assembly 1402 may include stator core 1404 and wire windings 1406. In some embodiments, wire windings 1406 may be comprised of copper. Stator assembly 1402 may also include busbars 1408. As an example, busbars 1408 may be electrically coupled to stator assembly 1402 and assist in electrical conduction of a current. Electric motor 1400 may include various bearings, including bearing retainer 1412 and roller bearing 1414. Bearing retainer 1412, roller bearing 1414, and shaft seal 1416 may be substantially aligned along a central axis. In some embodiments, bearing retainer 1412 may assist in cooling as a cooling oil manifold. In some embodiments, roller bearing 1414 may comprise a spherical shape. Electric motor 1400 may include bearing screws 1410. Bearing screws 1410 may fasten bearing retainer 1414 to various components of electric motor 1400, including to roller bearing 1414. In some embodiments, stator housing 1418 may enclose the stator assembly 1402, roller bearing 1414, bearing retainer 1412, shaft seal 1416, and bearing screws 1410. Stator housing 1418 may have an interference fit or press fit with stator assembly 1402. For example, stator housing 1418 may have a press fit with stator laminations. In some embodiments, stator housing 1418 may have a thermal interference fit to stator assembly 1402. As an example, stator housing 1418 may be a common housing that packages components of stator 1400 together, providing advantages including mass reduction and elimination of tubes, hoses, and other connectors. In some embodiments, a stator housing 1418 may include a sump 1420 for collecting liquid used in cooling or lubricating the electric propulsion system, as described herein. Further, in some embodiments, additional components of an electric propulsion system may reside within the stator housing to provide further mass reduction.

Figure 15A:
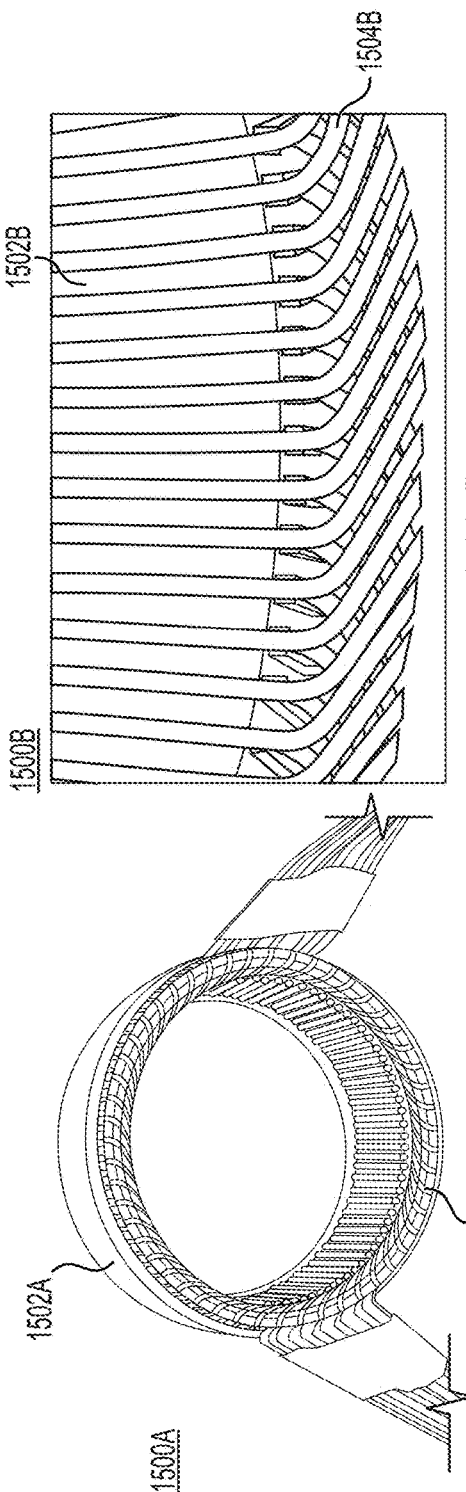
FIGS. 15A-15C are illustrations of stator assemblies of a VTOL aircraft, consistent with disclosed embodiments.
Figure 15B:
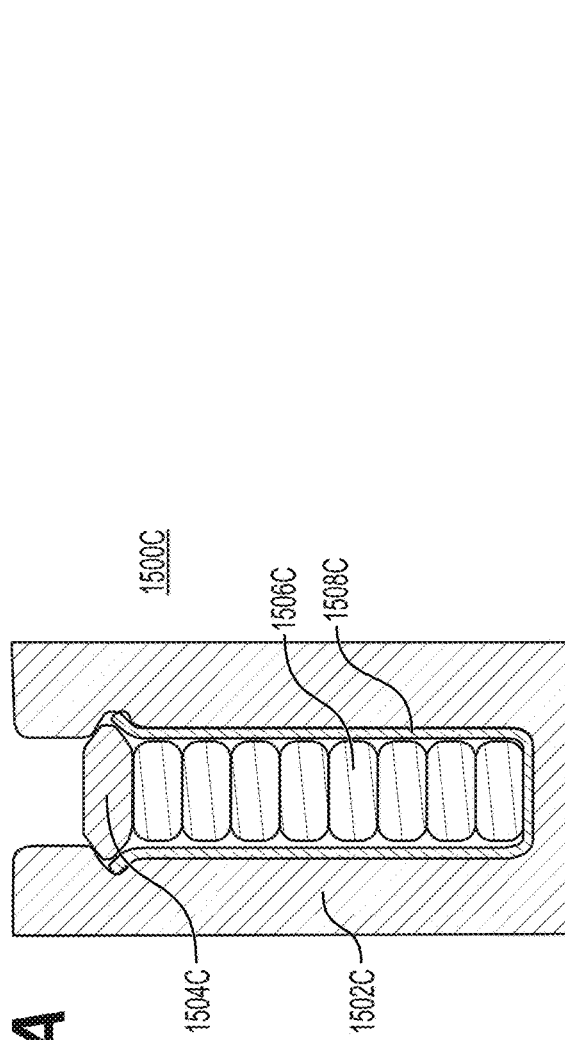
Figure 15C:
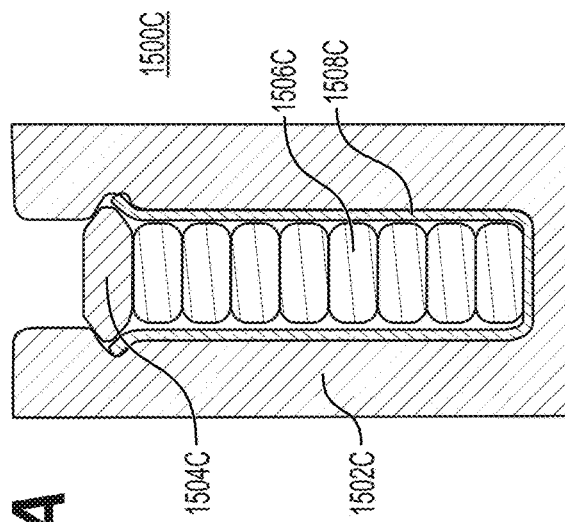

FIGS. 15A-15C are illustrations of stator assemblies of a VTOL aircraft, consistent with disclosed embodiments. FIG. 15A illustrates a view of a stator core. In some embodiments, stator 1500A may include wound stator assembly 1502A, and copper windings 1504A. FIG. 15B illustrates an additional view of a stator core 1500B. Laminations 1502B may separate copper windings 1504B. FIG. 15C depicts an example of a stator slot. As an example, stator core 1500C may include copper windings 1506C, which may be housed in stator iron 1502C. Slot liner 1508C may separate copper windings 1506C from stator iron 1502C. Slot liner 1508C may provide electric insulation. Stator iron 1502C may be contoured to fit slot wedge 1504C, with the slot wedge 1504C residing above the copper windings 1506C. The slot wedge 1504C may hold the copper windings 1506C in place in the stator iron 1502C. In some embodiments, stator laminations may be comprised of stator iron 1502C. Stator laminations may aid in insulating the core and reducing eddy currents or losses. In some embodiments, a stator assembly may include a cavity filled with oil that is posited around the stator to aid in cooling. Such a cavity may be fluidically coupled to a heat exchanger, as described herein.

FIGS. 16A-16C possess like numerals and refer to similar elements of the rotor assemblies 1600A and 1600B. As such, similar design considerations and configurations may be considered throughout the embodiments.

Disclosed embodiments of an electric motor assembly may include a rotor. In some embodiments, the electromagnetic field produced by a stator in an electric motor assembly may drive a rotation of a rotor about an axis.

FIGS. 16A-16B are illustrations of an exploded view and cross-section of rotor assemblies of a VTOL aircraft, consistent with disclosed embodiments. FIG. 16A illustrates an exemplary exploded view of a rotor. Rotor assembly 1600A may comprise a rotor 1602A including a rotor hub 1604A. In some embodiments, rotor hub 1604A may be machined and comprised of aluminum. Rotor 1602A may include laminations 1606A and Halbach array 1608A. Laminations 1606A may have a thermal interference fit to rotor hub 1604A. Rotor 1602A may be enclosed by rotor overwrap 1610A. In some embodiments, rotor overwrap 1610A may be comprised of carbon fiber. Halbach array 1608A may include magnets. Rotor overwrap 1610A may abut Halbach arrays 1608A and apply pressure on the magnets of Halbach array 1608A. In some embodiments, rotor 1602A may include hollow portions. Hollow portions of the rotor may allow for various motor assembly or gearbox assembly components to travel through the rotor 1602A, enabling configurations that may couple components to the rotor 1602A. In some embodiments, an electric motor assembly may be mechanically coupled to a gearbox assembly. Disclosed embodiments include various means of mating a rotor and sun gear. Rotor 1602A may be mechanically coupled to sun gear 1612A and affixed concentrically by various means of connecting and aligning components. Rotor 1602A may be mechanically coupled to sun gear 1612A by various fastening means. As an example, rotor 1602A may be fastened to sun gear 1612A using locking nuts 1620A, dowel pins, or screws 1622A. Bearing 1616A may have an interference fit with rotor assembly 1602A and sun gear 1612A. In some embodiments, sun gear 1612A may include gear teeth 1614A, which may be used in a gearbox assembly as described herein. Sun gear 1612A may comprise a hollow center. In some embodiments, a sun gear 1612A may be mechanically coupled to an oil sleeve 1618A that may assist in distributing cooling or lubricating liquid using centrifugal force during rotation.

FIG. 16B illustrates an additional view of a rotor assembly 1600B. As described herein, rotor 1602B may include rotor hub 1604B, lamination stack 1606B, and Halbach array 1608B. Rotor overwrap 1610B may abut Halbach array 1608B and enclose stator assembly 1602B. Bearing 1616A may include an inner race and outer race. In some embodiments, sun gear 1612B may be mechanically coupled with rotor 1602B. Some embodiments may include mechanically coupling the sun gear 1612B and rotor 1602B using screws 1622B. Bearing 1616B may assist with mechanically coupling rotor 1602B and sun gear 1612B by providing an interference fit. In some embodiments, a main shaft of the electric engine assembly may travel through the bearing 1616B, and thus through the sun gear 1612B and rotor 1602B. Further, some embodiments may include the bearing 1616B serving to support the rotor 1602B, and rotor hub 1604A, with any loads experienced by the rotor 1602B or rotor hub 1604B during normal operation. In some embodiments, the inner surface of the rotor assembly 1602B may possess a diameter equal to the outer race of bearing 1616B. Sun gear 1612B may include gear teeth 1614B. In some embodiments, rotor assembly 1612B and sun gear 1612B may be substantially aligned along a central axis 1624B.

As described herein, disclosed embodiments of an electric propulsion system may include a motor assembly and gearbox assembly. In some embodiments, a gearbox assembly may comprise torque paths that may exert loads. As described herein, an electric propulsion system may include a gearbox assembly and a rotor of an electric motor assembly, both of which may exert loads on a shaft. For example, gyroscopic effects due to the spinning rotor being in motion may exert moment loads. The moment loads may be on a centralized path of the shaft. A gearbox assembly, which may include planetary gears, may share torque through several paths, so the sharing of loads may be dependent on tolerances of components within the electric engine. As such, solutions that support loads and resist moments created by generated torque while maintaining a low mass and drag profile may be advantageous.

Figure 54:
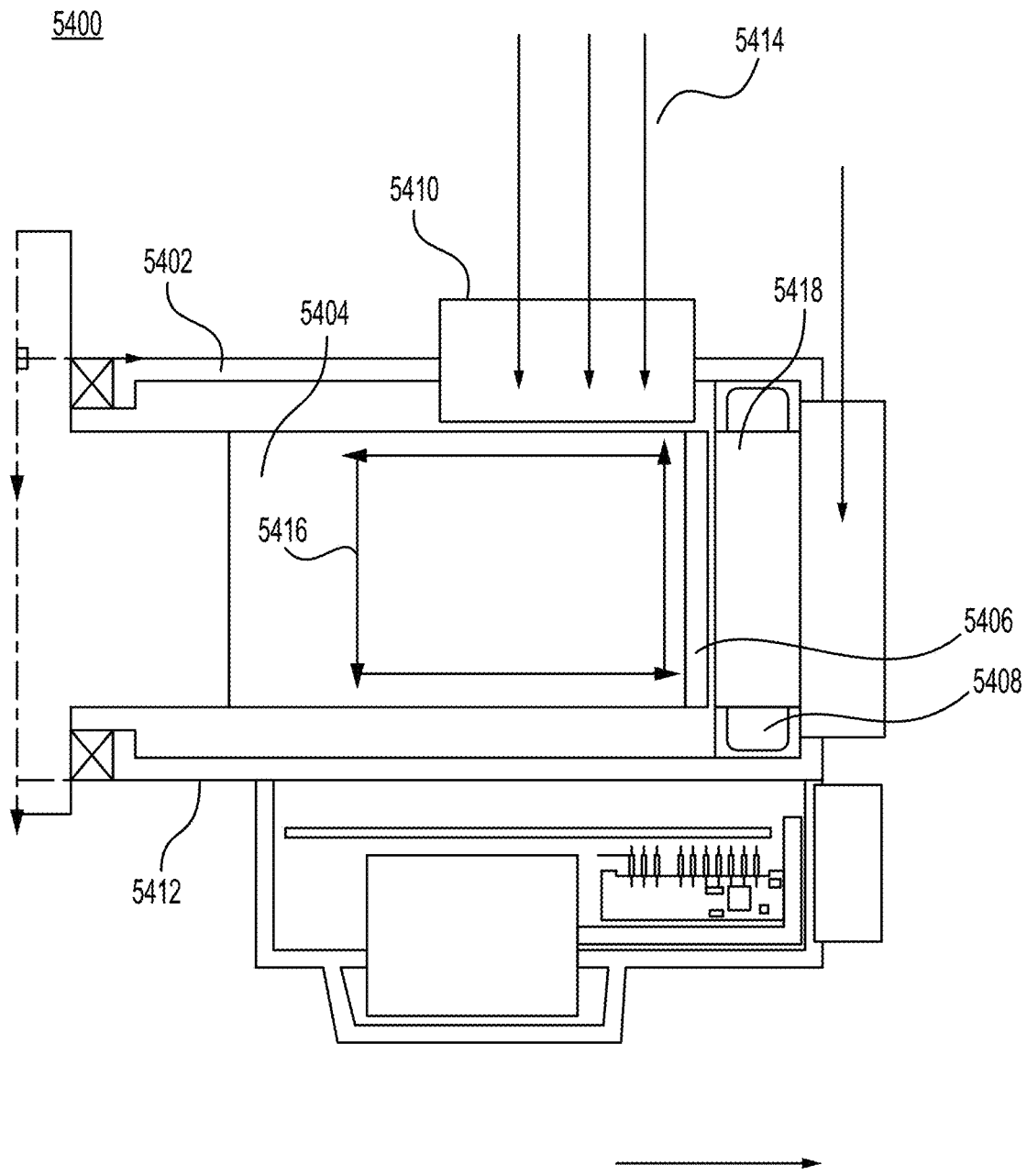
FIG. 54 is a schematic illustration of an exemplary electrical motor assembly in a partial cross-sectional view.

FIG. 54 is a schematic illustration of an exemplary electrical motor assembly in a partial cross-sectional view. As shown in FIG. 54, the electrical motor assembly 5400 may comprise a case 5402 enclosing a sealed environment 5404, with both the rotor 5406 and the stator 5408 (and magnets 5418 as part of the stator 5408) inside the case 5402. In some embodiments, the electrical motor assembly 5404 may be positioned so that the propeller assembly it drives (not shown in FIG. 54) may drive air towards it to provide a cooling effect. Therefore, the side 5410 that faces against the propeller assembly (i.e., faces against the air flow driven by the propeller assembly) is a cool side; the side 5412 that faces away the propeller assembly (i.e., on the back side of the air flow created by the propeller assembly) is a hot side. The air flow 5414 created by the propeller assembly may be used to cool the case 5402, thus making the side 5410 facing the propeller a cool side.

In some embodiments, as shown in FIG. 54, the rotor 5406 may create an air movement 5416 inside the sealed environment 5404 enclosed by the case 5402 from the cool side 5410 towards the hot side 5412 to provide cooling effect to one or more components on the outside of the case 5402 on the hot side 5412. In other words, the heat generated by the one or more components on the outside of the case 5402 on the hot side 5412 dissipates first to the cool side 5410 through the air movement 5416 inside the sealed case 5402, then further dissipates by the air flow 5414 created by the propeller assembly.

In some embodiments, air movement 5416 may also provide a cooling effect to dissipate the heat generated by the magnets 5418 inside the case 5402. The air movement 5416 facilitates heat dissipation from the magnets 5418 by the cooling effect created by the air flow 5414.

Figure 55A:
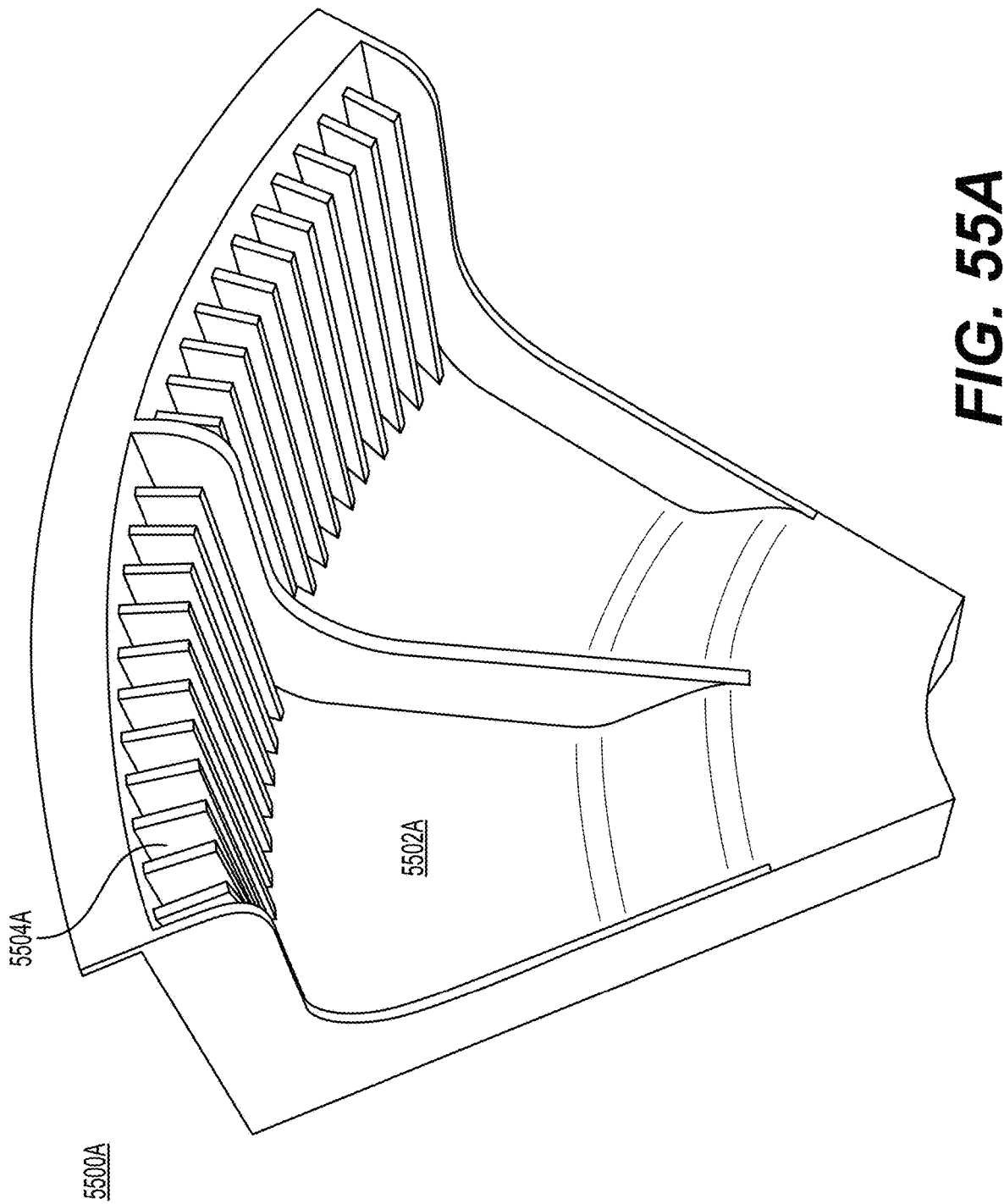
FIGS. 55A-55B are illustrations of inside surfaces of an exemplary rotor hub and an exemplary endplate, consistent with disclosed embodiments.
Figure 55B:
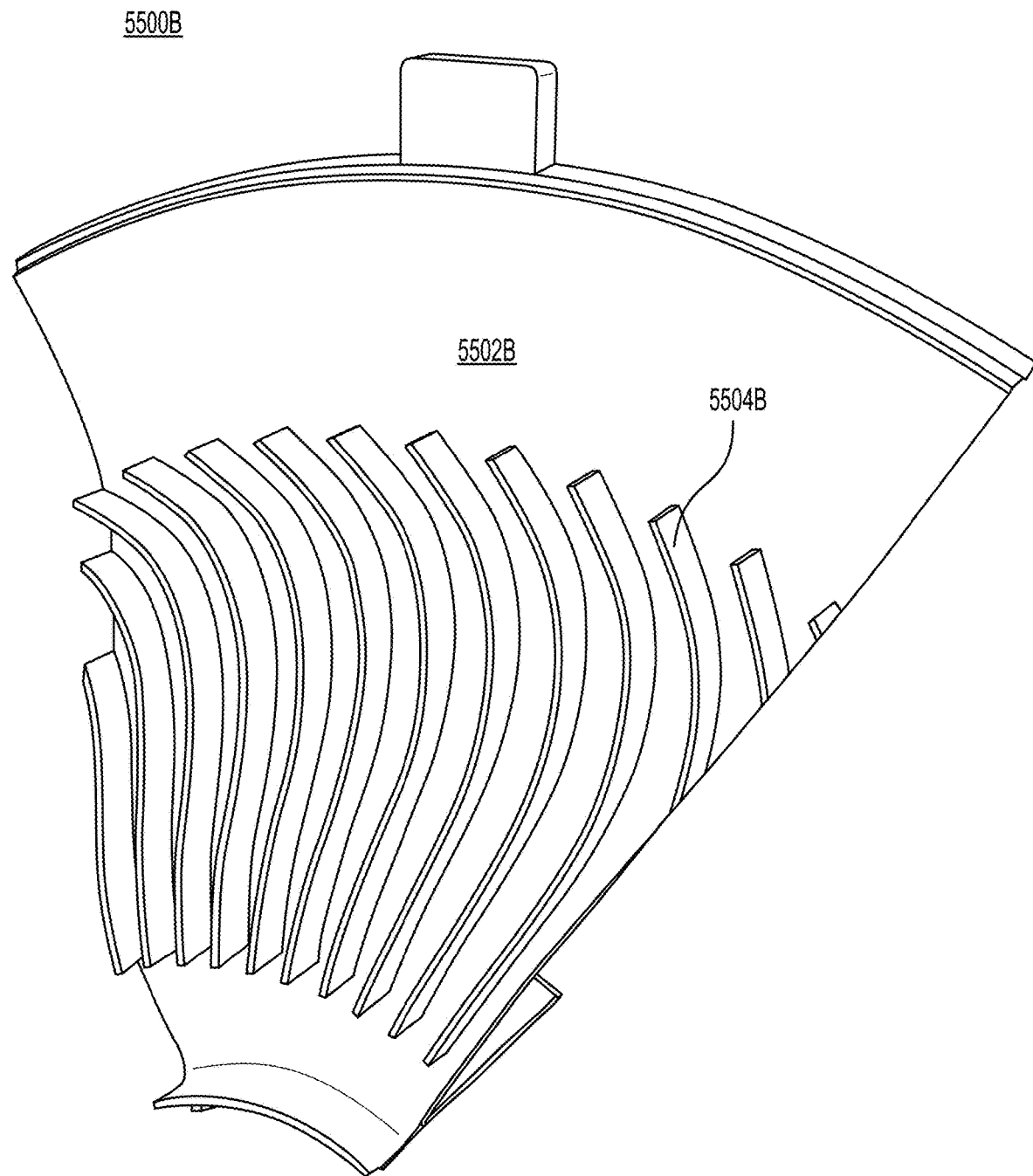

FIGS. 55A-55B are illustrations of exemplary inside surfaces of a portion of a rotor hub and a portion of an endplate. In some embodiments, the inside surfaces (e.g., 5502A, 5502B) of the rotor hub 5500A and the endplate 5500B, respectively, may have fins (e.g., 5504A, 5504B) to make the rotor more efficient in creating the air movement (e.g., 5416) inside the case 5402 (not shown in FIGS. 55A-55B) by defining an air path with less air resistance.

As shown in FIG. 55A, the fins 5504A on the inside 5502A of rotor hub 5500A may have different heights and shapes. In this exemplary embodiment, the different shape fins are all straight (i.e., flat) but they can have different geometry as well.

As shown in FIG. 55B, the fins 5504B on the inside 5502B of the endplate 5500B all have a same height. The height of the fins 5504B in this exemplary embodiment may be approximately 12 mm. Generally, this height may be between approximately 5 mm and 20 mm.

In this exemplary embodiment, the fins on the rotor hub and the stator may have a first clearance. The first clearance may be between 0.4 mm and 1.2 mm, or approximately 0.6 mm. The fins on the endplate and the rotor may have a second clearance. The second clearance may be between 0.4 mm and 1.2 mm, or approximately 0.6 mm. The first and second clearances may be determined so that the air inside the sealed environment (e.g., the case) is pressured through gaps formed between the fins and the rotor, and that the air is guided from edges of the hot side toward a center of the motor on the hot side, then toward the center of the motor on the cold side.

Figure 55C:
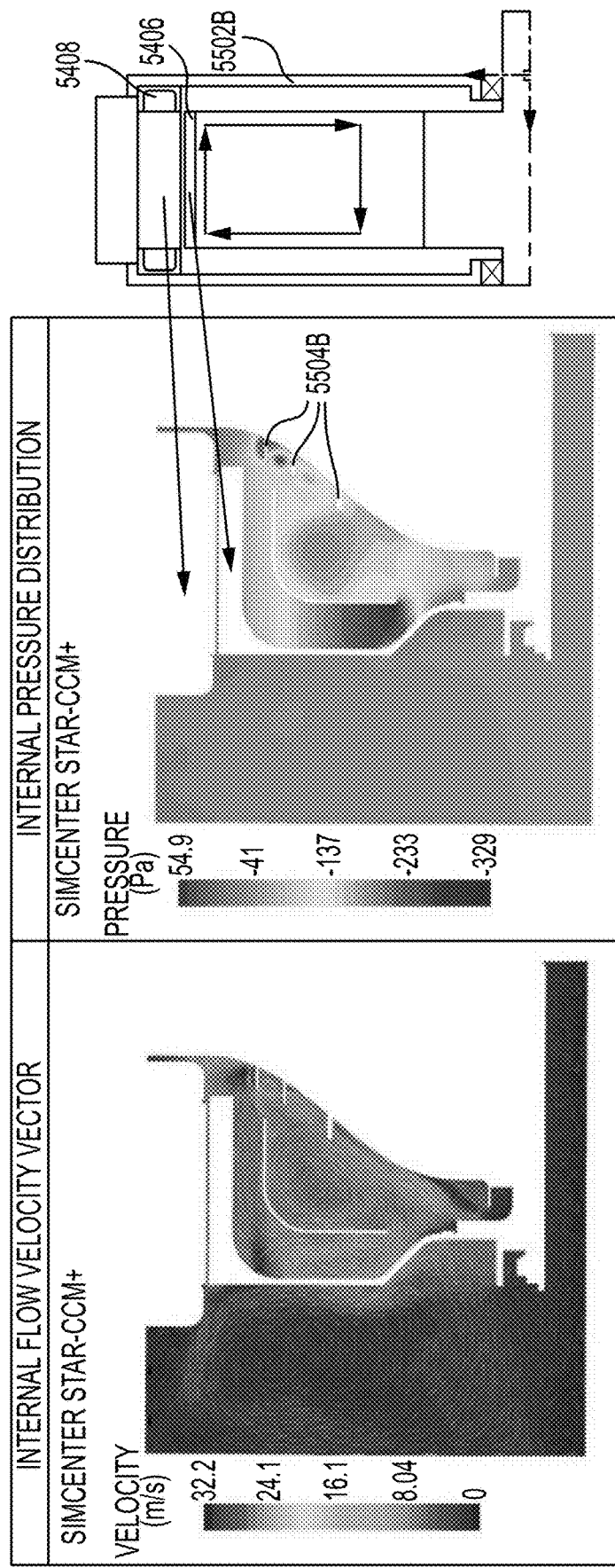
FIG. 55C is a simulation result of the air velocity and pressure distribution inside the case, consistent with disclosed embodiments.

FIG. 55C is a simulation result of the air velocity and pressure distribution inside the case, such as case 5402 of FIG. 54. In the example shown in FIG. 55C, white space denotes solid motor structure where no air is present. The different colors in the left figure represents air differences in air velocity, showing substantially higher air velocity between the rotor 5406 and the motor arbor 5502B than the left side, and thus shows that the air inside the sealed environment is agitated. In the middle figure, the different colors illustrate internal pressure distribution inside the sealed environment 5404. In some embodiments, a larger pressure difference between two points may create a higher air flow with a higher velocity, which may increase an efficiency of the heat exchange between the cool side and the hot side of the case, thus enhancing a cooling effect on the motor.

Figure 55D:
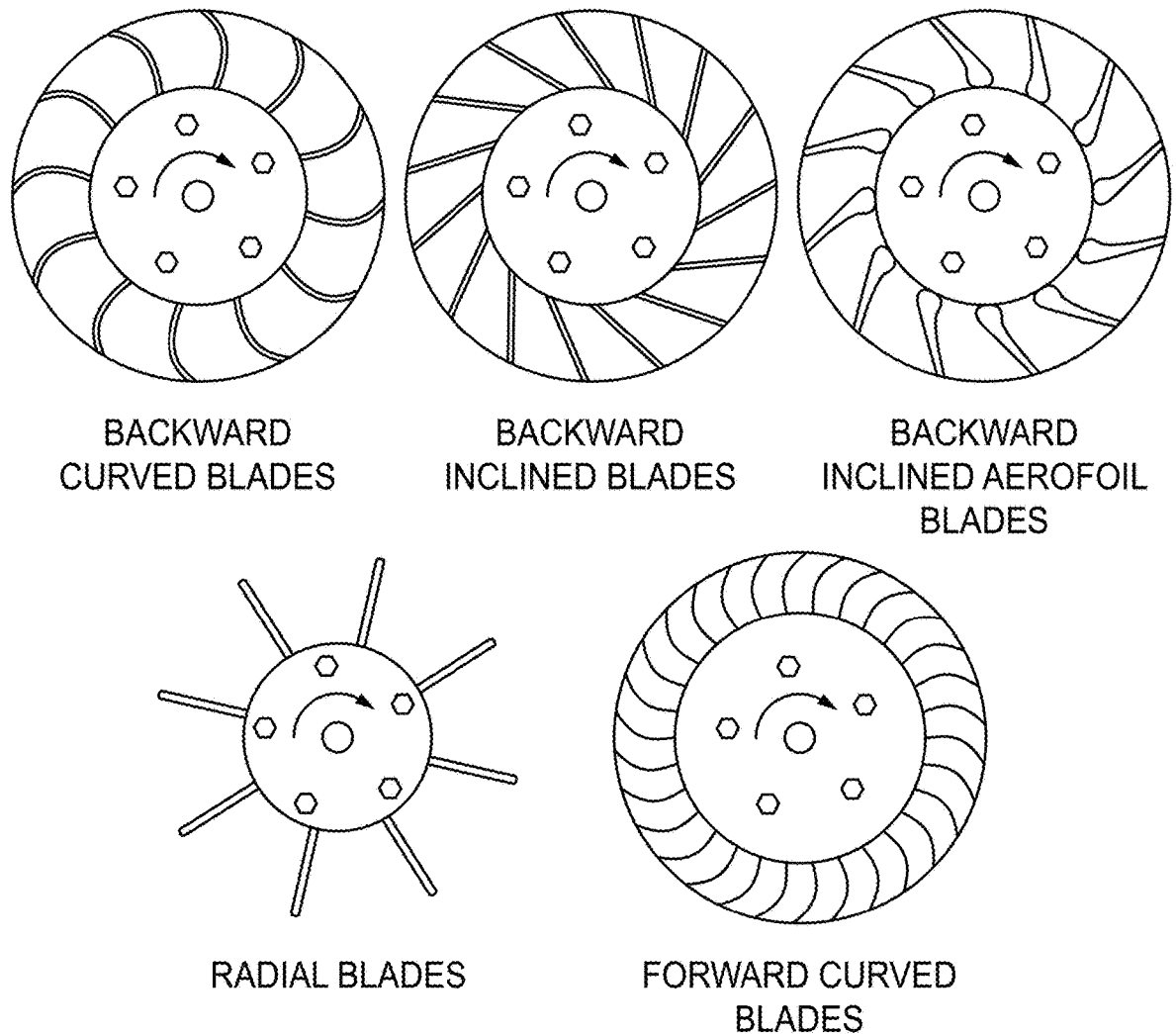
FIG. 55D shows illustrations of exemplary inside surfaces of an endplate, consistent with disclosed embodiments.

FIG. 55D is a set of exemplary inside surfaces of endplate, consistent with disclosed embodiments. The fins on the endplate and the rotor may have different geometry and arrangements, which can be optimized considering different design factors and operational parameters, for example, rotations per minute (RPM), clearances, motor size, weight, rotational mass, and other design and operational parameters that may be affected by the fin design and shape.

Figure 24:
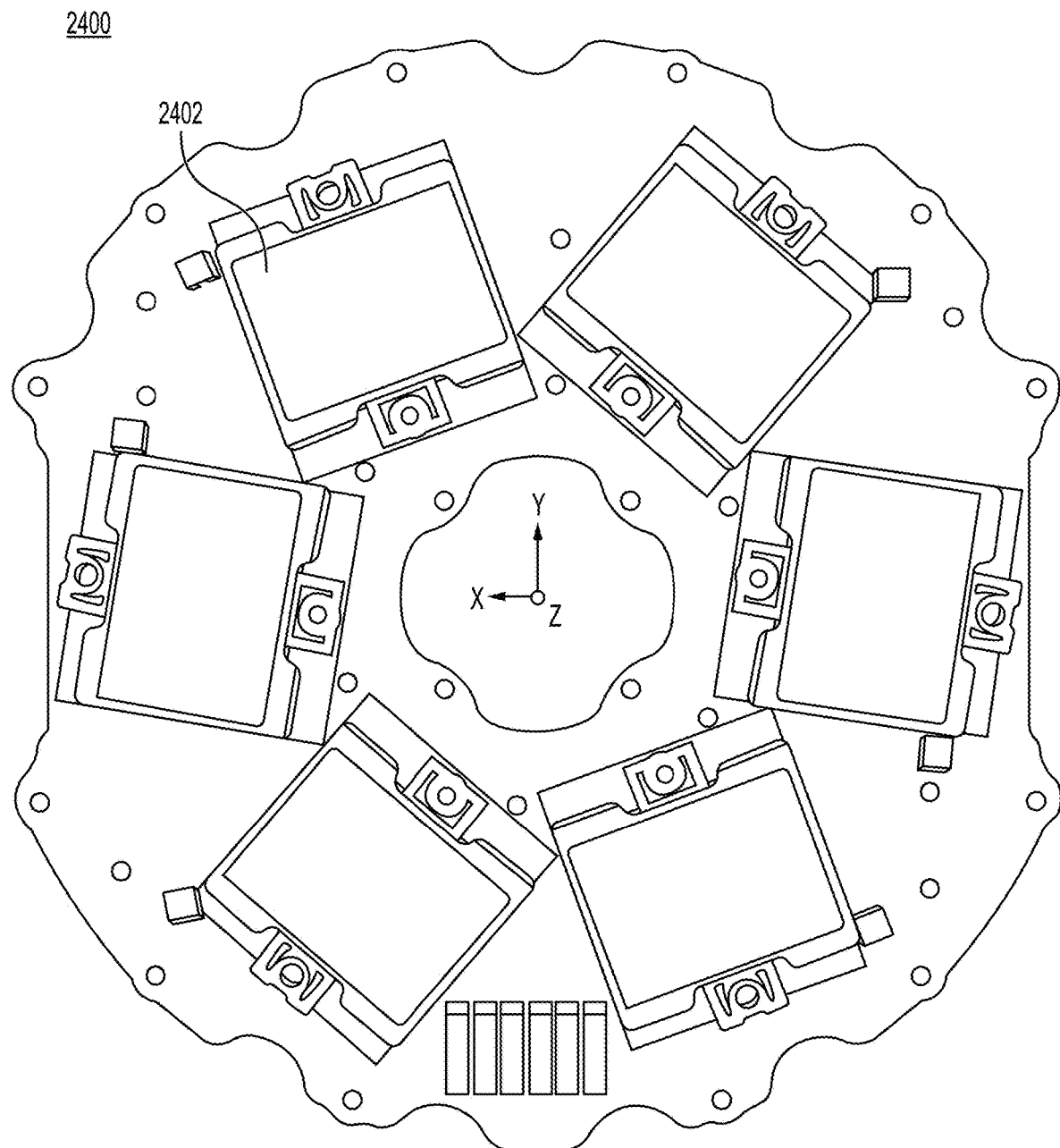
FIG. 24 is an illustration of an exemplary printed circuit board assembly of a VTOL aircraft, consistent with disclosed embodiments.

In some embodiments, the direction of the air flow may be reversed. For example, instead of having the air moving toward the center on the hot side, air may instead move from the center to the perimeter on the hot side. In such embodiments, air flow at the center of the motor will be from the hot side to the cool side. This may be achieved by changing the shapes (e.g., curvature) of the fins. FIG. 24 provides exemplary designs of the fin shapes, though the examples shown are not intended to limit the scope of potential fin designs and shapes. Fin shapes may be optimized or modified depending on the particular needs of the system and evaluations based on experiments and simulations.

Disclosed embodiments may include a bearing system comprising a rotor utilizing a bearing to support loads. FIG. 16C illustrates a cross-sectional view of an exemplary embodiment of a rotor assembly, consistent with embodiments of the present disclosure. In some embodiments, a rotor assembly may include a bearing system 1600C. Bearing system 1600C may include a rotor hub 1604C, sun gear 1612C, and main shaft 1626C. Bearing system 1600C may use various types of bearings to reduce loads experienced by components substantially aligned along a shaft. As described herein, a rotor assembly may be mechanically coupled to a sun gear 1612C. Main shaft 1626C may comprise outer surface 1628C, which may abut shaft flange assembly 1630C. Shaft flange 1630C may abut bearing 1634C. Bearing 1634C may have an inner race mechanically coupled to the main shaft 1626C and outer race mechanically coupled to rotor hub 1630C. In some embodiments, bearing 1634C may have an inner race mechanically coupled to the main shaft 1626C and outer race mechanically coupled to rotor hub 1630C and the sun gear 1612C. In some embodiments, bearing 1634C may abut both rotor hub 1604C and sun gear 1612C. Bearing 1634C may be mechanically coupled to shaft flange assembly 1630C. As described herein, bearing 1634C may support rotor hub 1604C and support loads from rotor hub 1604C. For example, the rotation and motion of rotor hub 1604 may cause gyroscopic effects that exert a load. Bearing 1634C may support loads including radial or axial rotor loads. Bearing 1634C may allow sun gear 1612C to float, which may allow the variation in loads to be absorbed. In some embodiments, bearing 1634C may be a rolling element bearing. For example, bearing 1634C may include rolling element 1616C, which may be immersed in lubricant 1632C within bearing 1634C. In some embodiments, lubricant 1632C may comprise oil. Other bearings, such as a ball bearing or deep groove ball bearing, capable of support loads and high speeds of rotations, may be used.

Disclosed embodiments of an electric propulsion system may also include a pilot system for bearings to support a rotor. As disclosed herein, an electric propulsion system may include a bearing that supports a sun gear and rotor. A bearing supporting a rotor may comprise a bearing with an outer race mechanically coupled to an inner surface of a rotor. For example, bearing 1634C may comprise outer race mechanically coupled to rotor hub 1604C. Bearing 1634C may pilot sun gear 1612C and rotor hub 1604C, by guiding an alignment or mating of multiple components. For example, a pilot may serve to align or mate the sun gear 1612C and rotor hub 1604C. Bearing 1634C may support an edge of sun gear 1612C and an edge of rotor hub 1604C to rest on outer race, which may concentrically affix sun gear 1612C and rotor hub 1604C. A first edge of sun gear 1612C and a first edge of rotor hub 1604C may abut and meet on the outer race of bearing 1634C. Bearing 1634C may influence the diameter of sun gear 1612C and rotor. The diameter of outer race of bearing 1634C may be substantially similar to a diameter of an inner surface of sun gear 1612C and an inner diameter of a rotor. In some embodiments, rotor hub 1604C and sun gear 1612C may be concentrically affixed. Sun gear 1612C may have a diameter equal to an inner diameter of a rotor. In some embodiments, a pilot system for bearings may include shoulders. A shoulder may be an edge of a component that abuts one or more edges of another component. For example, shoulders may comprise a portion of the sun gear 1640B that abuts one or more edges of bearing 1616B, and a portion of the rotor hub 1642B that abuts one or more edges of bearing 1616B. Shoulders may cooperate to restrict movement of a bearing. For example, shoulders may cooperate to restrict movement of bearing 1616B in an axial direction of the shaft or along the axis 1624B. In some embodiments, a pilot may include shoulders to capture a bearing radially. A pilot system may reduce mass and prevent the need for additional materials. In some embodiments, dowel pins may be used to pilot a sun gear and rotor.

In some embodiments, a rotor bearing system may also include bearings to resist moment loads and allow float to compensate for tolerances in a gearbox. A rotor bearing system may include a hydrodynamic bearing. A hydrodynamic bearing may resist, or counteract, rotor moment loads. In some embodiments, a hydrodynamic bearing may be positioned along a sun gear. For example, a hydrodynamic bearing may be located between a sun gear 1612C and main shaft 1626C, and the hydrodynamic bearing may be located in a position along the length of the sun gear 1612C. In some embodiments, the hydrodynamic bearing may extend along the full length of the sun gear 1612C. The hydrodynamic bearing may be positioned where a main shaft 1626C has a shoulder, or cavity, as described herein. For example, the hydrodynamic bearing may comprise fluids between a sun gear 1612C and a shoulder, or cavity, of a main shaft 1626C. In some embodiments, the size or shape of the shoulder may be determined by properties of the rotor. For example, the shoulder may have a depth and width which may be determined by properties of the rotor including mass, speed, rate of change, and change in axis or loads (including gyroscopic, axial, and radial loads or moments). The hydrodynamic bearing may comprise fluids, such as oil, located between a sun gear 1612C and the outer surface 1628C of a main shaft 1626C. The hydrodynamic bearing may assist in resisting moment loads experienced by sun gear 1612C. For example, the hydrodynamic bearing may exert a restoring force to resist gyroscopic loads. In some embodiments, hydrodynamic bearing may comprise oil. The hydrodynamic bearing may allow sun gear 1612C or a ring gear to float. The hydrodynamic bearing may allow for tolerances within various components of the electric propulsion system. The hydrodynamic bearing may comprise the same liquid, such as oil, that is used throughout the electric propulsion system for lubrication and cooling. As discussed herein, utilizng a single liquid for hydrodynamic bearings, cooling, and lubricating may provide advantages of reducing mass and reducing the size of various components.

Figure 50:
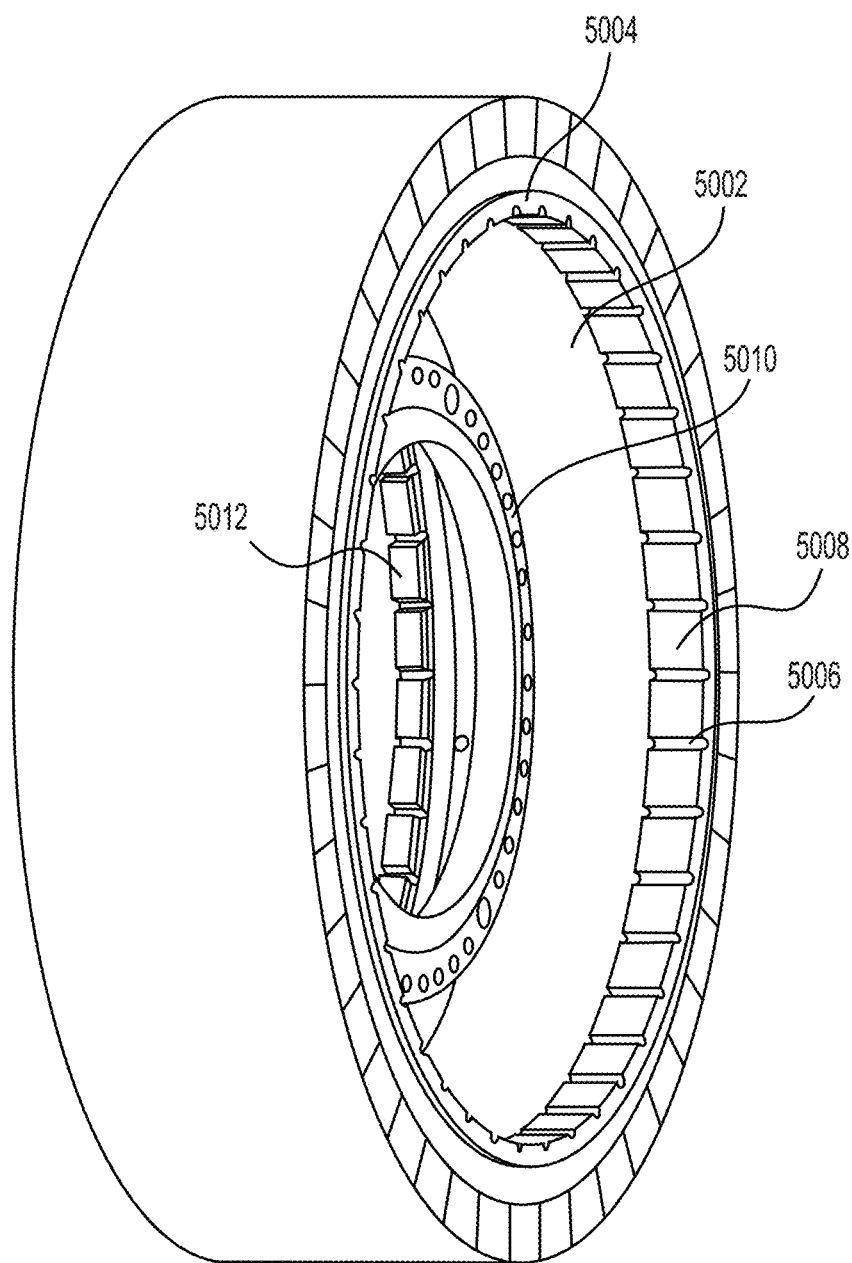
FIG. 50 is an illustration of a perspective view of an exemplary rotor of a VTOL aircraft, consistent with disclosed embodiments.

FIG. 50 illustrates a perspective view of an exemplary rotor of a VTOL aircraft, consistent with disclosed embodiments. In some embodiments, a rotor 5000 may comprise a rotor hub 5002. A rotor hub 5002 may possess layers 5004 and 5012. A rotor 5000 may be manufactured to include a rotor hub 5002 and layers 5004 and 5012. A rotor 5000 may be made of aluminum, steel, or other material capable of transferring torque to a propeller assembly. A rotor 5000 may be machined from a single piece of material using various types of machinery such as a lathe, a computer numerical control ("CNC") machine, or any other type of machine capable of machining a rotor. A layer 5004, 5012 may be present on the rotor 5000 for the purpose of being sacrificed later to balance the rotor 5000. A rotor 5000 may be unbalanced due to manufacturing constraints, such as the precision of the machine, during the machining of the rotor. In some embodiments, balancing a rotor 5000 may include adding or removing mass from the rotor.

In some embodiments, the manufacturing constraints of the various areas of the rotor 5000 may determine the mass of the layer 5004, 5012. For example, layer 5004, 5012 may have a certain minimum or maximum mass that is dictated by manufacturing equipment and steps of creating the rotor. Layer 5004, 5012 may include a mass of rotor material that is sized with a magnitude capable of countering the manufacturing constraints present in each area of the rotor. In some embodiments, the mass of the layer 5004, 5012, to later be removed in balancing the rotor, may be determined based on the precision of the machine(s) manufacturing the various portions of the rotor. For example, in some embodiments a machine or machines may manufacture portions of the rotor with a precision of +/−5% of the target mass of the portion of the rotor. In such an example, the rotor may include a layer 5004, 5012 with an overall mass that includes enough mass to be removed in balancing a rotor with a mass falling within the compounded deviated mass due to the precision of the machine(s) manufacturing the rotor. In some embodiments, the material properties of the layer 5004, 5012 may include aluminum, steel, or another other material capable of accommodating the manufacturing precision of the machine(s) manufacturing the portions of the rotor. In some embodiments, the thickness, or width, and depth of layer 5004, 5012 may be thicker or thinner depending on design considerations, the needs of the system, and manufacturing constraints. In some embodiments, various layers may have substantially similar widths and depths, where substantially similar comprises difference in the widths or depths of the layers being less than 5% of the greater widths or depths.

In some embodiments, a rotor 5000 may include multiple layers 5004, 5012. For example, a rotor 5000 may include a layer 5004 on the edges of an inner surface, or circumference, of the rotor hub 5002, as shown in FIG. 50. In some embodiments, a rotor 5000 may possess multiple layers 5004, 5012 that are disposed on opposing sides of the inner surface of the rotor, next to each other along an inner surface, or any other configuration of layers 5004, 5012 along the of the rotor hub 5002. In some embodiments, the layers 5004, 5012 may be posited along an inner surface of the rotor a distance from the edge of the rotor. Some embodiments may include the layers being a substantially similar distance from the edge of the rotor. As used herein, a substantially similar distance may comprise a variation in distance less than 5% of the larger distance.

In some embodiments, a layer 5004, 5012 may include grooves 5006 creating portions 5008. In some embodiments, the portions may be made of aluminum. Further, some embodiments may include grooves 5006 that may be made of aluminum. In some embodiments, grooves 5006 may serve to act as a liquid flow path for oil or other liquid that is present within the electric motor assembly. For example, in normal operation, as described herein, oil or liquid may be circulated throughout an electric motor assembly to assist in cooling or lubricating components. As such, grooves 5006 may act to allow oil or liquid to pass through the layers 5004, 5012 so that oil or liquid does not gather within the layers 5004, 5012 and is returned to the sump or other reservoir as described herein. In some embodiments, the multiple layers 5004 may be aligned such that the grooves 5006 of each layer are aligned.

In some embodiments, a rotor 5000 may comprise through-holes 5010. In some embodiments, a rotor 5000 may be machined with through-holes 5010. Those of ordinary skill in the art will appreciate that mass is a critical factor in aircraft design, and particularly in VTOL aircrafts design. Mass may impact the efficiency, payload, and flight time of a VTOL aircraft. As such, some embodiments of a rotor may include through-holes 5010, produced by a machining process, lasering process, or any other process of removing mass from a rotor. Through-holes 5010 may reduce the mass of a rotor 5000 by removing sections of the rotor hub 5002 material, such as aluminum. In some embodiments, through-holes may also serve as connection points for a sun gear as discussed above.

In some embodiments, an electric motor assembly of a VTOL aircraft, as described herein, may generate torque by rotating a rotor 5000 at high rates of rotation. At high rotational speeds, an unbalanced rotor having an axis of rotation that does not align with the center of mass of the rotor will experience high levels of unwanted vibration and noise. An unbalanced rotor may result from production tolerances of the manufacturing processes. For example, magnets present in the rotor assembly may not have a uniform mass and may not be uniformly placed along the rotor or lamination stack. Further, in some embodiments, through-holes 5010 may be produced using machining process and production tolerances may lead to an unbalanced rotor. As such, it is recognized that a process for balancing a rotor may be advantageous. It is also recognized that mass may be a critical design criteria in VTOL aircrafts and as such, traditional rotor balancing techniques that involve adding mass to the rotor or removing a minimal amount of mass may lead to unwanted mass remaining on the rotor. In some embodiments, processes may be used to balance a rotor while achieving a maximum reduction in the mass of the rotor.

Some disclosed embodiments may comprise an improved process for balancing a rotor of an electric motor assembly. Some embodiments may include identifying an axis of rotation of a rotor. As discussed herein, a rotor 5000 may include a layer 5004, 5012. In some embodiments, the layers 5004, 5012 serve as a sacrificial layer that may be machined to be integral with the rotor to later be removed from the rotor 5000 to achieve a balanced rotor. In some embodiments, the portions 5008 may serve as sacrificial portions that may be machined with the rotor to later be removed from the rotor 5000 to achieve a balanced rotor. It is recognized that removable layers and portions added to the rotor after the rotor is manufactured, via fasteners, glue, or similar materials, could serve a similar purpose as a sacrificial layer or sacrificial portion. However, removable layers and portions would require additional mass in the form of attachments that would not be advantageous to a VTOL's overall efficiency. Further, the attachments used for removable layers and portions, such as fasteners and adhesives, are at risk of failing during flight and may damage other components of the electric propulsion system.

Some embodiments of a process for balancing a rotor may comprise determining an imbalance present in the rotor by rotating the rotor about the axis of rotation. Determining an imbalance may include rotating the rotor and detecting a phase, and respective magnitude, of the imbalance. Some embodiments may include marking the rotor by laser etching the rotor, placing a reflective sticker on the rotor, or any other method of creating a distinctive mark on the rotor. In some embodiments, rotating the rotor may include using a machine to spin the rotor about the axis of rotation at a speed less than operating speed, such as a dynamic balancer. Operating speed may include the expected rate of rotation of the rotor for any phase of flight. In some embodiments, rotating the rotor may include rotating the rotor at a speed less than the first resonance of the rotor. Detecting a phase of an imbalance may include using a machine to monitor the distinctive mark of the rotor while in rotation. In some embodiments, the machine to monitor the rotation of the rotor may be the same machine that may rotate the rotor. The machine may be able to track the distinctive mark and calculate a displacement of the mark during rotation, indicating an imbalanced rotor. In some embodiments, detecting a phase of an imbalance may also include receiving signals from an encoder or accelerometer during the rotation, or downloading after the rotation, to identify the position of the rotor or forces experienced by the rotor in the position where the encoder, accelerometer, or a similar sensor is positioned on the rotor.

Some embodiments of a process for balancing a rotor may comprise calculating an amount of mass to add or remove at a position along the layer 5004, 5012 to correct an imbalance present in the rotor. Some embodiments may include a machine or algorithm that analyzes the phase, and respective magnitude, of the imbalance to determine amount of mass to add or remove and position for the mass to be added to or removed from. In some embodiments, a machine that calculates the mass to be added or removed may include the machine that is rotating the rotor, detecting the imbalance, or may be a separate machine. In some embodiments, the mass to be added or removed at a position along the layer 5004, 5012 may alter the center of mass of the rotor such that it coincides with the axis of rotation of the rotor. In some embodiments, a rotor may possess multiple layers 5004, 5012 posited along an inner surface of the rotor a distance from the edge of the rotor. As such, balancing the rotor may include balancing the rotor among one or more planes of the rotor by adding or removing mass along one, or along more than one, of the layers.

In some embodiments, removing an amount of mass from the layer 5004, 5012 may include machining away a portion of the volume of the layers 5004, 5012. In some embodiments, removing an amount of mass from the layers 5004, 5012 may include removing anywhere from 50% to 100% of the volume of the layers 5004, 5012. Removing 50% to 100% of the volume of the layers 5004, 5012 may reduce the mass of the rotor. In some embodiments, layers 5004, 5012 may only be present to be sacrificial material in balancing the rotor. Layers 5004, 5012 may be integrally formed with the rotor, to provide integrated rotor balancing material that is removed, rather than added. By removing sacrificial rotor material, a balancing process would not require the use of adhesives or fastening methods to add balancing weight.

In some embodiments, after removing material from the layers 5004, 5012, an amount of mass of the layers remaining on the rotor may be the minimal amount of mass required to balance the rotor, and thus may result in a balanced rotor with a minimized mass. Removing majority of the volume of the layers present on the rotor may allow for a reduction in mass of the rotor such that the rotor contains no additional material. For example, if a rotor with layers 5004, 5012 was determined to be balanced without removing any portion of the layers 5004, 5012, 100% of the volume comprising the layers 5004, 5012 may be machined away as none of the mass from the layers would be needed to balance the rotor. In some embodiments, it may be determined that 3% of the volume of layer 5004 would need to be present to balance in rotor. In such an example, 100% of layer 5012 may be removed and 97% of layer 5004 may be removed to balance the rotor.

Some embodiments may include utilizing specific machinery to remove the volume of layers 5004, 5012 in balancing the rotor. Some embodiments may include utilizing machinery capable of the volumes of layers 5004, 5012 at a precision of 0.01% to 0.1% of the layer. In some embodiments, machinery may be used in machining away the volume of the layers, such as a lathe or a CNC machine, at a resolution less than five microns. In such embodiments, using machinery capable of such precision may achieve the advantages of a balanced rotor having minimal mass. Some embodiments may include utilizing various types of machinery when removing the layers, such as removing a large fraction of the mass to be removed with a method with less precision than the method to remove the remaining amount of the mass to be removed.

Some embodiments may include calculating an amount of mass to be added at a position along the layers 5004, 5012 to balance to the rotor, and balancing the rotor may include machining away the volume of the layers 5004, 5012 such that only an amount of mass of the layers remaining is a portion of the layers 5004, 5012 that is equal to the amount of mass that was calculated to be added and present at the calculated position. In some embodiments, calculating an amount of mass to be removed at a position along the layers 5004, 5012 to balance the rotor may include machining away the volume of layers 5004, 5012 such that only an amount go mass of the layers remaining is a portion of the layers 5004, 5012 that is equal to the amount of mass that was calculated to be removed and present at a position on the opposite side of the layer from the calculated position.

In some embodiments, calculating an amount of mass to be removed may include calculating a number of sacrificial portions 5008 to remove. In some embodiments, the portions 5008 may be defined by grooves 5006. Some embodiments may include removing full portions 5008 or any partial amounts of portions 5008. In some embodiments, removing portions 5008 may include calculating a maximum amount of portions to be removed to achieve a balanced rotor. In some embodiments, the number k of portions to be removed may include an amount of portions such that if any additional mass were to be removed from the rotor after k portions are removed, the rotor may never be able to achieve balance.

FIG. 51 illustrates a flow chart of an exemplary process for balancing a rotor of a VTOL aircraft 5100, consistent with disclosed embodiments. While the block diagram may be described below in connection with certain implementation embodiments presented in other figures, those implementations are provided for illustrative purposes only, and are not intended to serve as a limitation on the block diagram.

FIG. 51 includes process blocks 5102 to 5108. At block 5102, a process for balancing a rotor of an electric engine of an electric propulsion system may include identifying an axis of rotation of a rotor, wherein the rotor comprises a sacrificial layer having a mass M formed along a circumference of the rotor, consistent with the discussion throughout this disclosure.

At block 5104, a process for balancing a rotor of an electric engine of an electric propulsion system may include determining an imbalance present in the rotor by rotating the root about the axis of rotation, consistent with the discussion throughout this disclosure.

At block 5106, a process for balancing a rotor of an electric engine of an electric propulsion system may include calculating an amount of mass k to add at a position p along the sacrificial layer such that the center of mass of the rotor coincides with the axis of rotation of the rotor, consistent with the discussion throughout this disclosure.

At block 5108, a process for balancing a rotor of an electric engine of an electric propulsion system may include removing an amount of mass r from the sacrificial layer such that an amount of remainder mass n is present along the circumference of the rotor, consistent with the discussion throughout this disclosure.

As discussed herein, a rotor assembly of an electric motor assembly may comprise a rotor mechanically coupled to a sun gear. Similar to the discussion above with respect to balancing a rotor, it may be advantageous to balance the rotor assembly to avoid unwanted vibrations and noise during normal operation. A rotor assembly may be unbalanced due to manufacturing tolerances and due to the multiple mating parts throughout the rotor assembly.

In some embodiments, a process for balancing the rotor assembly may include identifying an axis of rotation of the rotor assembly and rotating the rotor assembly at speeds less than operating speed. In some embodiments, the rotor assembly may be coupled to a machine that may be capable of rotating the rotor assembly at speeds less than operating speed. In some embodiments the rotor assembly may be rotated at a speed less than the first resonance of the rotor assembly. Some embodiments may include determining an imbalance present in the rotor assembly. Determining an imbalance present in the rotor assembly may include using a machine to identify a phase, and magnitude, of the imbalance by tracking a distinctive mark on the rotor assembly, such as a reflective sticker or laser etched mark, or using an electric eye, encoder, accelerometer, or a similar component to track the motion of the rotor assembly.

Some embodiments may include calculating an amount of mass to add to the rotor assembly such that the center of mass of the rotor assembly coincides with the axis of rotation of the rotor assembly. Calculating an amount of mass, and its respective position, may be done using a machine or algorithm that analyzes the phase and magnitude of the imbalance in various planes of the rotor assembly to determine an amount of, and position of, mass to be added to the rotor assembly. In some embodiments, the mass to be added may be in the form of rivets. Rivets may include masses that may be removably attached or permanently affixed to the through-holes 5010 of rotor 5000. Rivets may be made of aluminum, copper, steel, or any other material capable of balancing the rotor assembly. Adding rivets may include permanently affixing or removably attaching rivets to the rotor via through-holes such that the rotor assembly is balanced. In some embodiments, the amount of mass to be added may include rivets possessing different material properties and positions.

Figure 52:
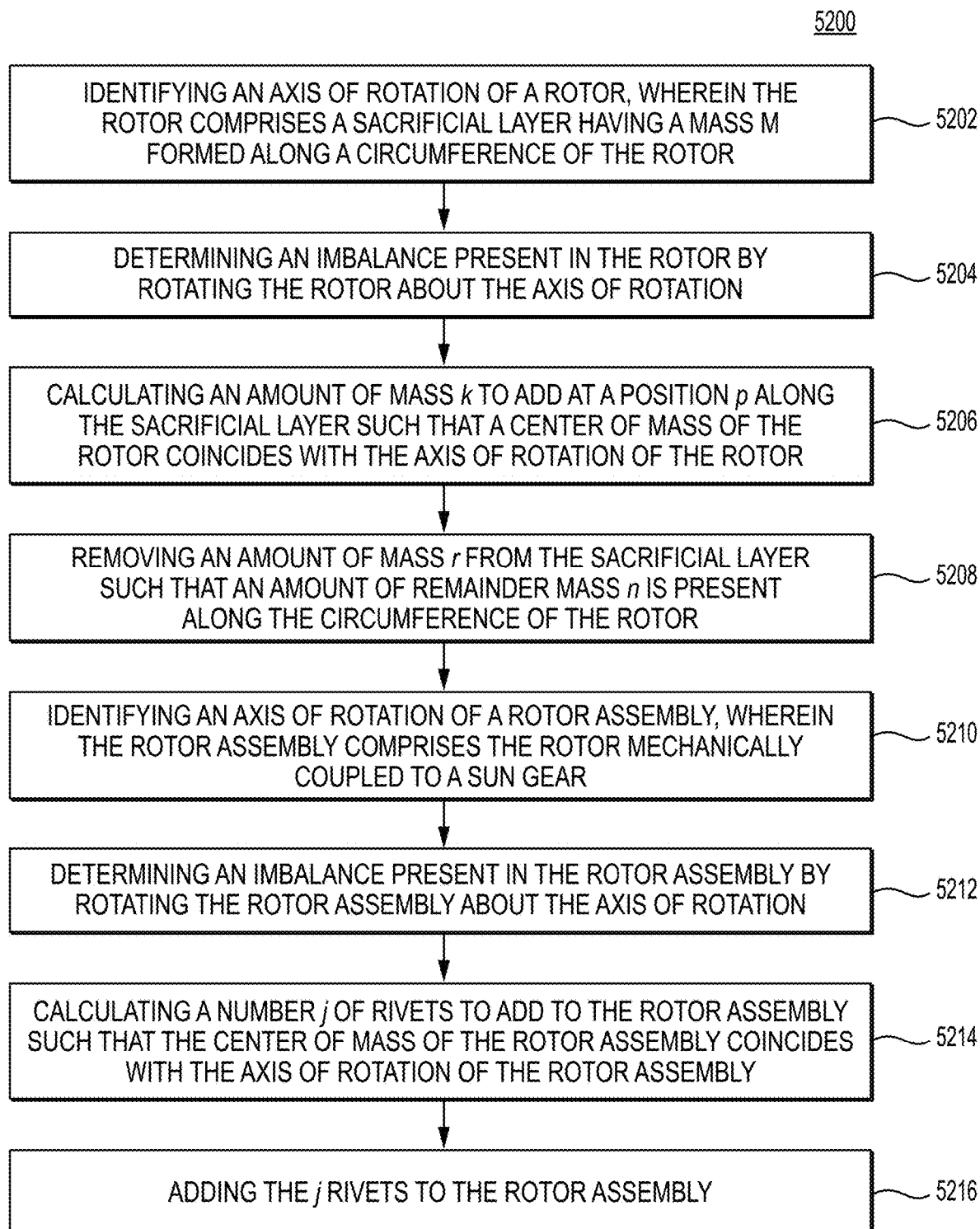
FIG. 52 is another flow chart of an exemplary process for balancing a rotor assembly of a VTOL aircraft, consistent with disclosed embodiments.

FIG. 52 illustrates another flow chart of an exemplary process for balancing a rotor assembly of a VTOL aircraft 5200. While the block diagram may be described below in connection with certain implementation embodiments presented in other figures, those implementations are provided for illustrative purposes only, and are not intended to serve as a limitation on the block diagram.

As shown in FIG. 52, the process may begin at block 5202, by identifying an axis of rotation of a rotor, wherein the rotor comprises a sacrificial layer having a mass M formed along a circumference of the rotor, consistent with the discussion throughout this disclosure.

At block 5204, a process for balancing a rotor assembly may proceed to determining an imbalance present in the rotor by rotating the rotor about the axis of rotation, consistent with the discussion throughout this disclosure.

At block 5206, a process for balancing a rotor assembly of an electric engine of an electric propulsion system may include calculating an amount of mass k to add at a position p along the sacrificial layer such that the center of mass of the rotor coincides with the axis of rotation of the rotor, consistent with the discussion throughout this disclosure.

At block 5208, a process for balancing a rotor assembly may proceed to include removing an amount of mass r from the sacrificial layer such that an amount of remainder mass n is present along the circumference of the rotor, consistent with the discussion throughout this disclosure.

At block 5210, a process for balancing a rotor assembly may proceed to identifying an axis of rotation of a rotor assembly, wherein the rotor assembly comprises the rotor mechanically coupled to a sun gear, consistent with the discussion throughout this disclosure.

At block 5212, a process for balancing a rotor assembly may proceed to determining an imbalance present in the rotor assembly by rotating the rotor about the axis of rotation, consistent with the discussion throughout this disclosure.

At block 5214, a process for balancing a rotor assembly may proceed to calculating a number j of rivets to add to the rotor assembly such that the center of mass of the rotor assembly coincides with the axis of rotation of the rotor assembly, consistent with the discussion throughout this disclosure.

At block 5216, a process for balancing a rotor assembly of an electric engine of an electric propulsion system may include adding the j rivets to the rotor assembly, consistent with the discussion throughout this disclosure.

Disclosed embodiments of an electric propulsion system may include a gearbox assembly, as described herein. A gearbox may assist in a gear reduction for an electric propulsion system. Some embodiments of an electric propulsion system may include a gearbox assembly located between the electric motor assembly and the end bell assembly, as described herein. A gearbox assembly may comprise a main shaft assembly.

Figure 17:
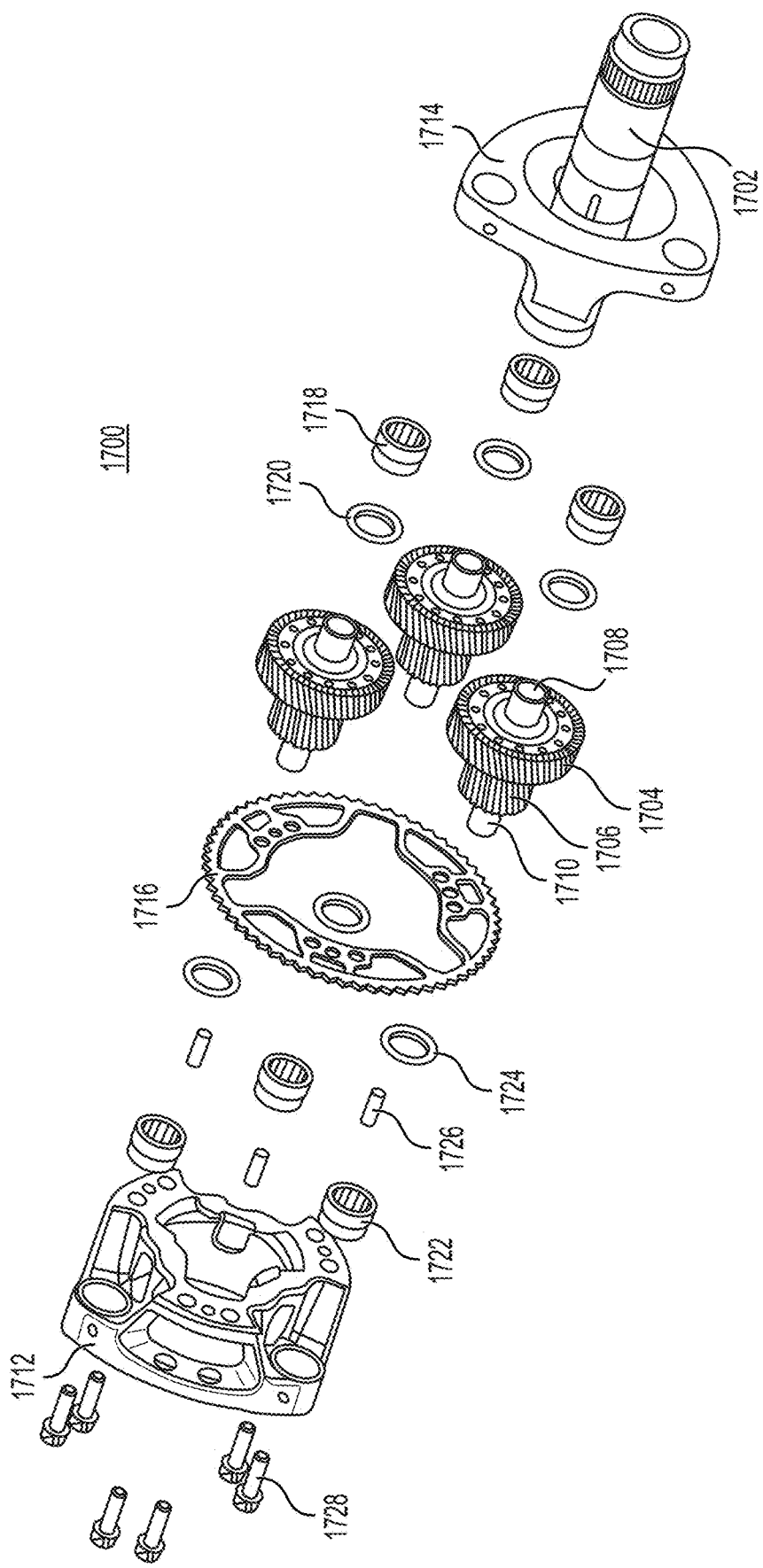
FIG. 17 is an exploded view of a main shaft assembly of a VTOL aircraft, consistent with disclosed embodiments.

FIG. 17 is an exploded view of a main shaft assembly of a VTOL aircraft, consistent with disclosed embodiments. Main shaft assembly 1700 may include a main shaft 1702, carrier cover 1714, planetary gears 1704, pump drive gear 1716, and planetary carrier 1712. Main shaft assembly 1700 may include compound planetary gears, such that planetary gears 1704 are mechanically coupled to planetary gears 1706. In some embodiments, shafts 1708 and 1710 may extend from planetary gears 1704. In some embodiments, shafts 1708 and 1710 may extend from a first planetary gear 1704 and a second planetary gear 1706, respectively. Planetary gears 1704 may interface with a sun gear and a ring gear. In some embodiments, the ring gear may be fixed. In such an embodiment, the planetary gears 1704, interfacing with the ring gear and sun gear, may rotate about the sun gear. In some embodiments, planetary gears 1706 may interface with a ring gear. In such an embodiment, the planetary gears 1704 may interface with a sun gear while the planetary gears 1706 interface with a fixed ring gear where the sun gear would drive planetary gears 1704 and 1706 to rotate about the sun gear. Planetary carrier 1712 may be mechanically coupled, via shaft 1710 or the like, to planetary gears 1704 and 1706 such that when a planetary gear, and thus the corresponding shaft 1710, rotates around the circumference of the sun gear, the planetary carrier 1712 rotates at the same speed. Planetary carrier 1712 may be mechanically coupled to multiple planetary gears 1704 and 1706. In some embodiments, a carrier cover may be mechanically coupled, via shaft 1708 or the like, to planetary gears 1704 and 1706 such that when a planetary gear, and thus the corresponding shaft 1708, rotates around the circumference of the sun gear, the carrier cover 1714 rotates at the same speed.

In some embodiments, a main shaft assembly 1700 may comprise a planetary carrier 1712 having bearings 1722 to assist the planetary carrier 1712 in receiving shafts 1710. Bearings 1722 may allow the shafts 1710 to rotate with the planetary gears 1704, 1706 while allowing the shafts to be housed within the planetary carrier 1712. In some embodiments, a carrier cover 1714 may have bearings 1718 to assist the carrier cover 1714 in receiving shafts 1708 such that the shafts 1708 may rotate with planetary gears 1704, 1706 while allowing the shafts 1708 to be housed within the carrier cover 1714. In some embodiments, washers 1720, 1724 may be positioned between the planetary gears 1704, 1706 and the carrier cover 1714 and planetary carrier 1712, respectively. Washers 1720, 1724 may be designed to account for machine tolerances in the manufacture of components throughout the gearbox assembly, or provide the planetary gears 1704, 1706 with a surface to rotate against without damaging the planetary carrier 1712 or carrier cover 1714. Some embodiments may include mechanically coupling the planetary carrier 1712 and carrier cover 1714 using screws 1728 or similar components.

In some embodiments, a carrier cover 1712 may be mechanically coupled to the main shaft 1702. In such an embodiment, a rotation of the main shaft would rotate at the same speed as the carrier cover and, thus, the same speed of the planetary gears 1704 or compound planetary gears 1704 and 1706. In some embodiments, a planetary carrier may be mechanically coupled to the main shaft 1702. In such an embodiment, a rotation of the main shaft would rotate at the same speed as the planetary carrier 1712 and, thus, the same speed of the planetary gears 1704 or compound planetary gears 1704 and 1706.

In some embodiments, a main shaft assembly 1700 may include a pump drive gear 1716. A pump drive gear may be disposed between a planetary carrier 1712 and carrier cover 1716. Further, in some embodiments, a pump drive gear 1716 may be disposed between the multiple planetary gears comprising a compound planetary gear 1704, 1706. A pump gear drive 1716 may be mechanically coupled to various components present within the gearbox assembly, including the planetary carrier 1712, planetary gears 1704, 1706, or the carrier cover 1714. A pump drive gear 1716 may interface with other components, not pictured here, within the electric engine assembly to circulate oil or other coolant liquids throughout liquid flow paths, as described herein, in an effort to cool or lubricate components present within an electric engine assembly. For example, a pump drive gear 1716 may interface with a pump gear that acts to draw liquid from a sump to a heat exchanger. In such an embodiment, the speed of rotation of the pump gear drive 1716 may determine the speed at which oil or other liquid is circulated throughout the electric engine assembly. In some embodiments, the pump drive gear 1716 may be mechanically coupled to the main shaft 1702 such that the pump drive gear rotates at the speed of the main shaft 1702. In some embodiments, main shaft assembly 1700 may comprise dowel pins 1726, or similar alignment components, that serve to align the pump drive gear with various components of the main shaft assembly 1700, including the planetary carrier 1712 or carrier cover 1714.

As described herein, an electric motor assembly may drive the rotation of a rotor. The rotation of a rotor, which may be mechanically coupled to a sun gear, may rotate the sun gear at rotor speed. The sun gear rotating at rotor speed may interface with planetary gears 1704 or compound planetary gears 1704 and 1706 to generate an output of the gearbox assembly comprising a new value of torque to be supplied to a propeller assembly. In some embodiments, the combination of using a sun gear, planetary gears, including compound planetary gears, and a ring gear, as described herein, may produce a gear reduction. Those of ordinary skill in the art would understand that a gear ratio can be calculated from the gears present in the gearbox assembly. As such, properties of the gears within the gearbox assembly may determine the gear reduction available in the electric propulsion system. In some embodiments, a gear reduction value may be a relevant design criteria for VTOL aircrafts as an aircraft may require a specific value to torque to be applied to the propeller assembly to accomplish providing lift for payloads. However, it should be understood that increasing gear size to create a larger gear reduction would result in an increase in electric engine drag profile and mass. As such, embodiments as described herein may provide optimized electric propulsion system design in terms of drag profile and mass versus payload capabilities.

Figure 18:
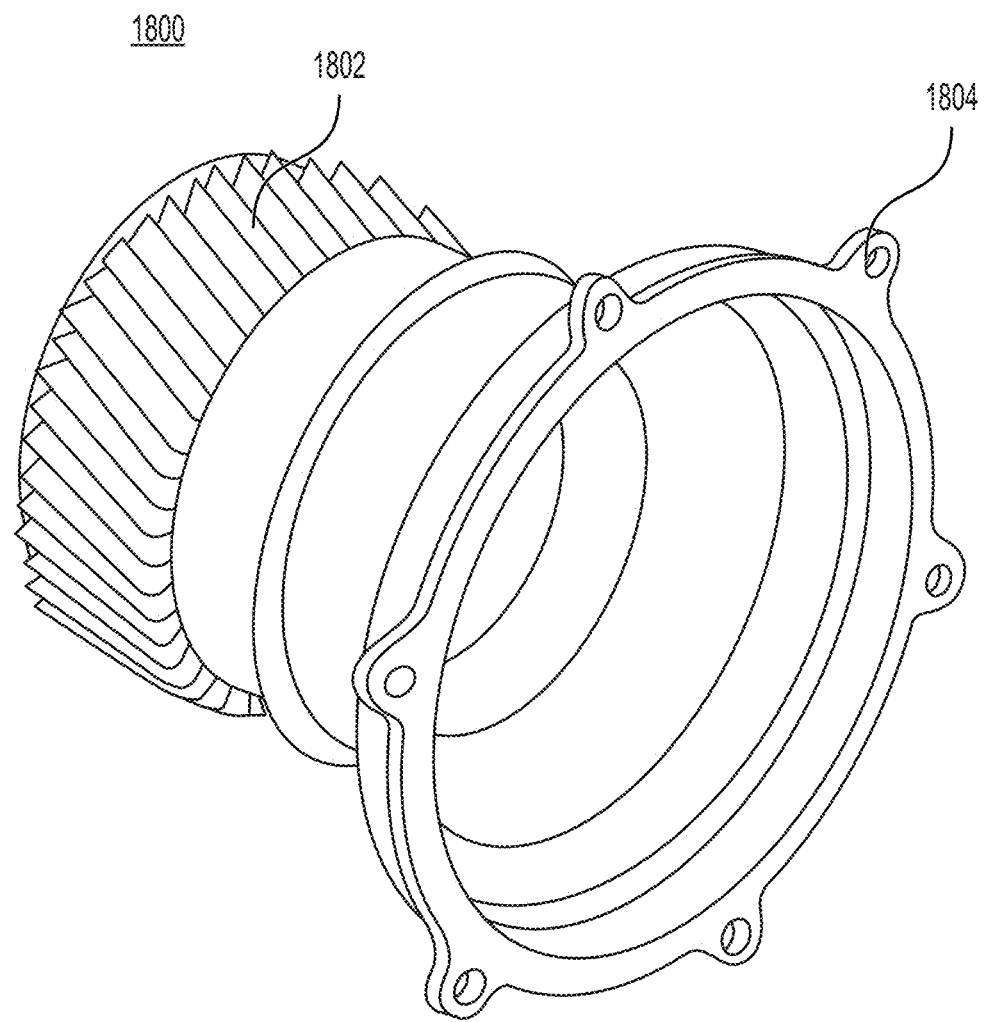
FIG. 18 is an illustration of an exemplary sun gear of a VTOL aircraft, consistent with disclosed embodiments.

As described herein, embodiments of a gearbox assembly may include a sun gear. FIG. 18 is an illustration of an exemplary sun gear of a VTOL aircraft, consistent with disclosed embodiments. Sun gear 1800 may be comprised of stainless steel, plastic, or any material capable of assisting in a gear reduction. Sun gear 1800 may include teeth 1802 to assist in a gear reduction. Some embodiments may include splined teeth. In some embodiments, the gear teeth 1802 may interact with planetary gears. Sun gear 1800 may include a hollow center. In some embodiments, components of a gearbox may travel through hollow portions of sun gear 1800. Sun gear 1800 may also include through holes 1804 to assist in fastening the sun gear 1800 to other components of the electric engine. In some embodiments, the sun gear 1800 may be mechanically coupled to other components of the electric engine assembly, such as a rotor of the electric motor assembly or an output shaft. Some embodiments may include the through holes 1804 allowing for such a mechanical coupling. In some embodiments, the sun gear 1800 may be fixed and as such may not rotate. In such an embodiment, the planetary gears and ring gear may be free to rotate. Some embodiments may include the through holes 1804 being fastened to another component or surface to restrict the rotation of the sun gear 1800.

Figure 19:
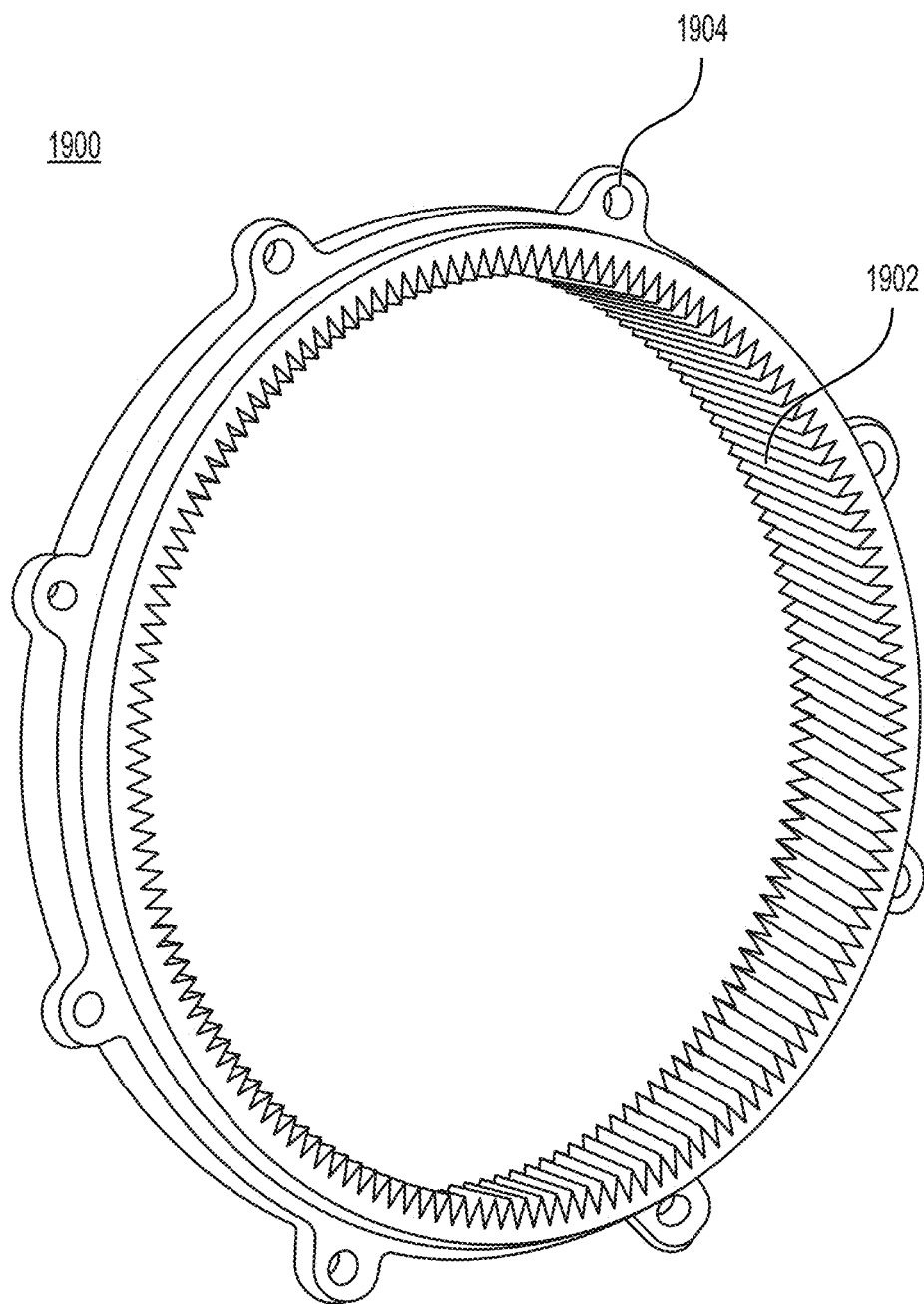
FIG. 19 is an illustration of an exemplary ring gear of a VTOL aircraft, consistent with disclosed embodiments.

Embodiments of a gearbox may include a ring gear. FIG. 19 is an illustration of an exemplary ring gear of a VTOL aircraft, consistent with disclosed embodiments. Ring gear 1900 may include teeth 1902. Teeth 1902 may interface with one or more planetary gears to assist in a gear reduction. Ring gear 1900 may be fixed or free to rotate. A fixed ring gear may be held stationary, allowing planetary gears to rotate around the sun gear. In some embodiments, a ring gear may be fixed by coupling the ring gear to various components or structures within the electric propulsion system using through-holes 1904. In other embodiments, a free ring gear may rotate around fixed planetary gears or a fixed sun gear. Ring gear 1900 may include slots 1902 to assist in fastening or mechanical coupling.

Figure 20:
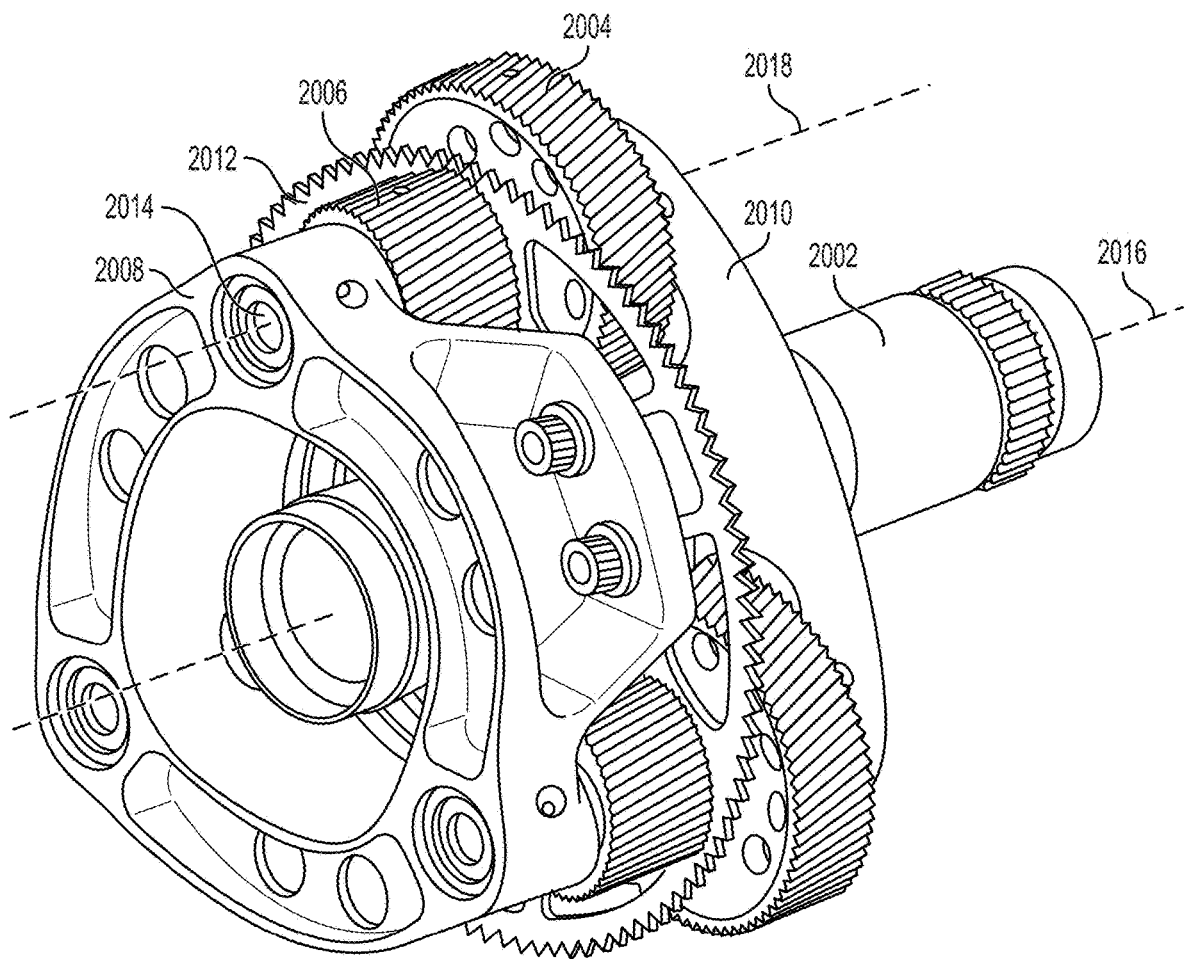
FIG. 20 is an illustration of an exemplary carrier assembly of a VTOL aircraft, consistent with disclosed embodiments.

As described herein, embodiments of a gearbox assembly may include a planetary carrier assembly. FIG. 20 is an illustration of an exemplary carrier assembly of a VTOL aircraft, consistent with disclosed embodiments. In some embodiments, carrier assembly 2000 may include a planetary carrier 2008, first planetary gear 2006, pump drive gear 2012, second planetary gear 2004, and carrier cover 2010. In some embodiments, the planetary carrier 2008, first planetary gear 2006, pump drive gear 2012, second planetary gear 2004, and carrier cover 2010 may rotate about a central axis 2016 or a shaft 2002. One or more planetary gears of carrier assembly 2000 may be substantially aligned along a shaft 2014 or central axis 2018, forming a set of compound planetary gears. For example, first planetary gear 2006 and second planetary gear 2004 may share shaft 2014 and be coaxial along central axis 2018. Carrier assembly 2000 may include shaft 2002. Shaft 2000 may be coaxial along a central axis 2016. In some embodiments the planetary carrier 2008, first planetary gear 2006, pump drive gear 2012, second planetary gear 2004, carrier cover 2010, and shaft 2002 may be mechanically coupled such that the components all rotate at the same rate. In some embodiments the shaft 2002 may be mechanically coupled to a propeller assembly such that the shaft transfers torque or mechanical shaft power to the propeller assembly. In some embodiments, carrier assembly 2000 may include cavities, ports, or holes to assist in distribution of a coolant such as oil.

In some embodiments, an electric engine may include an inverter assembly. An inverter assembly may include circuitry configured to receive input of a direct current, convert the direct current to an alternating current, and provide the alternating current to the stator ring of an electric motor.

As disclosed herein, embodiments of an electric engine assembly may include a thermal management system or cooling system that may circulate a coolant or lubricant throughout the engine. A lubricant or coolant, such as oil, may reside in a sump and may be distributed to components throughout the electric engine assembly. As disclosed herein, oil may travel from a sump to a heat exchanger, to various locations in the electric engine assembly, including an inverter assembly, a gearbox assembly, and an electric motor assembly. As described herein, an electric motor assembly may include an end bell assembly. In some embodiments, an end bell assembly may abut an inverter assembly.

Figure 21:
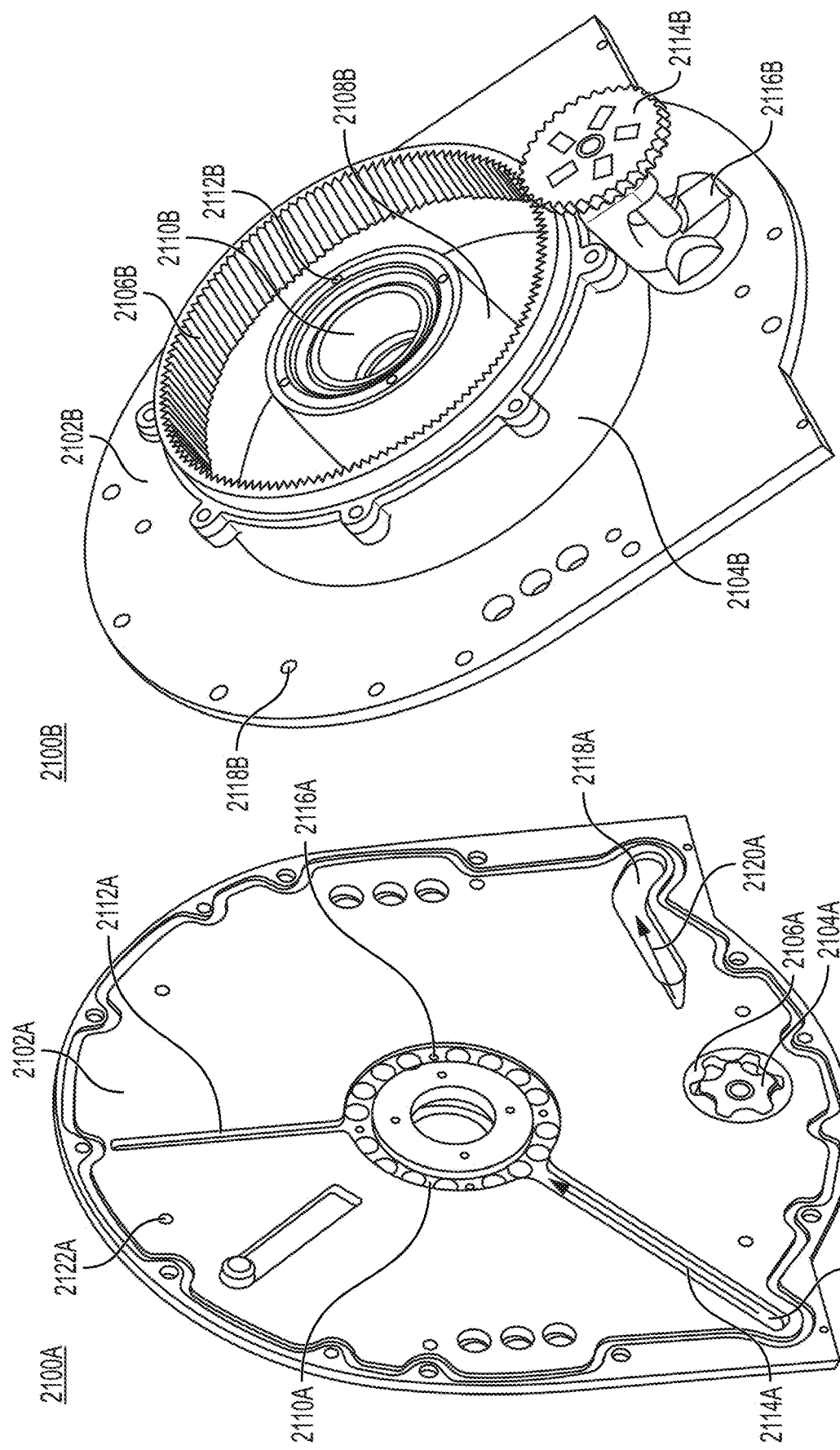
FIGS. 21A-21B are illustrations of an exemplary end bell assembly of a VTOL aircraft, consistent with disclosed embodiments.

FIGS. 21A-21B are illustrations of an exemplary end bell assembly of a VTOL aircraft, consistent with disclosed embodiments. FIG. 21A illustrates an internal view of an end bell plate of an end bell assembly. End bell plate 2100A may comprise a plate 2102A made of aluminum, steel, or another other type of thermally conductive material. End bell plate 2100A may include pump rotor 2104A and a passage rotor 2106A. A passage rotor 2106A may be sized such that a pump rotor 2104A may be able to rotate within the passage rotor 2106A such that multiple areas are open around the pump rotor 2104A while it is rotating within 2106A. A pump rotor 2104A may be positioned within a passage rotor 2106A. A pump rotor 2104A may be mechanically coupled to, and have a rotation driven by, another component of the electric engine assembly, such as a pump gear 2114B. In some embodiments, a pump rotor 2104A and a passage rotor 2106A may correspond to a gerotor, with an inner and outer rotor, or positive displacement pump. A pump rotor 2104A may circulate oil from a sump through a pump inlet 2116B. In some embodiments, a pump rotor 2104A may rotate within a passage rotor 2106A to draw oil from a pump inlet through open areas between the pump rotor 2104A and passage rotor 2106A. In some embodiments, a rotation of the pump rotor 2104A within the passage rotor 2106A may create a vacuum between the pump inlet 2116B and the sump containing any liquid. pump outlet 2118A such that. For example, a pump may create a vacuum to draw oil from the sump to the pump inlet 2116B. In some embodiments, a pressure differential may be present between the pump outlet 2118A and the various distribution points of the cooling system, as described herein, such that oil or other liquids may be drawn from the opening between the pump rotor 2104A and a passage rotor 2106A to the pump outlet 2118A and through the cooling system. In some embodiments, an end bell plate 2100A may include additional, or different, components such as electric pumps or other mechanical configurations to draw oil or other liquid through the pump inlet 2116B. After entering through the pump rotor 2104A and passage rotor 2016A, oil or liquid may travel in a direction 2120A and may travel from pump outlet 2118A into a heat exchanger. In some embodiments, a heat exchanger may be mounted to the thermal plate 2100A or divider plate as discussed herein.

In some embodiments, a heat exchanger may cool oil or other liquid used to lubricate or cool the inverter assembly, gearbox assembly, and/or electric motor assembly. In some embodiments, a certain portion of the cooled oil or liquid leaving the heat exchanger may be directed to the inverter assembly to cool such components or may be directed to a motor-gearbox housing to cool components of the gearbox assembly and/or electric motor assembly. Some embodiments may include different divisions of cooled oil or liquid among the inverter assembly versus the gearbox assembly and electric motor assembly. For example, an inverter assembly may receive 40% of the cooled oil by volume and the motor-gearbox hosing may receive 60%. The ratio may differ depending on the design considerations and requirements of the particular implementation. Indeed, different types of electric propulsion systems as described herein may use different fluid distribution percentages. Further, it should also be understood that tilter electric propulsion systems and lifter electric propulsion systems may possess similar or non-similar distributions of oil from the heat exchanger. The pump corresponding to pump rotor 2104A and pump gear 2114B may provide performance improvements to a gearbox assembly. Furthermore, using the pump to drive the transportation of oil to not only a gearbox assembly and electric motor assembly, but also an inverter assembly, may eliminate the need of extra components to transport coolants to the inverter assembly. Such an advantage may reduce the mass and improving the drag profile of an electric propulsion system.

From the heat exchanger, cooled oil may enter channel 2108A, and travel, in a direction 2114A, to annulus 2110A. Annulus 2110 may be aligned along a shaft, as described herein. Annulus 2110A may include ports 2116A. Oil from channels 2108A may travel through ports 2116A to various components of the electric engine, including to a gearbox assembly and motor assembly, to provide cooling and lubrication. Oil may also travel from annulus 2110A to channel 2112A. End bell plate 2100A may also include ports 2122A that allow oil or other liquids to be transferred to through the end bell assembly 2100B. In some embodiments, the pump may create pressure, which may drive the movement of liquids through the end bell plate 2100A. For example, pressure from the pump, which may be a gerotor or positive displacement pump, may propel the travel of oil in channels 2108A, 2112A, annulus 2110A, ports 2116A, or other grooves or cavities in the end bell plate that may assist in transport of liquid.

FIG. 21B illustrates a view of an exemplary end bell assembly. End bell assembly 2100B may include an end bell plate 2100. Further, an end bell assembly may include gears that may be driven by, or interact with, additional gears in a gearbox assembly, as described herein. In some embodiments, ring gear 2104B may be coupled to end bell plate 2102B assembly. Ring gear 2106B may include teeth that may interface with additional gears. Teeth of the ring gear 2106B may interface with planetary gears of a main shaft assembly, as described herein. In some embodiments, teeth of a pump drive gear may interface with teeth of a pump gear 2114B, such that the rotation of a pump drive gear drives a rotation of a pump gear 2114B. Pump gear 2114B may be mechanically coupled to a pump rotor 2104A, such that rotation of pump gear 2114B may drive a rotation of pump rotor 2104A. As a result, pump gear 2114B may drive the transport of a lubricant or coolant throughout the end bell assembly. In some embodiments, pump gear 2114B may drive a lubricant or coolant from a sump. End bell 2102B may include ports 2118B for drainage of oil from a thermal plate via ports 2122A.

In some embodiments, end bell assembly 2100B may comprise an end bell plate 2102B that serves to seal off an electric motor assembly housing or a motor-gearbox assembly housing. In some embodiments, an end bell assembly 2100B may comprise a first circular wall extending away from the end bell plate 2102B. In some embodiments, a ring gear 2106B may be coupled to the first circular wall 2104B such that the ring gear 2106B is not free to rotate, as described herein. In some embodiments, an end bell assembly 2100B may comprise a second circular wall 2108B extending away from the end bell plate 2102B. In some embodiments, the second circular wall 2108B may possess a diameter that is less than a diameter of the first circular wall 2104B. A second circular wall 2108B may housing a bearing 2110B. In some embodiments, the bearing 2110B may be mechanically coupled to a shaft, including a main shaft that may transfer mechanical shaft power to a propeller assembly. In some embodiments, bearing 2110B may include grooves to assist in the transfer of oil or other liquids. The second circular wall 2108B may also comprise an annulus that includes port holes 2112B. Port holes 2112B may aligned with ports 2116A to receive oil or liquid from the heat exchanger. Port holes 2112B may comprise a supply of oil or other liquid to cool or lubricate components of the electric motor assembly and gearbox assembly.

In some embodiments, the port holes 2112B may transfer oil or other liquid to the main shaft. In some embodiments, an outer surface of a main shaft may serve as a liquid flow path where the oil or other liquid flows upon the main shaft and may be distributed to components within the gearbox assembly and/or electric motor assembly.

Figure 22:
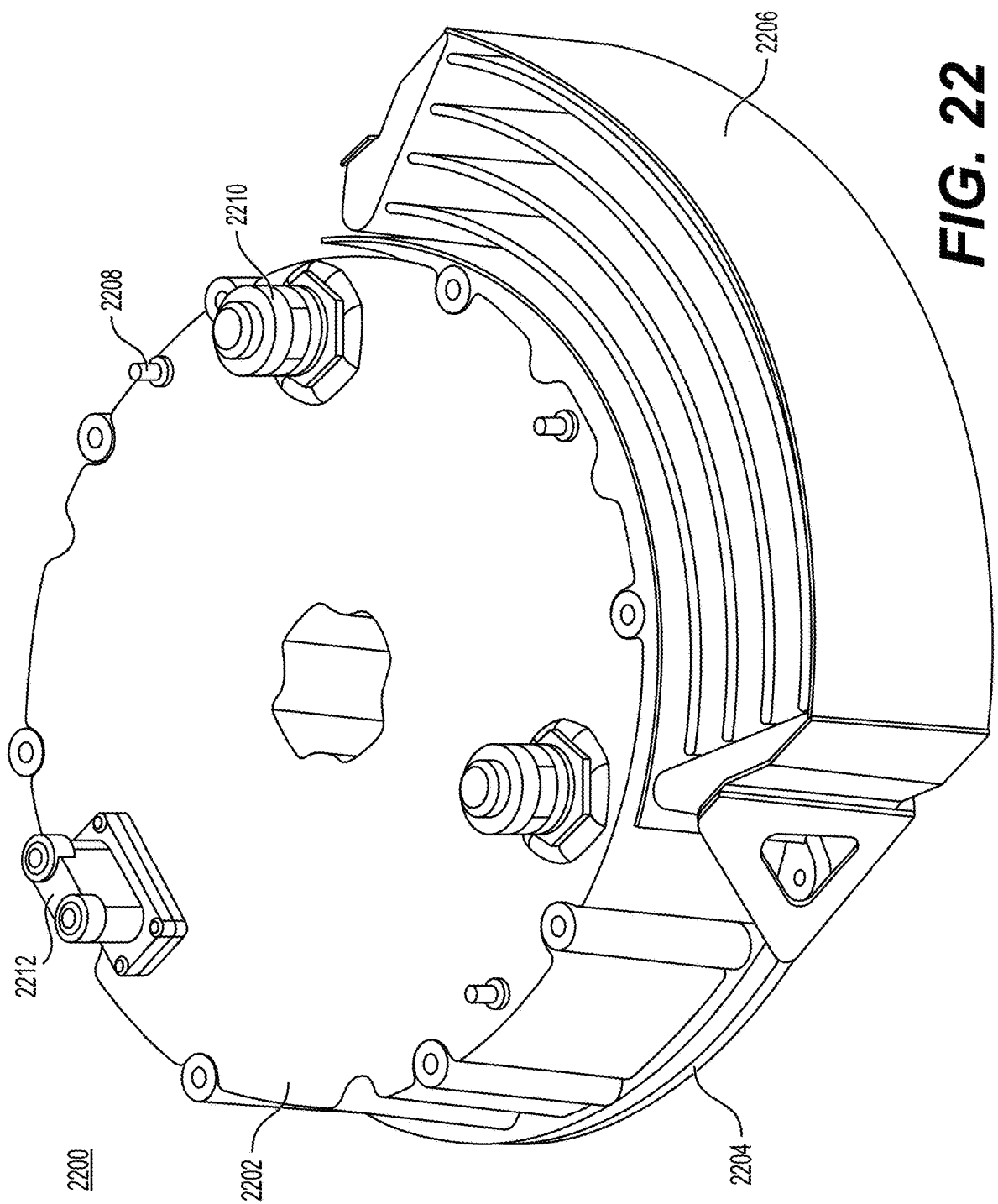
FIG. 22 is an illustration of an exemplary inverter assembly of a VTOL aircraft, consistent with disclosed embodiments.

Disclosed embodiments of an inverter assembly may include an inverter assembly with a heat exchanger. FIG. 22 is an illustration of an exemplary inverter assembly of a VTOL aircraft, consistent with disclosed embodiments. In some embodiments, an inverter assembly 2200 may include an inverter assembly housing 2202 coupled to a thermal plate 2204. An inverter assembly housing 2202 may serve to house inverter assembly components as discussed herein. An inverter assembly housing 2202, and thus an inverter assembly 2200, may possess a substantially circular profile. As used herein a profile may be substantially circular, having a length of a minor axis of a circular shape and a length of a major axis of a circular shape, where the length of the minor axis is at least 80% of the length of the major axis.

In some embodiments, an inverter assembly 2200 may comprise a high voltage connector 2212 and low voltage connectors 2210. High voltage connector 2212 may have a low profile. High voltage connector 2212 may receive high voltage power from a high voltage power system located elsewhere within the aircraft via high voltage channels. Inverter assembly 2212 may include at least one drain 2208. Drains 2208 may be configured to allow any oil or liquid present within the inverter assembly to exit the inverter assembly 2200 no matter the orientation of the electric engine assembly. In alternative embodiments, inverter assembly 2200 may also include vents. In some embodiments, an inverter assembly 2200 may comprise a heat exchanger 2206 coupled or mounted to the thermal plate 2204. In some embodiments, heat exchanger 2206 may be an integrated heat exchanger. In some embodiments, thermal plate 2204 may be welded to heat exchanger 2206. For an example, thermal plate 2204 may be comprised of aluminum. Assembly of thermal plate 2204 and heat exchanger 2206 may include brazing, quenching, aging, and welding. In some embodiments, thermal plate 2204 and heat exchanger 2206 may be machined from the same material.

FIG. 56A is an illustrations showing a cross-sectional view of a press-in mesh port after installation when operating in a tilted position, consistent with disclosed embodiments. In some embodiments, the inverter housing such as housing 2302 shown in FIG. 23 may have a plurality of drains and/or vents, such as drains/vents 2208 shown in FIG. 23 As shown in FIG. 56A, each of the drains and/or vents 5600 may comprise a press-in mesh drain and vent port 5602. Each of the ports 5602 may comprise a mesh 5604 and a press-fit latch 5606 on the mesh 5604. The press-fit latch 5606 may be configured to be pressed into the inverter housing 5608 (only partially shown in FIG. 56A) from inside and stay at an angle between 0° and 90°. In some embodiments, this angle may take manufacturing difficulties into consideration. In some embodiments, the mesh 5604 material may be aluminum, copper, titanium, stainless steel (as used in sintered metal type mesh,) or any mesh material with a match in coefficient of thermal expansion (CTE) with the material of housing 2302 (e.g., aluminum). In some embodiments, the drains and/or vents 5600 are positioned along a circumference of the inverter housing 5608, so that the inverter housing 5608 may drain through at least one of the plurality of drains and/or vents 5600 regardless the orientation of the inverter housing 5608.

In some embodiments, the inverter housing 5608 may have a lifter position and a tilter position, corresponding to scenarios separately described with respect to FIGS. 32A-32D.

Figure 56B:
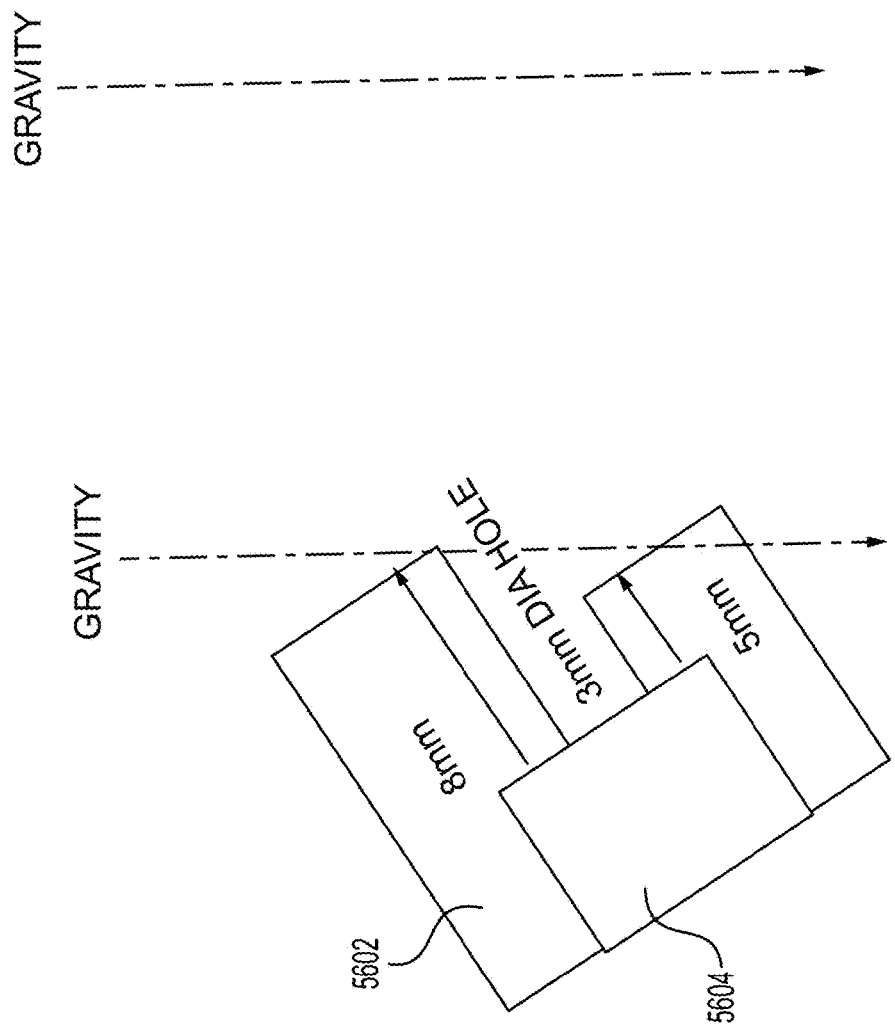
FIG. 56B is an illustration showing a cross-sectional view of a press-in mesh port after installation when operating in a tilted position, consistent with disclosed embodiments.

In some embodiments, the size of the ports 5602 may be adjusted for application needs. FIG. 56B is an illustrations showing a cross-sectional view of a press-in mesh port after installation when operating in a tilted position, consistent with disclosed embodiments. In some exemplary embodiments, as shown in FIG. 56B, the hole size may be around 3 mm, and the tilt angle after installation may be from 10° to 25°, or up to 35° relative to the gravity direction.

Figure 23:
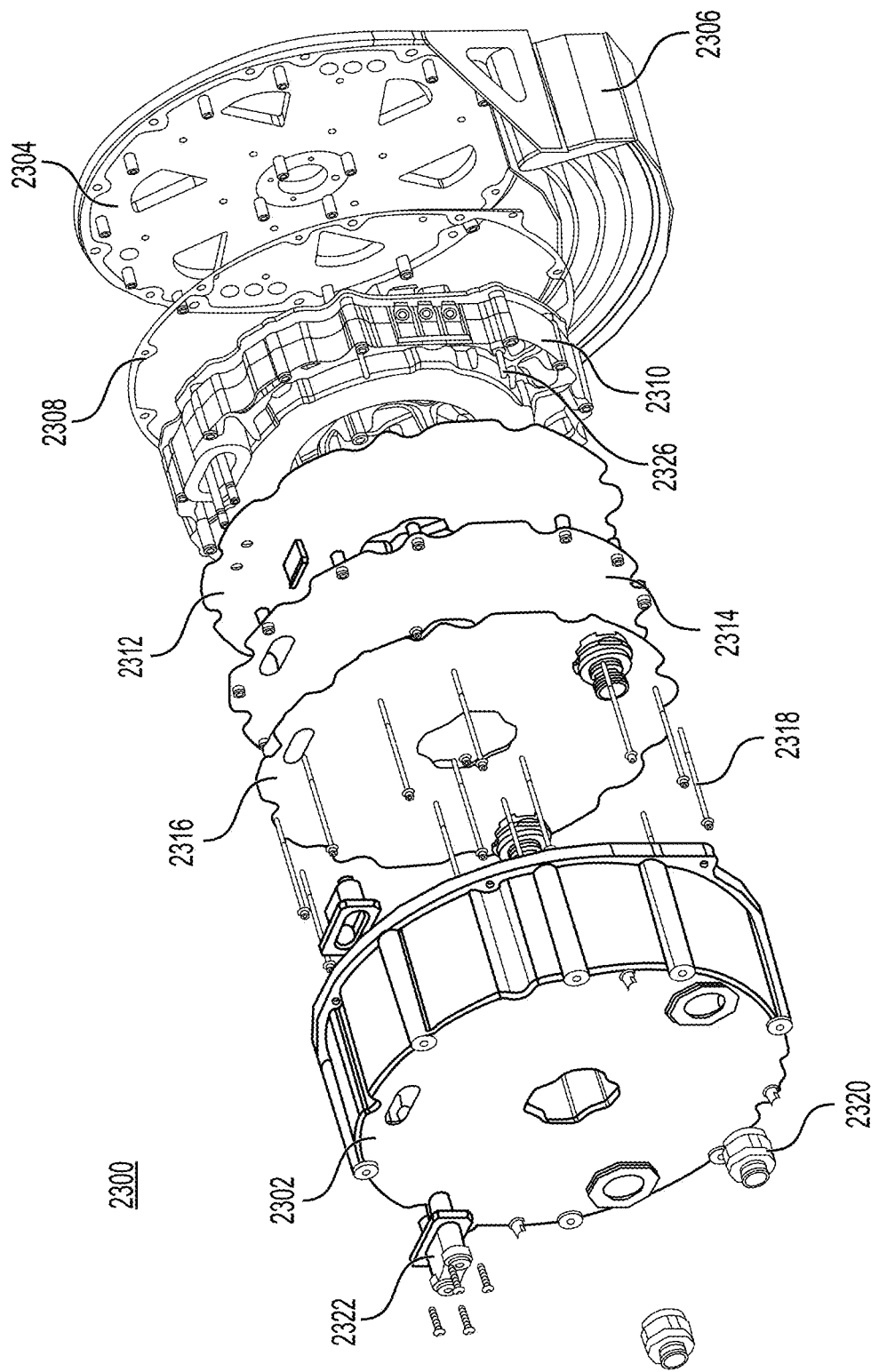
FIG. 23 is an illustration of an exploded view of an inverter assembly of a VTOL aircraft, consistent with disclosed embodiments.

Some embodiments may include an inverter assembly wherein the components of the inverter abut one another and may share a common housing. In some embodiments, components of the inverter assembly can be placed on top of one another in a stacked orientation. In some embodiments, components of the inverter assembly can be substantially aligned along a central axis. An inverter assembly may include various components for sensing, circuitry, and controls. FIG. 23 is an illustration of an exploded view of an inverter assembly of a VTOL aircraft, consistent with disclosed embodiments. An inverter assembly 2300 may include a control printed circuit board assembly ("PCBA") 2316, board spacer assembly 2314, a gate drive PCBA 2312, a capacitor assembly 2310, power PCBA 2324, housing gasket 2308, thermal plate assembly 2304, and heat exchanger 2306. Components of inverter assembly 2300 may be mechanically coupled by various means of fastening. For example, components of inverter assembly 2300, including inverter assembly housing 2302, may be fastened to one another by fasteners 2318. Further, an inverter assembly 2300 may include an inverter assembly housing 2302 that may be coupled to thermal plate assembly 2304 to enclose the inverter assembly components and protect them from any liquids, debris, or other material that may be harmful to the inverter assembly components. An inverter assembly housing 2302 may include connections for power and current used by components of the inverter assembly 2300 such as a high voltage connector 2322 and low voltage connectors 2320. In some embodiments, the inverter assembly housing 2302 may include inverter busbars for high current and low inductance.

In some embodiments, the inverter assembly housing 2302 may be cylindrical in shape, or may have a doughnut-like shape (i.e., a round overall shape with a center hole in plan view). The form factor of the inverter assembly housing 2302 may provide low drag during flight.

In some embodiments, the capacitor assembly and the at least one PCBA (e.g., 2312, 2314, 2316) may all be stacked and positioned inside the invertor housing 2302. In some embodiments, each of the components stacked (e.g., PCBA 2316, board spacer assembly 2314, gate drive PCBA 2312, capacitor assembly 2310, housing gasket 2308, thermal plate assembly 2304) may have a plurality of through positioning holes to allow fasteners 2318 going through to fasten the stacked structure. In some embodiments, the fasteners 2318 may be long screws, bolts, or rods.

In some embodiments, a set of alignment pins 2326 may facilitate the alignment of the stacked components (e.g., PCBA 2316, board spacer assembly 2314, gate drive PCBA 2312, capacitor assembly 2310, housing gasket 2308, thermal plate assembly 2304) in the inverter assembly 2310. In some embodiments, the alignment pins 2326 may be integrated with the housing of the capacitor assembly 2310. Alternatively, in some embodiments, the positioning pins 2326 may be separate components from the assembly. In some embodiments, the positioning pins 2326 may be overmolded as a feature of the housing of the capacitor assembly 2310.

In some embodiments, the thermal plate assembly 2304 may have a set of receptacles for the alignment pins 2326. The number of the receptacles may match the number of alignment pins 2326.

Figure 60A:
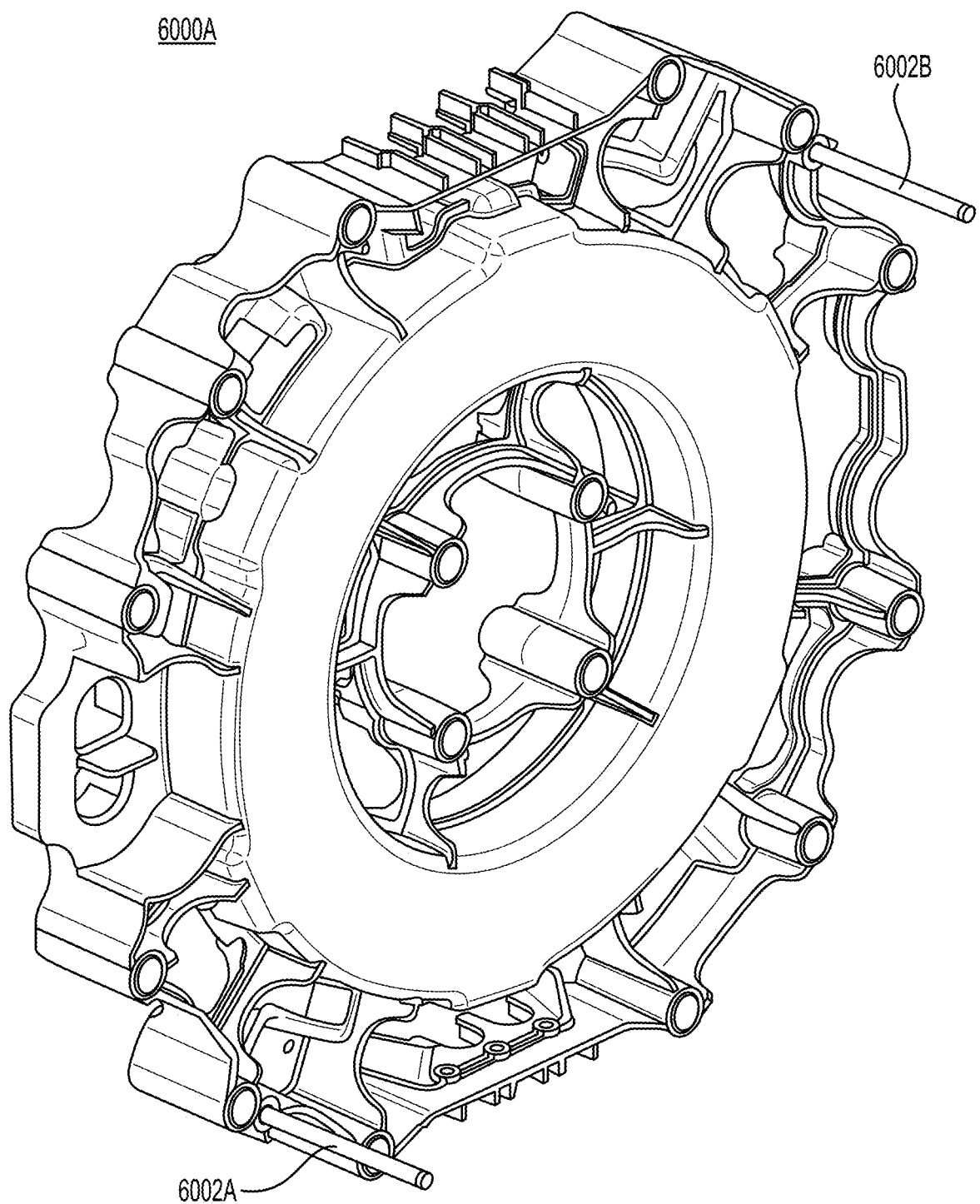
FIG. 60A is an illustration of a capacitor housing showing alignment pins, consistent with disclosed embodiments
Figure 60B:
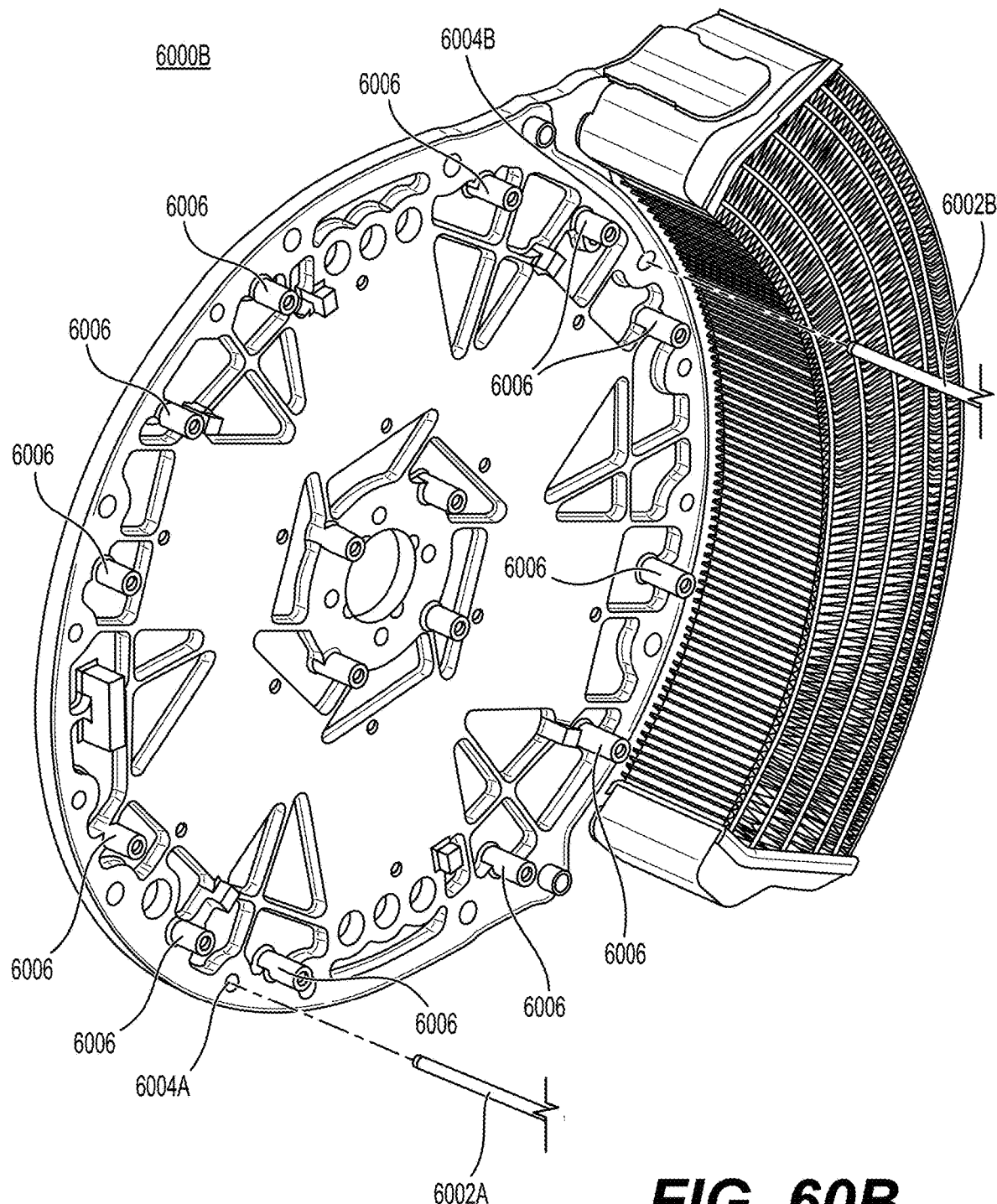
FIG. 60B is an illustration of a thermal plate and heat exchanger showing engaging alignment pins, consistent with disclosed embodiments.

FIG. 60A is an illustration of a capacitor housing showing alignment pins, according to an exemplary embodiment. FIG. 60B is an illustration of a thermal plate and heat exchanger showing engaging alignment pins, consistent with disclosed embodiments. In this exemplary embodiment, two alignment pins 6002A and 6002B may be overmolded as a feature on the housing 6000A of the capacitor assembly (e.g., 2310). On the thermal plate 6000B (e.g., 2304 in FIG. 23,) two receptacles 6004A and 6004B may have different shapes. The first receptacle 6004A may have a round shape, configured to provide friction fit to the first alignment pin 6002A. The second receptacle 6004B may take an elongated shape, (e.g., an long oval shape, a slot, or alike,) to accommodate dimensional tolerances. The long axis of the elongated shape may take the radial direction.

In some exemplary embodiments, the alignment pins 6002A and 6002B may extend in both directions, on both sides of the capacitor housing 6000A. In the assembly process, the capacitor assembly (e.g., 2310 in FIG. 23) may be positioned on top of the thermal plate 6000B (e.g., 2304 in FIG. 23) though the housing gasket (e.g., 2308 in FIG. 23) and the power PCBA (e.g., 2324 in FIG. 23). The bottom side of the first alignment pin 6002A engages with the first receptacle 6004A, the bottom side of the second alignment pin 6002B engages with the second receptacle 6004B. Both pairs together may provide a guide for aligning the capacitor assembly (e.g., 2310 in FIG. 23) and the thermal plate 6000B (e.g., 2304 in FIG. 23). The top sides of the alignment pins 6002A and 6002B then provide datums for the rest of the components of the inverter assembly (e.g., PCBA 2316, board spacer assembly 2314, gate drive PCBA 2312, capacitor assembly 2310, housing gasket 2308, thermal plate assembly 2304, in FIG. 23). Each of these components may have through alignment holes for the alignment pins 6002A and 6002B to go through. These holes may have clearance fit, or arrangements similar to the recepticles on the thermal plate 6000B for tolerancing reasons. After all components are stacked, fasteners 2318 may be applied to tighten components together. In some embodiments, receptacles 6006 may receive the fasteners 2318. The receptacles 6006 may, depending on the type of fastener 2318, be threaded, or have interference fit or crush ribs.

Now referring again to FIG. 23, in some embodiments, the stacked orientation in the housing may conform to various design shapes, for example a circular shape possessing a diameter proportional to that of a motor or gearbox, or any other design shapes. The internal components of the inverter may be arranged to assist in achieving that design goal shape. In some embodiments, a stacked orientation may be achieved by using common structural components through the stack, for example designing the different levels of the stack such that a common structure, such as various bolts of the same length, can pass through each level to create a stacked orientation.

In some embodiments, using a stacked orientation may create additional obstacles with respect to additional design considerations, such as heat transfer where the difficulty of managing the proper distribution of coolant could increase in such a configuration. Further, using long bolts to travel through various levels of an inverter my increase the shock and vibrations experienced by the inverter assembly. However, it is also understood that such a stacked orientation may be advantageous in view of various design considerations. For example, allowing a stacked orientation may be beneficial from an aerodynamic perspective where the stacking allows the inverter, or the inverter in combination with other engine components such as the gearbox and/or motor, to maintain a low drag profile. Additionally, a stacked orientation may be advantageous from a manufacturability point of view such that less components are involved in securing the inverter assembly, as well as being advantageous from a mass reduction perspective where less components, and potentially less mass, is being used to secure the components.

In some embodiments, the capacitor assembly 2310 may have at least one capacitor in a capacitor housing having at least one busbar on the outside. The capacitor assembly 2310 may have a center hole and a plurality of through positioning holes on the capacitor housing. The capacitor assembly 2310 may have at least one PCBA positioned inside the capacitor housing.

As disclosed herein, an inverter assembly may include a power PCBA. In some embodiments, power PCBA may include a power board. FIG. 24 is an illustration of an exemplary printed circuit board assembly of a VTOL aircraft, consistent with disclosed embodiments. Power board 2400 may also include a sensor assembly. As an example, possible sensors may include sensors for current shunt, motor temperature, and MOSFET module temperature. Further, some embodiments may include various power modules 2402 electrically coupled to the power board 2400. As discussed herein, power modules 2402 may generate heat during use and require cooling to ensure proper functionality and efficiency of the overall electric propulsion system.

Figure 57:
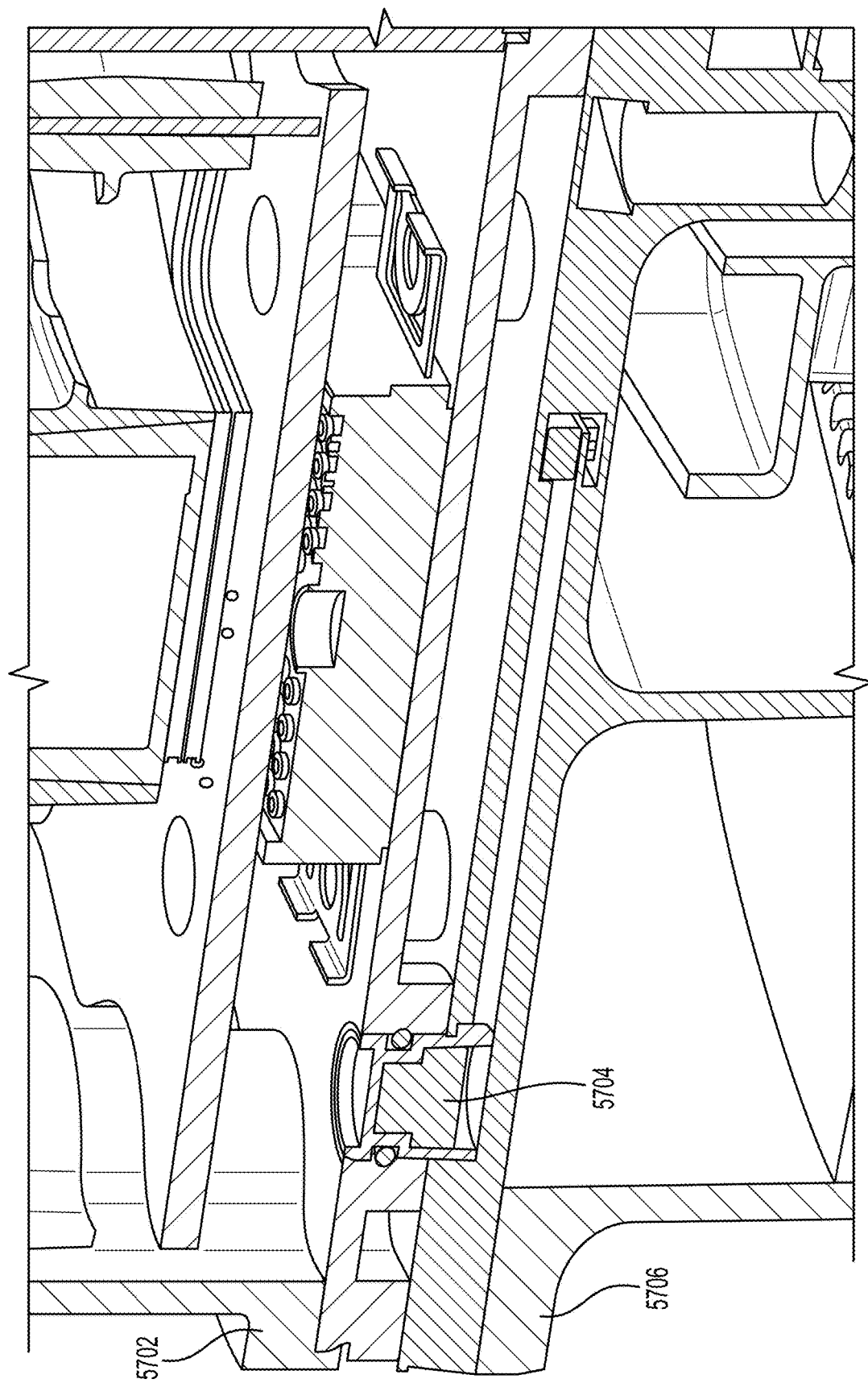
FIG. 57 is an illustration of a cross-sectional perspective view of integrated sensors on the power board, consistent with disclosed embodiments.

FIG. 57 is an illustration of a cross-sectional perspective view of integrated sensors on the power board, according to some embodiments of this disclosure. In some embodiments, the power board may be one of the at least one PCBA of the inverter assembly 2300.

In some embodiments, the power board 5702 may have sensors integrated to it. In some embodiments, the power board 5702 may have rotor position sensors integrated to it. In some embodiments, the rotor position sensors may be at least two hall sensors 5704 (only one shown in FIG. 57) integrated to it. In some embodiments, the gearbox of the propeller assembly may have a magnet on its planet carrier. The power board 5702 and the gearbox 5706 are placed close to each other so that the at least two hall sensors 5704 may sense the position of the magnet to determine a position of the propeller. In some embodiments, the heat plate 2304 of the inverter assembly 2300 and an end bell plate of the gearbox 5706 are made of materials not blocking magnetic fields so that the at least two hall sensors 5704 may sense the position of the magnet.

In some embodiments, the power board 5702 may have oil temperature sensor (not shown) integrated to it. In some embodiments, the oil temperature sensor may be positioned to sense the temperature of cooling fluid (e.g., oil, water, or other fluid or mixture of fluids known to have large heat capacity.) In some embodiments, the cooling fluid may be the one used to cool MOSFET, power modules, or other components that generates heat.

In some embodiments, the power board 5702 may have a secondary speed sensor (not shown) that is connected to a control board of the electrical propulsion system (not shown) to provide redundancy.

Figure 58:
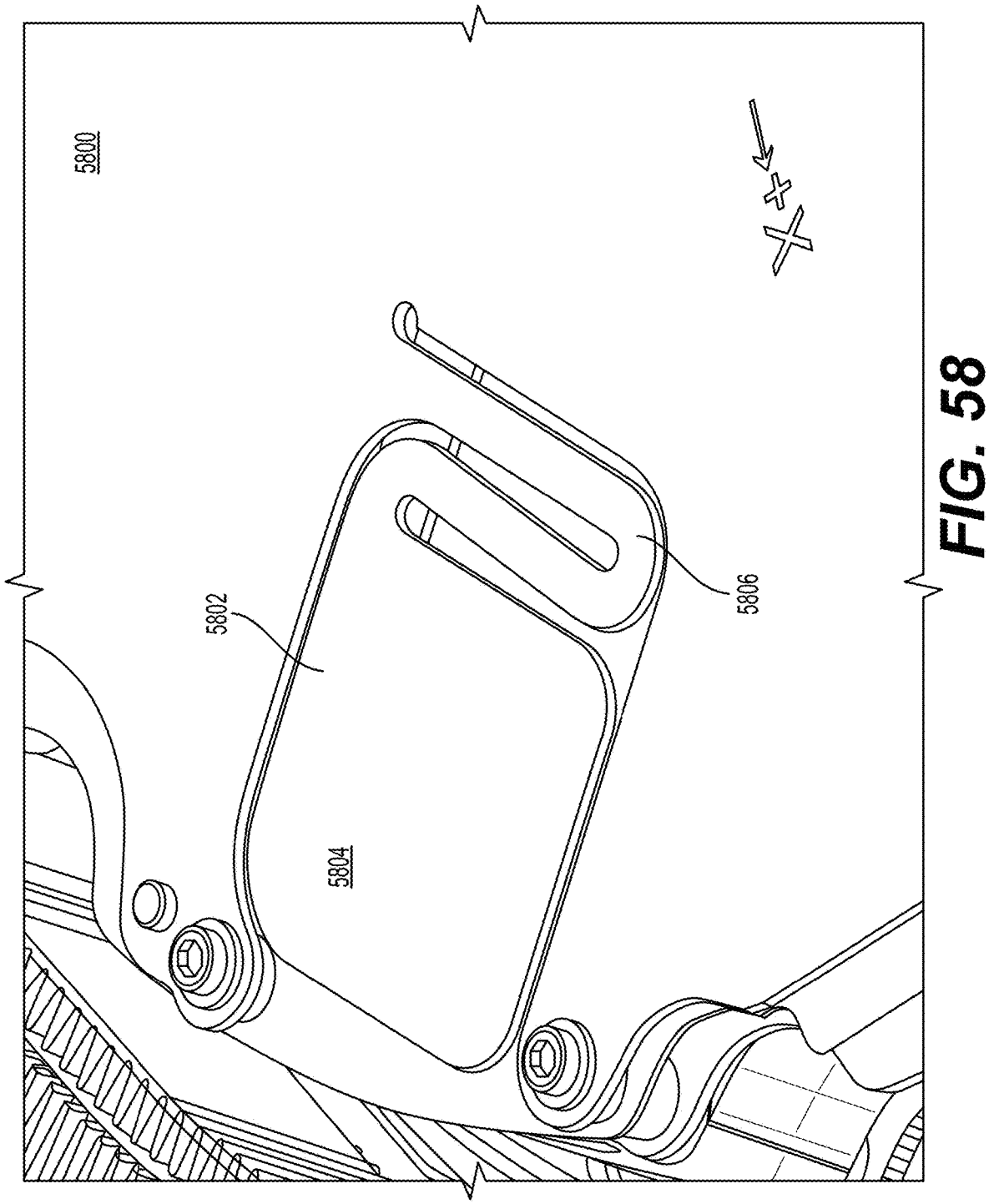
FIG. 58 is an illustration of a perspective view of a flexible PCBA connection, consistent with disclosed embodiments.

FIG. 58 is an illustration of a perspective view of a flexible PCBA connection, consistent with disclosed embodiments. In some embodiments, the PCBA 5800 may have a flexible PCBA structure 5802 to make electrical connections with an electrical component (not shown) off the PCBA plane. In some embodiments, the flexible PCBA 5802 may comprise a contact pad 5804 having an electrical contact (not shown) on it, and at least one snaking connection 5806 formed by cutting through the layered printed circuit board (PCB). The electrical contact may be electrically connected to electronics on the rest of the PCBA through at least one of the at least one snaking connections 5806.

In some embodiments, each of the snaking connection 5806 may have a flex factor. The flex factor is defined as the allowable displacement or deflection of the contact pad over the length of the flexible section (i.e., the snaking connection 5806 and the contact pad 5804). The flex factor may be defined for displacement of any direction, i.e., a direction within the plane defined by the PCBA, a direction perpendicular to the plane defined by the PCBA, or along any direction between the two aforesaid directions. In some embodiments, the flex factor serves as an indicator of the flexibility of the flexible PCBA structure 5802 when the contact pad 5804 deflects off the plane defined by the PCBA.

In some embodiments, the flexible PCBA structure 5802 may have more than one snaking connections 5806 connecting to a same contact pad 5804. In some embodiments, at least two of the snaking connections 5806 may have a same flex factor.

In some embodiments, the flex factor of a flexible PCBA structure 5802 may be less than 0.015, or approximately 0.005.

In some embodiments, the contact pad 5804 may have a plurality of stand-offs (not shown) on it.

In some embodiments, the PCBA (e.g., FR4) may include alternating substrate layers and copper layers.

In some embodiments, the flexible PCBA structure 5802 may allow electrical connections between the PCBA structure and another electrical contact off the PCBA without the needs of additional components (e.g., pin connectors, wire connectors, flex circuits, or additional processes, e.g., soldering, welding) and thus save on costs. In some embodiments, an electrical connection can be made by stacking and aligning the PCBA with the flexible PCBA structure 5802 onto another structure with another electrical contact. In some embodiments, the alignment of the PCBA can be done by letting positioning pins 2326 going through positioning holes on the PCBA. Because the flexible PCBA structure 5802 allows the contact pad 5804 to deflect off the plane, electrical connection may be made by pushing the contact pad 5804 against another electrical contact. Alternatively, the contact pad 5804 may include standoffs on the back side to provide necessary support, so electrical connection may be made by pushing another component on top of the contact pad 5804. The electrical connection may be secured in place by conventional means, for example, snap fits, soldering, ultrasonic welding, electrical welding, laser welding, ultrasonic wire bonding. The deflection of the contact pad 5804 may provide forgiveness to tolerance stack and thus make the electrical connection secure and robust.

Figure 59:
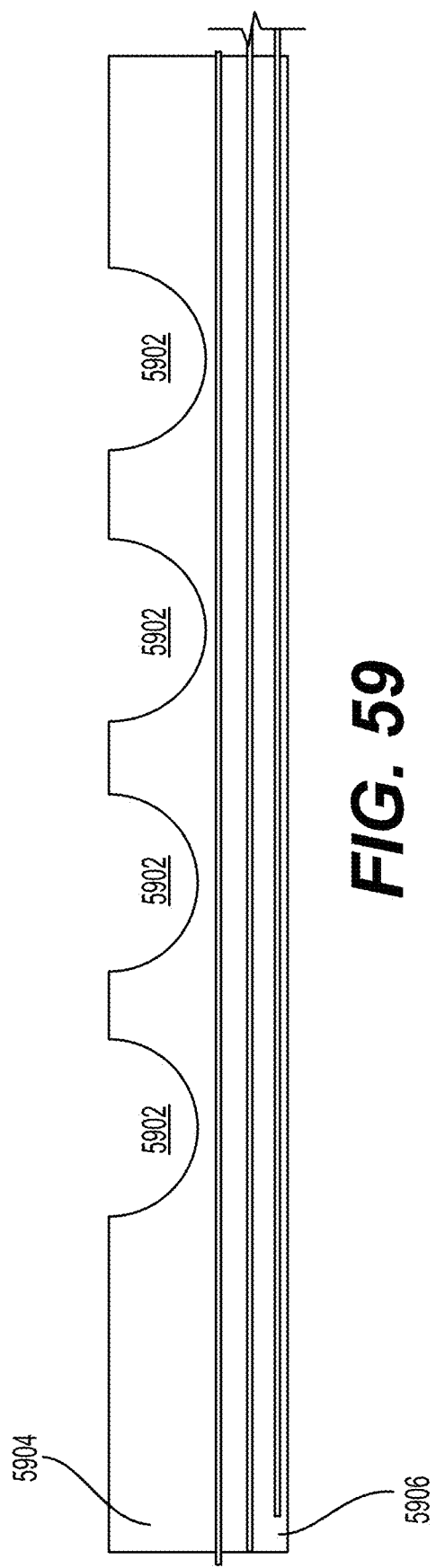
FIG. 59 is a cross-sectional view of a snaking connection of the flexible PCBA shown in FIG. 58, showing partial cut-outs consistent with disclosed embodiments.

In some embodiments, the snaking connection 5806 may be partially cut-out for more deflection of the contact pad 5804. FIG. 59 is a cross-sectional view of the snaking connection 5806 of the flexible PCBA shown in FIG. 58, showing partial cut-outs consistent with disclosed embodiments. In this exemplary embodiment, the cut-outs 5902 are only on substrate layers 5904. The copper layers 5906 may remain intact. In some embodiments, the cut-out directions are perpendicular to the instant running direction of the snaking connection, i.e., the cut-out 5902 always cut across the narrow width of the snaking connection. Cut-outs 5902 may further increase the flexibility of the flexible PCBA structure, making the contact pads 5804 deflecting more easily. In other words, the cut-outs 5902 may have a same effect as increasing the flex factor.

As discussed above, an electric engine and related control components of a VTOL aircraft may generate heat during operation. For example, such components may include an inverter assembly, electric motor assembly, and a gearbox assembly. An engine may accumulate a buildup of heat generated from mechanical friction between parts, and from resistive heating within the motor-gearbox assembly. The accumulated heat may be carried to the heat exchanger by lubricant circulating through one or more parts of the engine. The heat must be dissipated to prevent degradation or damage to the motor, control components and other elements of the VTOL aircraft. Such heat may be managed by cooling the engine, including by direct or indirect cooling. In some embodiments, cooling may be assisted by a heat exchanger. A heat exchanger may be configured to receive a circulating heat exchange medium from an electric engine. For example, the heat exchange medium may comprise oil, and the oil may be used to both lubricate and cool the components of the electric engine. A heat exchanger may interface one or more fluids with each other, thereby cooling a fluid that is at a higher temperature. A heat exchanger may be advantageously located next to an electric engine, thereby minimizing the volume (and weight) of material required to achieve the cooling and lubricating functions. In some embodiments, a heat exchanger may be fluidically, thermally, and mechanically coupled to an inverter assembly such that the heat exchanger may share common connections with the inverter assembly, reducing the need for components such as cables, wires, tubes, and hoses, which may add weight and require more space in the electric engine. Heat in the inverter assembly, electric motor assembly, or gearbox assembly may be transferred to a cooling fluid such as oil. The oil may absorb such heat, and the oil may then be directed to a sump.

Figure 25B:
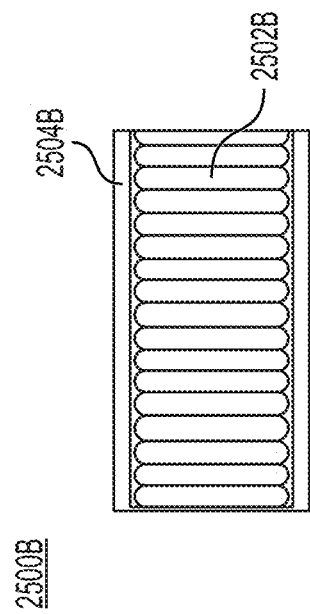
FIGS. 25A-25C are illustrations and exemplary front views of a heat exchanger of a VTOL aircraft, consistent with disclosed embodiments.
Figure 25C:
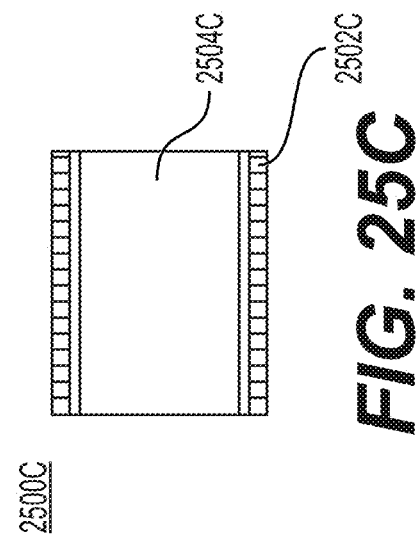
Figure 25A:
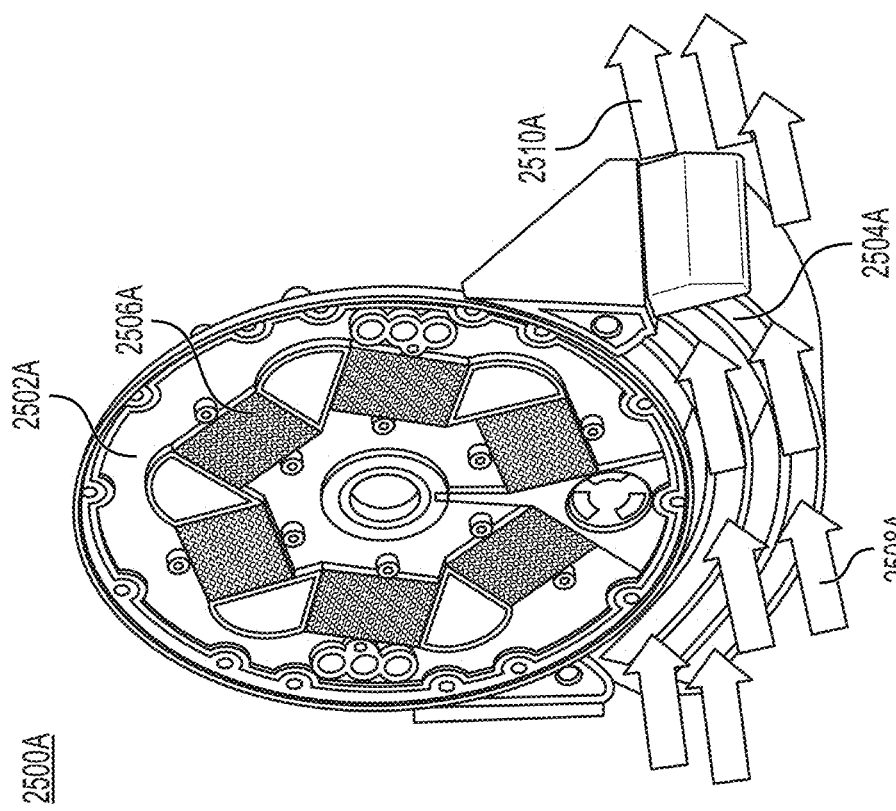

As described herein, an electric propulsion system may include a heat exchanger. FIGS. 25A-25C are illustrations and exemplary front views of a heat exchanger of a VTOL aircraft, consistent with disclosed embodiments. A heat exchanger 2504A may be mechanically coupled to a thermal plate 2502A of an inverter assembly, as described herein and, as shown in exemplary view 2500A. Thermal plate 2502A may include fin arrays 2506A. Fin arrays 2506A may provide a heat sink to draw heat from components of the inverter assembly. As described herein, heat exchanger 2504A may be positioned to receive air flow from a propeller. A propeller (not shown) may direct air flow 2508A into heat exchanger 2504A, and exiting air 2510A may exit the heat exchanger. Air flow 2508A, which may be cooler air, may be forced into heat exchanger 2504A as, e.g., downwash from propeller blades (not shown). Exiting air 2510A, which may be warmer air, may exit the heat exchanger 2504A without entering other components of the electric propulsion system. In some embodiments, heat exchanger 2504A may include cooling fins.

FIGS. 25B-25C illustrates exemplary views of cooling fins 2500B, 2500C in a heat exchanger, respectively. The oil or other lubricant or coolant which may absorb heat from the electric motor assembly, gearbox assembly, or inverter assembly may be circulated through the fins of heat exchanger 2504A. Heat exchanger 2504A may include tubes 2504B and fins 2502B. Tubes 2504B may carry oil, and fins 2502B may be thermally coupled to tubes 2504B. As a result, oil travelling in tubes 2504B may transfer heat to another fluid heat exchange medium. Fins 2502B may be configured to maximize the surface area of heat exchanger 2504A, increasing the surface area contact between the tubes 2504B and the fluid. Increased surface area may increase the rate of heat transfer. The fluid may comprise air. For example, air flow 2508A may enter heat exchanger 2504A, come into thermal contact with fins 2502C. and receive heat from oil traveling in tubes 2504C. Air may then exit heat exchanger 2504A as exiting air 2510A. Heat exchanger 2504A may transfer heat via convection.

Figure 26:
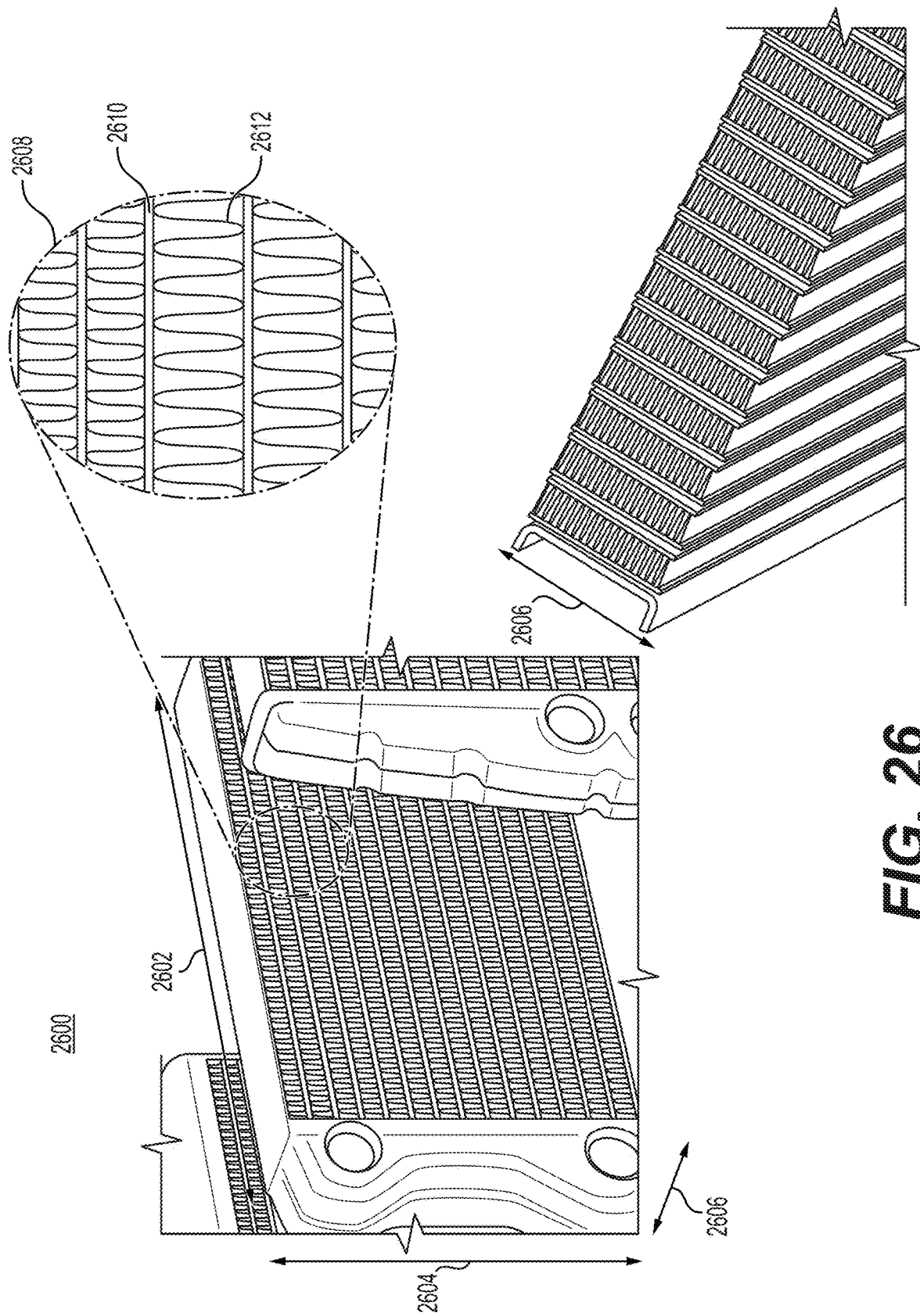
FIG. 26 is an illustration of a heat exchanger of a VTOL aircraft, consistent with disclosed embodiments.

FIG. 26 is an illustration of a heat exchanger of a VTOL aircraft, consistent with disclosed embodiments. Heat exchanger 2600 may include a length 2602, height 2604, and depth 2606. As described herein, heat exchanger 2600 may include tubes and fins to assist in heat transfer between fluids. Heat exchanger 2600 may include a number of cooling paths. Section 2608 shows an example of different cooling paths. A lubricant or coolant, such as oil, may travel in tubes 2610. Tubes 2610 may be thermally coupled to fins 2612, as described herein. Tubes 2610 may comprise hollow tubes for fluids. Fins 2612 may increase the surface area of contact between air and tubes 2610, thereby increasing the rate of heat transfer from oil in tubes 2610 to the air, as described herein. In some embodiments, heat exchanger 2600 may include multiple layers of fins 2612 stacked between, and thermally coupled to, tubes 2610. As a result, oil entering heat exchanger 2600 may flow into different tubes 2610, creating a number of cooling paths wherein heat can be transferred from the oil to the air.

As described herein, embodiments of an electric engine may include circulating a lubricant or coolant throughout the engine. A heat exchanger may cool lubricants or coolants directed to engine components such as a motor, gearbox, or inverter. In some embodiments, heat from the inverter assembly may be directly conducted to the coolant or lubricant, such as oil.

FIGS. 27A-27B are illustrations of a front view of a divider plate of a VTOL aircraft, consistent with disclosed embodiments. In some embodiments, a divider plate may be comprised of an end bell plate and a thermal plate. A dividing plate may comprise one or more plates sandwiched together and arranged between a motor-gearbox housing and an inverter assembly housing. Further, a divider plate may assist in the distribution of a lubricant or coolant throughout the engine. In some embodiments, a divider plate may include channels, tubes, ports, cavities, or other characteristics for transporting liquids. An end bell plate 2700 may include similar elements and discussion as the end bell plate of FIG. 21. In some embodiments an end bell plate 2700A may be coupled to thermal plate 2700B. In some embodiments, end bell plate 2700A may abut a gasket plate which may abut thermal plate 2700B. The inverter assembly may include thermal plate 2700B. Thermal plate 2700B may be mechanically, thermally, and fluidically coupled to heat exchanger 2710B. In some embodiments, the end bell plate 2700A and thermal plate 2700B may be positioned above a heat exchanger. The outer circumference of thermal plate 2700B may be connected to the heat exchanger 2710B. End bell plate 2700A and thermal plate 2700B may include channels to aid in the distribution of a lubricant or coolant.

Herein, channels may also refer to grooves, bores, or any other conduit configured to distribute oil or other coolant or lubricant in a planar direction. In some embodiments, a lubricant or coolant may be a liquid such as oil, as described herein. The thermal plate may be thermally and fluidically coupled to a heat exchanger by a liquid such as oil. In some embodiments, the distribution of a lubricant or coolant may be driven by a pump. Thermal plate 2700B may include grooves, bores, liquid flow paths, or any other conduit to assist a pump gear in transporting oil or other liquid from a sump. In some embodiments, oil may be transported from a sump through a passage rotor 2704A, 2704B and a pump rotor 2706A to inlet channel 2708A on end bell plate 2700A. Oil in inlet channel 2708A may be hot or warm oil traveling in flow path 2716A. Oil in inlet channel 2708A may travel to heat exchanger inlet 2706B in thermal plate 2700B and enter tubes or other liquid flow paths of heat exchanger 2710B. As described herein, oil circulating through liquid flow paths may be cooled in heat exchanger 2710B, and cooled oil may travel to a heat exchanger outlet 2708B in thermal plate 2700B. In some embodiments, oil transported between a thermal plate 2700B and end bell plate 2700A may travel through a gasket plate. Cooled oil in heat exchanger outlet 2708B may then travel to outlet channel 2710A along flow path 2718A to an annulus 2712A and channel 2714A of the end bell plate 2700A and annulus 2712B on thermal plate 2700B. In some embodiments, oil in annulus 2712B may flow into fin arrays 2714B in thermal plate 2700B to provide cooling and heat transfer. Oil from fin arrays 2714B may then return to a sump via ports. Some embodiments may include the annulus 2712A being substantially aligned along a main shaft or axis shared with the gearbox assembly or electric motor assembly. In some embodiments, oil or liquid may travel from the annulus 2712A, through port holes to a gearbox assembly or electric motor assembly, as described herein. In some embodiments, a channel 2714A may be fluidically connected to additional liquid flow paths within the motor-gearbox housing that may serve to circulate oil or liquid to additional portions of the electric engine, such as front bearings or components located near the propeller assembly. In some embodiments, the end bell plate may include a seal in the electric engine. The end bell assembly may include a face-seal between the heat exchanger and the inverter assembly to prevent oil leaks.

In some embodiments, a lubricant or coolant may be used to cool an inverter assembly using a thermal plate 2702B. Some embodiments may include hot oil or other liquid entering inlet channel 2708A, that may be aligned with heat exchanger inlet 2706B, to enter the heat exchanger 2710B. Cooled oil or other liquid exiting the outlet channel 2710A aligned with heat exchanger outlet 2708B and a portion, or all, of the cooled oil or liquid may follow a liquid flow path to an annulus 2712B of the thermal plate. Oil or other liquid in annulus 2712B may be distributed to heat sinks located on the thermal plate 2702B such as fin arrays 2714B and may provide cooling to power modules, such as those referenced in FIG. 24, by aligning fin arrays 2714B with the power modules located within the inverter assembly. It should be understood that an inverter assembly may possess components that may not perform well or efficiency when exposed to oil or other liquids. As such, a thermal plate may include heat sinks to remove heat from the inverter assembly and then may circulate oil or liquid within the thermal plate, and not within the inverter assembly housing, to transfer heat from those heat sinks into the oil or liquid to be cooled by the heat exchanger. A thermal plate 2702B may include port holes 2716B such that oil or liquid may pass through the port holes and enter an end bell assembly. In some embodiments, port holes 2716B may allow oil to return to a sump. In some embodiments, port holes 2716B may align with port holes 2720A present on the plate 2702A of the end bell plate 2700A. In some embodiments, oil from the port holes 2718B may enter the end bell assembly to circulate to a sump locating in the motor-gearbox housing. In some embodiments, oil may return to the sump along the direction of gravity, and such oil may be warm or hot. Cooling with oil may provide various advantages, including improving the overall performance of the inverter assembly. For example, using fluids to cool power modules, such as those referenced in FIG. 24, may improve the performance of the inverter assembly. Furthermore, liquid convection may improve durability of the inverter assembly compared to other cooling methods involving additional components, such as air convection methods requiring the addition of air-cooling fins.

Disclosed embodiments of the electric propulsion system may include one or more components for distributing a lubricant or coolant, as described herein. In some embodiments, the lubricant or coolant, such as oil, may be circulated from a sump 1212A, to a heat exchanger 1226A, and then to an inverter assembly, gearbox assembly, and motor assembly (as illustrated in FIG. 12A). As illustrated in FIG. 21A, an end bell assembly may assist in the distribution and circulation of the oil. As described herein, oil traveling from the heat exchanger in channel 2108A may be distributed to an annulus 2110A and ports 2116A located in annulus 2110A. As described herein, a main shaft, which may be substantially aligned with the annulus 2110A of the end bell assembly, may extend from the end bell assembly through the gearbox assembly and through the electric motor assembly. In some embodiments, portions of the oil in the end bell assembly may be shared among the annulus 2110A, ports 2116A, ports 2122A, and various other ports and channels. Centrifugal force, centripetal force, or pressure may drive oil from annulus 2110A, ports 2116A, or grooves in bearing 2110B along the main shaft, and towards the gearbox assembly and electric motor assembly. For example, pressure in end bell assembly 2100B may drive oil to grooves in bearing 2110B or port holes 2112B. may Then, centrifugal force may drive the oil along the main shaft to windings of the stator in the motor assembly. For example, rotation of the main shaft may exert centrifugal forces that propel oil to travel along the main shaft. In some embodiments, oil may travel from the end bell assembly through holes, pipes, channels, tubes, or ports to the gearbox assembly and motor assembly. For example, oil may flow in an annular area between a sun gear and a shaft. In some embodiments, a port may transfer oil from an end bell assembly to a channel, or similar structure, present within the motor assembly housing for the purpose of delivering oil to additional portions of the gearbox assembly or motor assembly. Some embodiments may include a channel, or similar structure, configured to deliver oil to the propeller assembly, bearings mechanically coupled to a shaft flange, or stator windings within the motor assembly.

As described herein, by using a fluid, such as oil, to provide both lubrication and cooling, the amount of oil used in the electric propulsion system may be minimized. Furthermore, the oil can be used for lubricating various bearings, such as rolling bearings or hydrodynamic bearings, as described herein. Minimizing the amount of oil used in the electric propulsion system may reduce the mass and drag profile of the electric propulsion system. Furthermore, minimizing the amount of oil necessary for operation of the electric propulsion system may enable the total quantity of oil in the electric propulsion system to remain below a threshold amount. For example, the electric propulsion system may reduce the amount of oil necessary for operation by using a heat exchanger, as described herein. Warm or hot oil that has been used for lubrication and cooling may reside in a sump, and by using a heat exchanger to cool such oil, the electric propulsion system may re-use the oil, eliminating the need for additional oil. Further, as described herein, the use of a common liquid for both cooling and lubricating can lead to a reduction in mass of components when compared to other methods of cooling and lubricating using various liquids. Such a configuration using various liquids may require additional mass and size of the electric propulsion system such as additional heat exchangers, additional fluid distribution channels or tubes, and additional surface area to receive cooling air from a propeller assembly.

In some embodiments, ventilation from air-flow may provide cooling to lubricants within the heat exchanger. It is understood that by using oil to not only lubricate the electric engine but also cool the electric engine rather than another coolant, additional oil will be added to the system, but that oil will remove traditional components that may be used to cool such an electric engine. For example, if the electric engine were cooled by another liquid such as glycol, the engine may comprise separate heat exchangers for both the lubricant fluid and the coolant fluid. As such, in embodiments where a single fluid is being used for both lubrication and cooling, such as oil, an increase in oil would be present but there would only be a need for one heat exchanger, so there may be a decrease in mass, due to using less heat exchangers and potentially other components not being required, of the overall system and a more appealing drag profile may be present. Further, using one substance for the lubrication and cooling of the engine may increase efficiency of the system due to the reduction in mass and the benefits of cooling the engine with a substance rather than relying on air cooling which may have issues traveling throughout the engine.

Some embodiments of an inverter may include an inverter possessing a coolant path traveling around the outer edge of the inverter but within the inverter housing rather than utilizing a heat exchanger. For example, a coolant path may travel around any printed circuit board assemblies, power modules, or other inverter components present in the inverter.

As disclosed herein, embodiments of electric engine may include an inverter assembly. In some embodiments, the inverter assembly may include a thermal plate. FIG. 28 is an illustration of a thermal plate of a VTOL aircraft, consistent with disclosed embodiments. Thermal plate 2802 may aid in heat transfer for inverter assemblies, including distributing a coolant to an inverter assembly. In some embodiments, thermal plate 2802 may abut components of an inverter assembly, such as an inverter housing or printed circuit board. Thermal plate 2802 may be thermally coupled to an inverter assembly. In some embodiments, thermal plate 2802 may abut an end bell assembly. In some embodiments, thermal plate 2802 may abut a gasket, which may abut an end bell assembly. The gasket may be a metal carrier gasket. In some embodiments, a thermal plate 2802 may abut a heat exchanger 2810. For example, thermal plate 2802 may be mounted on heat exchanger 2810 and coolants may travel through various paths in heat exchanger 2810. As an example, oil may be a coolant that travels through various paths in heat exchanger 2810. Pump rotor 2804 may drive oil through cooling paths, also referred to herein as liquid flow paths, in heat exchanger 2810. In some embodiments, oil or other liquid from a sump may be drawn through a pump rotor 2804 to a heat exchanger inlet 2806. In some embodiments, a heat exchanger 2810 may receive oil or other liquid from the heat exchanger inlet 2806, cool the oil or other liquid, and the cooled oil or other liquid may exit the heat exchanger at a heat exchanger outlet 2808. Cooled oil from heat exchanger 2810 may be driven by pump 2804 to different channels in the thermal plate. For example, oil may be transported to distribution channels 2812. In some embodiments, thermal plate 2802 may include heat sinks to assist in heat transfer for the inverter assembly. As an example, thermal plate 2802 may include fin arrays 2818. Fin arrays 2818 may include cooling fins that extend from a base and may increase the surface area to improve heat transfer. Fin arrays 2818 may sit within cavities in thermal plate 2802. Fin arrays 2818 may be a heat sink and may be comprised of a material with high thermal conductivity. In some embodiments, fins may be rectangular or circular in shape, and may be comprised of aluminum. Fin arrays 2818 may draw heat from the thermally and mechanically coupled inverter assembly to cool components including switching devices and MOSFETs. Fin arrays 2818 may be exposed to a flowing fluid. For example, cooled oil in distribution channels 2812 may enter fin arrays 2818, via channels 2814, and provide cooling and heat transfer to fin arrays 2818. From fin arrays 2818, oil may then flow to collection channel 2816. In other embodiments, oil may be transferred directly from distribution channels 2812 to collection channels 2816.

Figure 29:
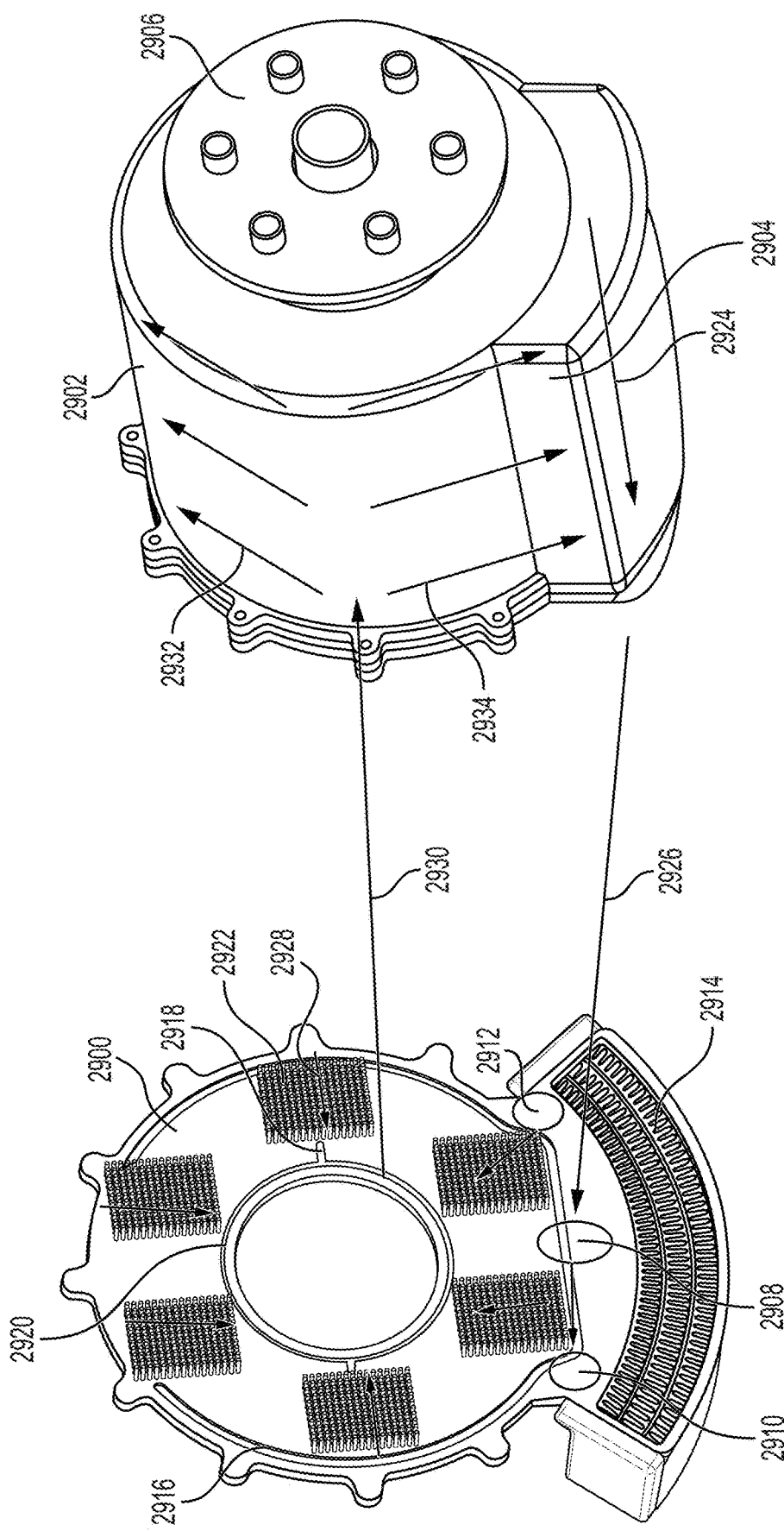
FIG. 29 is an illustration of an electric propulsion system of a VTOL aircraft, consistent with disclosed embodiments.

FIG. 29 is an illustration of an electric propulsion system of a VTOL aircraft, consistent with disclosed embodiments. In some embodiments, thermal plate 2900 may be thermally coupled to motor assembly housing 2902. Thermal plate 2900 may also be fluidically coupled to motor assembly housing 2902 by one or more coolant or lubricant flow paths. As described herein, thermal plate 2900 may assist in the distribution of a coolant or lubricant such as oil. For example, oil in thermal plate 2900 may enter heat exchanger 2914 via a heat exchanger inlet 2912 and exit heat exchanger 2914 via a heat exchanger outlet 2910. Thermal plate 2900 may include pump rotor 2908, distribution channel 2916, fin arrays 2922, and collection channel 2920. Cooled oil from heat exchanger 2914 may enter distribution channel 2916, flow through fin arrays 2922, via a direction 2928, and enter collection channel 2920 through channel 2918. As described herein, fin arrays 2922 may be a heat sink, and assist in transferring heat to cooled oil 2928 from the inverter assembly. In some embodiments, oil in thermal plate 2900 may be transferred to motor assembly housing 2902. For example, oil flow path 2930 may be an exemplary flow path from thermal plate 2900 to motor assembly housing 2902. Oil flow path 2932 may be an exemplary flow path of oil to various components in motor assembly housing 2902. Oil 2930 may also travel to a second oil flow path 2934. Oil in the various flow paths may travel to a gearbox assembly, electric motor assembly, or other components within motor assembly housing 2902 to provide cooling or lubrication, as described herein. Oil that has been distributed throughout the motor assembly housing 2902 may accumulate in a sump 2904. Oil may flow through the sump along a liquid flow path 2924 and then exit the sump 2904 and flow in a return path 2926 back to thermal plate 2900. Motor assembly 2902 may be mechanically coupled to a shaft flange assembly 2906, as described herein. In some embodiments, the location of thermal plate 2900 and heat exchanger 2914 may provide advantages to the electric propulsion system. For example, thermal plate 2900 abutting heat exchanger 2914 and being liquidly coupled to heat exchanger 2914 may eliminate the need for external connections. As discussed herein, oil may travel from heat exchanger 2914 to thermal plate 2900 and be distributed to components of the electric propulsion system such as an inverter assembly, gearbox assembly, and motor assembly, which may be packaged together. Such configuration, including a thermal plate integrating several components together, may eliminate the need for external connections and may reduce risks such as leaks and detachment of such external connections.

FIGS. 30A-30B are illustrations of exemplary electric propulsion systems of a VTOL aircraft, consistent with disclosed embodiments. As described herein, an electric propulsion system 3000A may include a heat exchanger 3008A mechanically, thermally, and fluidically coupled to a thermal plate 3006A. Thermal plate 3006A may be mechanically coupled to motor housing 3002A comprising a liquid sump 3004A. Electric propulsion system 3000A may include shaft flange assembly 3010A. In some embodiments, the electrical propulsion system 3000A may include a thermal plate 3006A and motor housing 3002A substantially aligned along an axis 3012A. FIG. 30B presents an additional view of an electric propulsion system 3000B. Heat exchanger 3008B may be mechanically coupled to thermal plate 3006B. Thermal plate 3006B may be mechanically coupled to motor housing 3002B that may comprise a liquid sump 3004B. In some embodiments, the electrical propulsion system 3000B may include a thermal plate 3006B and motor housing 3002B substantially aligned along an axis 3012B.

FIGS. 31A-31B are cross-sectional illustrations of electric propulsion systems of a VTOL aircraft, consistent with disclosed embodiments. FIG. 31A illustrates an exemplary embodiment of a tilter electric propulsion system. As disclosed herein, a tilter may refer to an electric propulsion system for tilt. A tilter 3100A may include an inverter assembly 3104A, a gearbox assembly 3106A, and an electric motor assembly 3102A. As described herein, heat exchanger 3118A may be thermally, fluidically, and mechanically coupled to inverter assembly 3104A. Inverter housing 3116A may enclose inverter assembly 3104A. A gearbox assembly 3106A may abut the inverter assembly 3104A and the electric motor assembly 3102A. Motor-gearbox assembly housing 3110A may enclose an electric motor assembly 3102A and a gearbox assembly 3106A. Sump 3112A may include a fluid inlet 3114A to transfer oil or other liquid to a heat exchanger 3118A. In some embodiments, sump 3112A may be a reservoir to hold oil. Sump 3112A may abut motor housing 3110A. In some embodiments, main shaft 3108A extends from an end bell assembly sealing the motor-gearbox assembly housing 3110A, through the gearbox assembly 3106A and electric motor assembly 3102A to a shaft flange assembly 3120A. As described herein, gearbox assembly 3106A and electric motor assembly 3102A may be substantially aligned along main shaft 3108A. Further, an inverter assembly 3104A may be substantially aligned along an axis sharing the axis of the main shaft 3108A.

As described above, a tilter may possess a variable pitch mechanism that serves to change the pitch of the propeller blades of a VTOL aircraft. In some embodiments, a variable pitch mechanism may be mounted to the rear of the electric engine assembly, such as the rear of an inverter assembly. Further, a variable pitch mechanism may interact with a main shaft, as described herein, to alter the pitch of the propeller blades. In such embodiments, the inverter assembly 3104A, inverter assembly housing 3116A, and divider plate, as discussed herein, may possess a packaging having a passage through their configurations and housings to allow the variable pitch mechanism to interface with the main shaft or propeller blades. As discussed throughout, a lifter electric propulsion system may not alter its orientation of thrust or pitch of blades. Therefore, in some embodiments, a divider plate may not possess a passage such as the one present in the tilter electric propulsion system. Further, the inverter assembly and inverter assembly housing of a lifter electric propulsion system may not possess such a passage, but it is recognized that from a safety testing point of view and a manufacturability standpoint, it may be beneficial to have the inverter assembly and inverter assembly housing of a lifter electric propulsion system possess a similar packaging, including the passage, to that of the tilter electric propulsion system.

FIG. 31B illustrates an exemplary embodiment of a lifter electric propulsion system. As disclosed herein, a lifter may refer to an electric propulsion system for lift. A lifter 3100B may include inverter assembly 3104B, gearbox assembly 3106B, and electric motor assembly 310BA. As described herein, heat exchanger 3118B may be thermally, fluidically, and mechanically coupled to inverter assembly 3104B. Inverter housing 3116B may enclose inverter assembly 3104A. A gearbox assembly 3106B may abut inverter assembly 3104B and electric motor assembly 3102B. Motor-gearbox housing 3110B may enclose an electric motor assembly 3102B. In some embodiments, main shaft 3108B extends from an end bell assembly sealing the motor-gearbox housing 3110B, through gearbox assembly 3106B, to electric motor assembly 3102B. As described herein, gearbox assembly 3106B and electric motor assembly 3102B may be substantially aligned along main shaft 3108B. Further, an inverter assembly 3104B may be substantially aligned along an axis sharing the axis of the main shaft 3108B.

As discussed herein, it is noted that having similar components between the tilter and lifter electric propulsion systems may be beneficial with respect to manufacturability of the overall aircraft. Further, using similar components between the tilter and lifter electric propulsion systems may be beneficial in terms of diagnosing issues and assuring safety requirements and protocols are met. However, in some embodiments, a lifter and tilter may possess components that are not present within the other. For example, a lifter electric propulsion system 3100B may include a lock nut 3112B posited between the main shaft 3108B and the shaft flange assembly 3120B that is larger than the lock nut present within the tilter electric propulsion system 3100A. A lock nut 3122B may serve to ensure the mechanical coupling of the main shaft 3108B and shaft flange assembly 3120B may not be damaged or corrupted due to the various vibrations loads experienced throughout the flight. For example, as discussed herein, some phases of flight do not require the lifter electric propulsion system to be active and in such cases may require the blades to be stored in a certain fashion. However, if the lifter blades were to not be properly stored, they may experience a drag force against the blades and the mechanical coupling of the main shaft 3108B and shaft flange assembly 3122B may experience a tension force. Further, in some embodiments, the lock nut 3112B of the lifter electric propulsion system 3100B may counteract operational loads. In some embodiments, a lifter electric propulsion system may also include a larger propeller flange 3126A, compared to the shaft flange of the tilter, for similar reasons as to the presence of the lock nut 3122B. Further, the lifter electric propulsion system may also include a bearing 3124A to assist in the rotation of the propeller flange 3126A. As described herein, an electric propulsion system may achieve different angles of orientation during operation. As such, fluids in the electric propulsion system, including coolants or lubricants, may move due to gravitational forces. For example, a lubricant or coolant such as oil may be shifted within the electric propulsion system during operation. Oil may reside in a sump, and the oil may shift within the sump and the electric propulsion system. Not matter the orientation, some embodiments may require some quantity of oil or other liquid acting as coolant or lubricant throughout all phases of flight. As such, a cooling system may be designed to allow for the circulation of oil no matter the orientation of the aircraft.

FIGS. 32A-32D are cross-sectional illustrations of electric propulsion systems of a VTOL aircraft, consistent with disclosed embodiments. FIGS. 32A-32D possess like numerals and refer to similar elements of the electric propulsion systems 3200A, 3200B, 3200C, and 3200D. As such, similar design considerations and configurations may be considered throughout the embodiments.

FIG. 32A illustrates an exemplary embodiment of an electric propulsion system in an upright orientation. As an example, an upright orientation could be achieved during flight operations including, but not limited to, takeoff, landing, or hover. Electric propulsion system 3200A may include motor-gearbox assembly housing 3202A, inverter assembly housing 3204A, main shaft 3206A, shaft flange assembly 3120, heat exchanger 3208A, and sump 3210A. Lubricants or coolants such as oil 3212A may be located in sump 3210A. In the exemplary orientation 3200A, oil may also be present in the volume 3218A at an oil level 3216A in the volume 3218A and the sump 3210A. Oil 3212A may enter pump inlet 3214A and travel to heat exchanger 3208A. Then, oil 3212A may be cooled in heat exchanger 3208A, and distributed throughout the electric propulsion system, as described herein. In some embodiments, oil may be distributed along main shaft 3206A by centrifugal forces.

FIG. 32B illustrates an exemplary embodiment of an electric propulsion system 3200B in a first angled orientation, for example a hover orientation at an angle 3222B. As an example, electric propulsion system 3200B may be oriented along central axis 3224B at an angle 3222B from vertical axis 3226B. As shown in FIG. 32B, although the electric propulsion system 3200B is in an angled orientation, pump inlet 3214B remains in contact with the oil 3212B and under the oil level 3216B to allow oil to continue to circulate through the liquid flow paths as described herein.

Figure 32C:
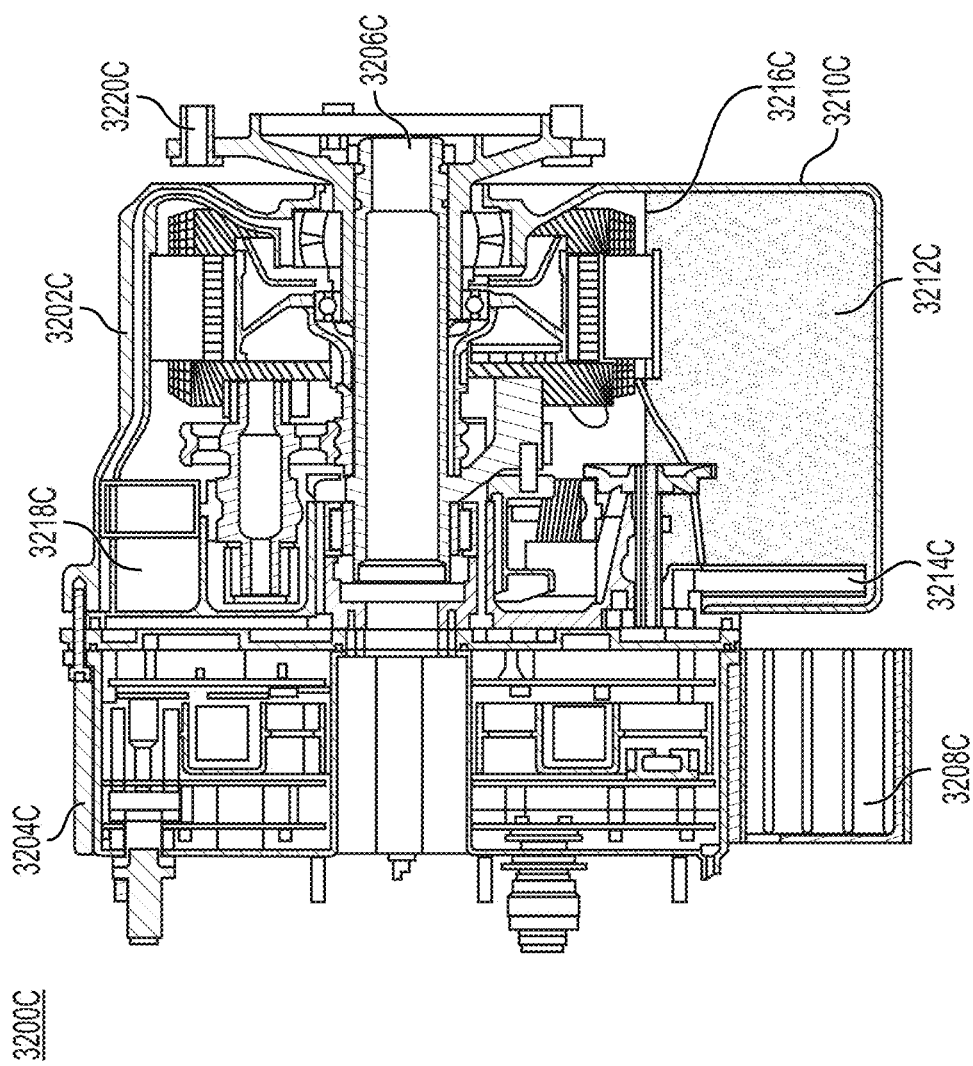

FIG. 32C illustrates an exemplary embodiment of an electric propulsion system 3200C in a horizontal orientation. As an example, electric propulsion system 3200C may be in a horizontal orientation during forward flight or cruise configuration. As shown in FIG. 32C, during a horizontal orientation, the pump inlet 3214C remains in contact with the oil 3212C and under the oil level 3216C to allow oil to continue to circulate through the liquid flow paths as described herein. Further, the volume 3218C may not contain oil during a horizontal configuration due to the force of gravity.

Figure 32D:
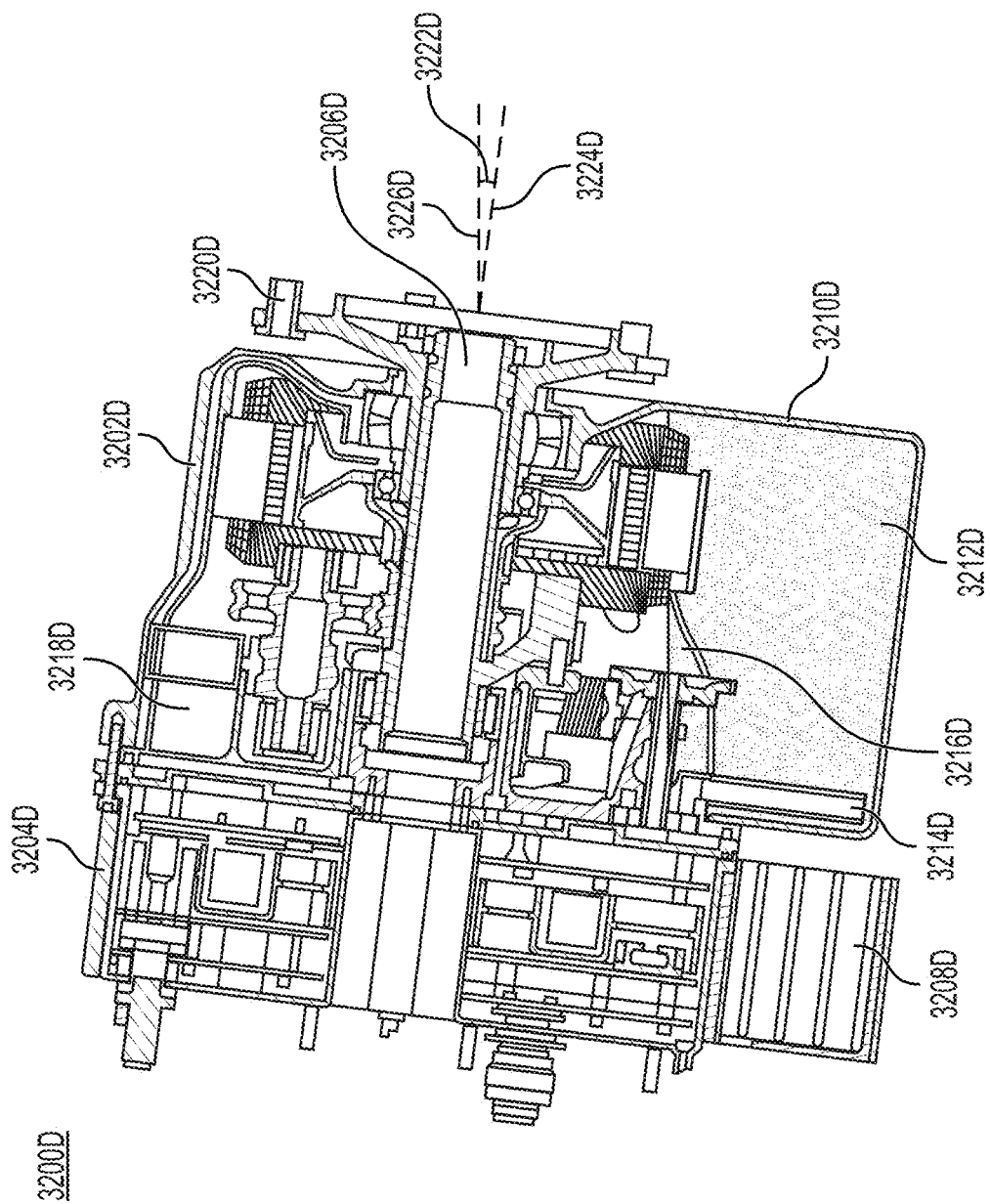

FIG. 32D illustrates an exemplary embodiment of an electric propulsion system in a second angled orientation, for example a dive at angle 3222D. As shown in FIG. 32D, during a dive orientation, the pump inlet 3214D remains in contact with the oil 3212D and under the oil level 3216D to allow oil to continue to circulate through the liquid flow paths as described herein. Further, the volume 3218D may not contain oil during a horizontal configuration due to the force of gravity. In some embodiments, oil, or other flammable liquid, may be used as a lubricant throughout an electric engine and may also be used as coolant fluid to assist in managing the heat generated by the engine during operation. As has been disclosed herein, an electric engine may have different primary functionalities, and as such may not include the same amount of lubricant and coolant. For example, a lifting and landing engine may only require less than one quart of oil while an engine that operates in all stages of flight may require more than one quart of oil. It should be understood that the example embodiments as mentioned herein are representative and do not dictate the bounds of the amount of lubricant and coolant that may be used in an electric engine.

It is understood that by using oil to not only lubricate the electric engine but also cool the electric engine rather than another coolant, additional oil will be added to the system, but that oil will remove traditional components that may be used to cool such an electric engine. For example, if the electric engine were cooled by another liquid such as glycol, the engine may comprise separate heat exchangers for both the lubricant fluid and the coolant fluid. In some embodiments, an electric engine may be cooled using various liquids. Some embodiments may include the electric propulsion system comprising multiple heat exchangers that cool their respective liquid flowing in their respective liquid flow paths. In some embodiments, multiple cooling and/or lubricating liquids, such as glycol and oil, may have a respective liquid flow path that circular through a common heat exchanger, also known as a dual heat exchanger. In such a configuration, the number of heat exchangers may be less than the number of types of liquid flow paths, based on liquid type, and the overall propulsion system may conserve mass by not possessing multiple, or more, heat exchangers.

However, with respect to embodiments utilizing a single fluid for both lubrication and cooling, such as oil, an increase in oil would be present but there would only be a need for one heat exchanger, so there may be a decrease in mass, due to using less heat exchangers and potentially other components not being required, of the overall system and a more appealing drag profile may be present. Further, using one substance for the lubrication and cooling of the engine may increase efficiency of the system due to the reduction in mass and the benefits of cooling the engine with a substance rather than relying on air cooling which may have issues traveling throughout the engine.

With respect to using oil, or other flammable liquids, within the electric propulsion systems as described herein, federal laws and regulations may be in place requiring safety components such as fire protective barriers adjacent to engines that use more than a threshold amount of oil or other flammable materials. Such federal laws and regulations may be enforced by government entities such as the Federal Aviation Administration.

It should be noted that some of the electric propulsion system embodiments as described herein may not include a fire protective barrier. A fire protective barrier as used herein may include an engine component or aircraft component designed, constructed, or installed with the primary purpose of preventing a hazardous quantity of air, fluid, or flame from passing around or through the fire protective barrier, and/or to protect against corrosion. In some embodiments, a fire protective barrier may be required for each electric propulsion system present on an aircraft. As such, if an aircraft, as described herein, possesses, for example, twelve electric propulsion systems, twelve fire protective barriers may be required to be installed on the aircraft. In some embodiments, a fire protective barrier may be required to be present on each wing, to surround the fuselage, or any other configuration based on federal law, regulations, or other safety requirements. As such, the presence of a fire protective barrier may add additional mass to the aircraft and thus decrease the efficiency of the electric propulsion system and further limit reduce the amount of payload, including passengers, present on the aircraft. This is especially relevant for VTOL aircraft design where a single aircraft may possess, for example, twelve electric propulsion systems so any increase in mass due to a single fire protective barrier could be experienced twelve-fold.

While some embodiments as described herein do not include a fire protective barrier, additional versions all embodiments described and considered herein may include a fire protective barrier. In addition, each embodiment as described herein may possess various types and locations of fire protective barriers.

FIGS. 33A-33C are schematic diagrams illustrating exemplary electric propulsion systems of a VTOL aircraft comprising fire protective barriers, consistent with disclosed embodiments. FIG. 33A illustrates an exemplary electric propulsion system 3300A comprising a fire protective barrier 3308A, consistent with the present disclosure. Fire protective barrier 3308A may be posited between the electric engine assembly 3302A, that is mechanically coupled to a propeller assembly 3306A, and boom 3304A with the primary purpose of stopping any fire or combustion that may occur in the electric engine assembly 3302A from spreading to other areas of the aircraft.

FIG. 33B illustrates an exemplary VTOL aircraft 3300B, consistent with the present disclosure. A VTOL aircraft 3300B may comprise a fire protective barrier 3306B mounted or connected to wing 3304B connected to a fuselage 3302B. As shown in FIG. 33B, a fire protective barrier 3306B may be posited between an electric propulsion system, comprising an electric engine 3308B and a propeller assembly 3310B, and the wing 3304B of the VTOL aircraft 3300B with the primary purpose of stopping any fire or combustion. In some embodiments, the fire protective barrier 3306B may posited between the wing 3304B and a boom housing the electric propulsion system.

FIG. 33C illustrates an exemplary electric propulsion system 3300C, consistent with the present disclosure. The electric propulsion system 3300C may comprise an electric motor assembly 3302C, including a gearbox assembly in some embodiments, and an inverter assembly 3304C that are fluidically coupled to a heat exchanger 3306C. In some embodiments, the electric motor assembly 3302C may abut the inverter assembly 3304C. Some embodiments may also include an electric engine assembly housing 3308C. An electric engine assembly housing 3308C may comprise a fire protective barrier 3310C. In some embodiments, the fire protective barrier 3310C may also serve to house the rear of the electric engine assembly, and as shown in this figure, the inverter assembly.

In some embodiments, fire risk management in the aircraft design may not be limited to inclusion of a fire protective barrier. Additional design considerations may address fire risks, such as additional components to ensure an aircraft may maintain flight if a fire were to occur. For example, an aircraft boom, as described herein, may feature additional components present within the boom to ensure that if a fire were present, components were lost to a fire, components became detached due to fire, or any other loss in functionality or components were to occur, the aircraft may still maintain balanced flight.

C. Exemplary Electric Propulsion System Configurations

As discussed above and throughout this disclose, an exemplary electric propulsion system may include components comprising an electric motor assembly, a gearbox assembly, and an inverter assembly across various configurations, such as representative configurations as described herein. Exemplary embodiments as discussed herein may include components of the electric propulsion system being aligned along a common axis or substantially aligned along a common axis. In some embodiments the components may be aligned along a shaft or main shaft that provides mechanical shaft power to turn the propellers of a propeller assembly. Some embodiments may include components of the electric propulsion system abutting each other in a sequence along an axis or substantially aligned along an axis. In some embodiments, the location or positioning of one or more electric propulsion system components may provide a reduction in mass of the system and yield a more efficiency drag profile. For example, one or more component may be substantially aligned along a common axis or abut each other, and may not require additional components such as connection wires or additional housing volume to allow for wires. As such, the respective mass and volume typically needed to allow such connection wires may not be needed in the disclosed electric propulsion systems.

In some embodiments, an electric propulsion system may also comprise a cooling system configured to target multiple heat-generating portions of electric propulsion system. Some embodiments may include portions of the electric propulsion system being air-cooled by air flow generated from the propeller assembly or air flow that is encountered during various phases of flight. Some embodiments may include portions of the electric propulsion system being cooled using one or more liquid flow paths throughout the electric propulsion system. Such embodiments may also include the liquid flow paths circulating through a heat exchanger that is exposed to air flow such that any heat contained in the liquid flow paths may be transferred to the air flowing through the heat exchanger. It should be understood that the components of the electric propulsion system, as described herein, may all be cooled using a common cooling system, may each have their own independent cooling system, or may combine various types and configurations of cooling systems. In some embodiments, the respective cooling system of an electric propulsion system may have an impact on efficiency of the components of the electric propulsion system. For example, in some embodiments, liquid cooling may allow for an inverter assembly to operate more efficiently than an inverter assembly utilizing an air-cooled system.

FIGS. 34A-34D are schematic diagrams illustrating exemplary electric propulsion systems of a VTOL aircraft, consistent with disclosed embodiments. As such, similar design considerations and configurations may be considered throughout the embodiments.

FIG. 34A schematically depicts an exemplary electric propulsion system 3400A consistent with the present disclosure. Electric propulsion system 3400A may include components such as an inverter assembly 3404A, at least one power module 3410A, and an electric motor assembly 3402A oriented along an axis extending along a shaft 3406A. Embodiments may include an electric motor assembly 3402A that provides torque to a propeller assembly 3408A via the shaft 3406A. In some embodiments, the shaft 3406A may be mechanically coupled to a gearbox assembly (not shown in this exemplary embodiment) to provide a gear reduction and increased torque to the propeller assembly 3408A. Housing of components of the electric propulsion system 3400A may share common shapes such as circular profiles centered about the shaft 3406A, rectangular profiles oriented along the shaft 3406A, or a mixture of profiles. Electric propulsion system 3400A may further comprise the electric motor assembly 3402A positioned between, and abutting, the inverter assembly 3404A and the propeller assembly 3408A. In such an embodiment, the shaft 3406A may pass through the electric motor assembly 3402A. Some embodiments may include the shaft 3406A also passing through the inverter assembly 3404A. In some embodiments, a power module 3410A may be axially oriented in the inverter assembly 3404A such that any heat generated by the power modules may escapes via a path 3412A going to the environment external to the inverter assembly 3404A. Some embodiments may also include orienting a power module 3410A in the inverter assembly 3404A such that a flow of air produced by the propeller assembly 3408A, or air encountered during flight, may be used to cool the power modules.

FIG. 34B schematically depicts an exemplary electric propulsion system 3400B consistent with the present disclosure. Electric propulsion system 3400B may comprise components such as an inverter assembly 3404B, at least one power module 3410B, and an electric motor assembly 3402B aligned along an axis extending along a main shaft 3406B. Electric propulsion system 3400B may further comprise and an inverter assembly 3404B positioned between an electric motor assembly 3402B and a propeller assembly 3408B. In some embodiments, a power module 3410B may be positioned on a portion of the inverter assembly 3404B such that it is located below the propeller assembly 3408B and may generate heat that escapes via a path 3412B going to the environment external to the inverter assembly 3404B. Some embodiments may include power modules oriented elsewhere in the inverter assembly such that any flow of air produced by a propeller assembly 3408B may be used to cool the power modules.

Figure 34D:
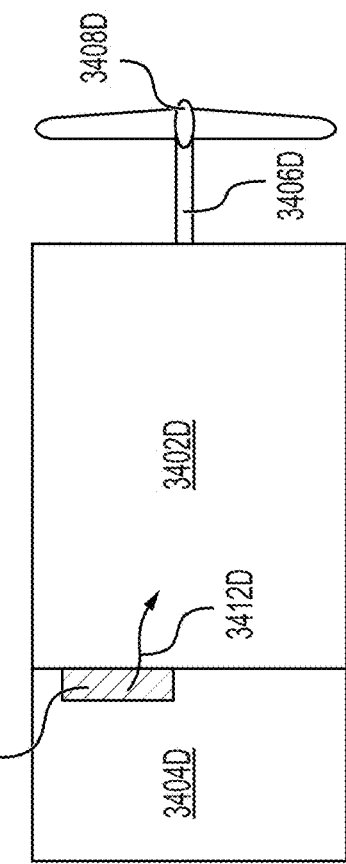
Figure 34C:
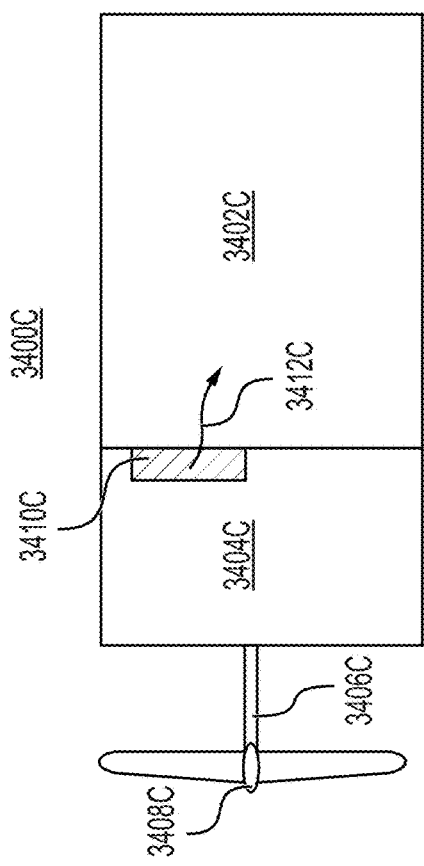

FIG. 34C schematically depicts an exemplary electric propulsion system 3400C consistent with the present disclosure. Electric propulsion system 3400C may comprise components such as an inverter assembly 3404C, at least one power module 3410C, and an electric motor assembly 3402C aligned along an axis extending along a shaft 3406C. Electric propulsion system 3400C may further comprise the inverter assembly 3404C positioned between the electric motor assembly 3402C and the propeller assembly 3408C. In some embodiments, a power module 3410C may be positioned on a portion of the inverter assembly 3404C such that it is located on an inverter assembly 3404C surface that abuts the electric motor assembly 3402C. In some embodiments, the power module 3410C may be positioned within the electric propulsion system 3400C as shown with path 3412C, as opposed to being positioned in the inverter assembly 3404C where heat generated by the power module 3410C cannot be cooled using air-cooling from the propeller assembly 3408C or any airstreams encountered during flight. In such embodiments, liquid cooling may be used to cool to the power module 3410C as well as other components located within the inverter assembly 3404C. Further embodiments may include a liquid cooling system that also thermally manages components of the electric motor assembly 3402 and/or components of a gearbox assembly.

FIG. 34D schematically depicts an exemplary electric propulsion system 3400D consistent with the present disclosure. Electric propulsion system 3400D may comprise components such as an inverter assembly 3404D, at least one power module 3410D, and an electric motor assembly 3402D oriented along an axis extending along a shaft 3406D. Electric propulsion system 4100D may further comprise an electric motor assembly 3402D positioned between an inverter assembly 3404D and a propeller assembly 3408D. In some embodiments, a power module 3410D may be positioned on a portion of the inverter assembly 3404D such that it is located on an inverter assembly 3404D surface that abuts the electric motor assembly 3402D. In some embodiments, the power module 3410D may be positioned within the electric propulsion system 3400D as shown with path 3412D, as opposed to in the inverter assembly 3404D where heat generated by the power module 3410D cannot be cooled using air-cooling from the propeller assembly 3408D or any airstreams encountered during flight. In such embodiments, liquid cooling may be used to cool to the power module 3410D as well as other components located within the inverter assembly 3404D. Further embodiments may include a liquid cooling system that also thermally manages components of the electric motor assembly 3402 and/or components of a gearbox assembly.

In some embodiments, an electric propulsion system may include a cooling system utilizing liquid cooling. In some embodiments, a cooling system liquid may include glycol, oil, or any other liquid that enables the transfer of heat from components of the electric propulsion system to the liquid. Further, some embodiments may include cooling an electric propulsion system using a liquid that is also used for lubricating components of the electric propulsion system. In some embodiments, the electric propulsion system may include a cavity, reservoir, or sump for collecting and circulating coolant liquid throughout the electric propulsion system.

Figure 35:
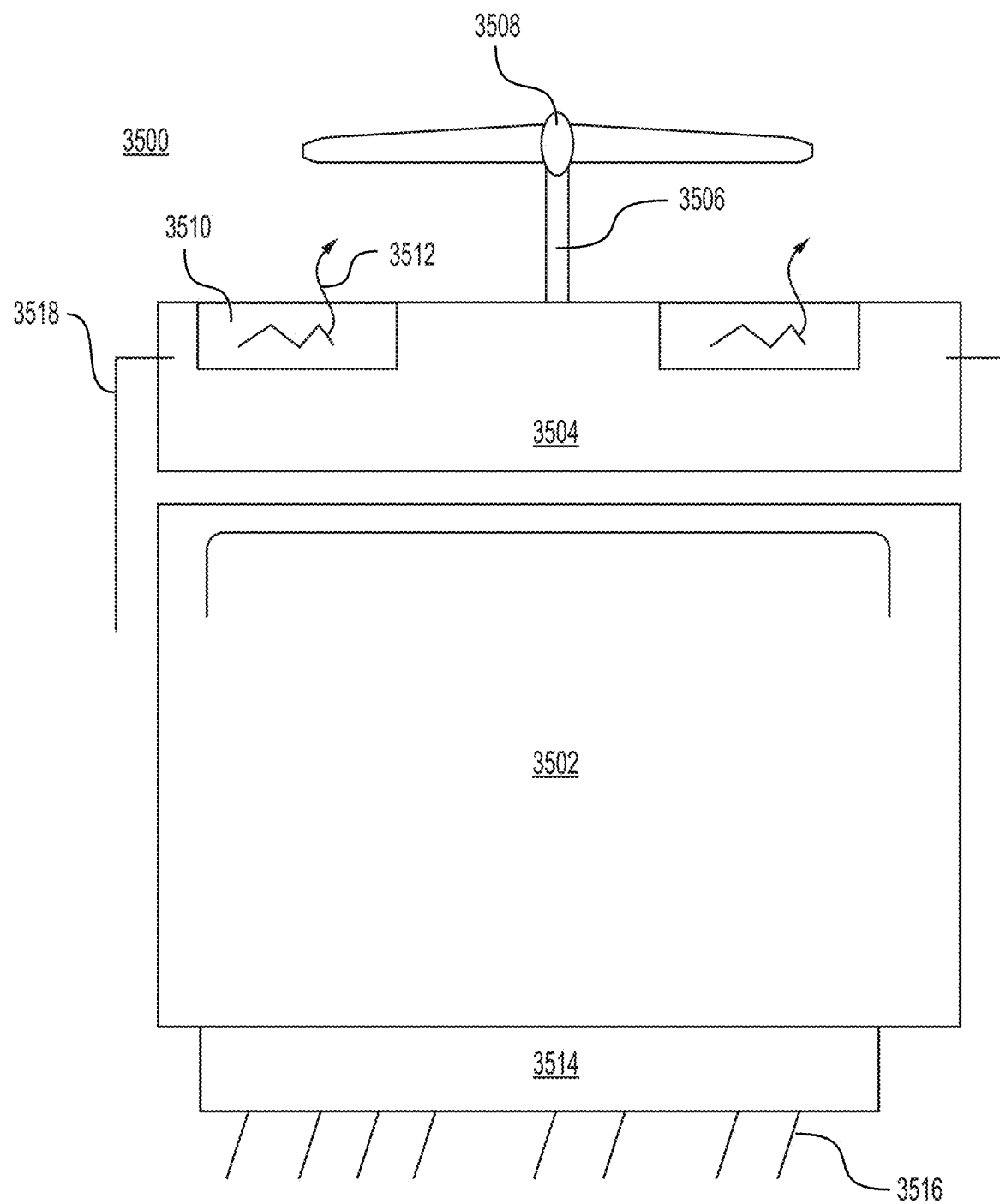
FIG. 35 is a schematic diagram illustrating an exemplary electric propulsion system of a VTOL aircraft, consistent with disclosed embodiments.

FIG. 35 is a schematic diagram illustrating an exemplary electric propulsion system of a VTOL aircraft, consistent with disclosed embodiments. Electric propulsion system 3500 may comprise components such as an electric motor assembly 3502, inverter assembly 3504, and sump 3514 aligned along a shaft 3506. As shown in FIG. 35, the electric motor assembly 3502 may be positioned between a sump 3514 and an inverter assembly 3504. The electric motor assembly 3502 may provide torque to a propeller assembly 3508 via the main shaft 3506 that may travel through the inverter assembly 3504. Further, the electric motor assembly 3502 may provide torque to a propeller assembly 3508 via a gear reduction using a gearbox assembly (not shown in this exemplary embodiment). The inverter assembly may include power connection channels 3518 connected to the inverter assembly 3504. The inverter assembly 3504 may include power modules 3510 positioned on an opposite portion of the inverter assembly 3504 as the portion that abuts the electric motor assembly 3502. Further, some embodiments may include the power modules 3510 being positioned within the inverter assembly 3504 such that any heat generated by the power modules 3510 may escape via a path 3512 going to the environment external to the inverter assembly. Some embodiments may include various cooling methods for the components of the electric propulsion system 3500. For example, in some embodiments the power modules 3510 may be positioned below the propeller assembly 3508 so that the air from the propeller assembly 3508 cools the power modules 3510. Further, the sump 3514 may house liquid to cool or lubricate the electric motor assembly 3502, the gearbox assembly, and/or the inverter assembly 3504. Some embodiments may include the components of the electric propulsion system 3500 possessing various housings profiles, such as circular housings centered about the shaft 3506, a mixture of housing profiles, and housing profiles that allow for an aerodynamic drag profile. Some embodiments may include component housings possessing cooling fins attached to the outer surface of the housing.

As shown in FIG. 35, a sump 3514 may possess cooling fins 3516 on the housing of the sump to assist in extracting heat from the liquid used for lubricating or cooling the electric motor assembly 3502, the gearbox assembly, and/or the inverter assembly 3504. While some embodiments discussed herein may include electric propulsion system components aligned along a common axis, some embodiments include the components substantially aligned along a common axis.

In some embodiments, an electric propulsion system may include components that are not aligned, or substantially aligned, along an axis. For example, an electric propulsion system may include an electric motor assembly aligned along a shaft that provides mechanical shaft power to the propeller assembly and an inverter assembly supplying alternating current to the electric motor assembly that is located elsewhere within the aircraft. Some embodiments may include an inverter assembly that does not abut the electric motor assembly but is instead housed elsewhere within the boom, wing, or fuselage. In such embodiments, wiring may be run from the inverter assembly to the electric motor assembly to transmit alternating current from the inverter. Separating the locations of components of the electric propulsion system may lead to an increase in mass of the aircraft due to the required wiring and other connection components.

Figure 36:
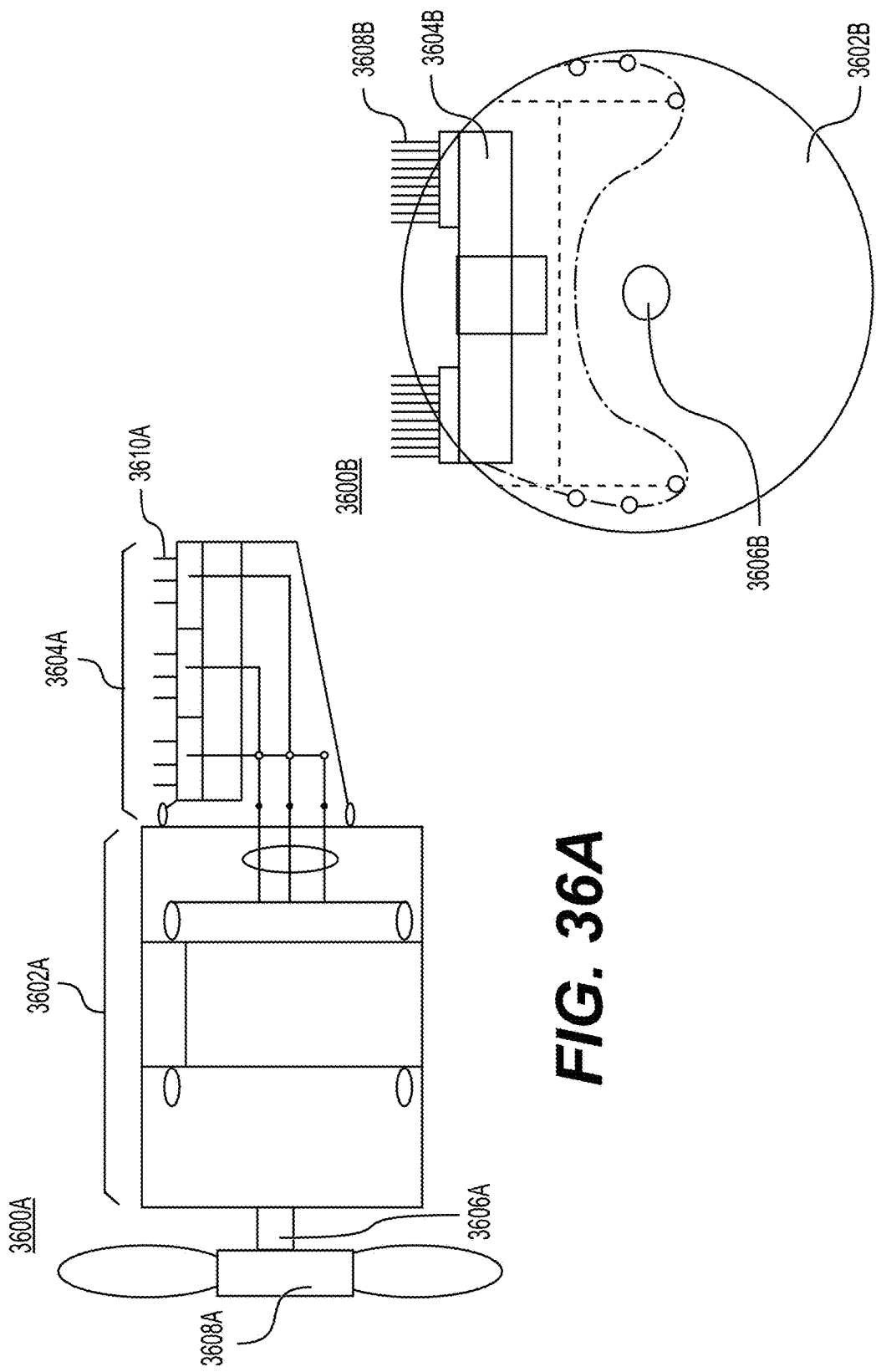
FIGS. 36A-36B are schematic diagrams illustrating exemplary electric propulsion systems of a VTOL aircraft, consistent with disclosed embodiments.

FIGS. 36A-36B are schematic diagrams illustrating exemplary electric propulsion systems of a VTOL aircraft, consistent with disclosed embodiments. As such, similar design considerations and configurations may be considered throughout the embodiments.

FIG. 36A schematically depicts an exemplary electric propulsion system 3600A consistent with the present disclosure. Electric propulsion system 3600A may comprise components such as an electric motor assembly 3602A centrally aligned along a shaft 3606A that provides torque to a propeller assembly 3608A. Embodiments of the electric propulsion system 3600A may also include a rectangular inverter assembly 3604A that is cantilevered behind the electric motor assembly 3602A. Further, some embodiments may include an inverter assembly 3604A possessing cooling fins 3610A oriented such that the cooling fins 3610A may utilize a flow of air from the propeller assembly 3608A in cooling the power modules, MOSFETs, or other components present in the inverter assembly 3604A. In some embodiments, the electric motor assembly 3602A may be housed in a housing with various profiles including circular, rectangular, or any other type of profile depending on the design and needs of the system. The electric motor assembly 3602A may reside in a motor housing that also possesses cooling fins to assist in cooling elements of the electric motor assembly 3602A such as the stator, stator windings, or any other element of the electric motor assembly 3602A. Although not shown in this figure, a gearbox assembly may be present between the electric motor assembly 3602B and propeller assembly 3608B, between the electric motor assembly 3602B and inverter assembly 3604B, within a housing that contains the electric motor assembly 3602B, or in any other configuration to allow a gear reduction to be present. Further, although not shown in the drawing, a gearbox assembly may be present within the motor housing and may also utilize the cooling fins to assist in thermal management.

FIG. 36B schematically depicts an exemplary electric propulsion system 3600B as disclosed in FIG. 36A and offers a frontward view from the propeller assembly 3608A. Electric propulsion system 3600B may comprise a circular electric motor assembly 3602B aligned along a shaft 3606B. Embodiments of the electric propulsion system 3600B may also include a rectangular inverter assembly 3604B that may be located behind the electric motor assembly 3602B. The inverter assembly 3604B may abut the electric motor assembly 3602B or may be positioned within the boom, wing, or fuselage. The inverter assembly 3604B may possess cooling fins 3608B that extend past the outer diameter of the electric motor assembly 3602B such that the cooling fins 3608B are exposed to air flow from the propeller assembly 3608A or air flow encountered during flight. Further, the cooling fins 3608B can be used to extract and transfer heat, generated by the power modules, MOSFETs, or other components present in the inverter assembly 3604A. The cooling fins 3608B may transfer heat to an environment external to the electric propulsion system. Similarly, the electric motor assembly 3602B may also possess its own cooling fins (not pictured), positioned on the electric motor assembly's housing, to assist in thermal management of the electric motor assembly 3602B and any gearbox assembly.

In some embodiments, an electric propulsion system may include thermal management, also referred to as cooling systems herein, that include liquid cooling. As disclosed herein, some exemplary cooling systems may include distributing a liquid coolant to components located throughout the electric motor assembly, the gearbox assembly, and the inverter assembly. However, it should be understood that cooling systems as disclosed herein may also include liquid coolant that is circulated about the perimeter of the electric motor assembly, the gearbox assembly, and/or the inverter assembly. For example, a cooling system may comprise a cavity, jacket, or distribution channels of a cooling system that circulates liquid coolant about the perimeter of components located within the electric propulsion system.

Figure 37:
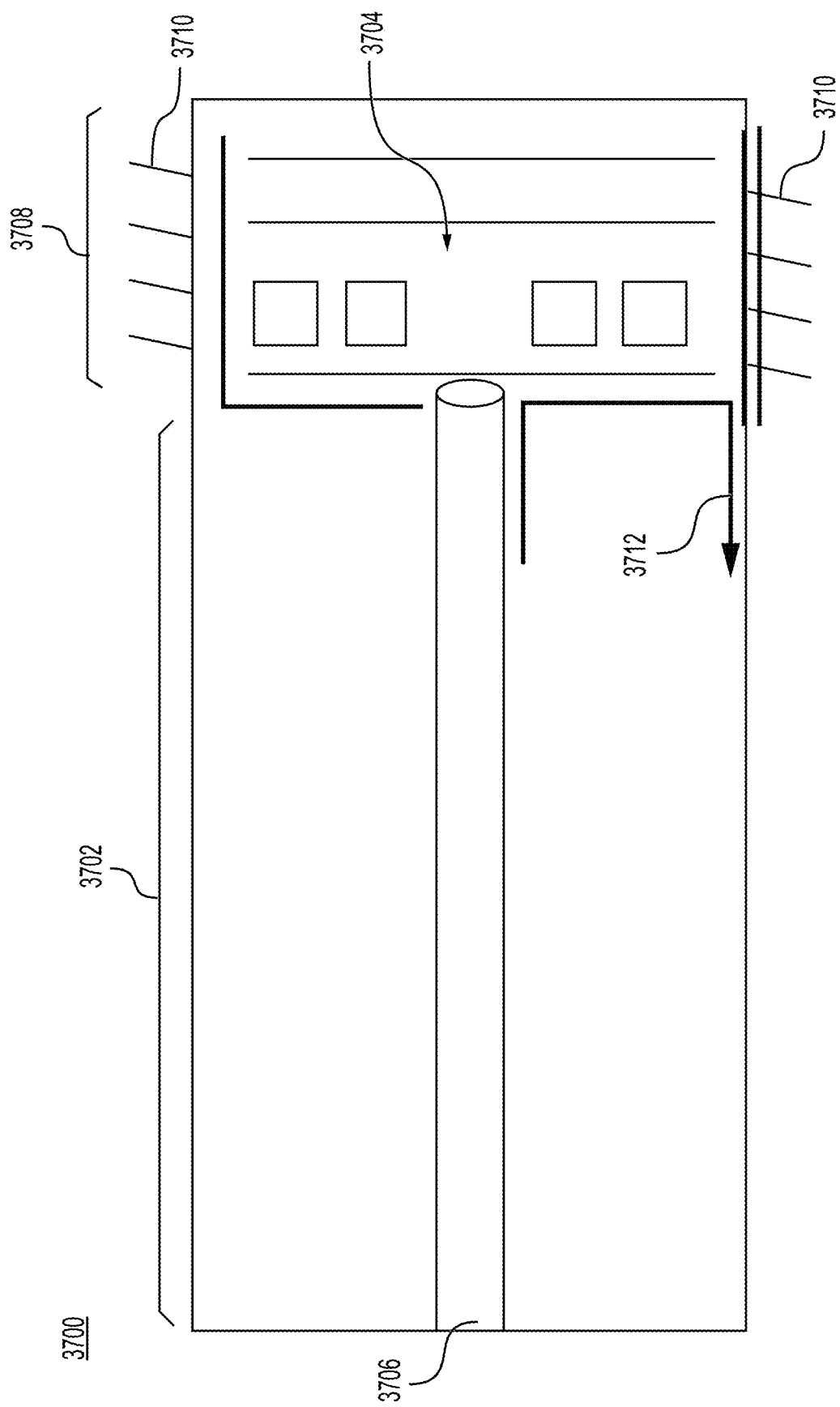
FIG. 37 is a schematic diagram illustrating an exemplary electric propulsion system of a VTOL aircraft, consistent with disclosed embodiments.

FIG. 37 is a schematic diagram illustrating an exemplary electric propulsion system of a VTOL aircraft, consistent with disclosed embodiments. Electric propulsion system 3700 may comprise a motor assembly housing 3702, housing an electric motor assembly, abutting an inverter assembly housing 3708 with a shaft 3706 traveling through motor assembly housing 3702. In some embodiments, motor assembly housing 3702 and inverter assembly housing 3708 may have various shapes or profiles including, for example, circular housings centered along an axis coinciding with the shaft 3706, rectangular housings, or any other appropriate geometric orientation. Some embodiments may include a motor assembly housing 3702 that, in addition to housing the electric motor assembly, houses a gearbox assembly. Embodiments may include a gearbox assembly that is positioned between an electric motor assembly and a propeller assembly external to the motor assembly housing 3702, an electric motor assembly that is positioned between the gearbox assembly and an propeller assembly external to the motor assembly housing 3702, a gearbox assembly located within the motor assembly housing 3702 but not aligned along the axis of the electric motor assembly, or any other configuration of a gearbox assembly sharing a housing with an electric motor assembly. Some embodiments may include an inverter assembly housing 3708 possessing an inverter assembly 3704 as described herein. Further, an inverter assembly housing 3708 may also possess cooling fins 3710 located on an outer surface of the inverter assembly housing 3708 that utilize air flow encountered during flight to assist in cooling the components of the inverter assembly 3704. Some embodiments may also include an inverter assembly 3704 utilizing liquid cooling, rather than air cooling, for thermal management. Such embodiments may include a cavity 3714, jacket, or distribution channels surrounding the inverter assembly 3704 such that liquid may be circulated through the cavity 3714, jacket, or distribution channels to extract heat generated from the components of the inverter assembly 3704. Additionally, liquid may be used to cool components within the motor assembly housing 3702. Path 3712 depicts an exemplary liquid flow path for cooling components located within the motor assembly housing 3702 where the liquid may move from a first end of the motor assembly housing to a second end of the motor assembly housing through distribution channels along the main shaft 3706. The liquid may be distributed radially from the shaft 3706 and may be collected, via a collection chamber, sump, or similar component, to be recirculated throughout the motor assembly housing 3702. In some embodiments, the electric motor assembly housing 3702 may be fluidically connected to the inverter assembly housing 3708 such that liquid coolant may be circulated throughout both assemblies via the liquid flow path 3712 and cavity 3714. In some embodiments, motor assembly housing 3702 and inverter assembly housing 3708 may utilize air cooling, liquid cooling, or a mixture of the two to thermally management components located within each housing.

As discussed herein, an electric propulsion system may include various configurations of components such as aligned along an axis, abutting one another, substantially aligned along an axis, or components connected using wires or other methods of connection. As such, some embodiments may include components sharing a housing. For example, as discussed above, a gearbox assembly may be housed within a motor assembly housing. Further, some embodiments may include housing a gearbox assembly, inverter assembly, or other assemblies or components of those assemblies within the propeller assembly. Such configurations may be driven by design constraints such as weight, drag profile, lift, torque, payload, flight time, or any other design constraints relevant to VTOL aircrafts.

FIGS. 38A-38B are schematic diagrams illustrating an exemplary electric propulsion system of a VTOL aircraft and an exemplary inverter assembly of an electric propulsion system, consistent with disclosed embodiments. Electric propulsion system 3800A may comprise a motor assembly housing 3802A aligned along a main shaft 3806A. Some embodiments may include a motor assembly housing 3802A that includes an electric motor assembly centrally aligned along the main shaft 3806A. Some embodiments may include a motor assembly housing 3802A that houses an electric motor assembly and gearbox assembly. Some embodiments of electric propulsion system 3800A may also include an inverter assembly 3804A mounted to the circular face of the motor assembly housing 3802A with a low voltage input 3808A located on the face of the motor assembly housing 3802A. In some embodiments, the inverter assembly 3804A, in addition to being mounted to the motor assembly housing 3802A, may be located within a propeller assembly. For example, an inverter assembly as described herein may be positioned within a spinner of a propeller assembly. Such a placement of the inverter assembly 3704A may be advantageous when other components of the electric propulsion system 3800A do not justify creating a more compact drag profile. For example, a propeller assembly may have a certain size to meet additional design criteria such as required torque or lift, and in such embodiments the size of the propeller assembly may possess vacant room to allow for the inverter assembly 3804A to be placed within the hub of the propeller assembly.

FIG. 38B schematically depicts an exemplary inverter assembly 3800B consistent with the discussion of inverter assembly 3804A as well as throughout this disclosure. An inverter assembly 3800B may comprise at least one power module 3802B, at least one gate drive 3804B, at least one control board 3806B, at least one DC capacitor or low inductance connector 3808B, and at least one DC current input port 3810B. Further, an inverter assembly 3800B may possess cooling fins 3812B located on the outer surface of the inverter assembly housing to assist in cooling various components of the inverter assembly 3800B.

In some embodiments, an electric propulsion system may include components present within various component housings. As discussed herein, various components of the electric propulsion system may be present within housings and may be organized in various ways within those housings. Some embodiments of an electric propulsion system may include various configurations of components to achieve varying design goals. Differing embodiments may possess differing primary design components that must be achieved at the expense of other design criteria. For example, some embodiments may contain redundant systems that may add extra mass to the aircraft yet increase passenger safety by avoiding and/or removing single points of failure. Further, some embodiments of an electric propulsion system may include various types of thermal management systems, also referred to herein as cooling systems. Some electric propulsion systems may include a combination of cooling systems, such as air-cooling and liquid cooling systems. For example, electric propulsion system components may possess air-cooling designs such as components being mechanically coupled to cooling fins and liquid cooling designs where components are fluidically coupled to liquid flow paths and a heat exchanger that extracts heat from the liquid and transfers it into external air.

FIGS. 39A-39D are schematic diagrams illustrating exemplary electric propulsion systems of a VTOL aircraft, consistent with disclosed embodiments. The electric propulsion system 3900A may comprise an inverter assembly 3904A, a gearbox assembly 3906A, and an electric motor assembly 3902A, and a main shaft 3908A connected to a flange shaft assembly 3912A. In some embodiments, electric motor assembly 3902A may be positioned between the gearbox assembly 3906A and the shaft flange assembly 3912A while both the gearbox assembly 3906A and electric motor assembly 3902A are aligned along the main shaft 3908A. Further, an inverter assembly 3904A may abut the motor-gearbox housing 3910A and the inverter assembly 3904A may possesses a rectangular profile. In some embodiments, the inverter assembly 3904A, electric motor assembly 3902A, and the gearbox assembly 3908A may possess common or individual cooling systems. For example, the motor-gearbox housing 3910A and/or the inverter assembly 3904A may utilize air flow encountered during flight or generated by the propeller assembly to cool the inverter assembly 3904A, the gearbox assembly 3906A, and/or the electric motor assembly 3902A.

FIG. 39B illustrates a perspective view of the exemplary electric propulsion system of FIG. 39A. While FIG. 39B and FIG. 39A are related, the figures may possess similar numerals that do not refer to the same elements. In some embodiments, the electric propulsion system 3900B may include the electric motor assembly 3902A and gearbox assembly 3906A may be located within a motor-gearbox housing 3910B. The motor-gearbox housing 3910B may be aligned along the main shaft 3908B, that is connected to a flange shaft assembly 3912B, and possess cooling fins 3914B oriented about the circumference of the electric engine housing 3910B for cooling the electric motor assembly 3902A and gearbox assembly 3906A using air flow from a propeller assembly (not pictured) connected to the flange shaft assembly 3912B or air flow encountered during flight. Further, the invert assembly 3904B may be mechanically coupled to the rear of the motor-gearbox housing 3910B and may also utilize air flow in cooling the components of the inverter assembly 3904B.

FIG. 39C provides a schematic illustration of an example electric propulsion system 3900C consistent with embodiments of this disclosure. An electric propulsion system 3900C may include an electric motor assembly 3902C and gearbox assembly 3906C located within a motor-gearbox housing 3910C. In such an embodiment, a propeller assembly 3912C may be mechanically coupled to a first end of the motor-gearbox assembly 3910C. Some embodiments may include a shaft traveling through the electric motor assembly 3902C and/or gearbox assembly 3906C to a propeller assembly 3912C. As shown in FIG. 39C, an exemplary embodiment may include an electric motor assembly 3902C located between the gearbox assembly 3906C and the propeller assembly 3912C. Further, some embodiments may include an inverter assembly 3904C abutting a second end of the motor-gearbox assembly 3910C.

FIG. 39D provides a schematic illustration of an example electric propulsion system consistent with embodiments of this disclosure. An electric propulsion system 3900D may include a similar arrangement of components as those depicted in FIG. 39C. However, an electric propulsion system 3900D may include a gearbox assembly 3906D located between an electric motor assembly 3902D and a propeller assembly 3912D connected to a first end of a motor-gearbox housing 3910D with an inverter assembly 3904D abutting a second end of the motor-gearbox housing 3910D.

FIGS. 40A-40D are cross-sectional illustrations and illustrations of electric propulsion systems of a VTOL aircraft, consistent with disclosed embodiments. FIG. 40A illustrates a cross-sectional drawing of an exemplary electric propulsion system 4000A. The electric propulsion system 4000A may comprise an inverter assembly 4004A, a gearbox assembly 4006A, and an electric motor assembly 4002A, respectfully, aligned along a main shaft 4020A that is connected to a shaft flange assembly 4008A. The gearbox assembly 4006A and the electric motor assembly 4002A may be located within a motor-gearbox assembly housing 4012A and the inverter assembly 4004A may be located within an inverter assembly housing 4014A. Further, the inverter assembly housing 4014A may be mounted to the rear of the motor-gearbox assembly housing 4012A. Additionally, power connection channels 4018A may be connected to the connector of the inverter assembly 4004A located in the inverter assembly housing 4014A. As depicted in the exemplary embodiment of FIG. 40A, the power connection channels 4018A may be connect to the inverter assembly 4004A behind a heat exchanger 4010A. Further to this embodiment, the heat exchanger 4010A may be mounted to the motor-gearbox assembly housing 4012A and can be used, along with distribution channels (not pictured) to assist in cooling the electric motor assembly 4002A, gearbox assembly 4006A, and/or the inverter assembly 4004A by cooling liquids that are circulated throughout the electric propulsion system 4000A. It should be understood that although the inverter assembly 4004A, gearbox assembly 4006A, and electric motor assembly 4002A are shown to be consistent with the described stacked assembly inverter assembly, planetary gearbox, and electric motor consisting of a stator and a rotor in this figure, this figure is exemplary and the inverter assembly, gearbox assembly, and electric motor assembly can be of any type as described herein or capable of achieving similar functionality.

FIG. 40B illustrates a perspective view of the exemplary electric propulsion system 4000B of FIG. 40A where the electric motor assembly 4002A and gearbox assembly 4006A are located within a motor-gearbox housing 4012B. In some embodiments, the motor-gearbox housing 4012B may be aligned along a main shaft 4020B that is connected to a shaft flange assembly 4008B. The motor-gearbox housing 4012B may possess cooling fins 4022B oriented about the circumference of the motor-gearbox housing 4012B. Additionally, a heat exchanger 4010B may be mounted to the motor-gearbox housing 4012B and may be used in liquid cooling the electric motor assembly 4002A, gearbox assembly 4006A, and/or the inverter assembly 4004A by cooling the liquids that are circulated throughout the electric motor assembly 4002A, gearbox assembly 4006A, and/or the inverter assembly 4004A to cool the respective components. It should be understood that while FIG. 40B depicts the inner circumference of the heat exchanger to be less than the outer circumference of the motor-gearbox housing, the heat exchanger 4010B may span any distance equal to or less than the outer circumference of the motor-gearbox housing 4012B. Further, an inverter assembly housing 4014B may be mechanically coupled to the rear of the motor-gearbox housing 4012B and also may possess cooling fins 4024B oriented about the circumference of the inverter assembly housing 4014B. Additionally, an inverter assembly housing 4014B may possess a connection point for power connection channels 4018B at a location on the outer edge of an inverter assembly housing 4014B and behind a heat exchanger 4010B.

FIG. 40C provides a schematic illustration of an example electric propulsion system consistent with embodiments of this disclosure. Electric propulsion system 4000C may comprise components such as an electric motor assembly 4002C and a gearbox assembly 4006 housed within a motor-gearbox housing 4012C, and an inverter assembly 4004C housed in an inverter assembly housing 4014C. Further, an electric propulsion system may comprise a propeller assembly 4008C and a heat exchanger 4010C fluidically coupled to the electric motor assembly 4002C and the gearbox assembly 4006C by way of a liquid path 4016C. Some embodiments may include a liquid path 4016C comprising a liquid used for cooling, lubricating, or cooling and lubricating components that are fluidically coupled to the heat exchanger 4010C. In some embodiments, a heat exchanger 4010C may be directly or indirectly mounted to the motor-gearbox housing 4012C. Liquid path 4016C may comprise distribution channels, devices for distributing liquid, or cavities capable of transporting liquid, distributing liquid to components fluidically coupled to the heat exchanger 4010C, and recirculating the liquid to the heat exchanger 4010C. Liquid present in the liquid path 4016C may collect heat from components fluidically coupled to the heat exchanger 4010C and transfer the heat to incoming air 4018C passing through the heat exchanger 4010C. As such, embodiments may include a heat exchanger 4010C positioned such that incoming air, experienced during flight or from the propeller assembly 4008C, may pass through and cool the liquid passing through the heat exchanger 4010C.

FIG. 40D provides a schematic illustration of an example electric propulsion system consistent with embodiments of this disclosure. An electric propulsion system 4000D may include a similar arrangement of components as those depicted and described in FIG. 40C. However, an electric propulsion system 4000D may include a gearbox assembly 4006D located between an electric motor assembly 4002D and a propeller assembly 4008D connected to a first end of a motor-gearbox housing 4012D with an inverter assembly 4004D housed within an inverter assembly housing 4014D that is connected to a second end of the motor-gearbox housing 4012D. Electric propulsion system 4000D may also comprise a gearbox assembly 4006D and an electric motor assembly 4002D fluidically coupled to a heat exchanger 4010D, partially exposed to incoming air 4018D, via a liquid path 4016D for the purpose of lubricating and cooling the gearbox assembly 4006D and electric motor assembly 4002D.

The liquid paths 4016C and 4016D are illustrated with a high level of generality as a simple loop. However, it should be understood that the liquid paths may comprise branches, sub-loops or other segmented paths. In general, the liquid may be circulated in any way that effectively lubricate and cool various components present within the motor-gearbox housing 4012C and 4012D.

Figure 41:
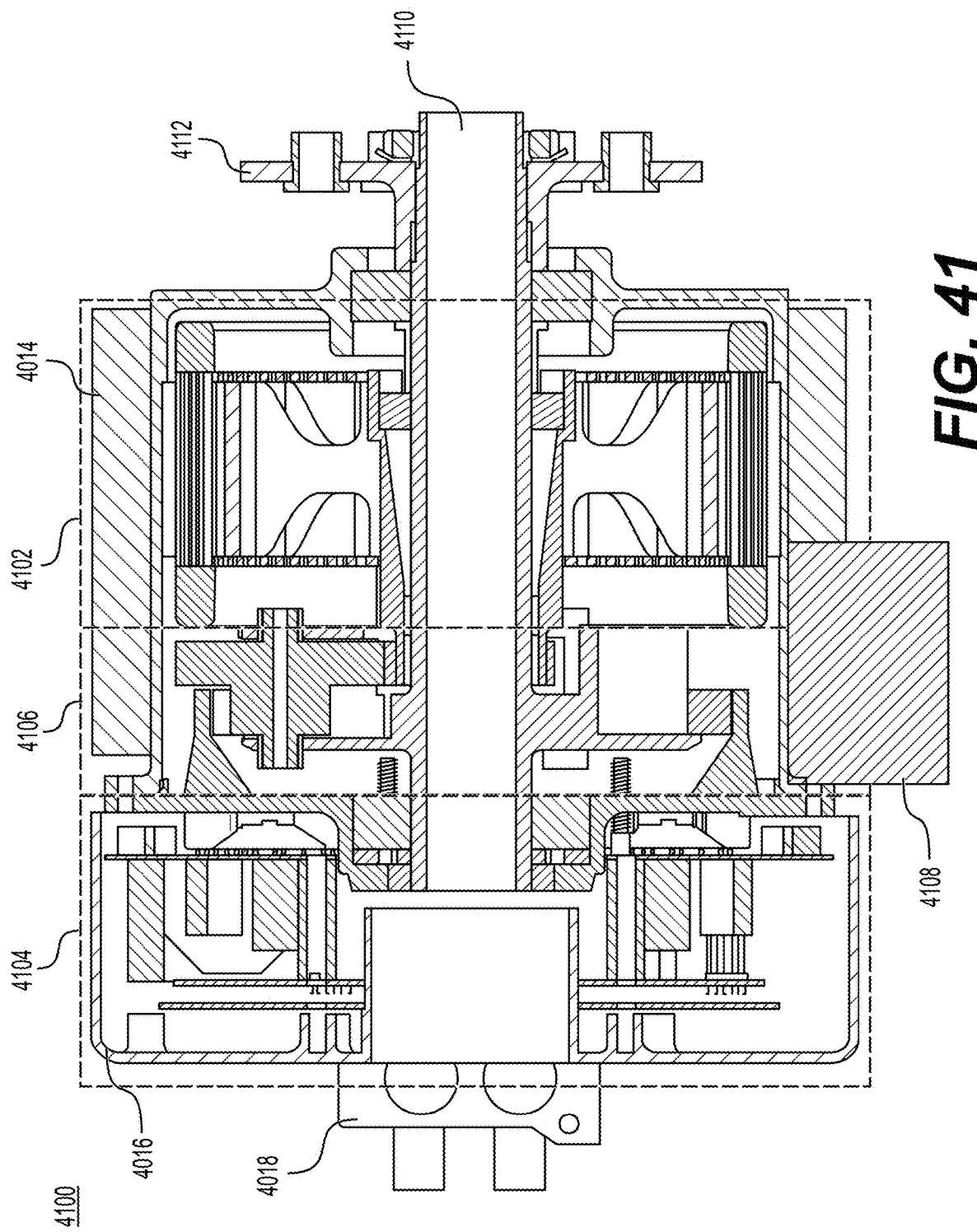
FIG. 41 is a cross-sectional illustration of an electric propulsion system of a VTOL aircraft, consistent with disclosed embodiments.

FIG. 41 is a cross-sectional illustration of an electric propulsion system of a VTOL aircraft, consistent with disclosed embodiments. The electric propulsion system 4100 may comprise an inverter assembly 4104, a gearbox assembly 4106, and an electric motor assembly 4102, respectfully, aligned along a main shaft 4110 that is mechanically coupled to a shaft flange assembly 4112. The inverter assembly 4104, a gearbox assembly 4106, and an electric motor assembly 4102 may be located within housings such as an inverter assembly housing 4116 and a motor-gearbox assembly housing 4114 where the inverter assembly 4116 abuts the motor-gearbox assembly housing 4114. Additionally, power connection channels 4118 may be connected to the high voltage connector located in the inverter assembly in the inverter assembly housing 4116. Further to this embodiment, a heat exchanger 4108 may be mounted to the motor-gearbox assembly housing 4114 and can be used, along with distribution channels (not pictured) to assist in liquid cooling the electric motor assembly 4102, gearbox assembly 4106, and/or the inverter assembly 4104 by cooling the liquids that are circulated throughout the electric motor assembly 4102, gearbox assembly 4106, and/or the inverter assembly 4104 to cool the respective components. While in some embodiments the inverter assembly, gearbox assembly, and electric motor assembly are shown to be consistent with the described stacked assembly inverter assembly, planetary gearbox, and electric motor consisting of a stator and a rotor in this figure, this figure is exemplary and the inverter assembly, gearbox assembly, and electric motor assembly can be of any type as described herein or capable of achieving similar functionality.

FIGS. 42A-42B are illustrations of exemplary electric propulsion systems of a VTOL aircraft, consistent with disclosed embodiments. An electric propulsion system 4200 may be cooled using liquid cooling. The electric propulsion system 4200A may comprise an electric motor assembly located within a motor assembly housing 4202A and a gearbox assembly located within a gearbox assembly housing 4206A aligned along a main shaft 4208A connected to a shaft flange assembly 4210A. In some embodiments, the electric motor assembly may be located between the gearbox assembly and the shaft flange assembly 4210A. Further, an inverter assembly housing 4204A may abut the gearbox assembly housing 4206A and may also be mechanically connected to power connection channels 4214A. In some embodiments, a heat exchanger 4212A may be coupled to the gearbox assembly housing 4206A and the inverter assembly housing 4204A. Further, the heat exchanger 4212A may be fluidically coupled to the electric motor assembly, gearbox assembly, and inverter assembly via liquid flow paths to provide liquid to cool and lubricate the components within the electric motor assembly, gearbox assembly, and inverter assembly. Some embodiments may include flow paths including channels, bores, and cavities capable of transporting liquid throughout the fluidically coupled components of the electric propulsion system 4200B.

FIG. 42B illustrates a perspective view of an exemplary electric propulsion system 4200B as discussed with respect to FIG. 42A that is liquid cooled using a heat exchanger 4212B that is fluidically coupled to the electric motor assembly, gearbox assembly, and inverter assembly. Exemplary electric propulsion system 4200B may comprise an electric motor assembly located within a motor assembly housing 4202B and a gearbox assembly housed with a gearbox assembly housing 4206B aligned along a main shaft 4208B that is mechanically coupled to a flange shaft assembly 4210B. Some embodiments may include the motor assembly housing 4202B and the gearbox assembly housing 4206B possessing substantially circular profiles with equal radii. An exemplary electric propulsion system 4200B may also comprise an inverter assembly housed within an inverter assembly housing 4204B with a substantially circular profile that is mechanically coupled to power connection channels 4214B and to the gearbox assembly housing 4206B. Some embodiments may include an inverter assembly housing 4204B possessing a radius that is greater than the radii of the gearbox assembly housing 4206B and/or the motor assembly housing 4202B.

FIGS. 43A-43D are illustrations and schematic diagrams illustrating exemplary electric propulsion systems of a VTOL aircraft, consistent with disclosed embodiments. The electric propulsion system 4300A may comprise, a gearbox assembly 4306A, an electric motor assembly 4302A, and an inverter assembly 4304A, respectfully, aligned along a main shaft 4316A that is connected to a shaft flange assembly 4308A. The inverter assembly 4304A may be located within an inverter assembly housing 4312A. Further, the gearbox assembly 4306A and electric motor assembly 4302A may be located within a motor-gearbox assembly housing 4310A. Some embodiments may include an inverter assembly housing 4312A, and thus an inverter assembly 4303A, located between the motor-gearbox assembly housing 4310A and the shaft flange assembly 4308A. In such a configuration, the main shaft 4316A may pass through the gearbox assembly 4306A, the electric motor assembly 4302A, and the inverter assembly 4304A. Additionally, power connection channels 4314A may extend from a boom, wing, or fuselage of an aircraft past the motor-gearbox assembly housing 4313A to a connection point in the inverter assembly housing 4312A.

FIG. 43B illustrates a perspective view of an exemplary embodiment of an electric propulsion system 4300B as discussed with respect to FIG. 43A that is air cooled. The electric propulsion system 4300B may comprise an electric motor assembly 4302A and a gearbox assembly 4306A housed within the motor-gearbox housing 4310B and an inverter assembly housed within the inverter assembly housing 4312B. The motor-gearbox housing 4310B and the inverter assembly housing 4312B may possess substantially circular profiles with substantially equivalent radii and be aligned along a main shaft 4316B that is connected to a flange shaft assembly 4308B. Some embodiments may include the inverter assembly housing 4312B positioned between the motor-gearbox assembly housing 4310B and the flange shaft assembly 4308B with power connection channels 4314B extending from the boom, wing, or fuselage of an aircraft past the motor-gearbox assembly housing 4310B to a connection point in the inverter assembly housing 4312B. Further embodiments may include motor-gearbox housing 4310B and the inverter assembly housing 4312B that possess cooling fins 4320B and 4318B, respectfully, on the outer surface of each housing. The cooling fins 4320B, 4318B may transfer heat from the components housed within the motor-gearbox housing 4310B and the inverter assembly housing 4312B to the external air passing through the cooling fins 4320B, 4318B.

FIG. 43C provides a schematic illustration of an exemplary electric propulsion system 4300C consistent with embodiments of this disclosure. An electric propulsion system 4300C may include a similar arrangement of components as those depicted and described in FIG. 43A and FIG. 43B. However, an electric propulsion system 4300C may include a gearbox assembly 4306C positioned between an electric motor assembly 4302C and an inverter assembly 4304C that is connected to a flange shaft assembly 4308C. In such a configuration, the main shaft 4316A, not pictured in this illustration, may pass through the electric motor assembly 4302C, the gearbox assembly 4306C, and the inverter assembly 4304C. Additionally, one or more power connection channels 4314C may extend from a boom of an aircraft past the motor-gearbox assembly housing 4310C to a connection point in the inverter assembly housing 4312C.

FIG. 43D provides a schematic illustration of an example electric propulsion system 4300D consistent with embodiments of this disclosure. An electric propulsion system 4300D may include a similar arrangement of components, and labeling, as those depicted and described in FIGS. 43A-43C. FIG. 43D depicts a similar electric propulsion system 4300D to that of the electric propulsion system 4300C in FIG. 43C where an inverter assembly housing 4312D is connected to power connection channels 4314D extending from the boom of an aircraft and abuts a flange shaft assembly 4308D and a motor assembly housing 4310D. However, the motor assembly housing 4310D houses an electric motor assembly 4302D that provides torque to the flange shaft assembly 4308D, via a main shaft that travels through the inverter assembly 4304D, without a gear reduction from a gearbox assembly.

FIGS. 44A-44C are schematic diagrams illustrating exemplary electric propulsion systems of a VTOL aircraft, consistent with disclosed embodiments. An exemplary electric propulsion system 4400A may comprise an inverter assembly 4404A housed within an inverter assembly housing 4416A positioned between a shaft flange assembly 4410A and a divider plate 4408A. In addition to the inverter assembly housing 4416A, the divider plate 4408A may be coupled to a motor-gearbox housing 4414A that houses an electric motor assembly 4402A and a gearbox assembly 4406A. In such a configuration, the inverter assembly housing 4416A may comprise an attachment point for power connection channels 4420A extending from the boom, wing, or fuselage of the aircraft. Further, such a configuration may comprise a main shaft mechanically coupled to the shaft flange assembly 4410A that travels through the inverter assembly housing 4416A, and in some embodiments the inverter assembly 4404A, and divider plate 4408A to the electric motor assembly 4402A. Some embodiments may include the main shaft extending from a first end of the motor-gearbox assembly housing 4414A that is mechanically coupled to the divider plate 4408A to a second end of the housing and thus, through or past the gearbox assembly 4406A to the electric motor assembly 4402A. Some embodiments may include a heat exchanger 4412A fluidically coupled to the inverter assembly 4404A, the gearbox assembly 4406A, and the electric motor assembly 4402A via a liquid flow path 4418A. A divider plate 4408A may act to seal off an upper portion of the motor-gearbox assembly housing 4414A via an end bell assembly and act to seal off a lower portion of the inverter assembly housing 4416A via a thermal plate. Divider plate 4408A may comprise grooves, bores, or other conduits configured to distribute liquid to cool the inverter assembly 4404A and cool and lubricate the gearbox assembly 4406A and the electric motor assembly 4402A. The liquid flow path 4418A may comprise circulating a liquid to extract heat from the components of the inverter assembly 4404A, gearbox assembly 4406A, and the electric motor assembly 4402A and transfer that heat to an air flow 4422A that passes through the cooling fins of the heat exchanger 4412A.

FIG. 44B provides a schematic illustration of an example electric propulsion system 4400B consistent with embodiments of this disclosure. An electric propulsion system 4400B may include a similar arrangement of components as those depicted and described in FIG. 44A. FIG. 44B depicts a similar electric propulsion system 4400B to that of the electric propulsion system 4400A in FIG. 44A where an inverter assembly housing 4416A is connected to power connection channels 4420A extending from the boom, wing, or fuselage of an aircraft and is positioned between the flange shaft assembly 4410B and the divider plate 4408B. However, the divider plate 4408B may also be coupled to a motor-gearbox assembly housing 4414B that houses a gearbox assembly 4406B that is located behind an electric motor assembly 4402B relative to the divider plate 4408B. Some embodiments may include a liquid flow path 4418B that fluidically couples a heat exchanger to the inverter assembly 4404B, the gearbox assembly 4406B, and the electric motor assembly 4402B. Further, the liquid flow path 4418B may comprise circulating a liquid to extract heat from the components of the inverter assembly 4404B, gearbox assembly 4406B, and the electric motor assembly 4402B and transfer that heat to an air flow 4422B that passes through the cooling fins of the heat exchanger 4412B.

FIG. 44C provides a schematic illustration of an example electric propulsion system 4400C consistent with embodiments of this disclosure. An electric propulsion system 4400C may include a similar arrangement of components as those depicted and described in FIGS. 44A-44B. FIG. 44C depicts a similar electric propulsion system 4400C to that of the electric propulsion systems 4400A in FIGS. 44A and 4400B in FIG. 44B. However, electric propulsion system 4400C comprises a direct drive system as discussed herein, wherein the motor assembly housing 4414C houses an electric motor assembly 4402C that provides torque to a shaft flange assembly 4410C without a gear reduction via gearbox assembly.

The liquid flow paths 4418A, 4418B, and 4418C are illustrated with a high level of generality as a simple loop. In some embodiments, liquid flow paths may comprise branches, sub-loops or other segmented paths. In general, the liquid may be circulated in any way that effectively lubricate and cool various components present within the motor-gearbox housings 4414A-C and inverter assembly housings 4416A-C.

FIGS. 45A-45D are schematic diagrams illustrating exemplary electric propulsion systems of a VTOL aircraft, consistent with disclosed embodiments. The electric engine 4500A may comprise an electric motor assembly housed within a circular motor assembly housing 4510A with an inverter assembly housed with an inverter assembly housing 4512A that is coupled to the outer surface of the motor assembly housing 4510A. While FIG. 45A depicts an inverter assembly housing 4512A tangentially coupled to the outer surface of the motor assembly housing 4510A, in some embodiments the base of the inverter assembly housing 4512A may be coupled to the outer surface of the motor assembly housing 4510A in any configuration, including the base of the inverter assembly housing having a curvature radius similar to the radius of the electric motor assembly housing 4510A. Further, the inverter assembly housing 4512A may comprise busbars 4516A that are connected to the motor assembly housing 4510A to supply alternating current to the electric motor assembly. The inverter assembly housing 4512A may also comprise cooling fins mounted to a portion of the inverter assembly housing 4512A that is opposite of the coupled portion of the inverter assembly housing 4512A. The cooling fins 4514A may act to remove heat generated from components present within the inverter assembly and transfer that heat to air flow through the cooling fins 4514A.

FIG. 45B illustrates a drawing of a perspective view of an exemplary embodiment of an electric engine 4500B consistent with this disclosure. An exemplary electric engine 4500B may include a similar arrangement of components as those depicted and described in FIG. 45A, including similar labeling of components such that similar numerical labeling corresponds to similar components across FIG. 45A and FIG. 45B. Exemplary electric engine 4500B may comprise an electric motor assembly housed within an electric motor assembly housing 4510B that is coupled to an inverter assembly housing 4512B that houses an inverter assembly. Further, an electric engine 4500B may comprise busbars 4516B that are connected to the motor assembly housing 4510B to supply alternating current to the electric motor assembly. Similar to FIG. 45A, electric engine 4500B may possess an inverter assembly housing 4512B comprising cooling fins 4514B that may act to remove heat generated from components present within the inverter assembly and transfer that heat to an external air flow through the cooling fins 4514B. Additionally, an inverter assembly housing 4512B may comprise a connection point for power connection channels 4518B originating within the boom, wing, or fuselage of the aircraft.

FIG. 45C schematically depicts an exemplary embodiment of an electric engine 4500C consistent with this disclosure. An exemplary electric engine 4500C may include a similar arrangement of components as those depicted and described in FIG. 45A and FIG. 45B, including similar labeling of components such that similar numerical labeling corresponds to similar components across FIG. 45A, FIG. 45B, and FIG. 45C. Electric engine 4500C may comprise an electric motor 4502C and a gearbox assembly 4506C housed within a motor assembly housing 4510C that is mechanically coupled to an inverter assembly housing 4512C that houses an inverter assembly 4504C. As shown in FIG. 45C, some embodiments may be configured with a gearbox assembly 4506C located between an electric motor assembly 4502C and a propeller assembly 4508C. In some embodiments, power connection channels 4518C may be connected to the inverter assembly housing 4512C that originate from another location within the boom, wing, or aircraft.

FIG. 45D schematically depicts an exemplary embodiment of an electric engine 4500D consistent with this disclosure. An exemplary electric engine 4500D may include a similar arrangement of components as those depicted and described in FIGS. 45A-45C, including similar labeling of components such that similar numerical labeling corresponds to similar components across FIGS. 45A-45C. Electric engine 4500D may comprise an electric engine 4502D and a gearbox assembly 4506D housed within a motor assembly housing 4510D that is coupled to an inverter assembly housing 4512D that houses an inverter assembly 4504D. Some embodiments may include a configuration such that an electric motor assembly 4502D is located between the gearbox assembly 4506D and a propeller assembly 4508D. In some embodiments, power connection channels 4518D may be connected to the inverter assembly housing 4512D that originate from another location within the boom, wing, or aircraft.

Figure 46B:
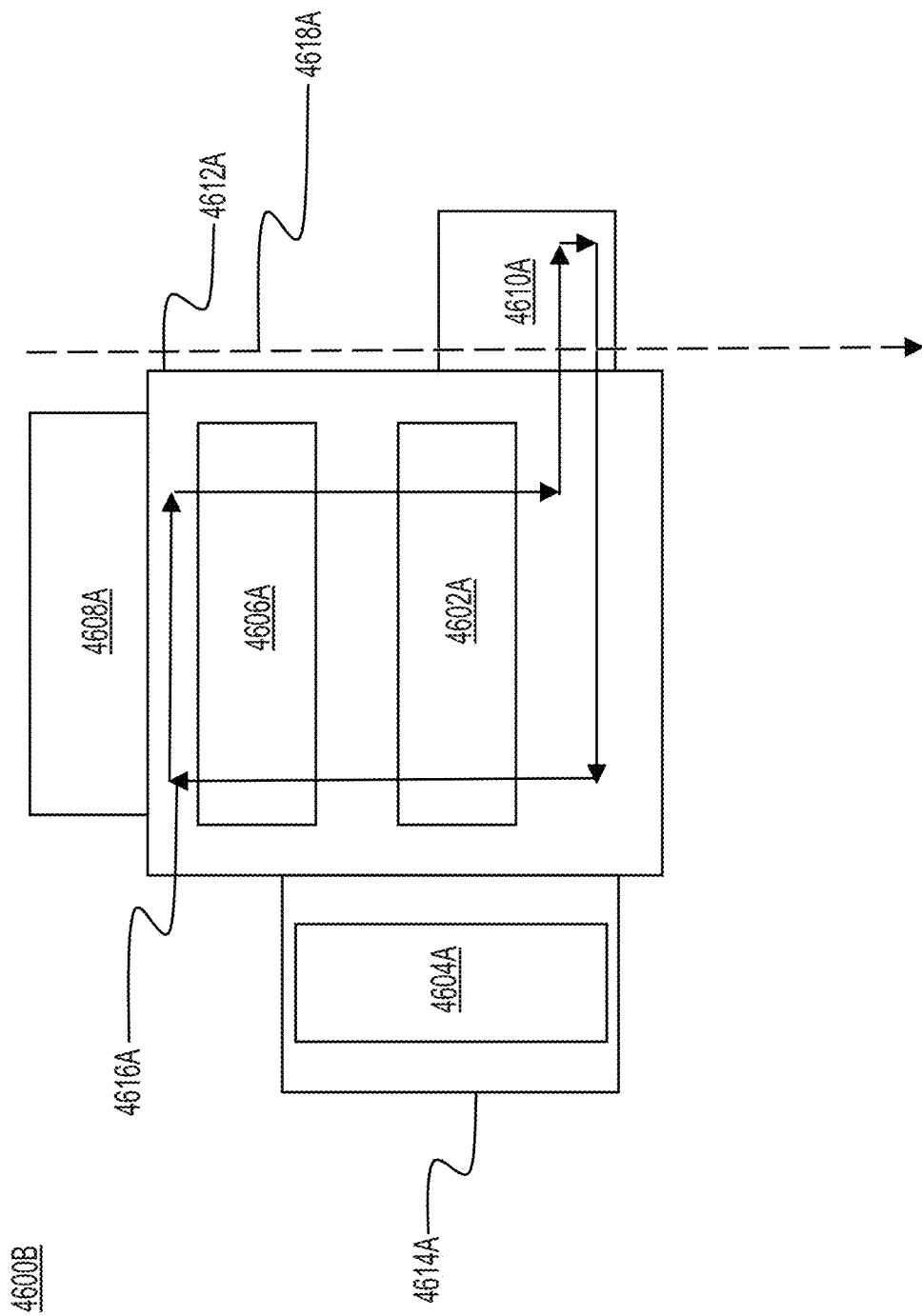

FIGS. 46A-46B are schematic diagrams illustrating exemplary electric propulsion systems of a VTOL aircraft, consistent with disclosed embodiments. An electric propulsion system 4600A may comprise an electric motor assembly 4602A and a gearbox assembly 4606A housed within a motor assembly housing 4612A that is coupled to an inverter assembly housing 4614A that houses an inverter assembly 4604A. Some embodiments may include a gearbox assembly 4606A positioned between an electric motor assembly 4602A and a propeller assembly 4608A. Some embodiments may include a heat exchanger 4610A coupled to the motor assembly housing 4612A and fluidically coupled to the electric motor assembly 4602A and gearbox assembly 4606A via liquid flow paths 4616A. Liquid flow paths 4616A may be used to extract heat from components present within the electric motor assembly 4602A and propeller assembly 4608A. Liquid flow paths 4616A may transport extracted heat to heat exchanger 4610A, which transfers heat to an air flow 4618A passing through the cooling fins of the heat exchanger 4610A.

FIG. 46B schematically depicts an exemplary embodiment of an electric propulsion system 4600B consistent with this disclosure. An exemplary electric engine 4600B may include a similar arrangement of components as those depicted and described in FIG. 46A, including similar labeling of components such that similar numerical labeling corresponds to similar components across FIG. 46A and FIG. 46B. An electric propulsion system 4600B may comprise an electric motor assembly 4602B and a gearbox assembly 4606B housed within a motor assembly housing 4612B that is coupled to an inverter assembly housing 4614B that houses an inverter assembly 4604B. Some embodiments may include an electric motor assembly 4602B positioned between a gearbox assembly 4606B and a propeller assembly 4608B. Some embodiments may include a heat exchanger 4610B that is coupled to the motor assembly housing 4612B and fluidically coupled to the electric motor assembly 4602B and gearbox assembly 4606B via liquid flow paths 4616B. Liquid flow paths 4616B may be used to extract heat from components present within the electric motor assembly 4602B and propeller assembly 4608B. Liquid flow paths 4616B may transport extracted heat to heat exchanger 4610B, which transfers heat to an air flow 4618B passing through the cooling fins of the heat exchanger 4610B.

The liquid paths 4616A and 4616B are illustrated with a high level of generality as a simple loop. In some embodiments, the liquid paths may comprise branches, sub-loops or other segmented paths. In general, the liquid may be circulated in any way that effectively lubricate and cool various components present within the motor assembly housing 4612A and 4612B.

Figure 47A:
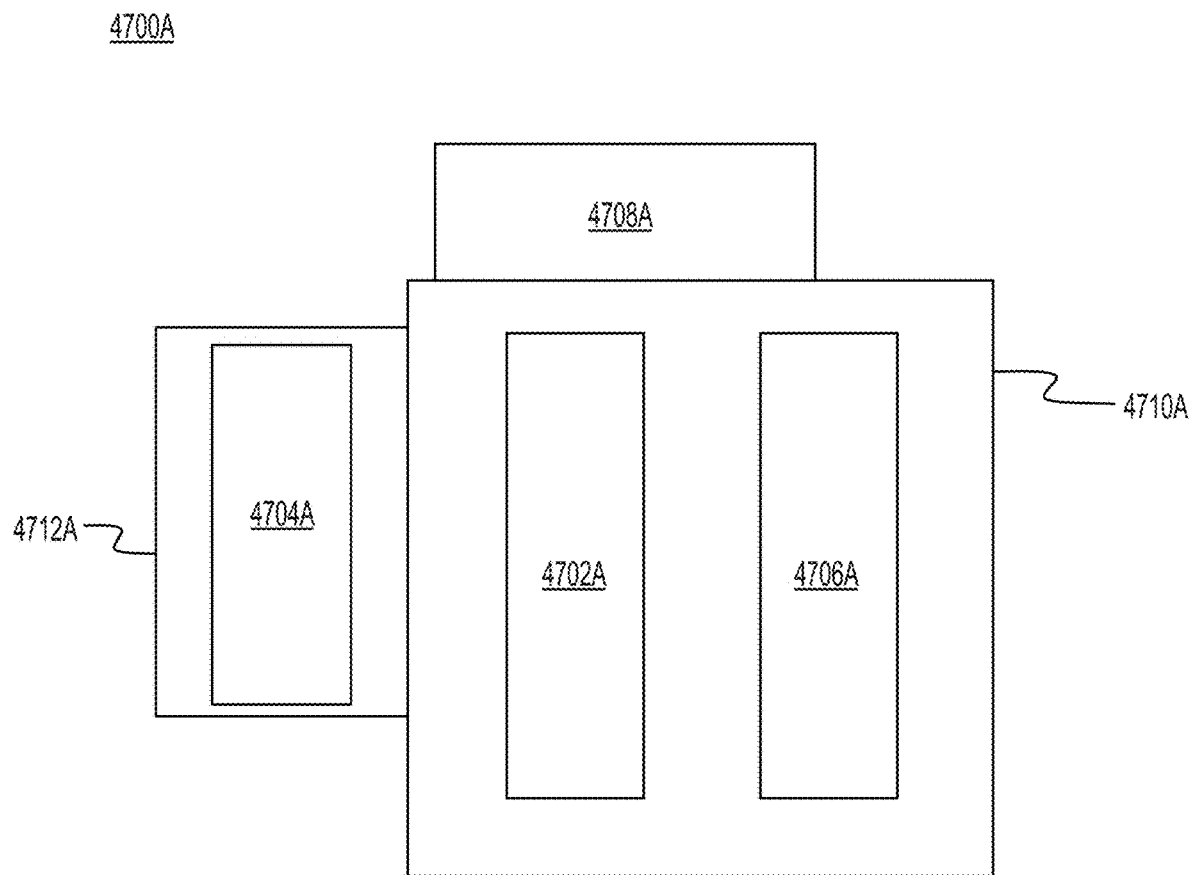
FIGS. 47A-47B are schematic diagrams and a cross-sectional illustration of exemplary electric propulsion systems of a VTOL aircraft, consistent with disclosed embodiments.
Figure 47B:
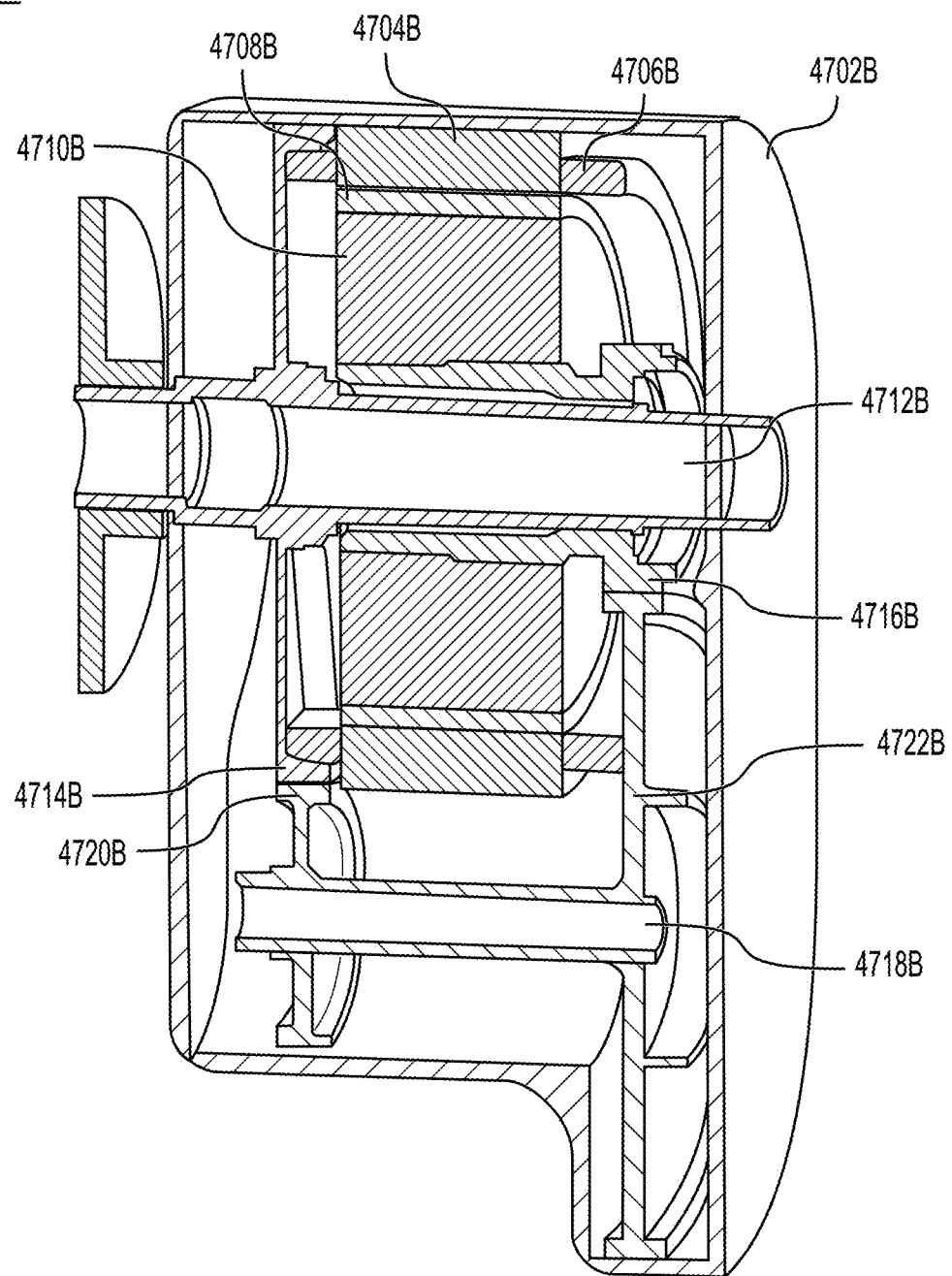

FIGS. 47A-47B are schematic diagrams illustrating exemplary electric propulsion systems of a VTOL aircraft, consistent with disclosed embodiments. The electric propulsion system 4700A may comprise an electric motor assembly 4702A and a gearbox assembly 4706A located within a motor-gearbox housing 4710A. The embodiment depicted in FIG. 47A may include a main shaft traveling through or from the electric motor assembly 4702A to the propeller assembly 4708A located outside of the motor-gearbox housing 4710A. Further, the gearbox assembly 4706A may not share an axis with the electric motor assembly 4702A or the main shaft that is used by the electric motor assembly 4702A to provide torque to the propeller assembly 4708A. In such embodiments, the gearbox assembly 4706A may still provide gear reduction between the electric motor assembly 4702A and propeller assembly 4708A. Some embodiments may also include an inverter assembly 4704A located in an inverter assembly housing 4712A that is mounted directly or indirectly to the motor-gearbox housing 4710A. While the inverter assembly 4704A is shown to be mounted to an outside edge of the motor-gearbox housing 4710A, in some embodiments an inverter assembly may have a circular profile that wraps around, or partially around, the motor-gearbox housing 4710A. Further, some embodiments may include an inverter assembly housing 4704A that may be coupled to an outer surface of the motor-gearbox assembly housing opposite the propeller assembly 4708A In some embodiments, the electric motor assembly 4702A, the gearbox assembly 4706A, and the inverter assembly 4704A may each possess various components giving rise a various volumes for each assembly, and as such, the motor-gearbox housing 4710A and inverter assembly housing 4712A may possess various profiles and volumes based on their respective assembly configurations.

FIG. 47B illustrates a cutaway view of an electric propulsion system 4700B. While FIG. 47B may be related to FIG. 47A, the elements identified by similar numerals may not refer to the same elements across the figures. Some embodiments of an electric propulsion system 4700B may comprise an electric motor assembly 4702A and a gearbox assembly 4706A located in a common motor-gearbox housing 4702B with a shaft 4712B traveling through the electric motor assembly 4702A. Some embodiments may include a propeller assembly that is mechanically coupled to the shaft 4712B. In some embodiments, an electric motor assembly 4702A may include a stator 4704B with stator windings 4706B and a rotor 4710B possessing a magnet array 4708B aligned along the shaft 4712B. In some embodiments, the rotor 4710B may be connected directly or indirectly to a secondary shaft 4716B surrounding the shaft 4712B such that the secondary shaft 4716B rotates at a speed equal to the rotor 4710B speed. Further to this example, embodiments of the secondary shaft 4716B may have splined shaft that interfaces with a gearbox assembly 4706A, adjacent to the electric motor assembly 4702A, where the gearbox assembly 4706A also interfaces with the shaft 4712B providing torque to the propeller assembly 4708A. Embodiments of a gearbox assembly 4706A as described herein may include at least a first gear 4722B, a second gear 4720B, and a gearbox shaft 4718B connecting them. In some embodiments, the radius of the first gear 4722B may be greater than the diameter of the second gear 4720B or vice versa. As such, the splined portion of the secondary shaft 4716B may interact with and rotate the first gear 4722B at the speed of the rotating rotor 4710B. A rotating first gear 4722B may drive a rotation of the gearbox shaft 4718B and the second gear 4720B. The second gear 4720B of the gearbox assembly 4706A may be interfaced with a portion of the shaft 4714B having a radius differing from the radius of the portion of the shaft 4712B connecting to the propeller assembly 4708A. In such an embodiment, the gearbox shaft 4718B of the gearbox assembly 4706A may be positioned to not share an axis with the shaft 4712B or the electric motor assembly 4702A yet still provide a gear reduction to the shaft 4712B providing torque to the propeller assembly 4708A.

Figure 48:
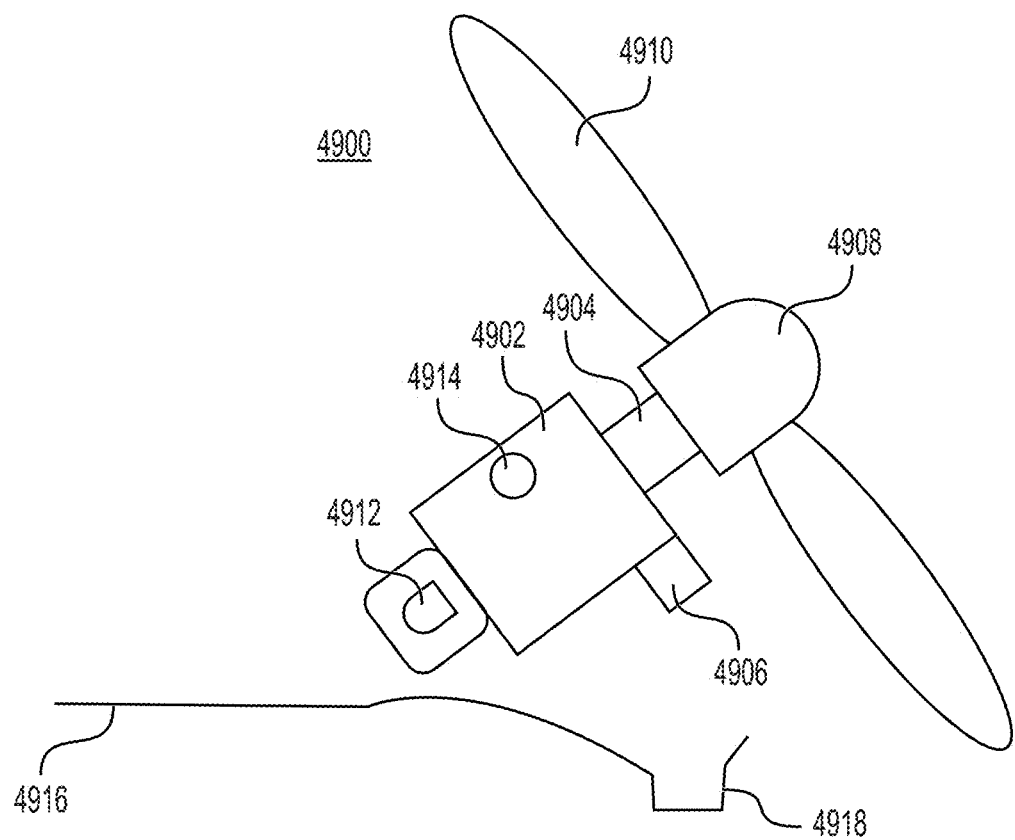
FIG. 48 is a schematic diagram illustrating an exemplary electric propulsion system of a VTOL aircraft, consistent with disclosed embodiments.

FIG. 48 is a schematic diagram illustrating an exemplary electric propulsion system of a VTOL aircraft, consistent with disclosed embodiments. Electric propulsion system 4800 may comprise an electric engine housed within an electric engine housing 4802 that is aligned along a shaft 4804 traveling from the electric engine housing 4802 to a propeller assembly 4808, comprising propellers 4810. In some embodiments, the electric propulsion system 4800 may include a heat exchanger 4806 fluidically coupled, via liquid flow paths present within the electric engine housing 4802, to components of the electric engine. Some embodiments may include an electric engine housing 4802 coupled to a boom 4816 of an aircraft via an apparatus 4814 for articulating the position of the electric propulsion system. Some embodiments may also include a blade pitch actuator 4812 coupled to the rear of the electric engine housing 4802. Components of the electric engine may generate various amounts of heat depending on the phase of flight an aircraft is engaged in. For example, components of an electric engine in a vertical takeoff-and-landing aircraft may generate more heat during a hover phase than during a cruise phase of flight, and therefore, may require more air flow through a heat exchanger 4806 to cool liquid that is being used to cool and/or lubricate components of the electric engine in a hover phase than a cruise phase. As such, some embodiments may include a boom 4816 comprising a cavity 4818 in the boom wherein the heat exchanger 4806 may be housed during cruise phase. The cavity 4818 may act to block or reduce air flow entering the heat exchanger during flight due to the reduction of air required to cool the system in various stages of flight. The embodiments may further be described using the following clauses:

Clause Set A: 1. An inverter assembly that converts direct current (DC) power to alternate current (AC) power for an electrical propulsion system, the inverter assembly comprising: a housing; a capacitor assembly having: a center hole, at least one capacitor, a capacitor housing having at least one busbar, and a plurality of through holes in the capacitor housing; at least one printed circuit board assembly (PCBA); and a plurality of positioning pins; wherein: the capacitor assembly and the at least one PCBA are positioned inside the housing, the plurality of through holes provide for positioning the at least one PCBA, and the plurality of positioning pins pass through the plurality of through holes of the capacitor housing and the at least one PCBA and are connected to the housing.

2. The inverter assembly of Clause A1, wherein the center hole is substantially aligned to a main shaft of the electrical propulsion system.

3. The inverter assembly of Clause A1, wherein the at least one PCBA and the capacitor assembly are stacked.

4. The inverter assembly of Clause A3, wherein the at least one PCBA comprises a gate drive PCBA and a power PCBA, wherein the capacitor assembly is positioned between the gate drive PCBA and the power PCBA.

5. The inverter assembly of Clause A1, wherein: the center hole of the capacitor assembly is a through hole, and the inverter assembly has a substantially doughnut shape.

6. The inverter assembly of Clause A1, wherein the at least one busbar is positioned outside the capacitor housing.

7. The inverter assembly of Clause A1, further comprising: a control board with low voltage (LV) logic input; an electromagnetic interference (EMI) shield; and a heat exchanger; wherein the control board and the EMI shield are positioned inside the housing; and wherein the heat exchanger is outside the housing.

8. The inverter assembly of Clause A7, wherein the heat exchanger is coupled to a thermal plate.

9. The inverter assembly of Clause A8, wherein each of the control board, the thermal plate, and the EMI shield includes a plurality of alignment holes to align with the positioning pins.

10. The inverter assembly of Clause A8, wherein the plurality of position pins comprise rods built into the thermal plate.

11. The inverter assembly of Clause A7, wherein the heat exchanger is configured to cool the inverter assembly using fluid.

12. The inverter assembly of Clause A11, wherein the fluid is oil.

13. The inverter assembly of Clause A1, wherein the at least one capacitor is a ring capacitor.

14. The inverter assembly of Clause A1, wherein the plurality of positioning pins are screws.

15. The inverter assembly of Clause A1, wherein the plurality of positioning pins are bolts.

16. The inverter assembly of Clause A1, wherein the plurality of positioning pins are rods pre-fixed on the capacitor housing.

17. An electrical propulsion system for a vertical take-off and landing (VTOL) aircraft, the electrical propulsion system comprising: an electrical motor assembly including at least a stator and a rotor; and an inverter assembly, comprising: a housing; a capacitor assembly having: a center hole, at least one capacitor, a capacitor housing having at least one busbar, and a plurality of through holes in the capacitor housing; at least one printed circuit board assembly (PCBA); and a plurality of positioning pins; wherein the capacitor assembly and the at least one PCBA are positioned inside the housing, the plurality of through holes provide for positioning the at least one PCBA, and the plurality of positioning pins pass through the through the plurality of through holes of the capacitor housing and the at least one PCBA and are connected to the housing.

18. The electrical propulsion system of Clause A17, wherein: the electrical motor assembly is positioned in a motor housing; and the motor housing and the housing of the inverter assembly are substantially aligned along a main shaft.

19. The electrical propulsion system of Clause A18, wherein the main shaft passes through a center line of the motor housing.

20. The electrical propulsion system of Clause A18, further comprising a gearbox assembly and a propeller assembly, wherein: the main shaft is substantially aligned with the center hole of the capacitor assembly; the electrical motor assembly drives the propeller assembly through the main shaft; the main shaft passes through the gearbox assembly; the electrical motor assembly is positioned between the gearbox assembly and the propeller assembly; and the inverter assembly and the propeller assembly are positioned on opposite ends of the main shaft.

21. An electrical propulsion system for a vertical take-off and landing (VTOL) aircraft, the electrical propulsion system comprising: a propeller assembly; a gearbox assembly; an electrical motor assembly including at least a stator and a rotor; wherein: the electrical motor assembly drives the propeller assembly through a main shaft, the electrical motor is positioned between the gearbox assembly and the propeller assembly, and the main shaft extends through the gearbox assembly; and an inverter assembly, comprising: a housing; a capacitor assembly having: a center hole substantially aligned to the main shaft, at least one capacitor, a capacitor housing having at least one busbar, and a plurality of through holes in the capacitor housing; at least one printed circuit board assembly (PCBA); and a plurality of positioning pins; wherein: the inverter assembly and the propeller assembly are positioned on different ends of the main shaft, the capacitor assembly and the at least one PCBA are positioned inside the housing, the plurality of through holes provide for positioning the at least one PCBA, and the plurality of positioning pins pass through the plurality of through holes of the capacitor housing and the at least one PCBA and are connected to the housing.

22. An inverter assembly comprising the inverter assembly of any clauses A1-A16.

23. An electric propulsion system for a vertical takeoff-and-landing (VTOL) aircraft comprising the aircraft of any clauses A17-A21.

Clause Set B: 1. A flexible printed circuit board assembly (PCBA) structure, comprising: a contact pad having at least one electrical contact; and at least one snaking connection; wherein: the contact pad deflects off a plane defined by the PCBA, the contact pad and the at least one snaking connection are formed by cutting through a printed circuit board, the printed circuit board including at least one substrate layer and at least one copper layer, and the at least one electrical contact is electrically connected to electronics on the printed circuit board through at least one of the at least one snaking connection.

2. The flexible PCBA structure of Clause B1, wherein the at least one snaking connection includes a partial cut-out of the at least one substrate layer.

3. The flexible PCBA structure of Clause B2, wherein the partial cut-out and does not extend into the copper layers.

4. The flexible PCBA structure of Clause B2, wherein the partial cut-out of the at least one substrate layer is perpendicular to an instant running direction of the at least one snaking connections.

5. The flexible PCBA structure of Clause B1, wherein each of the at least one snaking connection has an allowable deflection and a length, and a flex factor defined by the allowable deflection over the length.

6. The flexible PCBA structure of Clause B5, wherein at least two of the snaking connections have the same flex factor.

7. The flexible PCBA structure of Clause B6, wherein the flex factor is less than 0.015.

8. The flexible PCBA structure of Clause B1, further comprising a plurality of stand-offs on the contact pad.

9. A method to stack and connect at least one printed circuit board assembly (PCBA), comprising: providing at least one PCBA, the PCBA comprises: a contact pad having a first electrical contact; and at least one snaking connection; wherein: the contact pad deflects off a plane defined by the PCBA, the contact pad and the at least one snaking connection is formed by cutting through a printed circuit board, the printed circuit board including at least one substrate layer and at least one copper layer, and the first electrical contact is electrically connected to electronics on the rest of the printed circuit board through at least one of the at least one snaking connections; stacking an electrical component on top of the at least one PCBA, the electrical component having a second electrical contact; and aligning and connecting the first electrical contact and the second electrical contact.

10. The method of Clause B9, wherein the at least one substrate layers of the at least one snaking connection is partially cut-out.

11. The method of Clause B10, wherein the partially cut-out layer of the at least one substrate layer is perpendicular to an instant running direction of the at least one snaking connections. 12. The method of Clause B9, wherein each of the at least one snaking connection has an allowable deflection and a length, and a flex factor defined by the allowable deflection over the length.

13. The method of Clause B12, wherein at least two of the snaking connections have the same flex factor.

14. The method of Clause B13, wherein the flex factor is less than 0.015.

15. The method of Clause B9, further comprising a plurality of stand-offs on the contact pad.

16. A flexible PCBA structure comprising the flexible PCBA structure of any clauses B1-B8.

17. A method to stack and connect at least one PCBA comprising the method of any clauses B9-B15.

Clause Set C: 1. An electrical propulsion system, comprising: an electrical motor assembly including at least a stator and a rotor; and a rotor position sensor integrated to a printed circuit board assembly (PCBA), comprising: at least two hall sensors integrated to the PCBA, and a magnet on a planetary carrier of a gearbox assembly of the electrical propulsion system; wherein a thermal plate of the inverter and an end bell plate of the gearbox assembly are constructed of materials that are transparent to magnetic fields so that the at least two hall sensors are configured to sense the position of the magnet to determine a position of a propeller. 2. The electrical propulsion system of Clause C1, wherein the PCBA further comprises an integrated oil temperature sensor.

3. The electrical propulsion system of Clause C2, where in the integrated oil temperature sensor is positioned to sense temperature of cooling oil, the cooling oil is configured to cool MOSFET and/or power modules.

4. The electrical propulsion system of Clause C1, further comprising a secondary speed sensor. 5. The electrical propulsion system of Clause C4, wherein the secondary speed sensor is connected to a control board of the electrical propulsion system.

6. An electrical propulsion system for a vertical take-off and landing (VTOL) aircraft, the electrical propulsion system comprising: an electrical motor assembly including at least a stator and a rotor; and a printed circuit board assembly (PCBA), comprising: a rotor position sensor, at least two hall sensors, and a gearbox assembly having a planetary carrier with a magnet; wherein the at least two hall sensors are configured to sense the position of the magnet to determine a position of a propeller driven by the electrical motor.

7. An electrical propulsion system comprising the electrical propulsion system of any clauses C1-C6.

Clause Set D: 1. A press-in mesh port for a power inverter of an electrical propulsion system, comprising: at least one mesh port; and a press-fit latch on the at least one mesh port configured to be pressed into a housing of an inverter from inside; wherein the at least one mesh port, once press-fit to the housing from inside, is tilted at an angle relative to a direction of gravity.

2. The press-in mesh port of Clause D1, wherein the angle is between 0° and 90°.

3. The press-in mesh port of Clause D1, wherein the at least one mesh port material is aluminum, copper, titanium, or stainless steel.

4. The press-in mesh port of Clause D2, wherein the at least one mesh port is positioned along a circumference of an inverter housing.

5. An inverter housing, comprising a plurality of press-in mesh ports, each of the plurality of press-in mesh ports comprises: at least one mesh port; and a press-fit latch on the at least one mesh port configured to be pressed into a housing of an inverter from inside; wherein the at least one mesh port, once press-fit to the housing from inside, is tilted at an angle relative to a direction of gravity; wherein the plurality of press-in mesh ports are positioned along a circumference of the inverter housing.

6. The inverter housing of Clause D5, wherein the plurality of press-in mesh ports are positioned to allow drainage from the inverter housing regardless of an orientation of the inverter housing. 7. A press-in mesh port comprising the press-in mesh port of any clauses D1-D4.

8. An inverter housing comprising the inverter housing of any clauses D5-D6.

Clause Set E: 1. A motor of an electrical propulsion system, comprising: a case enclosing a sealed environment; a rotor inside the case; and a stator inside the case; wherein: the motor has a cool side and a hot side; and the rotor is configured to create an air movement inside the sealed environment from the cool side towards the hot side to provide a cooling effect to one or more components on the hot side outside the case.

2. The motor of Clause E1, further comprising an inside surface comprising: a first inside surface of a rotor arbor having a first plurality of fins; and a second inside surface of an endplate having a second plurality of fins.

3. The motor of Clause E2, wherein the first plurality of fins has a different shape than the second plurality of fins.

4. The motor of Clause E1, wherein the first plurality of fins are straight.

5. The motor of Clause E4, wherein the first plurality of fins have a plurality of different heights. 6. The motor of Clause E4, wherein the second plurality of fins have a same height.

7. The motor of Clause E6, wherein the same height of the second plurality of fins is between 5 mm and 20 mm.

8. The motor of Clause E2, wherein a curvature of the second plurality of fins directs air movement towards the center of the motor.

9. The motor of Clause E2, wherein the first plurality of fins and the rotor have a first clearance, the first clearance is between 0.4 mm and 1.2 mm.

10. The motor of Clause E2, wherein the second plurality of fins on the inside surface of the end plate and the rotor have a second clearance, the second clearance is between 0.4 mm and 1.2 mm.

11. The motor of Clause E2, wherein: air inside the sealed environment is pressured through gaps formed by the first plurality of fins and the second plurality of fins, and the pressurized air is guided from edges of the hot side toward a center of the motor on the hot side, and toward a center of the motor on the cold side.

12. An electrical propulsion system, comprising: at least one propeller; and at least one motor having a cool side and a hot side, the at least one motor comprising: a case enclosing a sealed environment, a stator inside the case, and a rotor inside the case, the rotor being configured to create an air movement inside the sealed environment from the cool side towards the hot side to provide a cooling effect to one or more components on the hot side outside the case; wherein: the at least one propeller and the at least one motor are equal in number, each of the at least one propeller is positioned on the cool side of a corresponding one of the at least one motor, and each of the at least one propeller is configured to drive air flow towards the cool side of the corresponding one of the at least one motor to cool the motor.

13. The electrical propulsion system of Clause E12, further comprising an inside surface of the sealed environment, the inside surface of the sealed environment comprises:
  a first inside surface of a rotor arbor having a first plurality of fins; and
  a second inside surface of an endplate having a second plurality of fins.

14. The electrical propulsion system of Clause E13, wherein the first plurality of fins has a different shape than the second plurality of fins.

15. The electrical propulsion system of Clause E13, wherein the first plurality of fins are straight. 16. The electrical propulsion system of Clause E15, wherein the first plurality of fins have a plurality of different heights.

17. The electrical propulsion system of Clause E12, wherein the second plurality of fins have a same height.

18. The electrical propulsion system of Clause E17, wherein the same height of the second plurality of fins is between 5 mm and 20 mm.

19. The electrical propulsion system of Clause E13, wherein a curvature of the second plurality of fins directs the air movement towards the center of the motor.

20. The electrical propulsion system of Clause E13, wherein the first plurality of fins and the rotor have a first clearance, the first clearance is between 0.4 mm and 1.2 mm.

21. The electrical propulsion system of Clause E13, wherein the second plurality of fins on the inside surface of the endplate and the rotor have a second clearance, the second clearance is between 0.4 mm and 1.2 mm.

22. The electrical propulsion system of Clause E13, wherein: air inside the sealed environment is pressured through gaps formed by the first plurality of fins and the second plurality of fins, and the pressurized air is guided from edges of the hot side toward a center of the motor on the hot side, and toward the center of the motor on the cold side.

23. A motor of an electrical propulsion system comprising the motor of any clauses E1-E11.

24. An electrical propulsion system comprising the electrical propulsion system of any clauses E12-E22.

The embodiments disclosed herein are intended to be non-limiting. Those of ordinary skill in the art will appreciate that certain components and configurations of components may be modified without departing from the scope of the disclosed embodiments.

What is claimed is:

1. An electrical propulsion system, comprising:
  an inverter comprising a thermal plate and a printed circuit board assembly (PCBA);
  an electrical motor assembly comprising a stator and a rotor;
  a gearbox assembly comprising an end bell plate; and
  a rotor position sensor connected to the PCBA, the rotor position sensor comprising:
    at least two hall sensors coupled to the PCBA, and
    a magnet located on the gearbox assembly, wherein the at least two hall sensors are configured to detect a magnetic field of the magnet through at least one of the thermal plate or the end bell plate to sense a position of the magnet.

2. The electrical propulsion system of claim 1, wherein the PCBA further comprises an integrated oil temperature sensor.

3. The electrical propulsion system of claim 2, wherein the integrated oil temperature sensor is positioned to sense temperature of cooling oil.

4. The electrical propulsion system of claim 3, wherein the cooling oil is configured to cool at least one of a MOSFET or a power module.

5. The electrical propulsion system of claim 1, further comprising a secondary speed sensor.

6. The electrical propulsion system of claim 5, wherein the secondary speed sensor is connected to a control board of the electrical propulsion system.

7. The electrical propulsion system of claim 1, wherein the magnet is located on a planetary carrier of the gearbox assembly.

8. A vertical take-off and landing (VTOL) aircraft, comprising the electrical propulsion system of claim 1.

9. A method of operating an electrical propulsion system, the method comprising:
  operating an electrical motor assembly to rotate a propeller, the electrical motor assembly comprising at least a stator and a rotor and being coupled to a gearbox assembly comprising an end bell plate;
  providing electrical power to the electrical motor assembly by an inverter, the inverter comprising a thermal plate and a printed circuit board assembly (PCBA), and
  sensing a rotational position of the propeller using a rotor position sensor integrated to the PCBA, the rotor position sensor comprising:
    at least two hall sensors integrated to the PCBA; and
    a magnet located on the gearbox assembly, wherein sensing the rotational position of the propeller comprises using the at least two hall sensors to detect a magnetic field of the magnet through at least one of the thermal plate or the end bell plate to sense a position of the magnet.

10. The method of claim 9, wherein the PCBA further comprises an integrated oil temperature sensor.

11. The method of claim 10, wherein the integrated oil temperature sensor is positioned to sense temperature of cooling oil.

12. The method of claim 11, wherein the cooling oil is configured to cool at least one of a MOSFET or a power module.

13. The method of claim 9, further comprising a secondary speed sensor.

14. The method of claim 13, wherein the secondary speed sensor is connected to a control board of the electrical propulsion system.

15. The method of claim 9, wherein the magnet is located on a planetary carrier of the gearbox assembly.

16. A method of operating a vertical take-off and landing (VTOL) aircraft, the method comprising:
- operating an electrical motor assembly of the VTOL aircraft to rotate a propeller of the VTOL aircraft, the electrical motor assembly comprising at least a stator and a rotor and being coupled to a gearbox assembly comprising an end bell plate;
- providing electrical power to the electrical motor assembly by an inverter, the inverter comprising a thermal plate and a printed circuit board assembly (PCBA), and
- sensing a rotational position of the propeller using a rotor position sensor integrated to the PCBA, the rotor position sensor comprising:
  - at least two hall sensors integrated to the PCBA; and
  - a magnet located on the gearbox assembly, wherein sensing the rotational position of the propeller comprises using the at least two hall sensors to detect a magnetic field of the magnet through at least one of the thermal plate or the end bell plate to sense a position of the magnet.

17. The method of claim 16, wherein the PCBA further comprises an integrated oil temperature sensor.

18. The method of claim 17, wherein the integrated oil temperature sensor is positioned to sense temperature of cooling oil.

19. The method of claim 18, wherein the cooling oil is configured to cool at least one of a MOSFET or a power module.

20. The method of claim 16, further comprising a secondary speed sensor.

21. The method of claim 20, wherein the secondary speed sensor is connected to a control board of the electrical propulsion system.

22. The method of claim 16, wherein the component of the gearbox assembly comprises a planetary carrier.

* * * * *